United States Patent
Shibata et al.

(10) Patent No.: US 11,238,925 B2
(45) Date of Patent: *Feb. 1, 2022

(54) SEMICONDUCTOR MEMORY DEVICE AND MEMORY SYSTEM

(71) Applicant: TOSHIBA MEMORY CORPORATION, Tokyo (JP)

(72) Inventors: Noboru Shibata, Kawasaki Kanagawa (JP); Tokumasa Hara, Kawasaki Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/137,723

(22) Filed: Dec. 30, 2020

(65) Prior Publication Data

US 2021/0118495 A1 Apr. 22, 2021

Related U.S. Application Data

(60) Continuation of application No. 16/896,601, filed on Jun. 9, 2020, now Pat. No. 10,916,300, which is a
(Continued)

(30) Foreign Application Priority Data

Feb. 20, 2017 (JP) .................. 2017-029095

(51) Int. Cl.
*G11C 11/56* (2006.01)
*G11C 16/08* (2006.01)
(Continued)

(52) U.S. Cl.
CPC .......... *G11C 11/5628* (2013.01); *G06F 13/16* (2013.01); *G11C 11/5642* (2013.01);
(Continued)

(58) Field of Classification Search
CPC . G11C 11/5628; G11C 13/16; G11C 11/5642; G11C 16/0483; G11C 16/08;
(Continued)

(56) References Cited

U.S. PATENT DOCUMENTS 8,054,684 B2 11/2011 Gorobets et al.
8,159,882 B2 4/2012 Honma et al.
(Continued)

FOREIGN PATENT DOCUMENTS

JP 2009059453 A 3/2009
JP 2009259326 A 11/2009
(Continued)

OTHER PUBLICATIONS

U.S. Appl. No. 16/275,776; First Named Inventor: Noboru Shibata; Title: "Semiconductor Memory Device, Memory System, and Write Method"; filed: Feb. 14, 2019.
(Continued)

*Primary Examiner* — Tri M Hoang
(74) *Attorney, Agent, or Firm* — Holtz, Holtz & Volek PC

(57) ABSTRACT

A semiconductor memory device includes a first memory cell for storing data using at least three levels of threshold voltages, including a first level, a second level higher than the first level and a third level higher than the second level. A first word line is connected to the first memory cell. In writing of data to the first memory cell from a state where a threshold voltage of the first memory cell is the first level, a plurality of program operations and verify operations are performed, each program operation including applying a program voltage to the first word line, each verify operation including applying a read voltage lower than the program voltage. The program operations include a program operation for the second level and a program operation for the third level, and the verify operations include a verify opera-
(Continued)

tion for the second level, and do not include a verify operation for the third level.

20 Claims, 93 Drawing Sheets

Related U.S. Application Data continuation of application No. 16/733,491, filed on Jan. 3, 2020, now Pat. No. 10,714,170, which is a division of application No. 15/702,476, filed on Sep. 12, 2017, now Pat. No. 10,566,051.

(51) Int. Cl.
| | |
|---|---|
| *G11C 16/10* | (2006.01) |
| *G11C 16/26* | (2006.01) |
| *G11C 16/32* | (2006.01) |
| *G11C 16/34* | (2006.01) |
| *G11C 16/04* | (2006.01) |
| *G06F 13/16* | (2006.01) |

(52) U.S. Cl.
CPC .......... *G11C 16/0483* (2013.01); *G11C 16/08* (2013.01); *G11C 16/10* (2013.01); *G11C 16/26* (2013.01); *G11C 16/32* (2013.01); *G11C 16/3459* (2013.01); *G11C 2211/5648* (2013.01)

(58) Field of Classification Search
CPC ......... G11C 16/26; G11C 16/10; G11C 16/32; G11C 16/3459
See application file for complete search history.

(56) References Cited

U.S. PATENT DOCUMENTS

| | | | |
|---|---|---|---|
| 8,473,809 B2 | 6/2013 | Wan et al. | |
| 8,605,500 B2 | 12/2013 | Kobayashi et al. | |
| 8,837,213 B2 | 9/2014 | Shibata | |
| 8,902,657 B2 | 12/2014 | Iwai et al. | |
| 9,190,161 B2 | 11/2015 | Shibata | |
| 9,224,476 B2 | 12/2015 | Shibata | |
| 9,558,828 B2 | 1/2017 | Shibata | |
| 9,799,406 B2 | 10/2017 | Sato et al. | |
| 9,830,983 B1 | 11/2017 | Hara et al. | |
| 10,049,749 B2 | 8/2018 | Shibata | |
| 10,566,051 B2* | 2/2020 | Shibata | G11C 16/08 |
| 10,714,170 B2* | 7/2020 | Shibata | G11C 16/10 |
| 10,916,300 B2* | 2/2021 | Shibata | G11C 16/3459 |
| 2009/0267128 A1 | 10/2009 | Maejima | |
| 2009/0268522 A1 | 10/2009 | Maejima | |
| 2010/0135078 A1 | 6/2010 | Iwai et al. | |
| 2010/0142270 A1 | 6/2010 | Shibata | |
| 2010/0207195 A1 | 8/2010 | Fukuzumi et al. | |
| 2010/0214838 A1 | 8/2010 | Hishida et al. | |
| 2011/0205805 A1 | 8/2011 | Honma et al. | |
| 2011/0284946 A1 | 11/2011 | Kiyotoshi | |
| 2012/0054416 A1 | 3/2012 | Kobayashi et al. | |
| 2012/0069663 A1 | 3/2012 | Itagaki et al. | |
| 2014/0047163 A1 | 2/2014 | Kwak | |
| 2014/0233311 A1 | 8/2014 | Iwai et al. | |
| 2015/0213895 A1 | 7/2015 | Kwak | |
| 2015/0269992 A1 | 9/2015 | Hara et al. | |
| 2015/0302920 A1 | 10/2015 | Shibata | |
| 2015/0357040 A1 | 12/2015 | Hara et al. | |
| 2016/0098197 A1* | 4/2016 | Kuo | G06F 3/0604 |
| | | | 711/103 |
| 2016/0125951 A1* | 5/2016 | Sun | G11C 11/5642 |
| | | | 365/185.24 |
| 2016/0365150 A1* | 12/2016 | Tokiwa | G11C 16/10 |
| 2017/0060482 A1* | 3/2017 | Hara | G11C 16/10 |
| 2017/0097869 A1* | 4/2017 | Sharon | G06F 3/0611 |
| 2017/0154677 A1 | 6/2017 | Lim et al. | |
| 2017/0154685 A1 | 6/2017 | Kim et al. | |
| 2017/0255514 A1* | 9/2017 | Honma | G06F 11/1048 |
| 2017/0262379 A1* | 9/2017 | Hara | G06F 12/0246 |
| 2017/0365335 A1* | 12/2017 | Wang | G06F 3/0659 |
| 2018/0025782 A1 | 1/2018 | Bandic et al. | |
| 2018/0240515 A1 | 8/2018 | Shibata et al. | |
| 2020/0043549 A1 | 2/2020 | Shibata et al. | |
| 2020/0143877 A1 | 5/2020 | Shibata et al. | |

FOREIGN PATENT DOCUMENTS

| | | |
|---|---|---|
| JP | 2009259328 A | 11/2009 |
| JP | 2010160873 A | 7/2010 |
| JP | 2012048791 A | 3/2012 |
| JP | 2014035786 A | 2/2014 |
| JP | 2015195071 A | 11/2015 |
| JP | 2015204126 A | 11/2015 |
| JP | 2016131025 A | 7/2016 |
| JP | 2018005959 | 1/2017 |

OTHER PUBLICATIONS

U.S. Appl. No. 16/724,100; First Named Inventor: Noboru Shibata; Title: "Semiconductor Memory"; filed: Dec. 20, 2019.

* cited by examiner

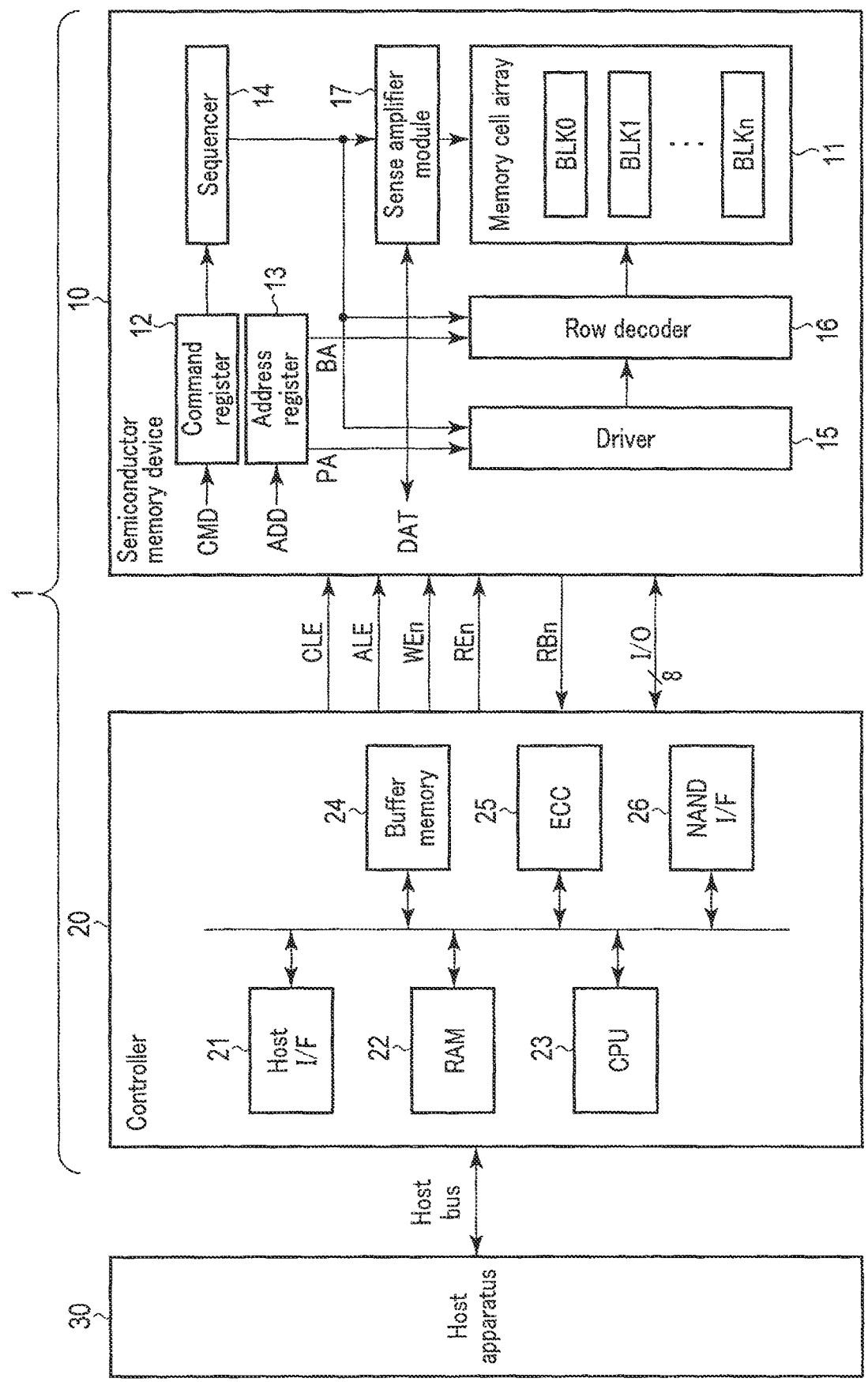
F I G. 1

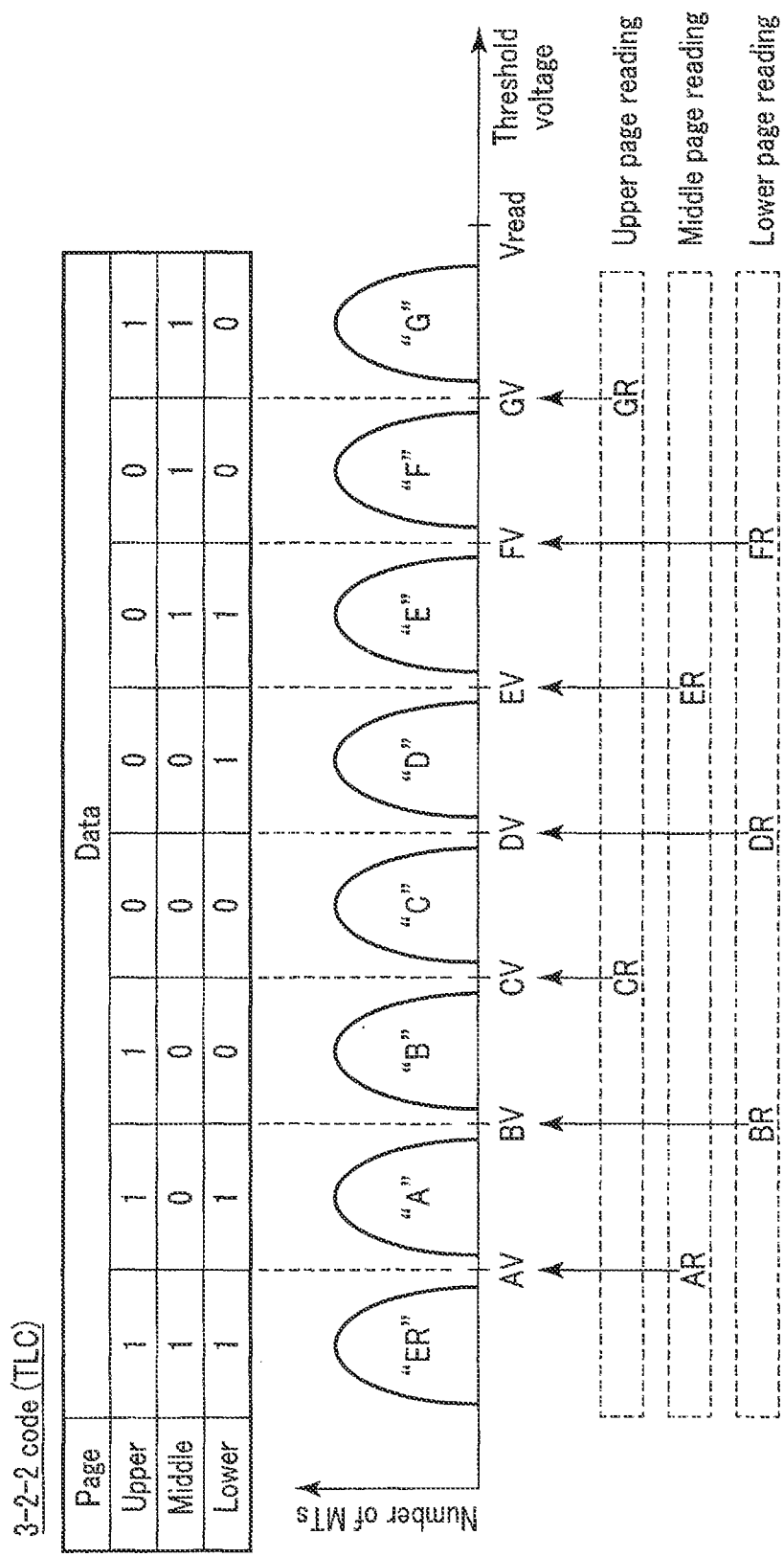
F I G. 3

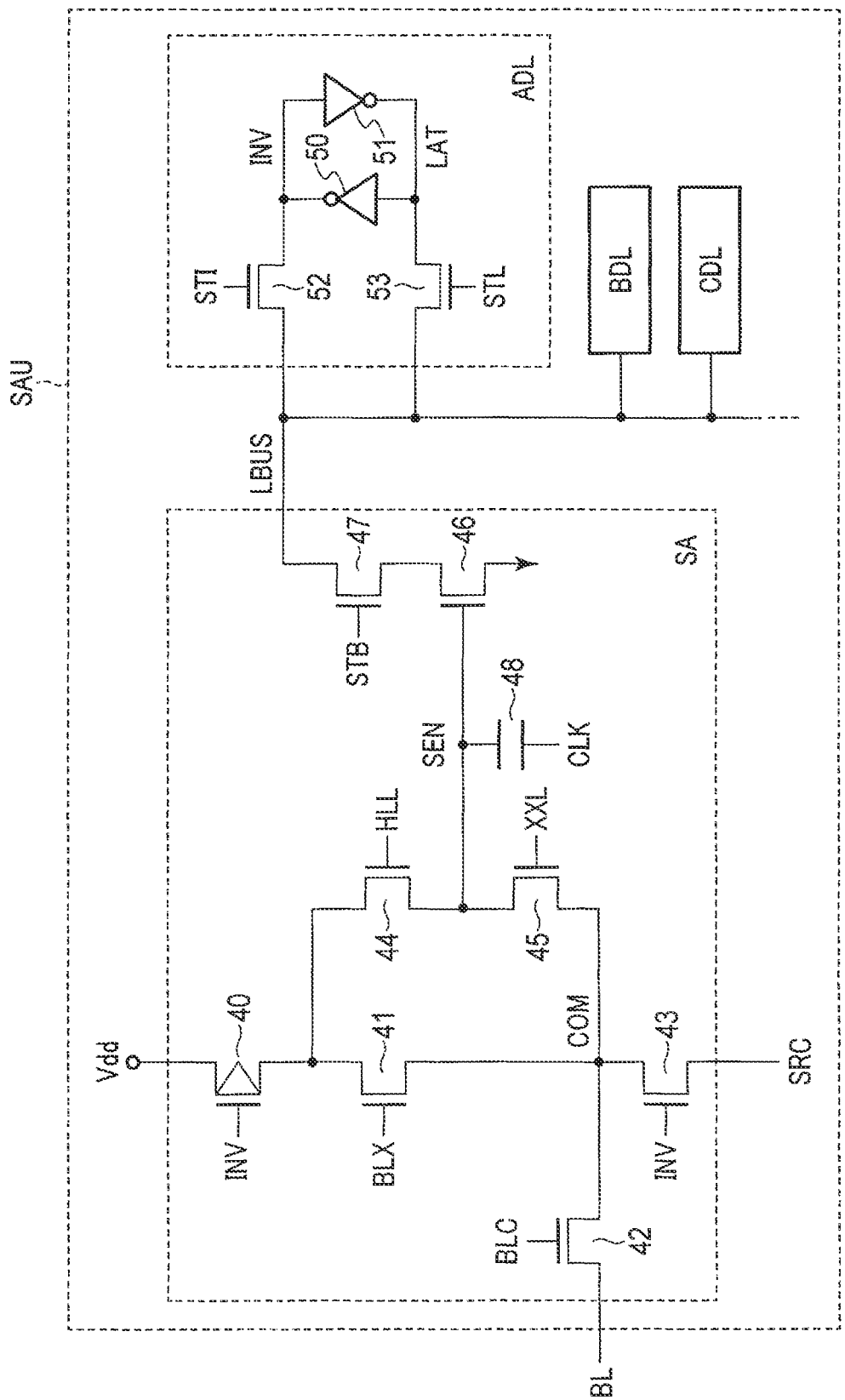
F I G. 4

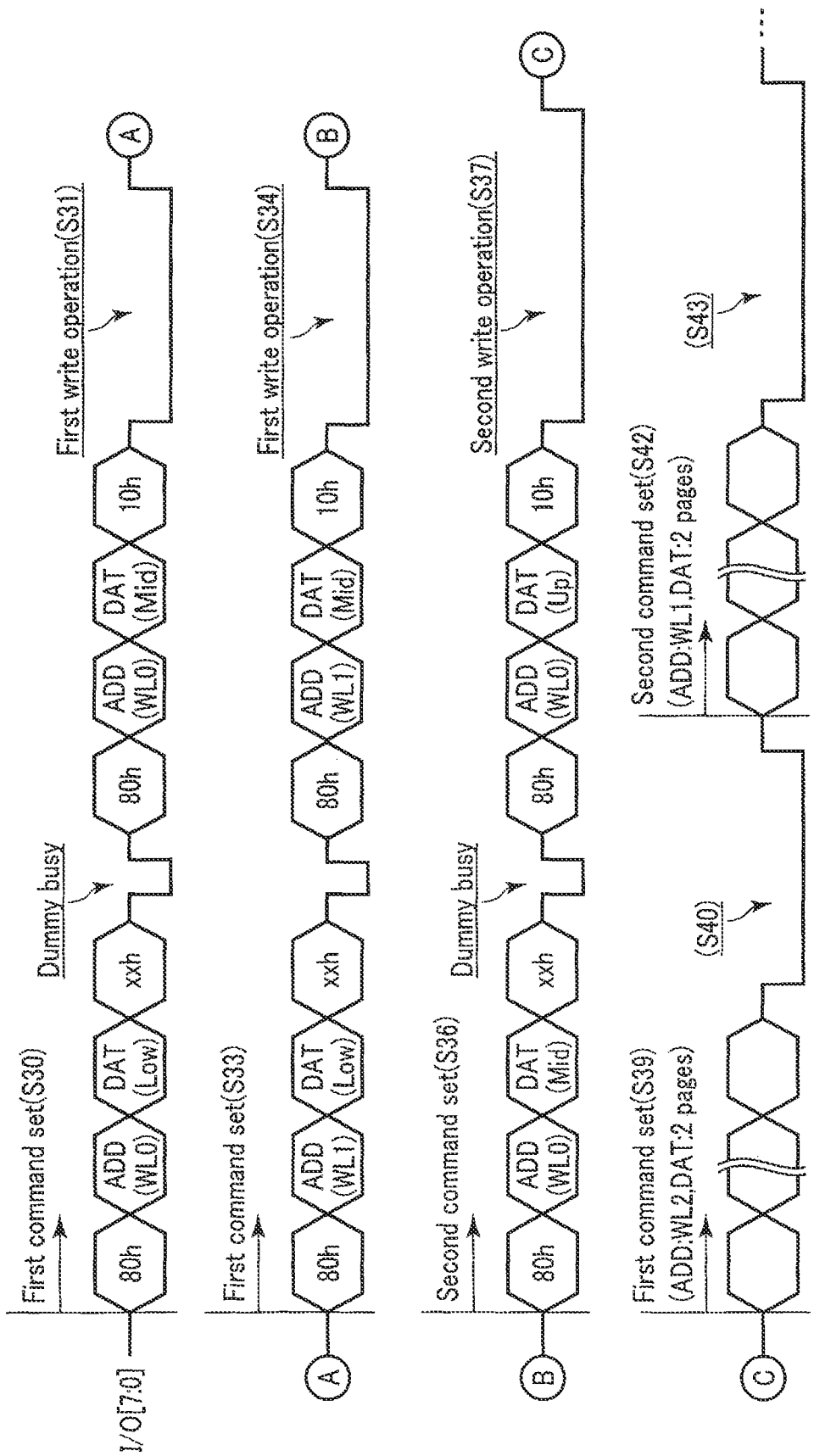
F I G. 12

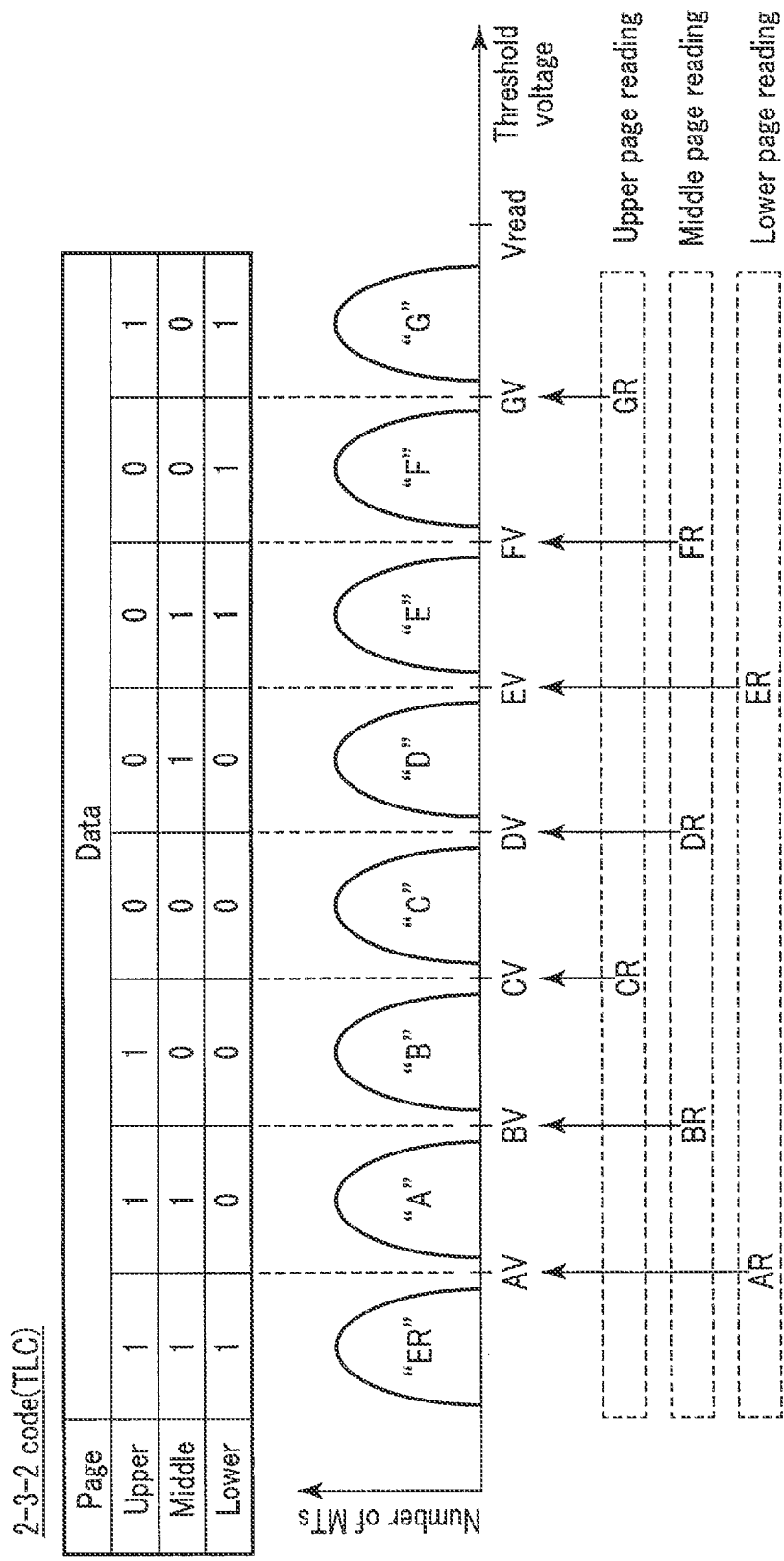
F I G. 18

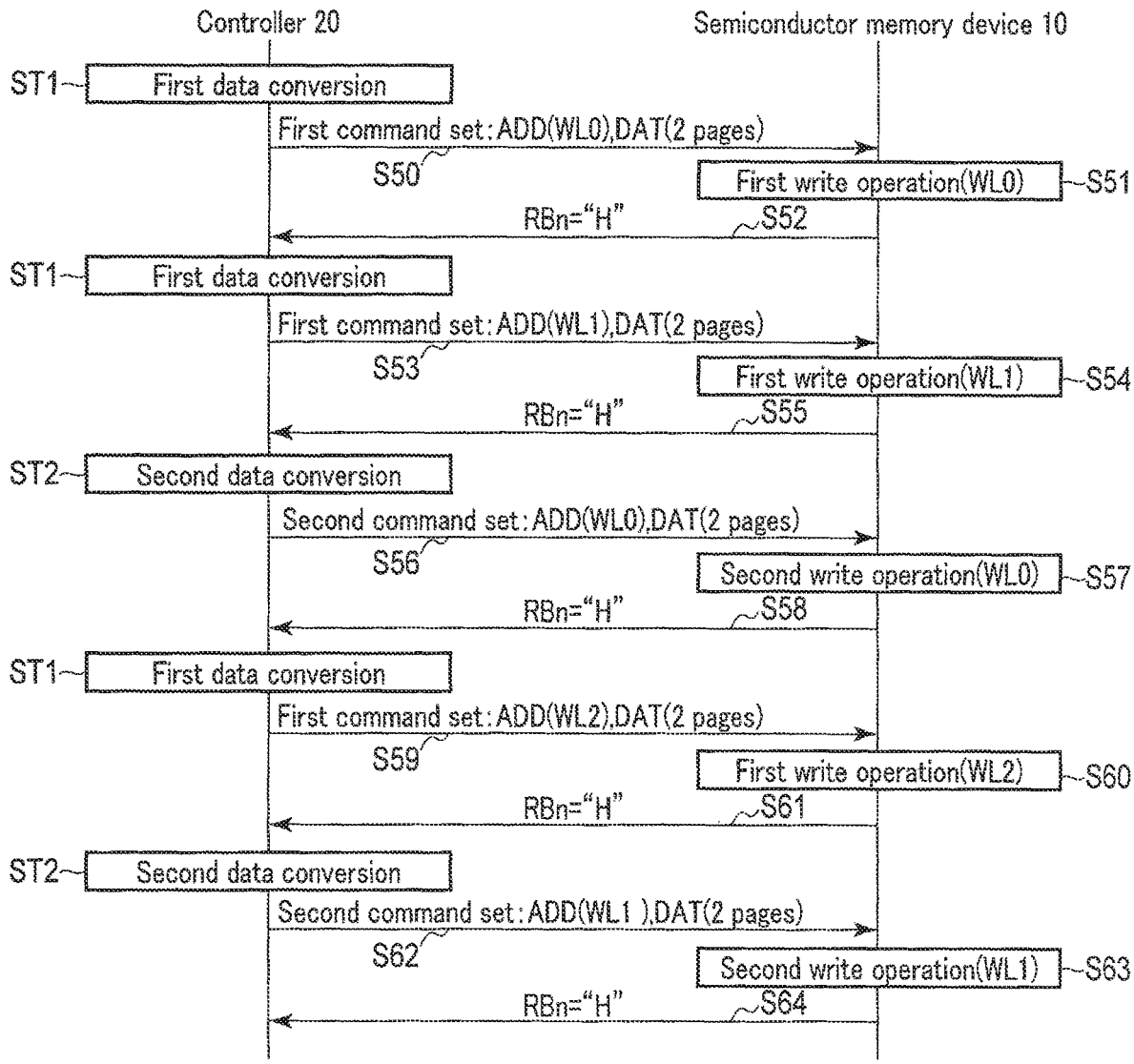
F I G. 19

2-3-2 code(TLC)

| Page | Data | | | | | | | |
|---|---|---|---|---|---|---|---|---|
| Upper | 1 | 1 | 0 | 0 | 0 | 0 | 1 | 1 |
| Middle | 1 | 1 | 0 | 1 | 1 | 0 | 0 | 0 |
| Lower | 1 | 0 | 0 | 0 | 1 | 1 | 1 | 1 |
| Distribution | ER | A | B | C | D | E | F | G |

Data conversion

First write data

| Page | Data | | | | | | | |
|---|---|---|---|---|---|---|---|---|
| MU1 | 1 | 0 | 0 | 0 | 0 | 1 | 1 | 1 |
| ML1 | 1 | 1 | 1 | 0 | 1 | 0 | 0 | 0 |

Second write data

| Page | Data | | | | | | | |
|---|---|---|---|---|---|---|---|---|
| MU2 | 1 | 0 | 1 | 1 | 0 | 1 | 0 | 0 |
| ML2 | 1 | 1 | 0 | 1 | 1 | 0 | 0 | 0 |

F I G. 24

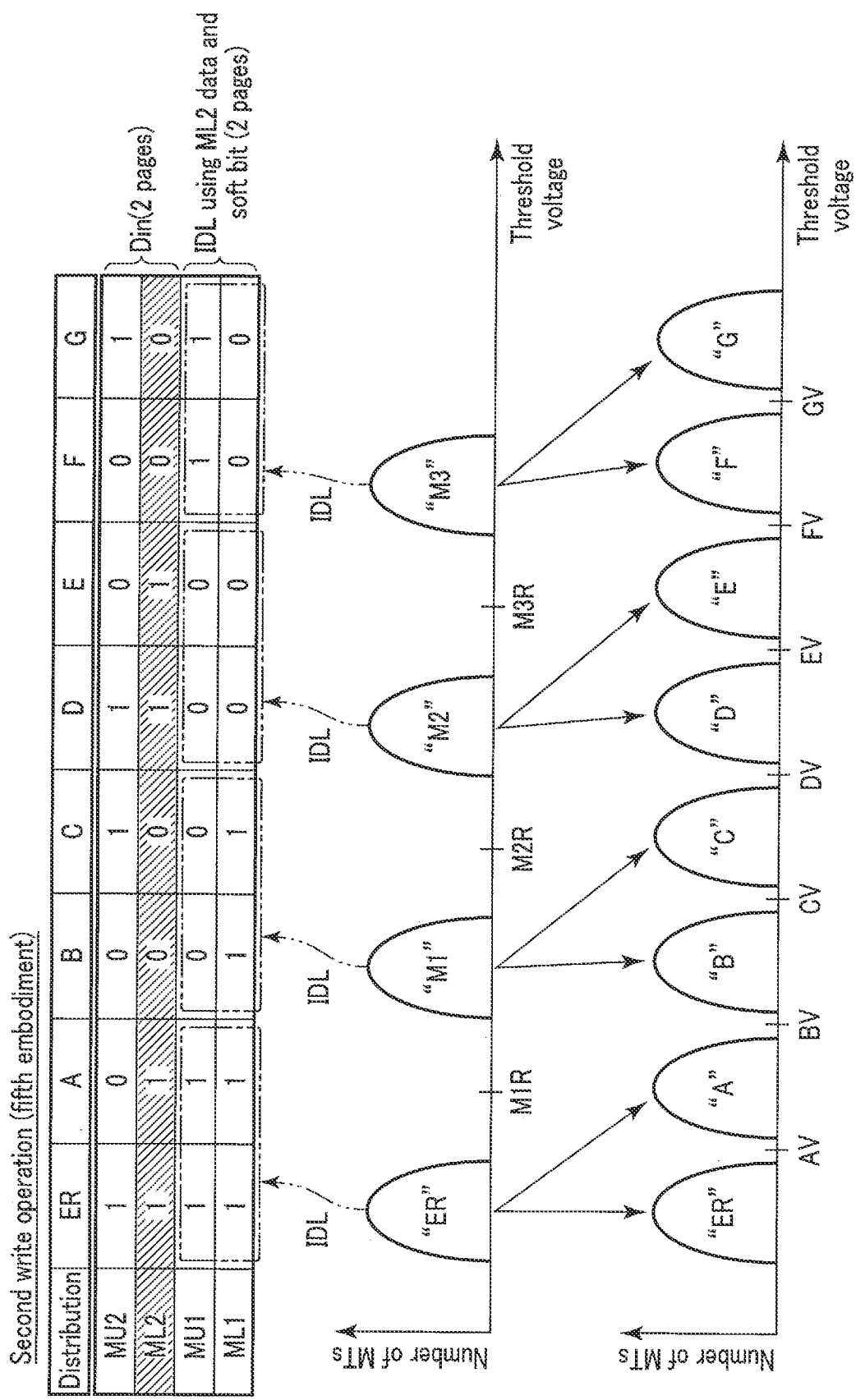
F I G. 26

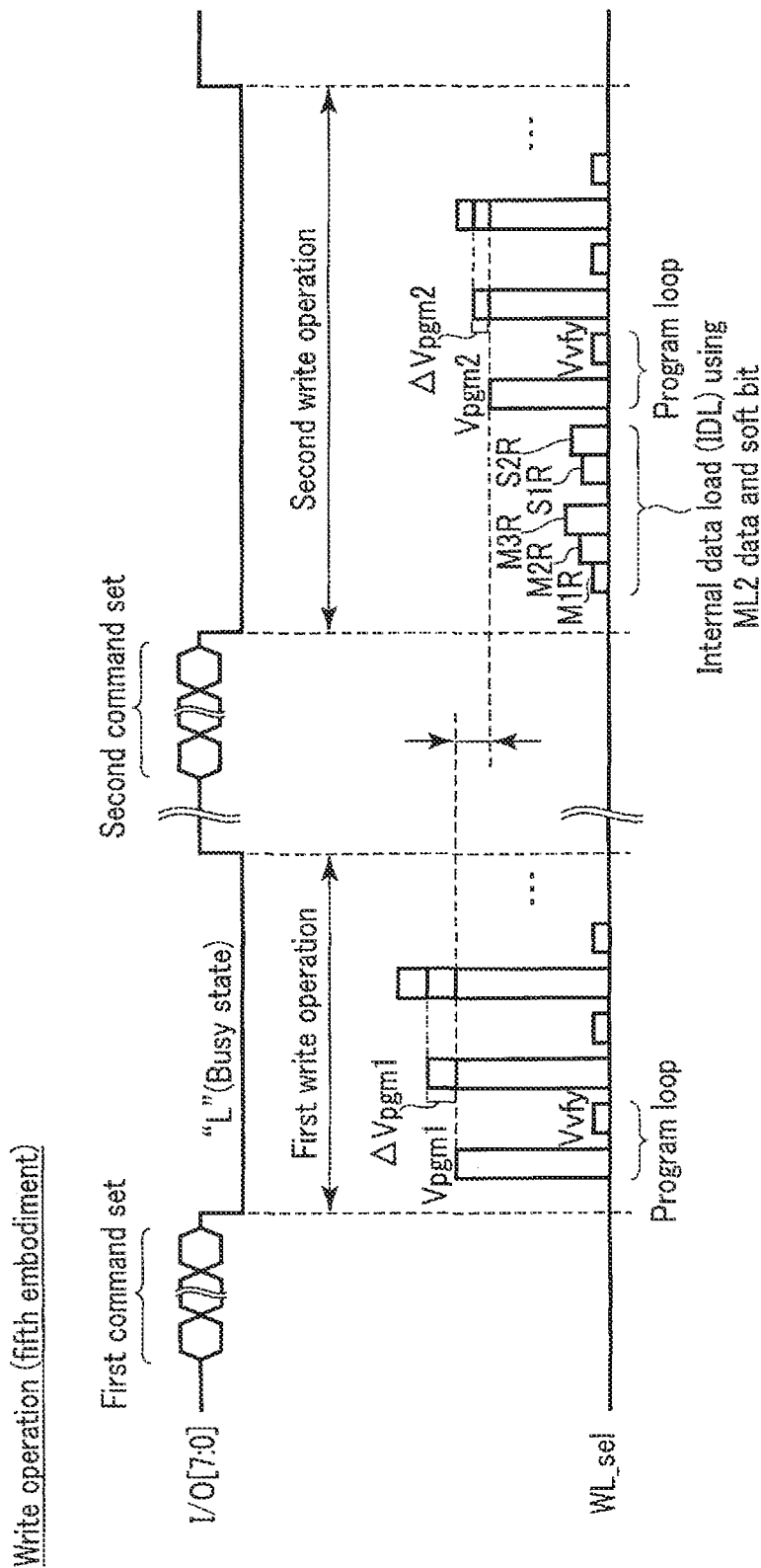
F I G. 28

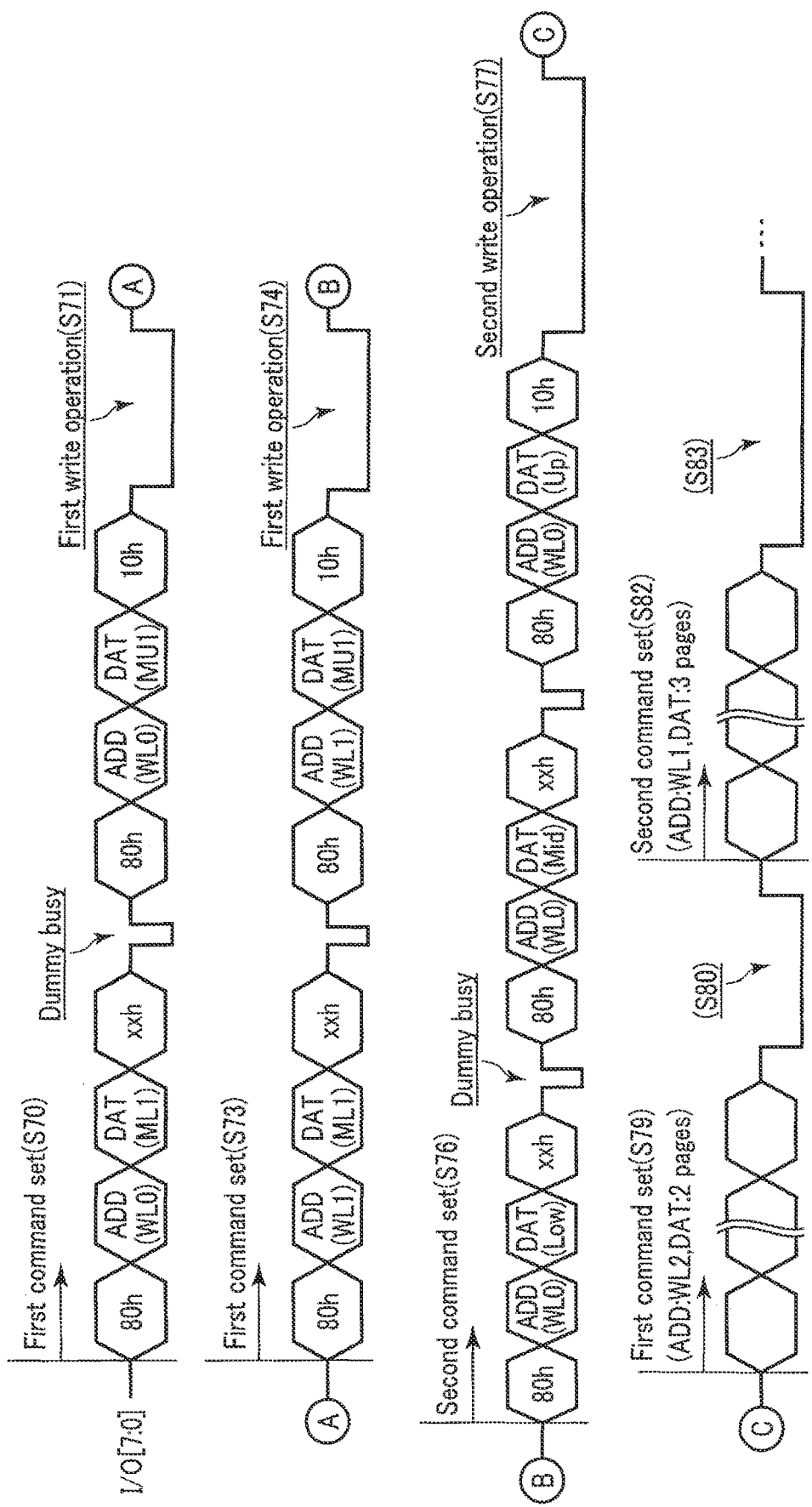
F I G. 32

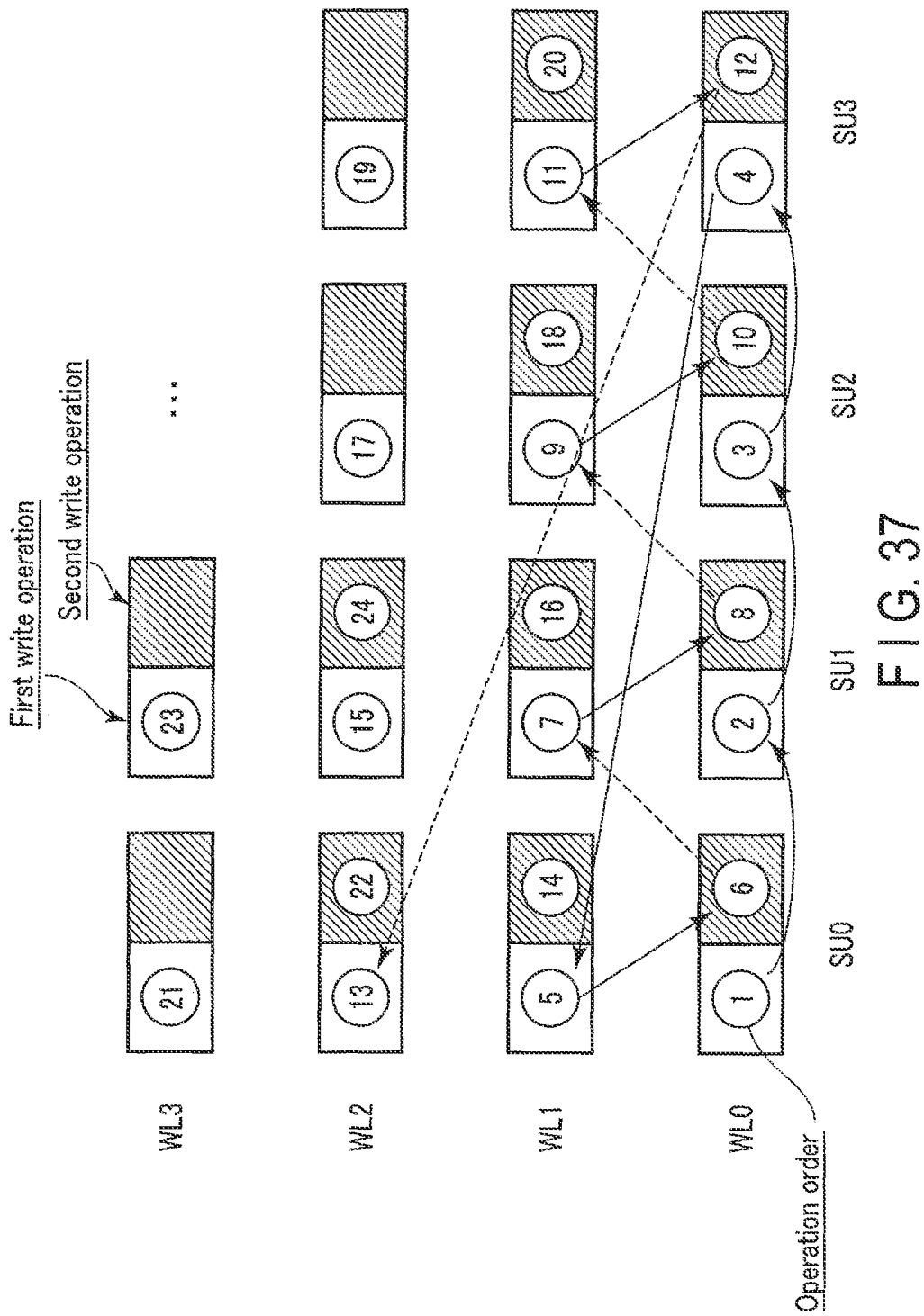
F I G. 37

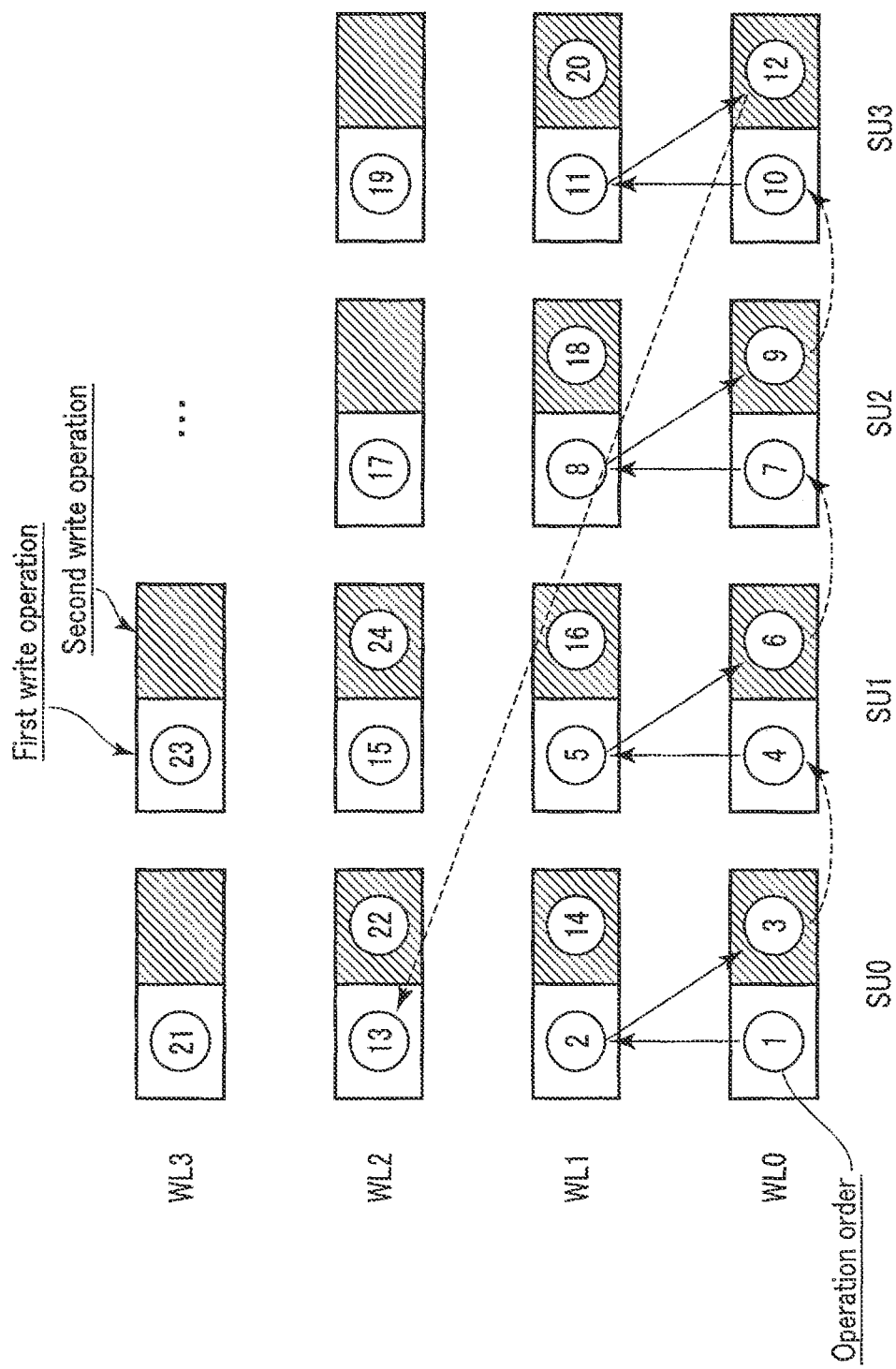
F I G. 39

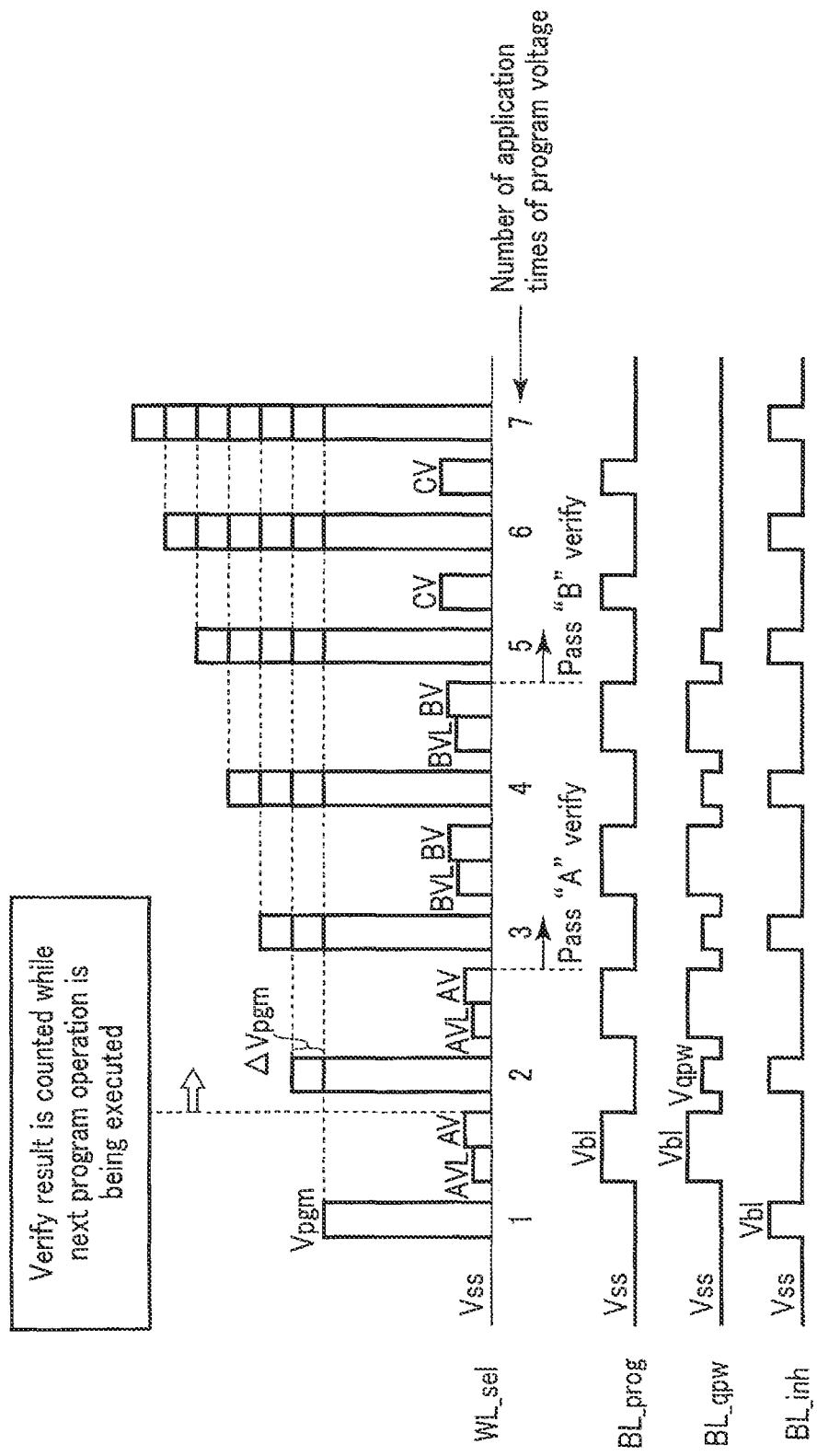
F I G. 42

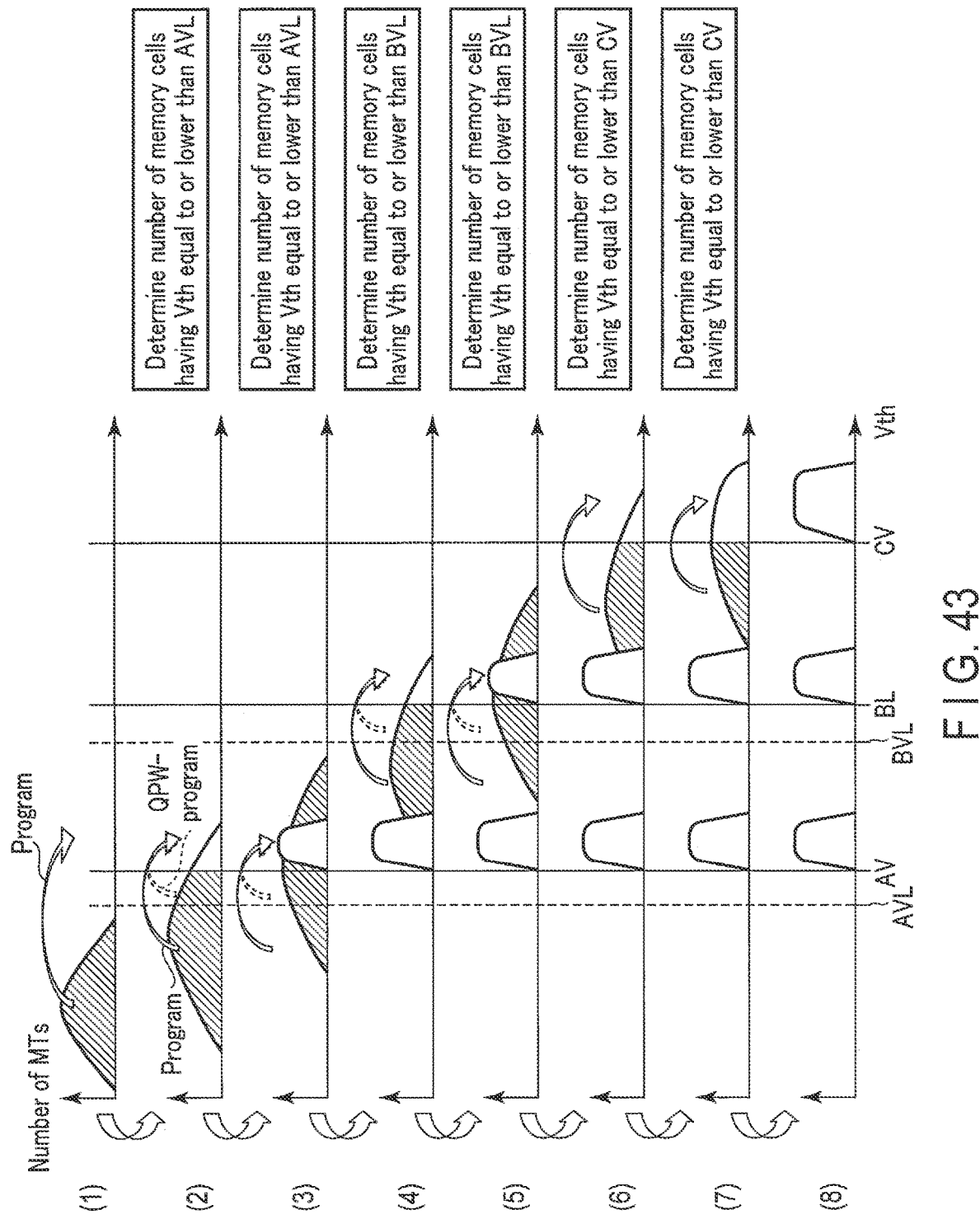
F I G. 43

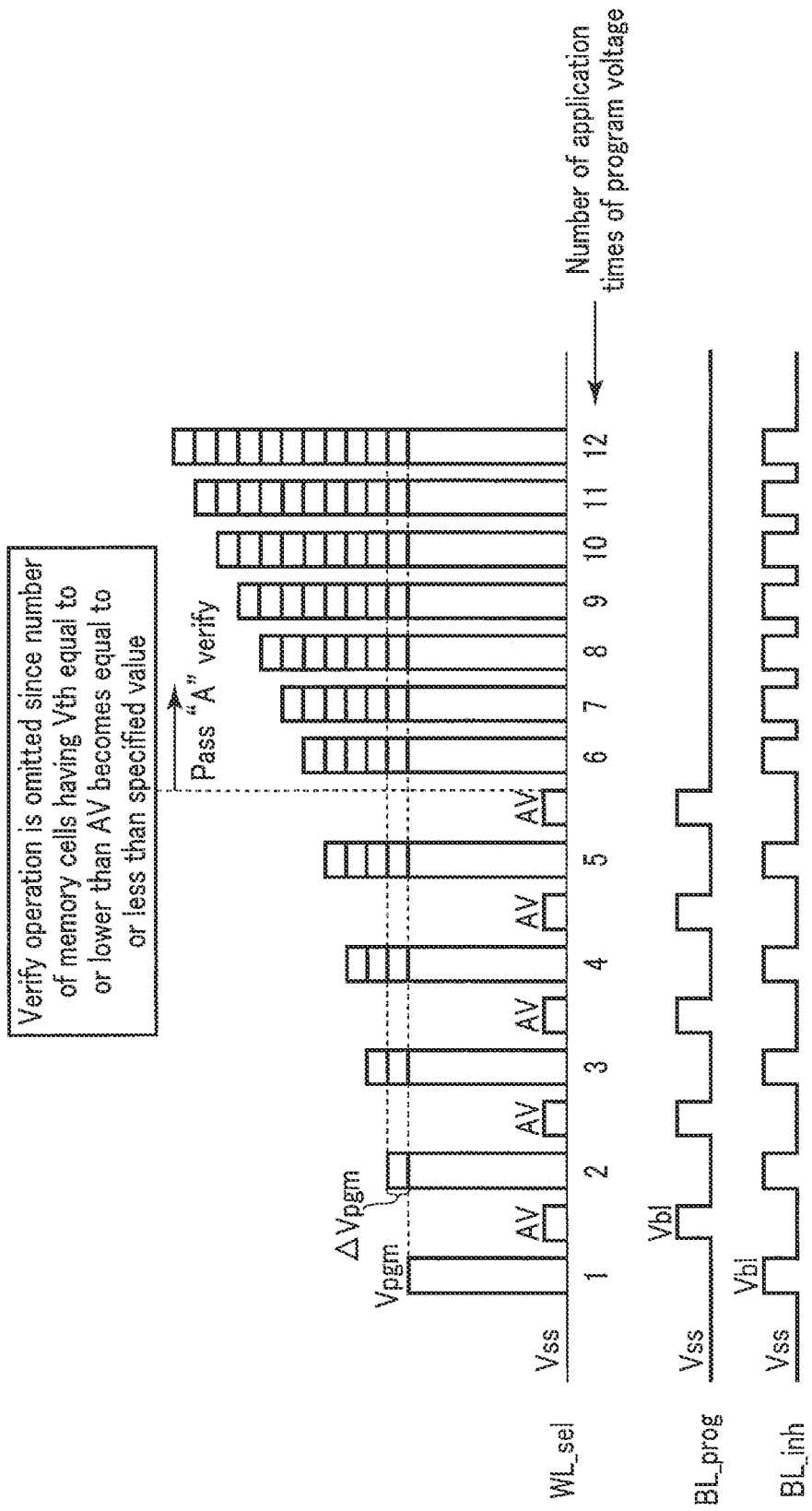
F I G. 46

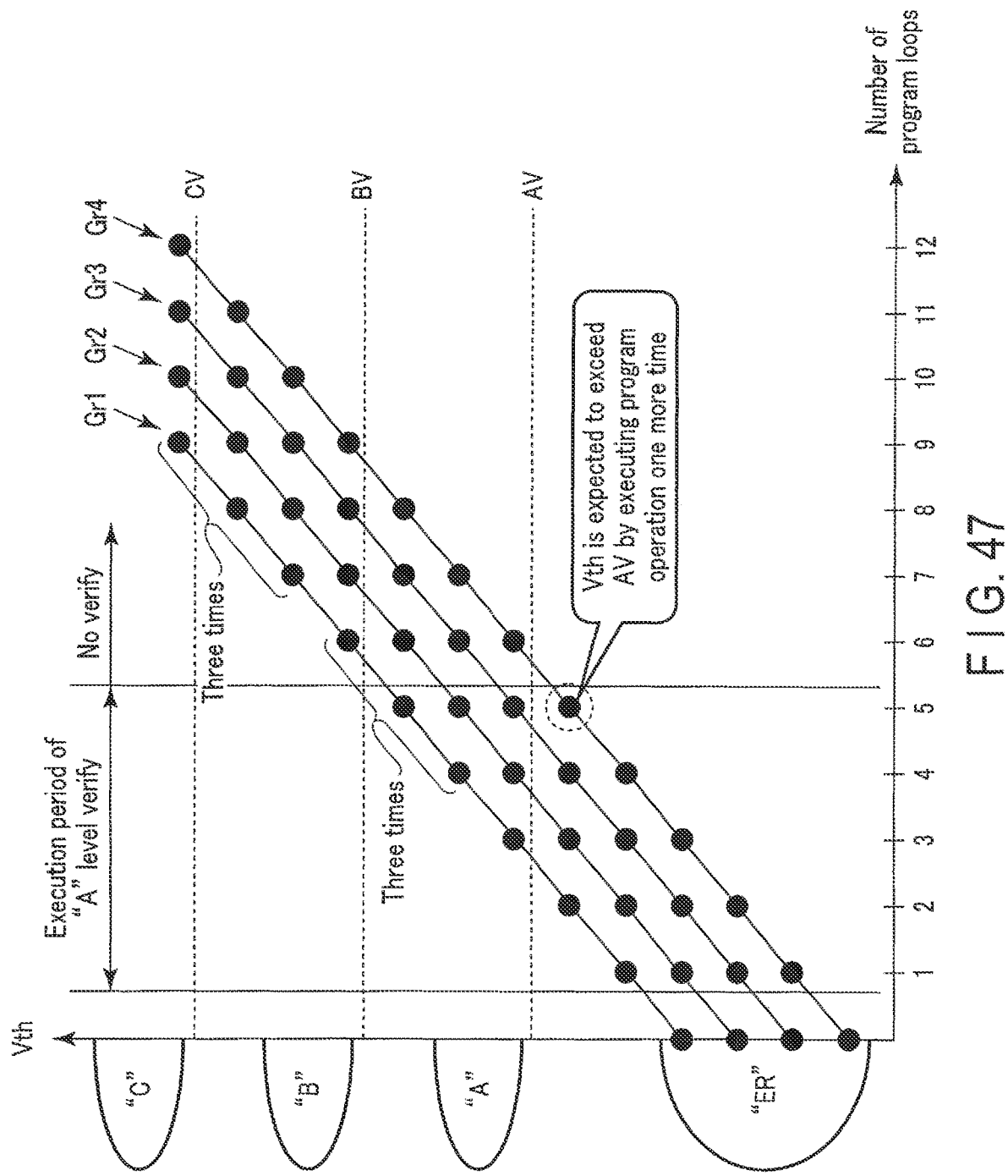
F I G. 47

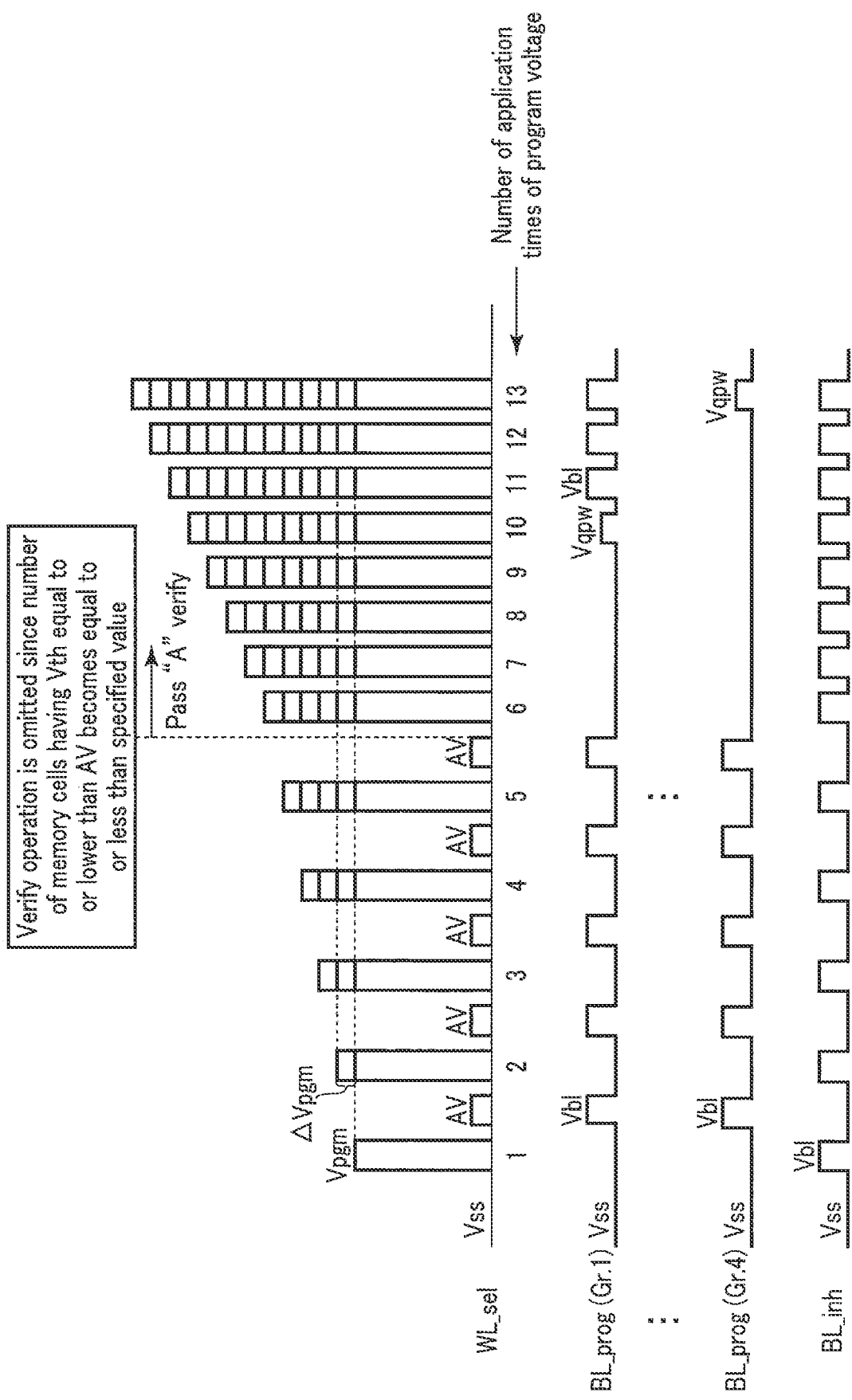
F I G. 48

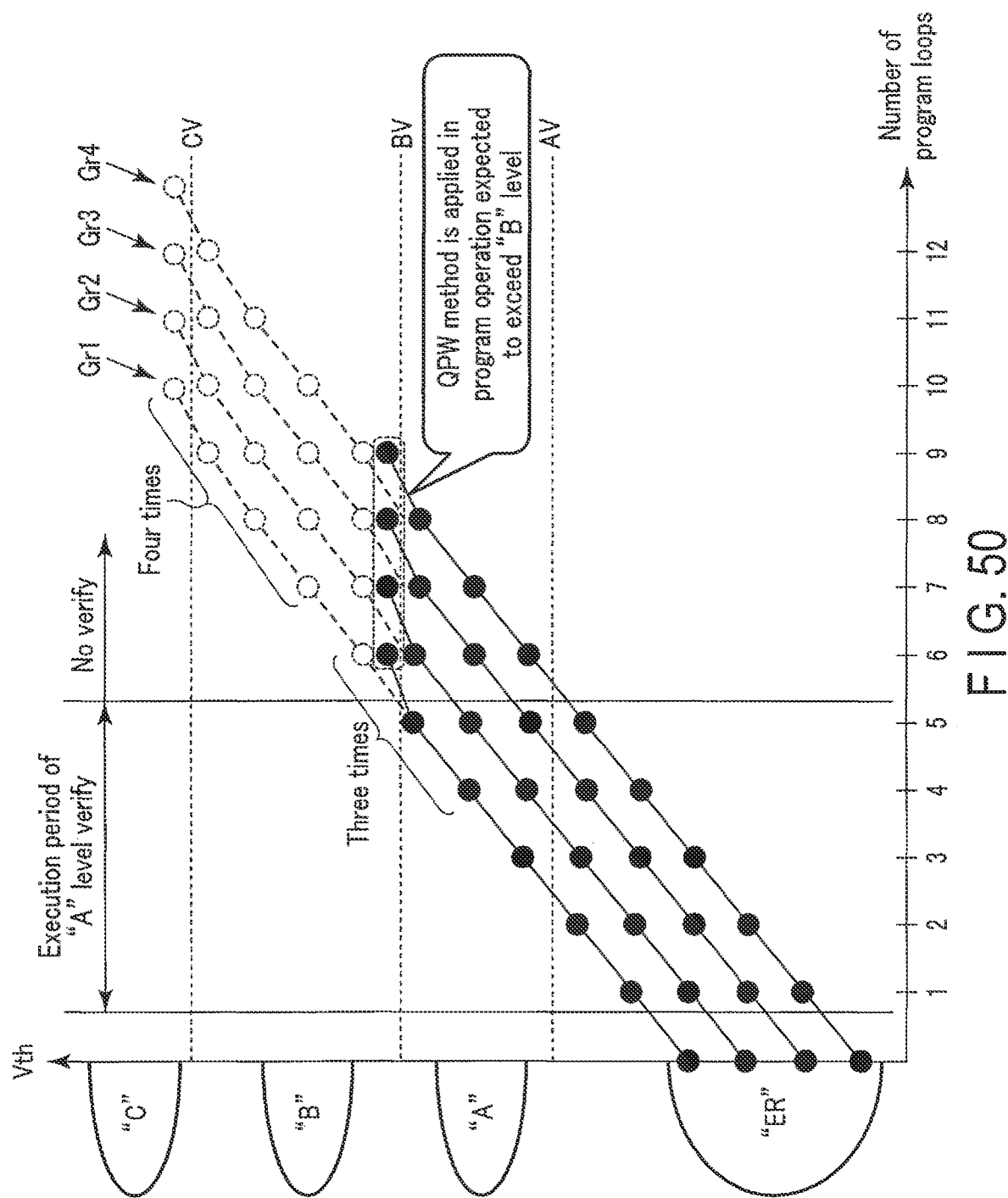
F I G. 50

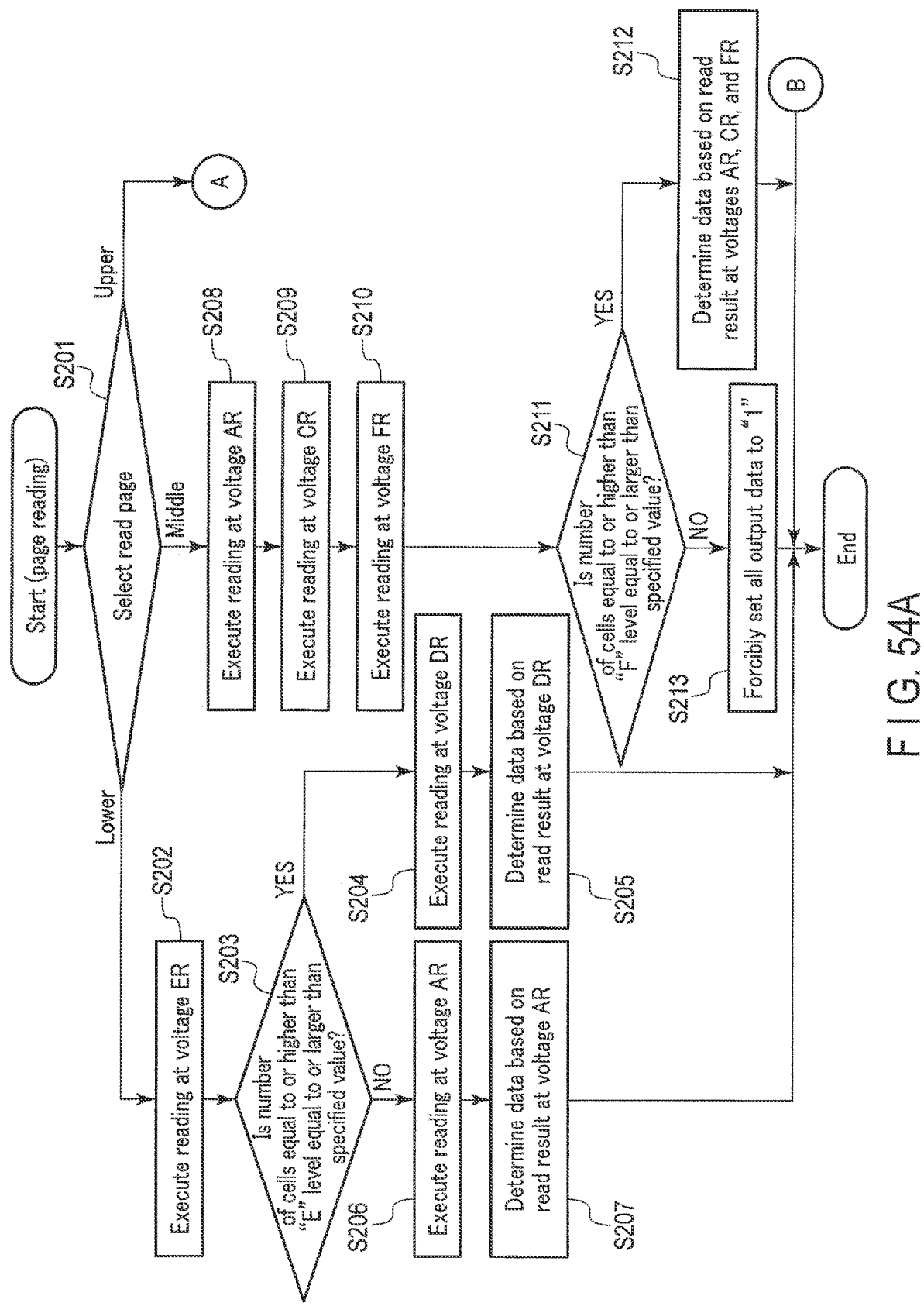
F I G. 54A

| | $x^4$ | $x^3$ | $x^2$ | $x^1$ |
|---|---|---|---|---|
| 1 | 0 | 0 | 0 | 1 |
| 2 | 0 | 0 | 1 | 1 |
| 3 | 0 | 1 | 1 | 1 |
| 4 | 1 | 1 | 1 | 1 |
| 5 | 1 | 1 | 1 | 0 |
| 6 | 1 | 1 | 0 | 1 |
| 7 | 1 | 0 | 1 | 0 |
| 8 | 0 | 1 | 0 | 1 |
| 9 | 1 | 0 | 1 | 1 |
| 10 | 0 | 1 | 1 | 0 |
| 11 | 1 | 1 | 0 | 0 |
| 12 | 1 | 0 | 0 | 1 |
| 13 | 0 | 0 | 1 | 0 |
| 14 | 0 | 1 | 0 | 0 |
| 15 | 1 | 0 | 0 | 0 |

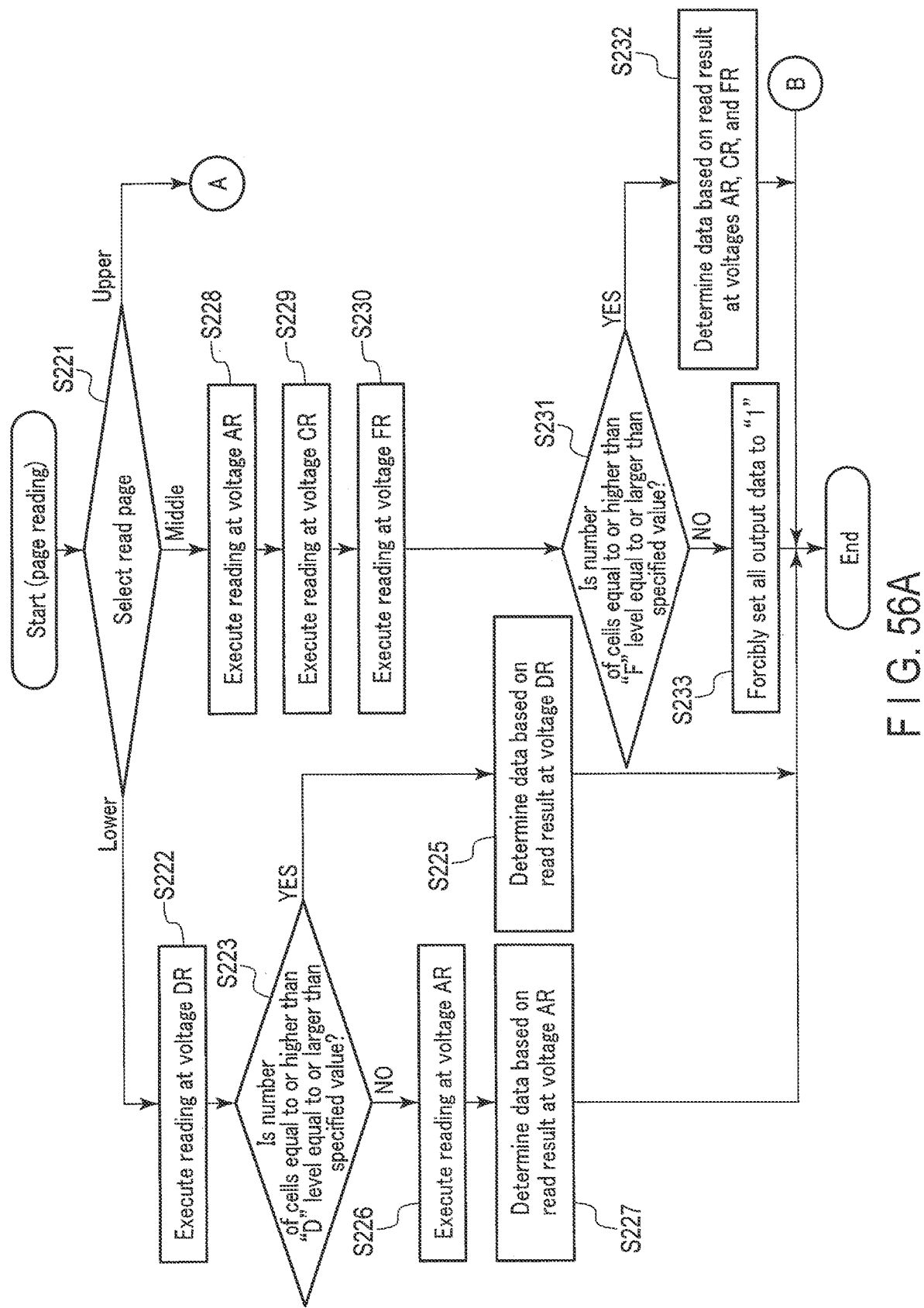
F I G. 56A

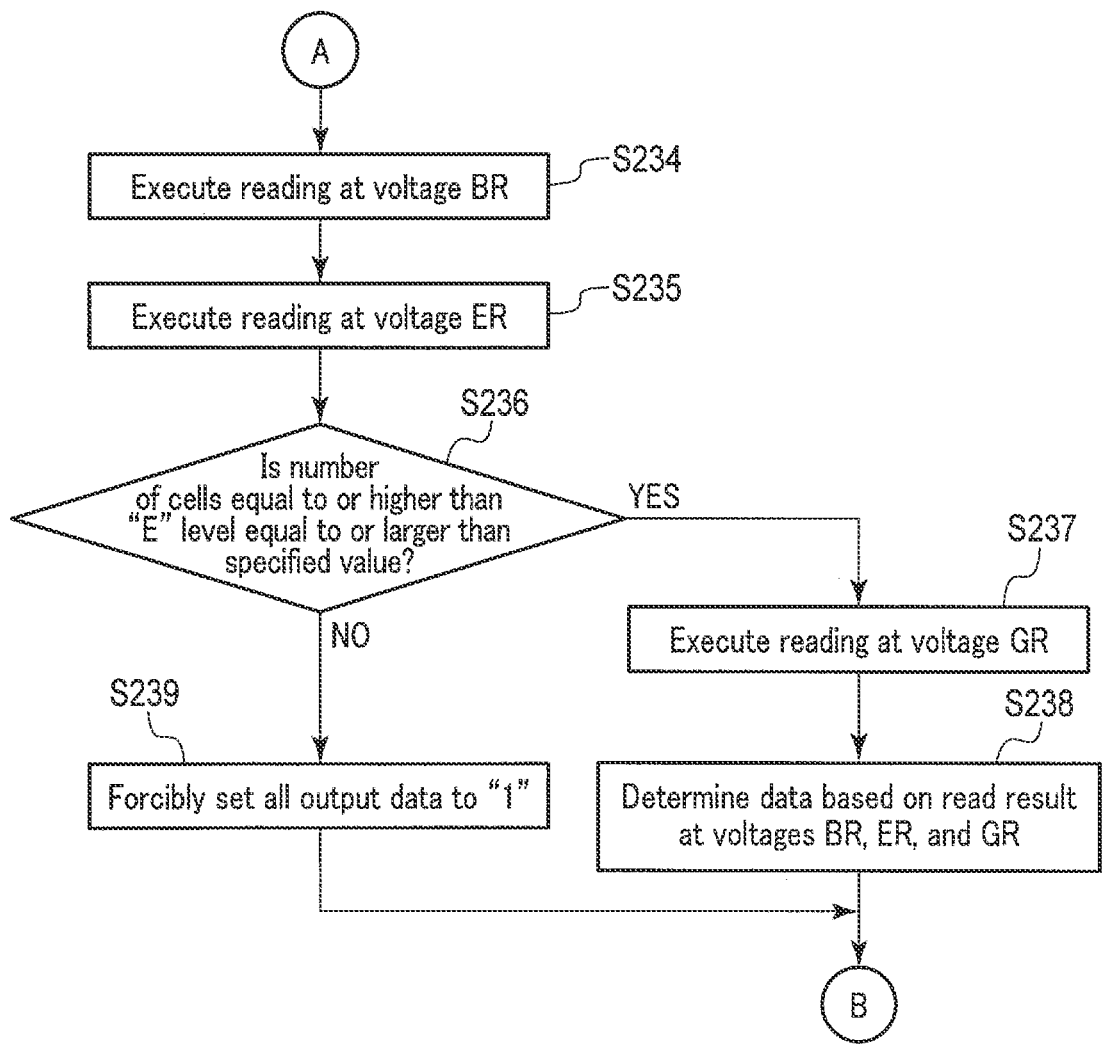
F I G. 56B

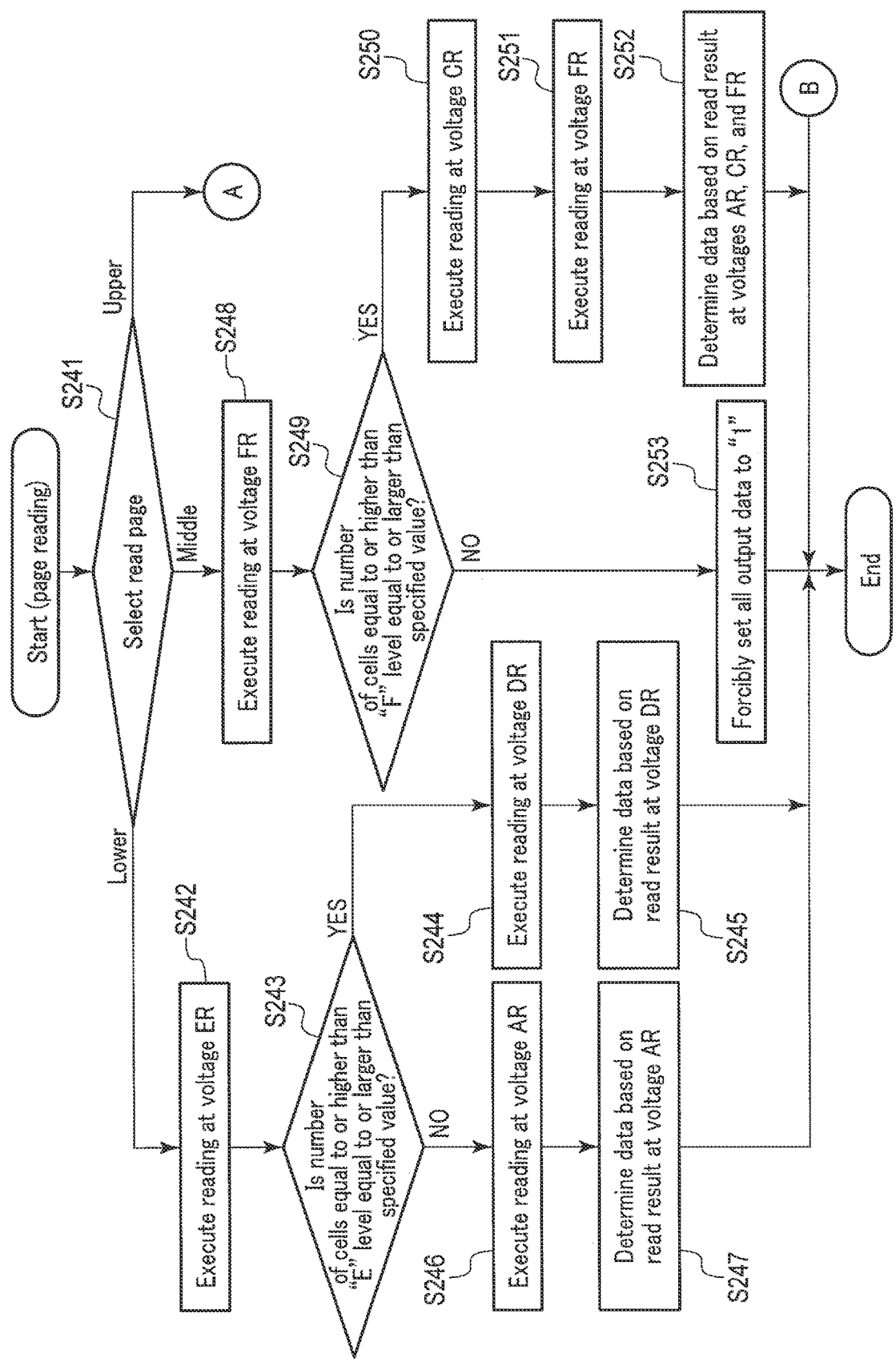
F I G. 57A

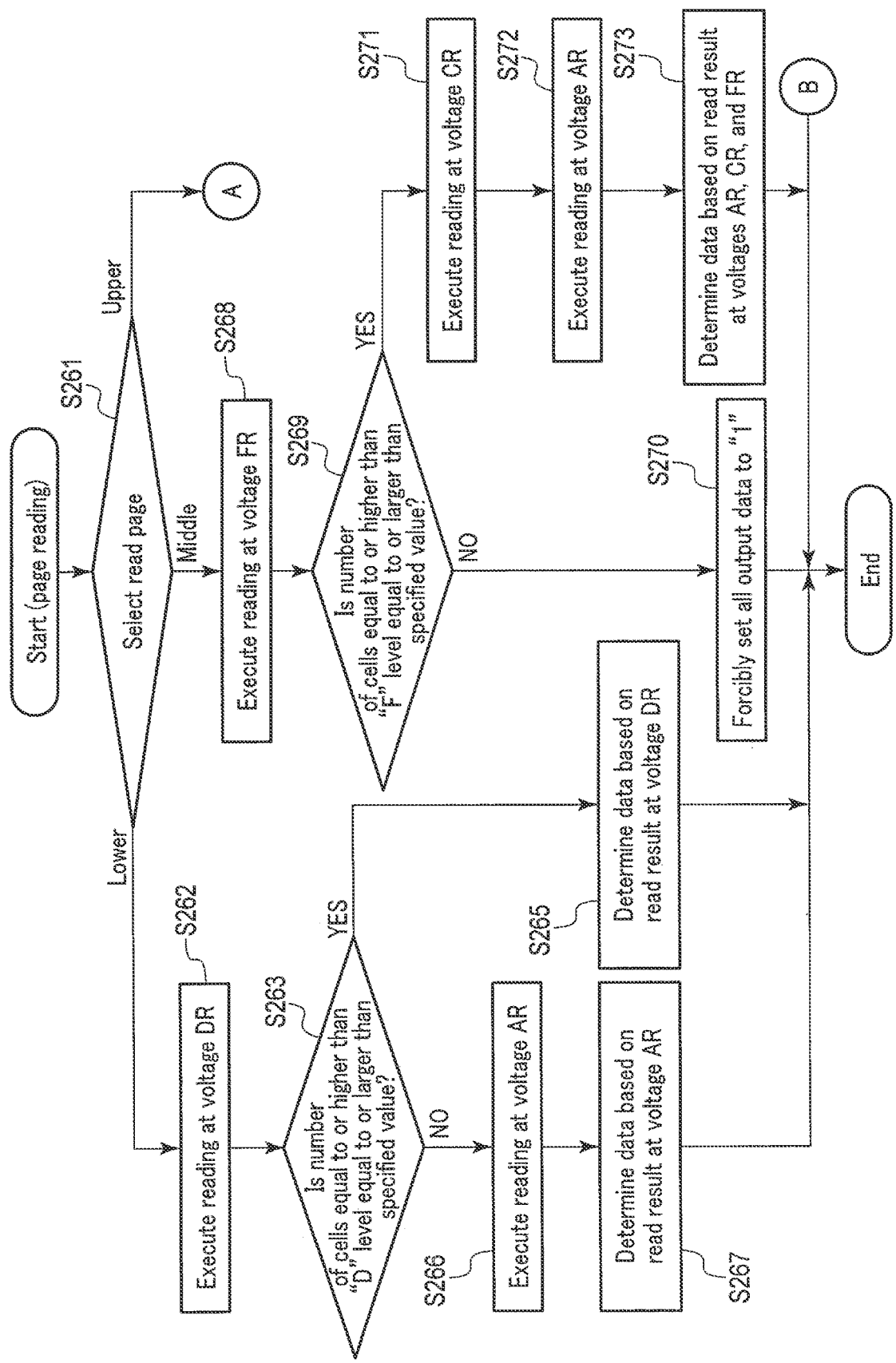
F I G. 58A

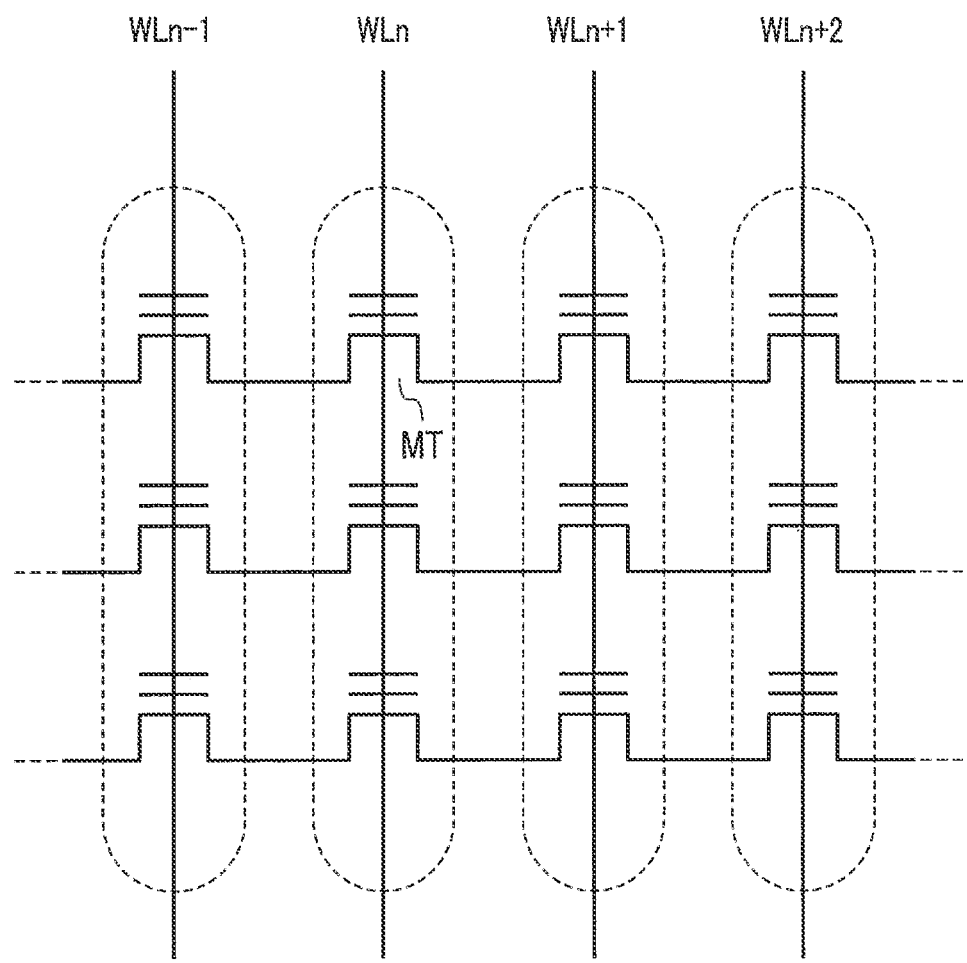
F I G. 66

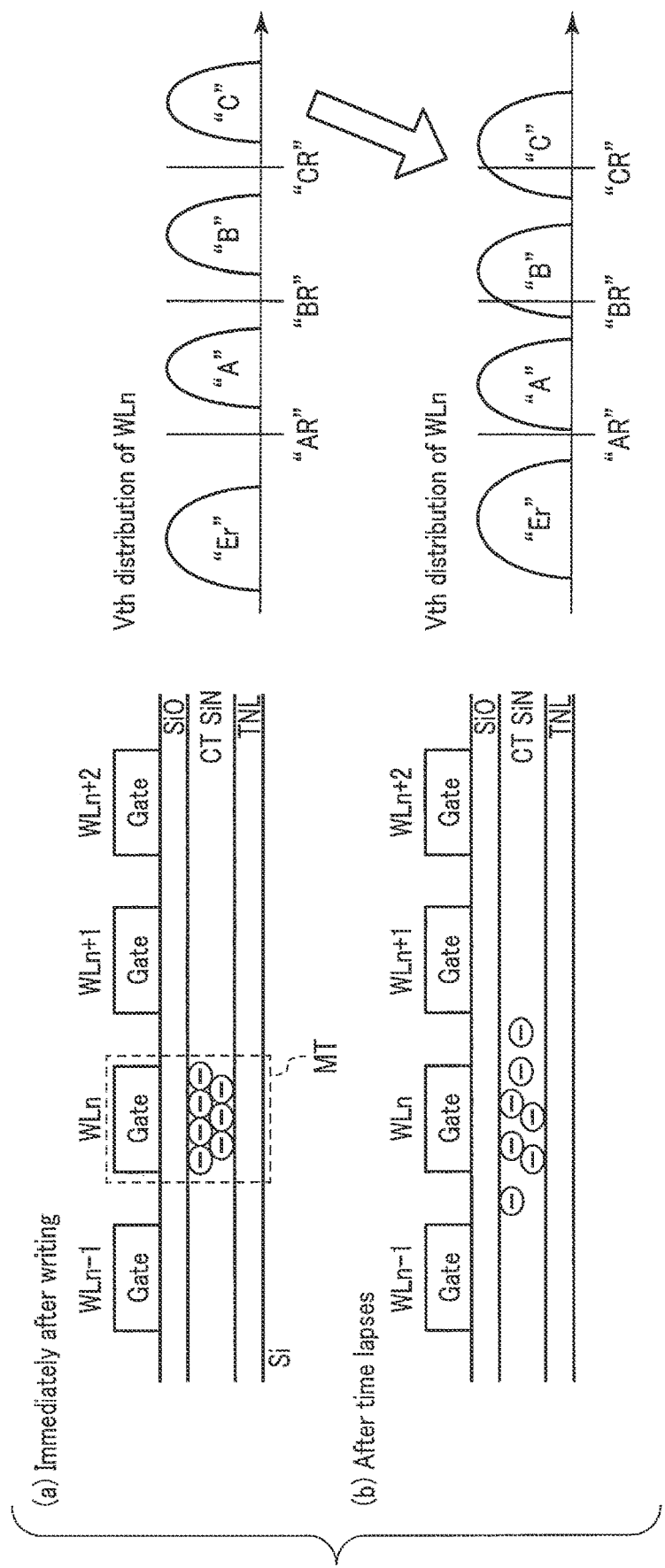
F I G. 67

F.I.G. 68

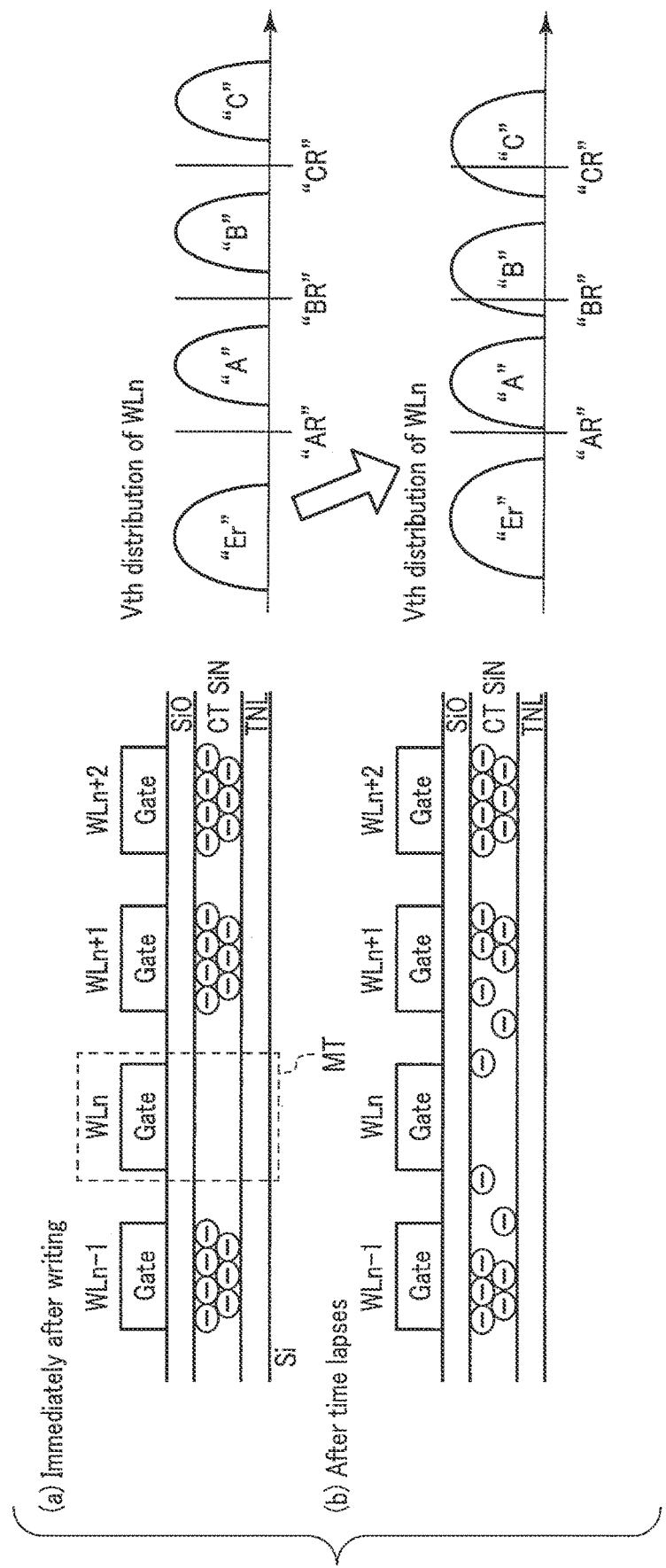
F I G. 69

|  |  | WLn+1 | |
|---|---|---|---|
|  |  | H(C,B) | L(A,Er) |
| WLn−1 | H(C,B) | R | R−d1 |
|  | L(A,Er) | R−d1 | R−d2 |

F I G. 70

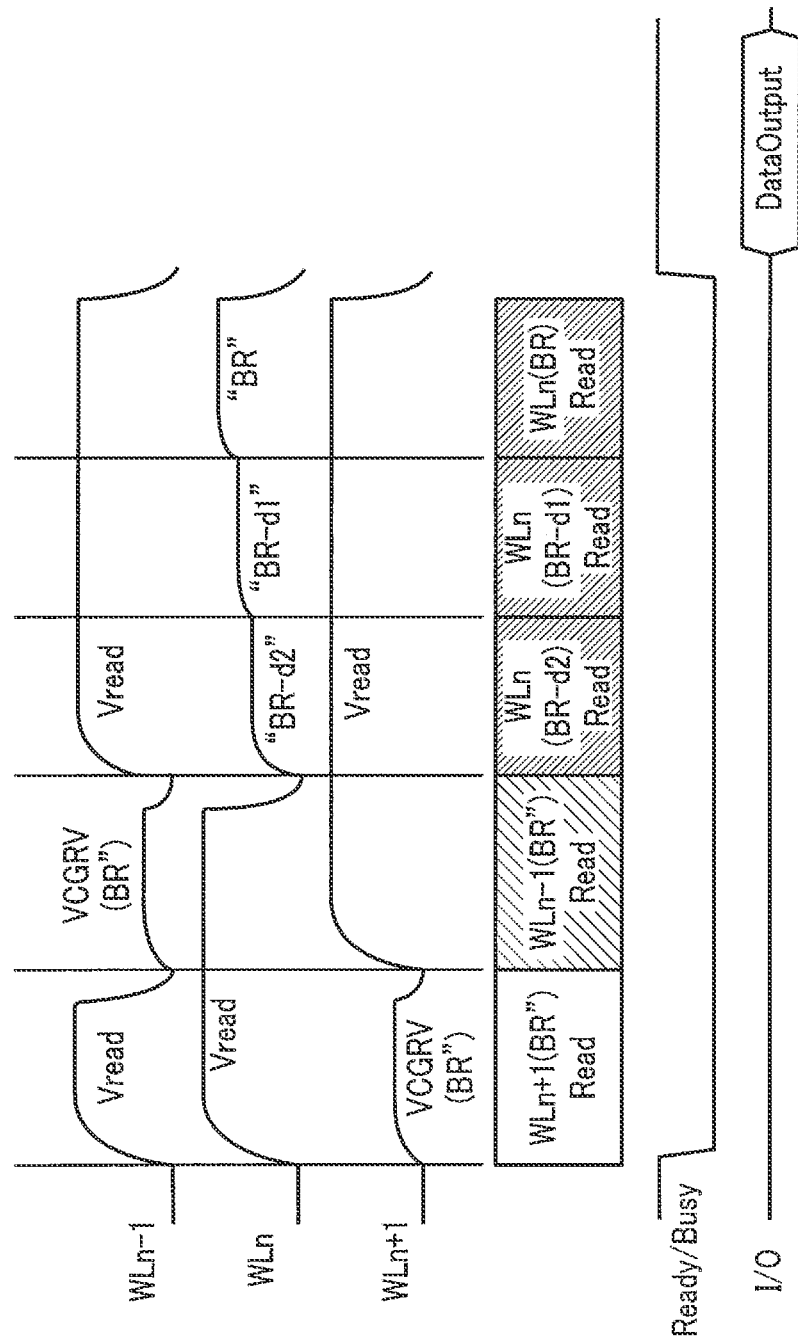
F I G. 72

|  |  | WLn+1 | | | |
|---|---|---|---|---|---|
|  |  | HH(C) | H(B) | L(A) | LL(Er) |
| WLn−1 | HH(C) | R | R−d1 | R−d2 | R−d3 |
|  | H(B) | R−d1 | R−d2 | R−d3 | R−d4 |
|  | L(A) | R−d2 | R−d3 | R−d4 | R−d5 |
|  | LL(Er) | R−d3 | R−d4 | R−d5 | R−d6 |

F I G. 73

|  |  | WLn+1 | |
|---|---|---|---|
|  |  | H(C,B) | L(A,Er) |
| WLn−1 | H(C,B) | AR+da | AR |
|  | L(A,Er) | AR | AR−d2 |

F I G. 74

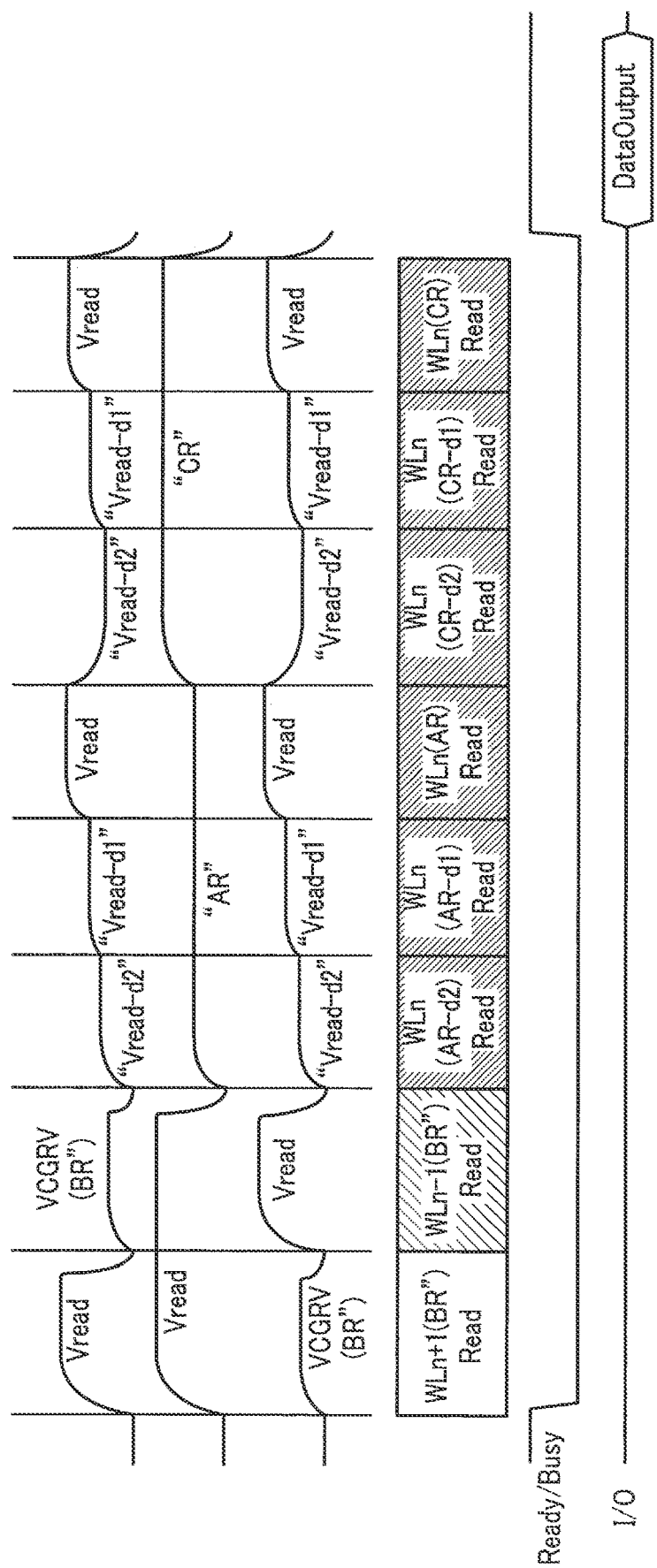
F I G. 76

|        | Selected SU |     |     |     |
|--------|------|------|------|------|
|        | SU0  | SU1  | SU2  | SU3  |
| SGD0A  | ON   | OFF  | OFF  | OFF  |
| SGD0B  | OFF  | ON   | ON   | ON   |
| SGD1A  | ON   | ON   | OFF  | OFF  |
| SGD1B  | OFF  | OFF  | ON   | ON   |
| SGD2A  | ON   | ON   | ON   | OFF  |
| SGD2B  | OFF  | OFF  | OFF  | ON   |

F I G. 79

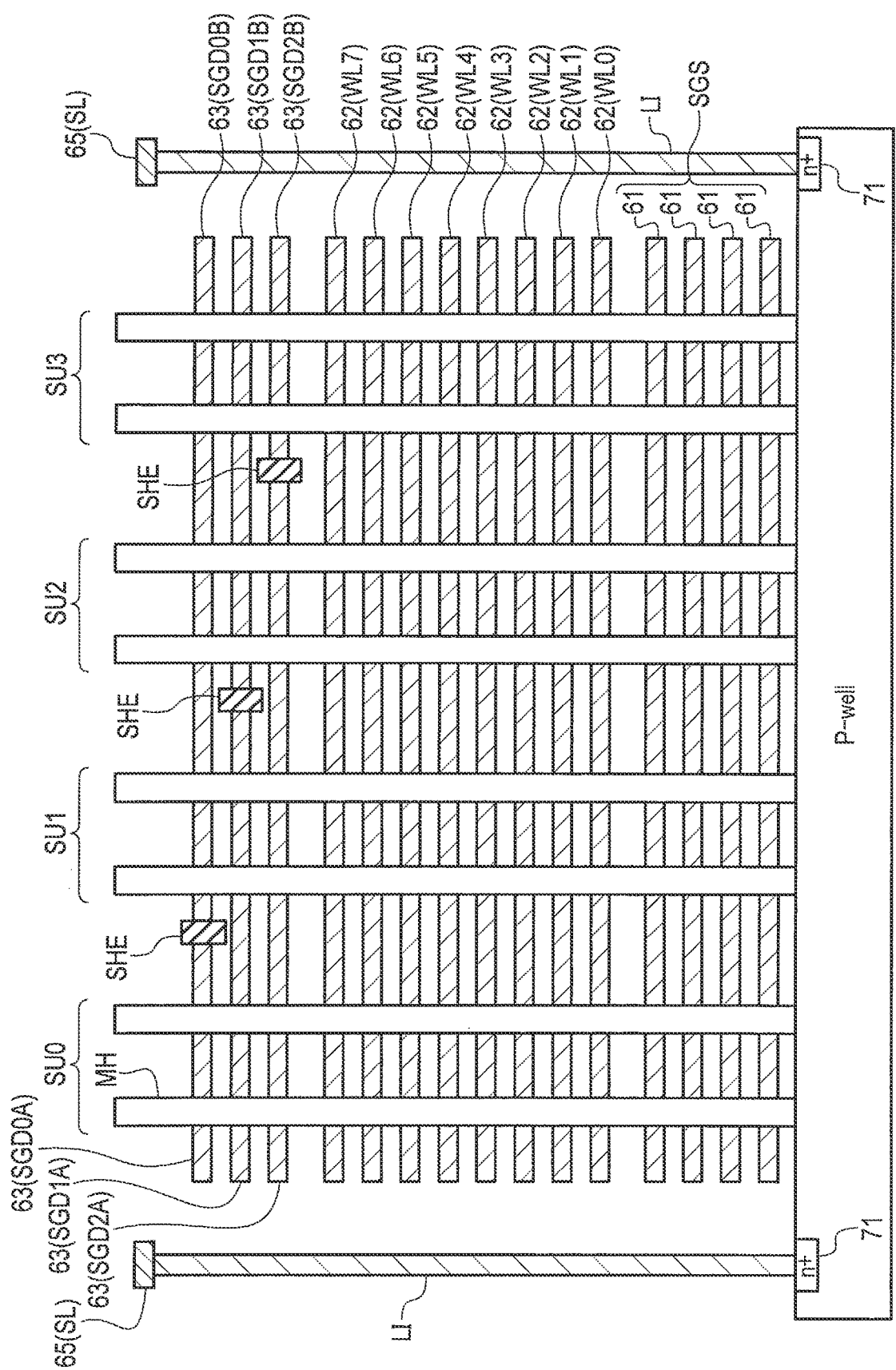
F I G. 82

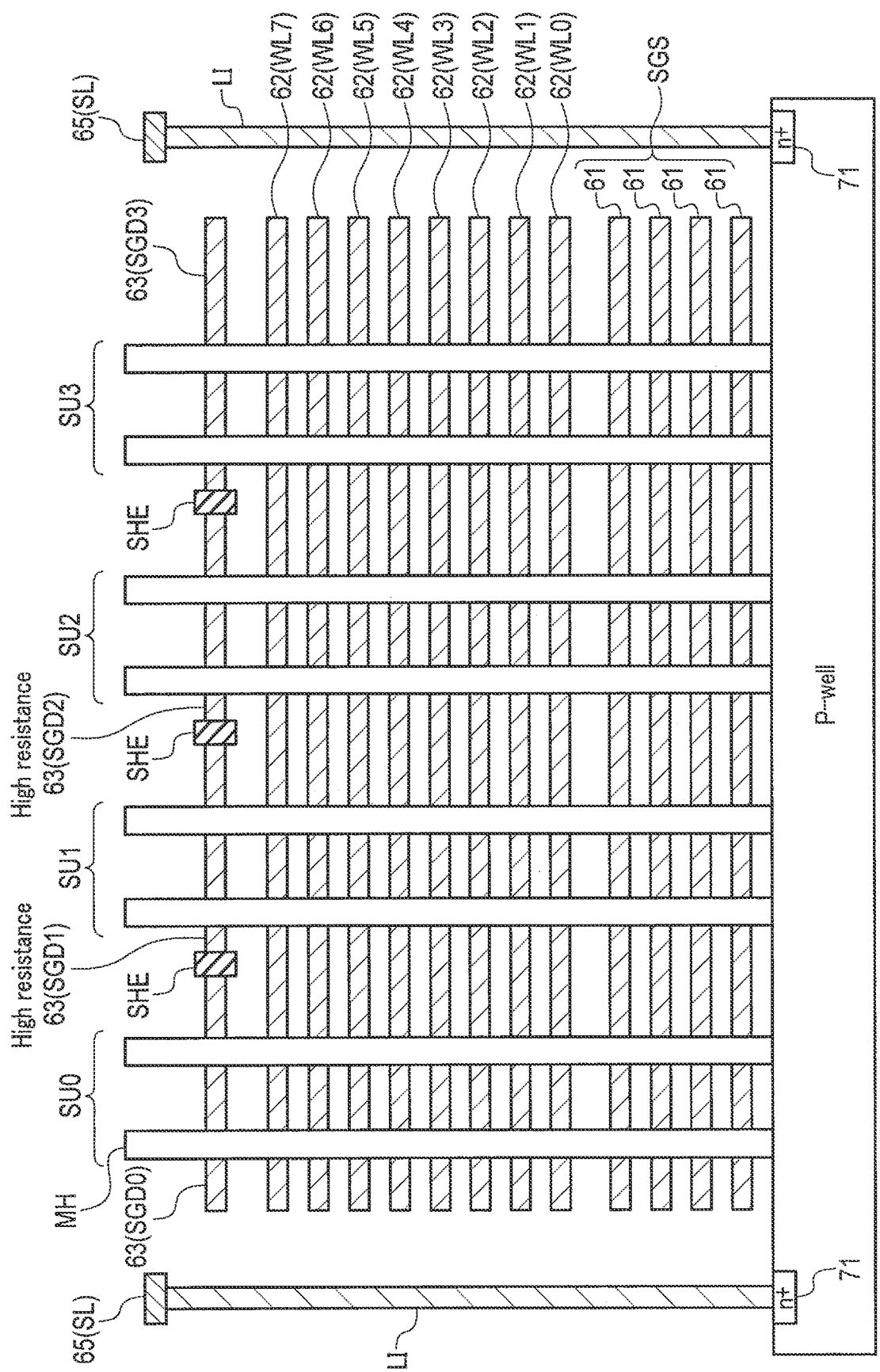
F I G. 84

US 11,238,925 B2

SEMICONDUCTOR MEMORY DEVICE AND MEMORY SYSTEM

CROSS-REFERENCE TO RELATED APPLICATION

This application is a Continuation Application of U.S. application Ser. No. 16/896,601, filed on Jun. 9, 2020, issued as U.S. Pat. No. 10,916,300 on Feb. 9, 2021, which is a Continuation Application of U.S. application Ser. No. 16/733,491, filed on Jan. 3, 2020, issued as U.S. Pat. No. 10,714,170 on Jul. 14, 2020, which is a Divisional Application of U.S. application Ser. No. 15/702,476, filed Sep. 12, 2017, issued as U.S. Pat. No. 10,566,051 on Sep. 12, 2017, which is based upon and claims the benefit of priority from Japanese Patent Application No. 2017-029095, filed Feb. 20, 2017, the entire contents of all of which are incorporated herein by reference.

FIELD

Embodiments described herein relate generally to a semiconductor memory device.

BACKGROUND

A NAND type flash memory as a semiconductor memory device is known.

BRIEF DESCRIPTION OF THE DRAWINGS

FIG. 1 is a block diagram showing an example of a memory system according to a first embodiment;

FIG. 3 is a diagram showing threshold distribution and data assignment of memory cells included in the semiconductor memory device according to the first embodiment;

FIG. 4 is a diagram showing an example of a circuit configuration of the sense amplifier module included in the semiconductor memory device according to the first embodiment;

FIG. 12 is a diagram showing an example of a command sequence of the write operation of the memory system according to the second embodiment;

FIG. 18 is a diagram showing threshold distribution and data assignment of memory cells included in a semiconductor memory device according to a fourth embodiment;

FIG. 19 is a flowchart showing an example of a write operation of a memory system according to the fourth embodiment;

FIG. 24 is a diagram showing an example of a data conversion process in a write operation of a memory system according to a fifth embodiment;

FIG. 26 is a diagram showing an example of a change in threshold distribution in a second write operation of the memory system according to the fifth embodiment;

FIG. 28 is a diagram showing an example of a command sequence and a waveform of the write operation of the memory system according to the fifth embodiment;

FIG. 32 is a diagram showing an example of a command sequence of the write operation of the memory system according to the sixth embodiment;

FIG. 37 is a diagram showing an example of a writing order in the write operation of the memory system according to the seventh embodiment;

FIG. 39 is a diagram showing an example of a writing order in a write operation of a memory system according to a variation of the seventh embodiment;

FIG. 42 is a waveform diagram showing an example of the write operation of the memory system according to the eighth embodiment;

FIG. 43 is a diagram showing an example of a change in threshold distribution in the write operation of the memory system according to the eighth embodiment;

FIG. 46 is a waveform diagram showing an example of the write operation of the memory system according to the ninth embodiment;

FIG. 47 is a diagram showing an example of a change in a threshold voltage in the write operation of the memory system according to the ninth embodiment;

FIG. 48 is a waveform diagram showing an example of a write operation of a memory system according to a tenth embodiment;

FIG. 50 is a diagram showing an example of a change in a threshold voltage in the write operation of the memory system according to the tenth embodiment;

FIGS. 54A and 54B are flowcharts showing an example of a write operation of the memory system according to the eleventh embodiment;

FIGS. 56A, 56B, 57A, 57B, 58A, and 58B are flowcharts showing an example of the write operation of the memory system according to the eleventh embodiment;

FIG. 66 is a diagram showing an example of a circuit configuration of a memory cell array included in a semiconductor memory device according to a twelfth embodiment;

FIG. 67 is a diagram showing an example of a state and threshold distribution of memory cells in the semiconductor memory device according to the twelfth embodiment;

FIGS. 68 and 69 are diagrams showing an example of a state and threshold distribution of memory cells in the semiconductor memory device according to the twelfth embodiment;

FIG. 70 is an example of a table showing a reading method of a memory system according to the twelfth embodiment;

FIGS. 71 and 72 are waveform diagrams showing an example of a read operation of the memory system according to the twelfth embodiment;

FIGS. 73 and 74 are examples of tables showing a reading method of the memory system according to the twelfth embodiment;

FIGS. 76 and 77 are waveform diagrams showing an example of a read operation of the memory system according to the twelfth embodiment;

FIG. 79 is an example of a table showing a reading method of a memory system according to the thirteenth embodiment;

FIG. 82 is a diagram showing an example of a cross-sectional configuration of the memory cell array included in the semiconductor memory device according to the thirteenth embodiment;

FIG. 84 is a diagram showing an example of a cross-sectional configuration of the memory cell array included in the semiconductor memory device according to the thirteenth embodiment.

DETAILED DESCRIPTION

Figure 2:
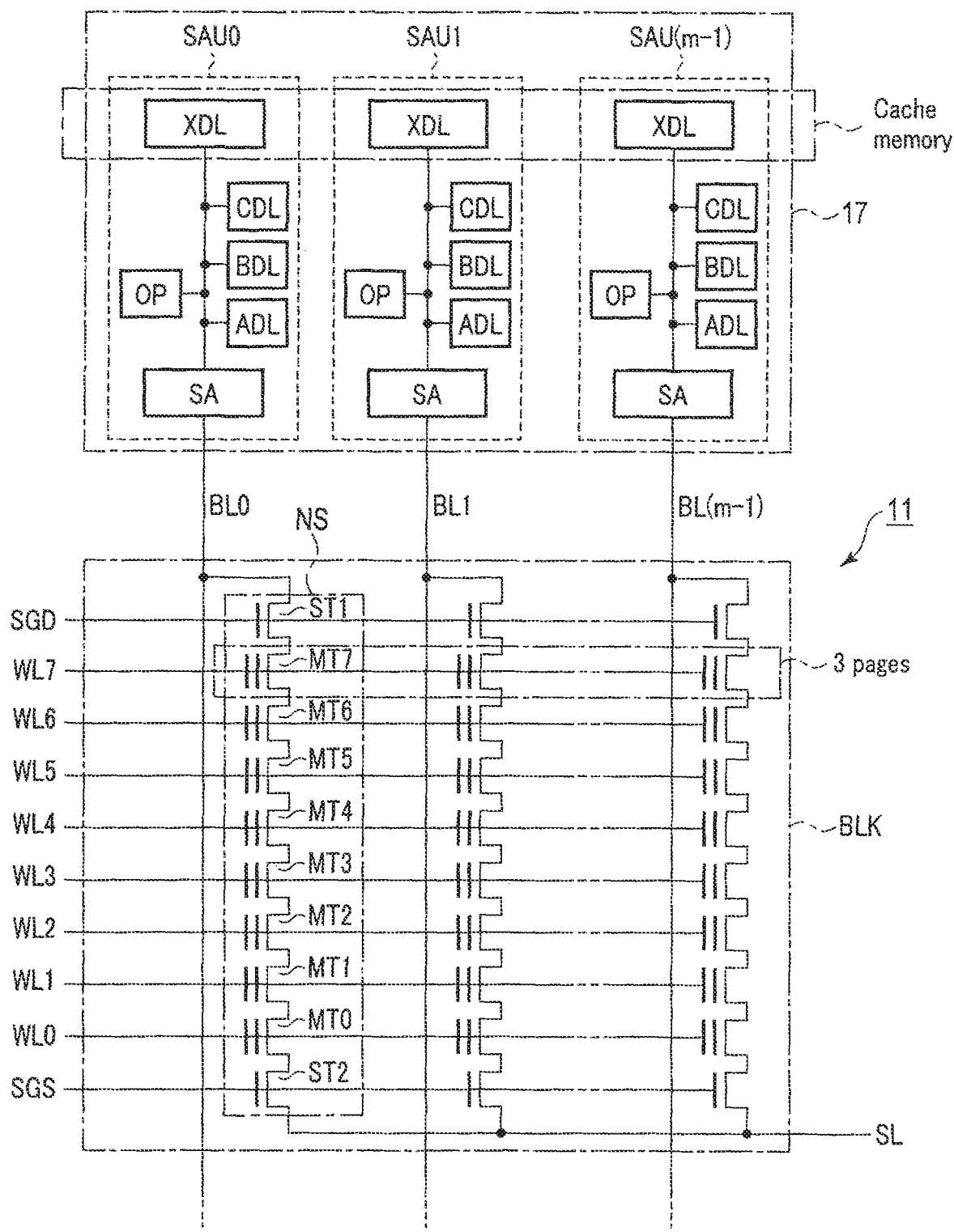
FIG. 2 is a diagram showing an example of a circuit configuration of a memory cell array and a sense amplifier module included in a semiconductor memory device according to the first embodiment.

In general, according to one embodiment, a semiconductor memory device includes a first memory cell capable of storing 3-bit data. When receiving first data including a first bit and a second bit from an external controller, the semiconductor memory device writes the received first data to the first memory cell. After receiving the first data, when the semiconductor memory device receives second data including a third bit and a fourth bit, the semiconductor memory device reads the first data from the first memory cell and writes the 3-bit data to the first memory cell based on 1-bit of the read first data and the received third bit and fourth bit.

Hereinafter, embodiments will be described with reference to the drawings. The drawings are schematic. In the following description, the same reference signs denote constituent elements having substantially the same functions and configurations. Numeric characters after the letters constituting a reference sign, letters after the numeric characters constituting a reference sign, and "under bar+letters" attached to the letters constituting a reference sign are referenced by reference signs containing the same letters, and are used to distinguish components having a similar configuration. When the components denoted by the reference signs containing the same letters do not need to be distinguished from each other, the components are referred to by the reference signs containing only the same letters or numeric characters.

[1] First Embodiment

A memory system according to a first embodiment will be described below.

[1-1] Configuration

[1-1-1] Configuration of Memory System 1

First, with reference to FIG. 1, a configuration example of a memory system 1 will be described. FIG. 1 is a block diagram showing an example of the memory system according to the first embodiment. As shown in FIG. 1, the memory system 1 includes a semiconductor memory device 10 and a controller 20, and is connected to an external host apparatus 30.

The semiconductor memory device 10 is a NAND-type flash memory capable of nonvolatilely storing data. As shown in FIG. 1, the semiconductor memory device 10 includes a memory cell array 11, a command register 12, an address register 13, a sequencer 14, a driver circuit 15, a row decoder 16, and a sense amplifier module 17.

The memory cell array 11 includes blocks BLK0 to BLKn (n is an integer of 1 or more). The block BLK is a collection of a plurality of nonvolatile memory cells associated with a bit line and a word line, and is, for example, a data erase unit. The semiconductor memory device 10 can retain data by the Multi-level cell (MLC) method for storing data of two bits or more in each memory cell. In the present embodiment, it will be described that the 3-level cell (TLC) method for storing 3-bit data in each memory cell is used.

The command register 12 retains a command CMD received from the controller 20. The address register 13 retains address information ADD received from the controller 20. The address information ADD includes a page address PA and a block address BA.

The sequencer 14 controls the overall operation of the semiconductor memory device 10 based on the command CMD retained in the command register 12. Specifically, the sequencer 14 controls the driver circuit 15, the row decoder 16, the sense amplifier module 17, and the like based on the command CMD, and executes a write operation, a read operation, and the like.

The driver circuit 15 generates a desired voltage based on an instruction from the sequencer 14. The driver circuit 15 further supplies the generated voltage to the row decoder 16 based on the page address PA retained in the address register 13.

The row decoder 16 selects any one of the blocks BLK0 to BLKn based on the block address BA retained in the address register 13. The row decoder 16 further selects a row direction in the selected block BLK, and applies the voltage supplied from the driver circuit 15 to the selected and unselected word lines.

The sense amplifier module 17 outputs to the controller 20 data DAT read from the memory cell array 11. The sense amplifier module 17 further transfers the write data DAT received from the controller 20 to the memory cell array 11.

The controller 20 instructs the semiconductor memory device 10 to execute reading, writing, erasing, or the like in response to an instruction from the host apparatus 30. As shown in FIG. 1, the controller 20 includes a host interface circuit 21, an internal memory (random access memory: RAM) 22, a processor (central processing unit: CPU) 23, a buffer memory 24, an ECC circuit 25, and a NAND interface circuit 26.

The host interface circuit 21 is connected with the host apparatus 30 through a host bus and communicates with the host apparatus 30. For example, the host interface circuit 21 transfers an instruction and data received from the host apparatus 30 to the CPU 23 and the buffer memory 24 respectively.

The host interface circuit 21 further transfers data in the buffer memory 24 to the host apparatus 30 in response to an instruction from the CPU 23.

The RAM 22 is a semiconductor memory such as a DRAM, and retains firmware for managing the semiconductor memory device 10, various management tables, and the like. The RAM 22 is used as a work area of the CPU 23.

The CPU 23 controls the overall operation of the controller 20. For example, the CPU 23 issues a write command to the NAND interface circuit 26 in response to a write instruction received from the host apparatus 30. This operation is similarly executed in reading and erasing. The CPU 23 further executes various processes for managing a memory space of the semiconductor memory device 10, such as wear leveling.

The buffer memory 24 temporarily retains read data received by the controller 20 from the semiconductor memory device 10, write data received from the host apparatus 30, and the like.

The ECC circuit 25 executes a data error checking and correcting (ECC) process. Specifically, the ECC circuit 25 generates parity bits based on write data during data writing.

Then, the ECC circuit 25 generates syndrome bits from the parity bits during data reading, detects an error, and corrects the detected error.

The NAND interface circuit 26 is connected with the semiconductor memory device 10 through a NAND bus and communicates with the semiconductor memory device 10. A signal is transmitted or received between the semiconductor memory device 10 and the controller 20 in accordance with the NAND interface. For example, based on the instruction received from the CPU 23, the NAND interface circuit 26 transmits a command latch enable signal CLE, an address latch enable signal ALE, a write enable signal WEn, and a read enable signal REn to the semiconductor memory device 10, receives a ready/busy signal RBn from the semiconductor memory device 10, and transmits or receives an input/output signal I/O to or from the semiconductor memory device 10.

The signals CLE and ALE notifies the semiconductor memory device 10 that the input signals I/O transmitted to the semiconductor memory device 10 are a command CMD and address information ADD. The signal WEn is asserted at an "L" level and is a signal for causing the semiconductor memory device 10 to take the input signal I/O. The signal REn is asserted at the "L" level and is a signal for reading the output signal I/O from the semiconductor memory device 10.

The ready/busy signal RBn indicates whether the semiconductor memory device 10 can receive an instruction from the controller 20. The ready/busy signal RBn is set to an "H" level, when, for example, the semiconductor memory device 10 is in a ready state in which the semiconductor memory device 10 can receive the instruction from the controller 20, and the ready/busy signal RBn is set to the "L" level when the semiconductor memory device 10 is in a busy state in which the semiconductor memory device 10 cannot receive the instruction.

The input/output signal I/O is a signal of 8 bits and corresponds to, for example, the command CMD, the address information ADD, data DAT, and the like. For example, during a write operation, the input/output signal I/O transferred to the semiconductor memory device 10 includes a write command CMD issued by the CPU 23 and write data DAT in the buffer memory 24. On the other hand, during a read operation, the input/output signal I/O transferred to the semiconductor memory device 10 includes a read command, and the input/output signal I/O transferred to the controller 20 includes read data DAT.

Examples of the host apparatus 30 using the memory system 1 described above include a digital camera and a personal computer.

A semiconductor device may be constituted by combining the semiconductor memory device 10 and the controller 20, for example. Examples of such a semiconductor device include a memory card, such as an SD™ card, and a solid state drive (SSD).

[1-1-2] Configuration of Memory Cell Array 11

Next, a configuration example of the memory cell array 11 will be described with reference to FIG. 2. FIG. 2 shows an example of a circuit configuration of the memory cell array 11 and the sense amplifier module 17, and shows a detailed circuit configuration of one block BLK in the memory cell array 11. As shown in FIG. 2, the block BLK includes a plurality of NAND strings NS.

The NAND strings NS are provided to respective bit lines BL0 to BL(m-1) ((m-1) is an integer of 1 or more), and each include, for example, eight memory cell transistors MT (MT0 to MT7) and select transistors ST1 and ST2. The number of the memory cell transistors MT included in one NAND string NS is not limited thereto, and may be a given number.

The memory cell transistor MT includes a control gate and a charge storage layer, and nonvolatilely retains data. The memory cell transistors MT0 to MT7 are connected in series between a source of the select transistor ST1 and a drain of the select transistor ST2. Control gates of the memory cell transistors MT0 to MT7 in the same block BLK are commonly connected to word lines WL0 to WL7 respectively.

Control gates of the select transistors ST1 and ST2 in the same block BLK are commonly connected to select gate lines SGD and SGS respectively. Drains of the select transistors ST1 on the same column in the blocks BLK are commonly connected to the corresponding bit line BL. That is, the bit line BL commonly connects the NAND strings NS on the same column in a plurality of blocks BLK. Sources of the select transistor ST2 in the blocks BLK are commonly connected to a source line SL.

In the above structure, a collection of 1-bit data retained in the memory cell transistors MT connected to the common word line WL is referred to as a "page". Accordingly, when the TLC method for storing 3-bit data in one memory cell transistor MT is used, data of three pages is stored in a collection of memory cell transistors MT connected to the word line WL. The semiconductor memory device 10 may execute writing and reading of data for each page, or for each word line WL.

The distribution of the threshold voltages of the memory cell transistors MT described above is as shown in, for example, FIG. 3. FIG. 3 shows an example of threshold distribution of memory cell transistors MT, assigned data, and voltages used in the write and read operations. The vertical axis and the horizontal axis in FIG. 3 correspond to the number of memory cell transistors MT and the threshold voltage Vth respectively. In the following description, 3-bit data retained in one memory cell transistor MT is referred to as a lower bit, a middle bit, and an upper bit in order from a lower bit. A collection of lower bits retained in the memory cell transistors MT connected to the same word line WL is referred to as a "lower page", and a collection of middle bits is referred to as a "middle page", and a collection of upper bits is referred to as an "upper page".

As shown in FIG. 3, when data is written by the TLC method, the threshold distribution of the memory cell transistors MT is divided into eight. The eight threshold distributions are referred to as an "ER" level, an "A" level, a "B" level, a "C" level, a "D" level, an "E" level, an "F" level, and a "G" level in order from a lower threshold voltage.

The "ER" level corresponds to an erase state of the memory cell transistor MT. The "A" level, the "B" level, the "C" level, the "D" level, the "E" level, the "F" level, and the "G" level correspond to write states of the memory cell transistor MT, and are formed by write operations using verify voltages AV, BV, CV, DV, EV, FV, and GV respectively. The relation between these voltage values is as follows:

$$AV<BV<CV<DV<EV<FV<GV$$

Specifically, the threshold voltage of the memory cell transistor MT included in the "ER" level is lower than the voltage AV. The threshold voltage of the memory cell transistor MT included in the "A" level is equal to or higher than the voltage AV, and lower than the voltage BV. The threshold voltage of the memory cell transistor MT included in the "B" level is equal to or higher than the voltage BV and lower than the voltage CV. The threshold voltage of the memory cell transistor MT included in the "C" level is equal to or higher than the voltage CV and lower than the voltage DV. The threshold voltage of the memory cell transistor MT included in the "D" level is equal to or higher than the voltage DV and lower than the voltage EV. The threshold voltage of the memory cell transistor MT included in the "E" level is equal to or higher than the voltage EV and lower than the voltage FV. The threshold voltage of the memory cell transistor MT included in the "F" level is equal to or higher than the voltage FV and lower than the voltage GV. The threshold voltage of the memory cell transistor MT included in the "G" level is equal to or higher than the voltage GV.

In the present embodiment, data is assigned to the memory cell transistors MT included in each threshold distribution as follows:
"ER" level: "111" ("lower bit/middle bit/upper bit") data,
"A" level: "101" data,
"B" level: "001" data,
"C" level: "000" data,
"D" level: "100" data,
"E" level: "110" data,
"F" level: "010" data, and
"G" level: "011" data.

In the threshold distributions described above, the read voltages are set between respective adjacent threshold distributions. For example, a read voltage AR for determining whether a memory cell transistor MT has a threshold voltage of the "ER" level or a threshold voltage of the "A" level or higher is set between the maximum threshold voltage at the "ER" level and the minimum threshold voltage at the "A" level. A read voltage BR for determining whether a memory cell transistor MT has a threshold voltage of the "A" level or a threshold voltage of the "B" level or higher is set between the maximum threshold voltage at the "A" level and the minimum threshold voltage at the "B" Level. Other read voltages CR, DR, ER, FR, and GR are also set similarly to the read voltages AR and BR. Then, a read pass voltage Vread is set to a voltage higher than the maximum threshold voltage in the threshold distribution at the "G" level. The voltage Vread is a voltage applied to the unselected word line during a read operation, and the memory cell transistor MT in which the voltage Vread is applied to the control gate is turned ON regardless of the retained data.

In the read operation, the lower page data is determined by the read results using the voltages BR, DR, and FR. The middle page data is determined by the read results using the voltages AR and ER. The upper page data is determined by the read results using the voltages CR and GR. That is, the lower page data, the middle page data, and the upper page data are determined by executing the read operation three times, twice, and twice respectively. Hereinafter, such data assignment is referred to as a "3-2-2 code".

As various verify voltages and various read voltages set between respective threshold distributions, the same voltage value or a different voltage value may be set.

[1-1-3] Configuration of Sense Amplifier Module 17

Returning to FIG. 2, a configuration example of the sense amplifier module 17 will be described. As shown in FIG. 2, the sense amplifier module 17 includes sense amplifier units SAU (SAU0 to SAU (m−1)) provided for each bit line BL.

The sense amplifier units SAU each include a sense amplifier part SA, latch circuits ADL, BDL, CDL, and XDL, and an operation unit OP. The sense amplifier part SA, the latch circuits ADL, BDL, CDL, and XDL, and the operation unit OP are connected so as to be able to transmit and receive data to and from each other.

The sense amplifier part SA senses read data on the corresponding bit line BL during a read operation, and determines whether the read data is "0" or "1". The sense amplifier part SA further applies a voltage to the bit line BL during a write operation based on write data.

The latch circuits ADL, BDL, and CDL temporarily retain read data and write data. The read data determined by the sense amplifier part SA during the read operation and the write data transferred to the latch circuit XDL during the write operation are transferred to, for example, any one of the latch circuits ADL, BDL, and CDL.

The operation unit OP can perform various operations, such as a logical sum (OR) operation, logical product (AND) operation, and exclusive logical sum (XOR) operation, with respect to data retained in the latch circuits ADL, BDL, and CDL.

The latch circuit XDL is used for inputting and outputting data between the sense amplifier unit SAU and the controller 20. For example, the data received from the controller 20 is transferred to the latch circuit ADL, BDL, or CDL, or to the sense amplifier part SA through the latch circuit XDL. Similarly, data retained in the latch circuit ADL, BDL, or CDL, or the sense amplifier part SA is transferred to the controller 20 through the latch circuit XDL.

The latch circuit XDL functions as a cache memory of the semiconductor memory device 10. For example, if the latch circuits ADL, BDL, and CDL are being used, the semiconductor memory device 10 can be in the ready state as long as the latch circuit XDL is not used.

FIG. 4 shows a detailed circuit configuration of the sense amplifier part SA and the latch circuit ADL described above. As shown in FIG. 4, the sense amplifier part SA includes a p-channel MOS transistor 40, n-channel MOS transistors 41 to 47, and a capacitor 48. The latch circuit ADL includes inverters 50 and 51 and n-channel MOS transistors 52 and 53.

In the transistor 40, one end is connected to a power supply terminal, and the gate is connected to a node INV. In the transistor 41, one end is connected to the other end of the transistor 40, the other end is connected to a node COM, and a control signal BLX is input to the gate. In the transistor 42, one end is connected to the node COM, the other end is connected to the corresponding bit line BL, and a control signal BLC is input to the gate. In the transistor 43, one end is connected to the node COM, the other end is connected to a node SRC, and the gate is connected to a node INV. In the transistor 44, one end is connected to the other end of the transistor 40, the other end is connected to a node SEN, and a control signal HLL is input to the gate. In the transistor 45, one end is connected to the node SEN, the other end is connected to the node COM, and a control signal XXL is input to the gate. In the transistor 46, one end is connected to the ground terminal, and the gate is connected to the node SEN. In the transistor 47, one end is connected to the other end of the transistor 46, the other end is connected to a bus LBUS, and a control signal STB is input to the gate. In the capacitor 48, one end is connected to the node SEN, and a clock CLK is input to the other end. A voltage Vdd which is, for example, a power supply voltage of the semiconductor memory device 10 is applied to the power supply terminal connected to the one end of the transistor 40. A voltage Vss which is, for example, a ground voltage of the semiconductor memory device 10 is applied to the node SRC.

In the inverter 50, the input terminal is connected to a node LAT, and the output terminal is connected to a node INV. In the inverter 51, the input terminal is connected to the node INV and the output terminal is connected to the node LAT. In the transistor 52, one end is connected to the node INV, the other end is connected to the bus LBUS, and a control signal STI is input to the gate. In the transistor 53, one end is connected to the node LAT, the other end is connected to the bus LBUS, and a control signal STL is input to the gate. Since the circuit configuration of the latch circuits BDL and CDL is similar to the circuit configuration of the latch circuit ADL described above, the description thereof is omitted.

In the configuration of the sense amplifier unit SAU described above, various control signals are generated by, for example, the sequencer 14. In the read operation, the timing of when the data read by the sense amplifier part SA is determined is based on the timing of when the signal STB is asserted. In various operations, the transistor 42 clamps the voltage of the bit line BL based on the signal BLC.

The configuration of the sense amplifier module 17 is not limited thereto and may be variously changed. For example, the number of latch circuits included in the sense amplifier unit SAU is not limited thereto, and is designed based on the number of bits of data retained in one memory cell transistor MT.

[1-2] Write Operation of Memory System 1

Next, the write operation of the memory system 1 will be described. In the first embodiment, the memory system 1 executes a two-stage write operation when storing 3-bit data in the memory cell transistor MT by the TLC method. In the following description, the first-stage write operation of the two-stage write operation is referred to as a first write operation, and the second-stage write operation is referred to as a second write operation.

In the first write operation, the controller 20 transmits lower page data to the semiconductor memory device 10, and the semiconductor memory device 10 writes the lower page data received from the controller 20 to the memory cell array 11.

In the second write operation, the controller 20 transmits middle page data and upper page data to the semiconductor memory device 10, and the semiconductor memory device 10 writes, based on the middle page data and the upper page data received from the controller 20 and the lower page data read from the memory cell array 11, 3-page data to the memory cell transistor MT from which the lower page data has been read.

Figure 5:
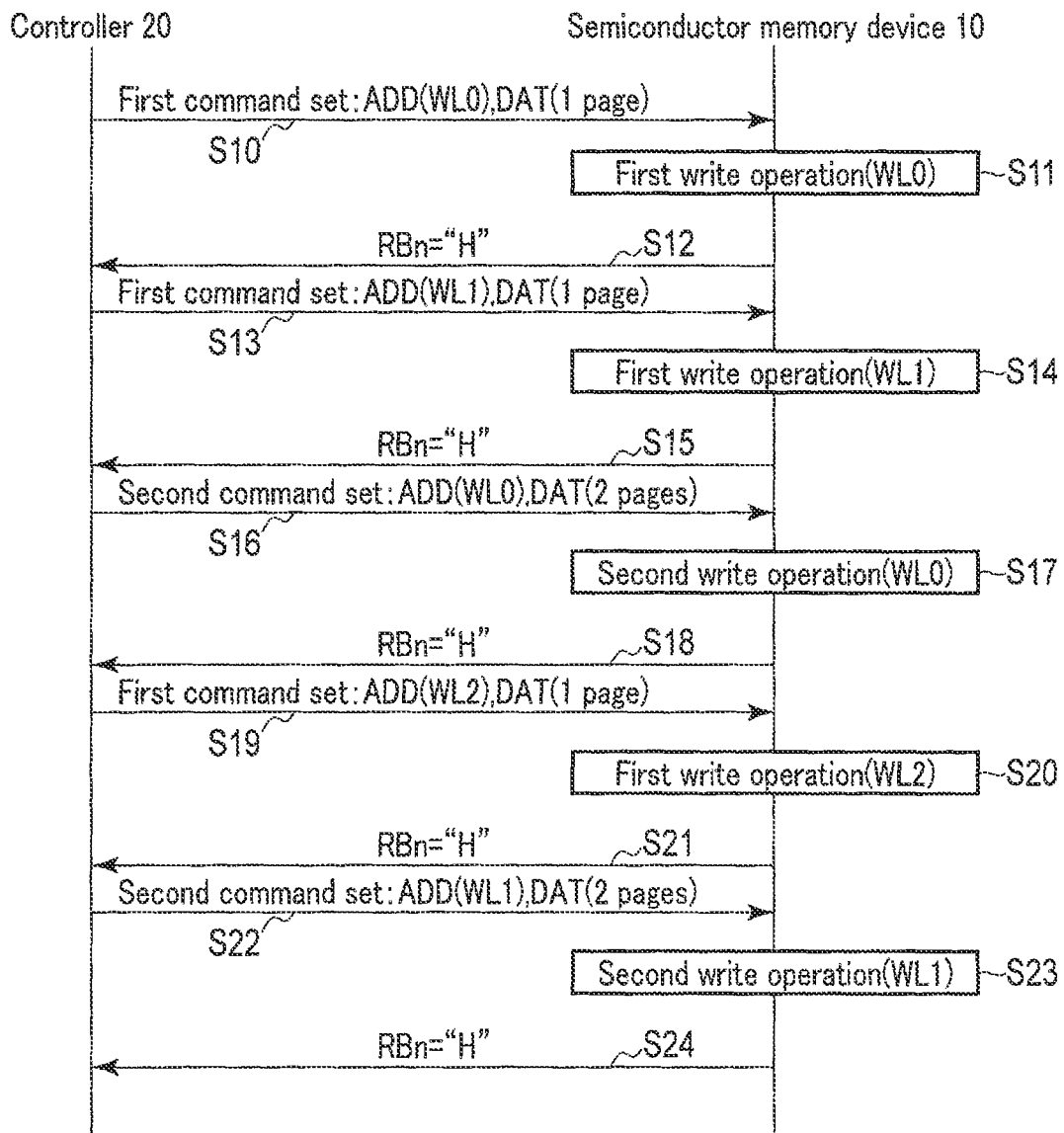
FIG. 5 is a flowchart showing an example of a write operation of the memory system according to the first embodiment.
Figure 6:
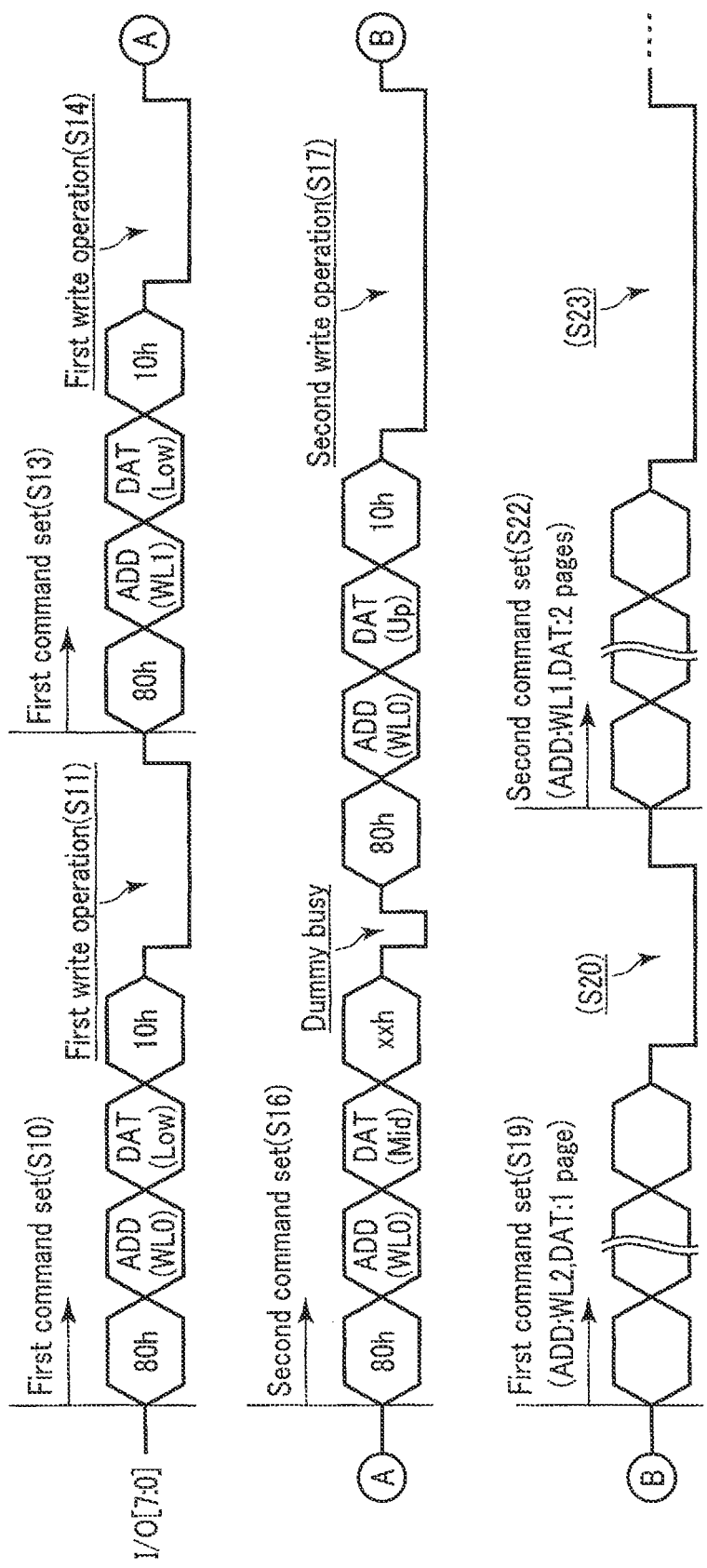
FIG. 6 is a diagram showing an example of a command sequence of the write operation of the memory system according to the first embodiment.

Hereinafter, the details of the write operation of the memory system 1 will be described with reference to FIGS. 5 and 6. FIG. 5 is a flowchart showing an example of the write operation of the memory system 1, and FIG. 6 shows a command sequence of the operation corresponding to FIG. 5. It is assumed that the controller 20 receives the write data from the host apparatus 30 and stores the received write data in the RAM 22 in a page unit before the write operation described below is executed. In the following description, it is assumed that a command CMD received by the semiconductor memory device 10 is stored in the command register 12, and address information ADD received by the semiconductor memory device 10 is stored in the address register 13.

As shown in FIG. 5, the controller 20 first issues a first command set including address information ADD specifying the word line WL0 and transmits the first command set to the semiconductor memory device 10 (step S10). Specifically, as shown in FIG. 6, the controller 20 first issues a command "80h" and transmits the command "80h" to the semiconductor memory device 10. The command "80h" corresponds to an address and data input reception command for writing, and is a command instructing the semiconductor memory device 10 to write data. Next, the controller 20 continuously transmits the address information ADD specifying the word line WL0 and the lower page data DAT to the semiconductor memory device 10. The semiconductor memory device 10 allows the received data DAT to be retained in the latch circuit XDL of the sense amplifier module 17. Then, the controller 20 issues a command "10h" and transmits the command "10h" to the semiconductor memory device 10. The command "10h" is a command instructing the semiconductor memory device 10 to execute the write operation. This series of command sequences corresponds to the first command set.

When the command "10h" is stored in the command register 12, the sequencer 14 sets the ready/busy signal RBn to the "L" level. Then, the sequencer 14 transfers the write data retained in the latch circuit XDL to, for example, the latch circuit ADL, and executes the first write operation in which the word line WL0 is selected (step S11).

Figure 7:
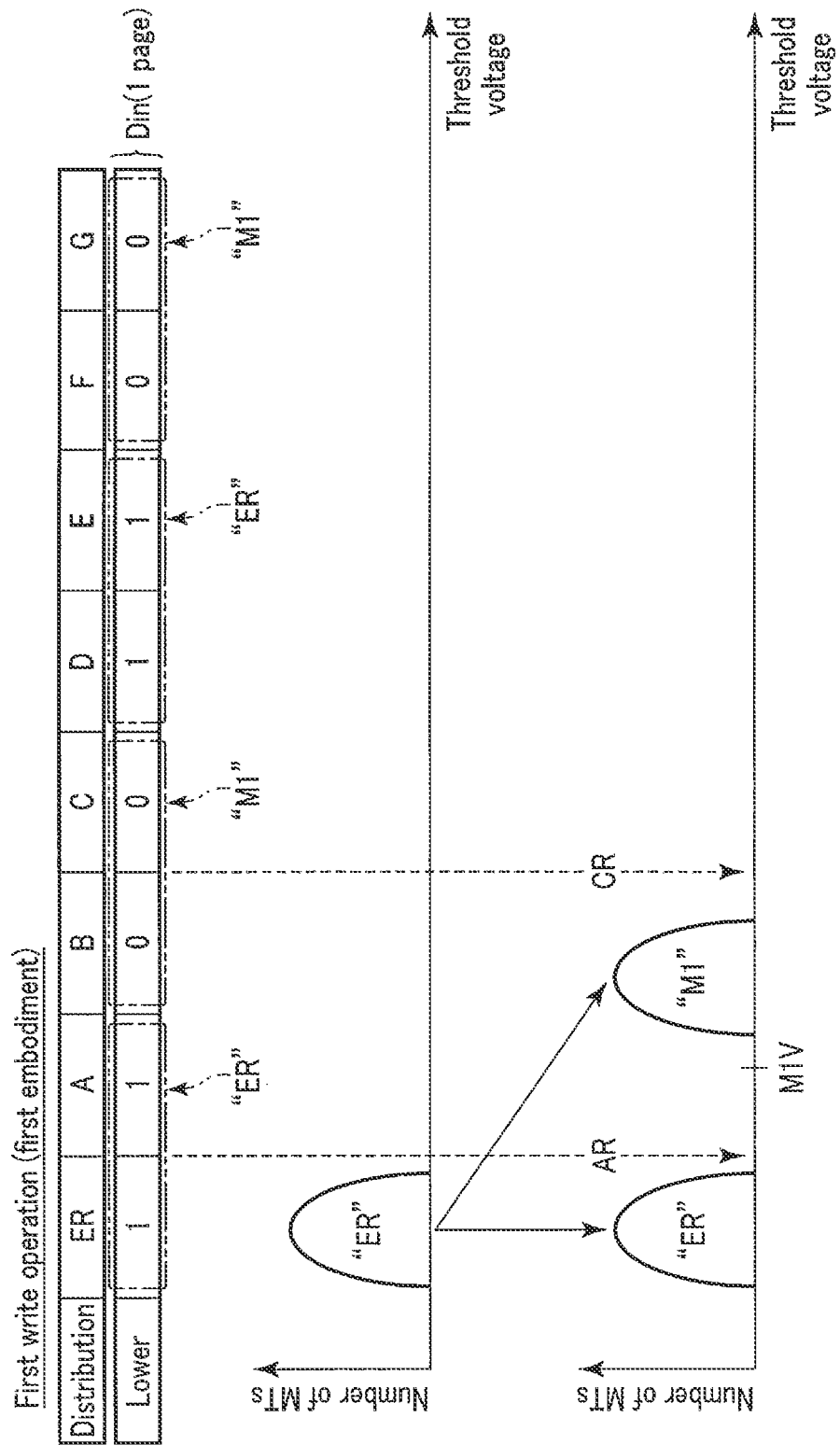
FIG. 7 is a diagram showing an example of a change in threshold distribution in a first write operation of the memory system according to the first embodiment.

Here, an example of a change in the threshold distribution of the memory cell transistors MT by the first write operation will be described with reference to FIG. 7. FIG. 7 shows 1-page data used in the first write operation and threshold distributions of the memory cell transistors MT before and after the first write operation is executed. In the following description, it is assumed that an increase in the threshold voltage of a write-inhibited memory cell transistor MT and a memory cell transistor MT having passed a verify is suppressed by applying channel boost or the like.

As shown in FIG. 7, the threshold voltages of the memory cell transistors MT before the execution of the first write operation are distributed to the "ER" level, which is the erase state. In the first write operation, the semiconductor memory device 10 executes the write operation for 1-page data based on the lower page data input from the controller 20, and forms two threshold distributions from the threshold distribution at the "ER" level.

Specifically, the semiconductor memory device 10 sets the memory cell transistors MT to which "1" ("lower bit") data is written as a write inhibit state, and executes the write operation using a voltage M1V as a verify voltage to the memory cell transistors MT to which "0" data is written. The voltage M1V is lower than the voltage CR. Thus, the threshold voltages of the memory cell transistors MT to which "1" data is written are distributed to the "ER" level and the threshold voltages of the memory cell transistors MT to which "0" data a written are distributed to the "M1" level.

The threshold voltage of the memory cell transistor MT included in the "M1" level is equal to or higher than the voltage M1V and lower than the voltage CV. That is, in consideration that the threshold distribution at the "M1" level changes to the threshold distribution at the "B" level or higher by the second write operation, the verify voltage M1V is set so that the threshold voltage of the memory cell transistor MT having passed the verify is to be lower than the voltage CR.

Returning to FIG. 5, when the first write operation in step S11 is ended, the sequencer 14 sets the ready/busy signal RBn to the "H" level (step S12). When detecting that the semiconductor memory device 10 is in the ready state, the controller 20 issues a first command set including the address information ADD specifying the word line WL1, and transmits the first command set to the semiconductor memory device 10 (step S13). When receiving the first command set from the controller 20, the semiconductor memory device 10 sets the ready/busy signal RBn to the "L" level and executes the first write operation in which the word line WL1 is selected (step S14). Thus, the lower page data is written to the memory cell transistors MT connected to the word line WL1.

When the first write operation in step S14 is ended, the sequencer 14 sets the ready/busy signal RBn to the "H" level (step S15). When detecting that the semiconductor memory device 10 is in the ready state, the controller 20 issues a second command set including the address information ADD specifying the word line WL0 and transmits the second command set to the semiconductor memory device 10 (step S16).

Specifically, as shown in FIG. 6, the controller 20 first issues a command "80h" and transmits the command "80h" to the semiconductor memory device 10. Then, the controller 20 continuously transmits the address information ADD specifying the word line WL0 and the middle page data DAT to the semiconductor memory device 10. Then, the semiconductor memory device 10 allows the received data DAT to be retained in the latch circuit XDL of the sense amplifier module 17. Next, the controller 20 issues a command "xxh" and transmits the command "xxh" to the semiconductor memory device 10. The command "xxh" is a command indicating that the data received so far corresponds to 1-page data. When the command "xxh" is stored in a command register 12, the sequencer 14 sets the ready/busy signal RBn to the "L" level, and transfers the write data retained in the latch circuit XDL to, for example, the latch circuit ADL. The sequencer 14 sets the ready/busy signal RBn to the "H" level. This operation is indicated as "dummy busy" in FIG. 6. When the ready/busy signal RBn is set to the "H" level, the controller 20 issues a command "80h" and transmits the command "80h" to the semiconductor memory device 10. Then, the controller 20 continuously transmits the address information ADD specifying the word line WL0 and the upper page data DAT to the semiconductor memory device 10. The semiconductor memory device 10 then allows the received data DAT to be retained in the latch circuit XDL of the sense amplifier module 17. Next, the controller 20 issues a command "10h" and transmits the command "10h" to the semiconductor memory device 10. This series of command sequences corresponds to the second command set.

When the command "10h" is stored in the command register 12, the sequencer 14 sets the ready/busy signal RBn to the "L" level. Then, the sequencer 14 transfers the write data retained in the latch circuit XDL to, for example, the latch circuit BDL, and executes the second write operation in which the word line WL0 is selected (step S17).

Figure 8:
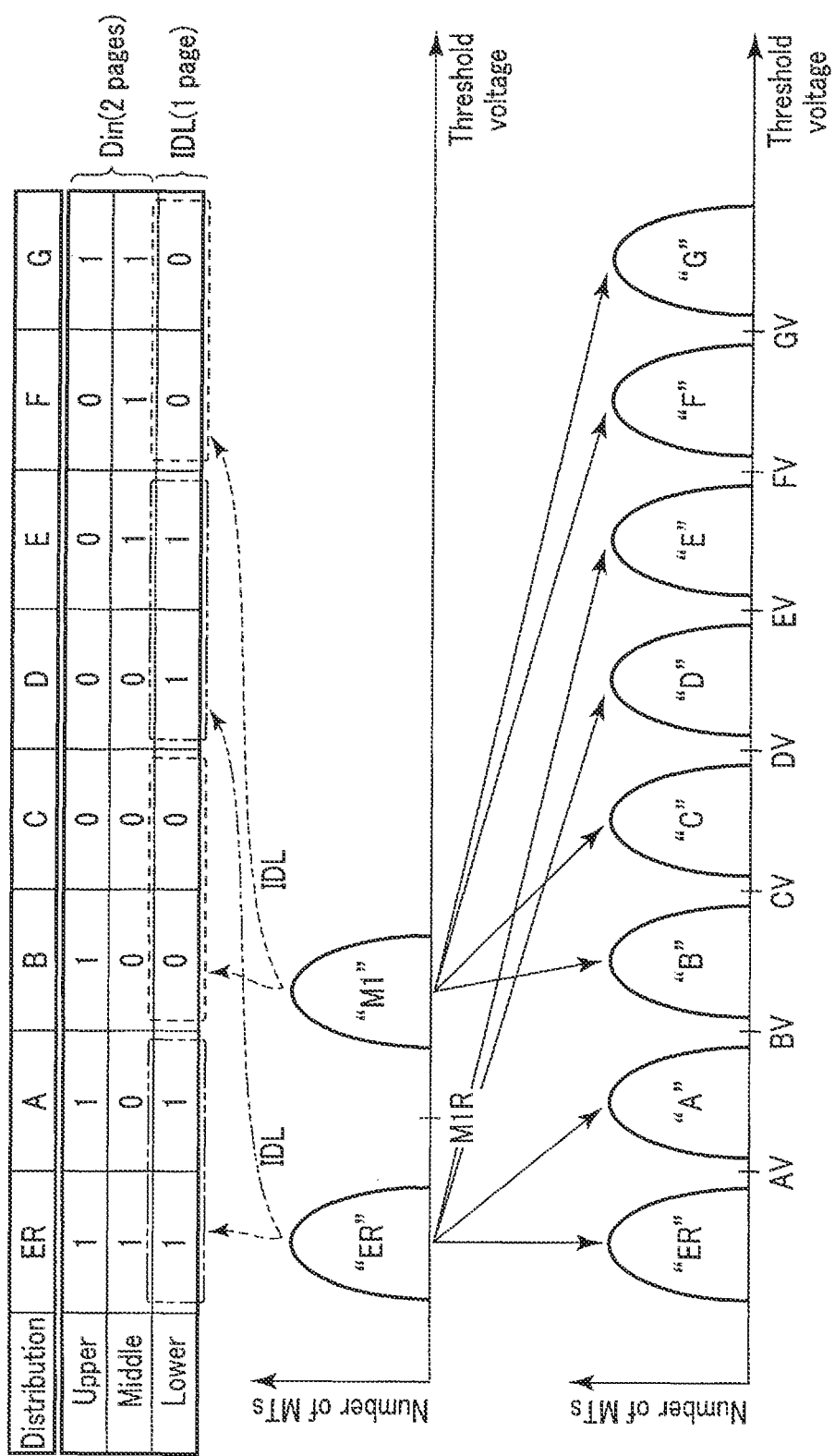
FIG. 8 is a diagram showing an example of a change in threshold distribution in a second write operation of the memory system according to the first embodiment.

Here, an example of a change in the threshold distribution of the memory cell transistors MT by the second write operation will be described with reference to FIG. 8. FIG. 8 shows 3-page data used in the second write operation and threshold distributions of the memory cell transistors MT before and after the second write operation is executed.

As shown in FIG. 8, the threshold voltages of the memory cell transistors MT before the execution of the second write operation are distributed to the "ER" level and the "M1" level. In the second write operation, the semiconductor memory device 10 writes, based on the middle page data and the upper page data input from the controller 20 and the lower page data read from the memory cell array 11, 3-page data to the memory cell transistor MT from which the lower page data is read, and forms eight threshold distributions from the threshold distributions at the "ER" level and "M1" level.

Specifically, the sequencer 14 first executes an internal data load (IDL). In the IDL, before a program pulse (program voltage) is applied to a selected word line WL, there is a data read operation of the data stored in, for example, the memory cell transistor MT corresponding to the applicable word line WL. In the IDL in the present embodiment, a read operation using a voltage M1R is executed. The voltage M1R is set between the threshold distribution at the "ER" level and the threshold distribution at the "M1" level. The sense amplifier part SA determines whether the threshold voltage of the memory cell transistor MT is lower than the voltage M1R by the read operation using the voltage M1R, and transfers the determined data to, for example, the latch circuit CDL. In this manner, the lower page data ("1" data or "0" data) written by the first write operation is restored to the latch circuit in the sense amplifier unit SAU.

The sequencer 14 sets the memory cell transistor MT to which "111" ("lower bit/middle bit/upper bit") data is written as a write inhibit state, and executes the write operations using the voltages AV, BV, CV, DV, EV, FV, and GV as verify voltages to the memory cell transistors MT to which "101" data, "001" data, "000" data, "100" data, "110" data, "010" data, and "011" data are written respectively. Thus, the threshold distributions at the "A" level, the "D" level, and the "E" level are formed from the threshold distribution at the "ER" level, and the threshold distributions at the "B" level, the "C" level, the "F" level, and the "G" level are formed from the threshold distribution at the "M1" level.

Returning to FIG. 5, when the second write operation in step S17 is ended, the sequencer 14 sets the ready/busy signal RBn to the "H" level (step S18). When detecting that the semiconductor memory device 10 is in the ready state, the controller 20 issues a first command set including the address information ADD specifying the word line WL2 and transmits the first command set to the semiconductor memory device 10 (step S19). When receiving the first command set from the controller 20, the semiconductor memory device 10 sets the ready/busy signal RBn to the "L" level and executes the first write operation in which the word line WL2 is selected (step S20). Thus, the lower page data is written to the memory cell transistors MT connected to the word line WL2.

When the second write operation in step S20 is ended, the sequencer 14 sets the ready/busy signal RBn to the "H" level (step S21). When detecting that the semiconductor memory device 10 is in the ready state, the controller 20 issues a second command set specifying the word line WL1 and transmits the second command set to the semiconductor memory device 10 (step S22). When receiving the second command set from the controller 20, the semiconductor memory device 10 sets the ready/busy signal RBn to the "L" level and executes the second write operation in which the word line WL2 is selected (step S23). Thus, the 3 page data is written to the memory cell transistors MT connected to the word line WL1. When the second write operation in step S23 is ended, the sequencer 14 sets the ready/busy signal RBn to the "H" level (step S24).

In the subsequent write operation, an operation similar to steps S19 to S24 is repeated. When the second write operation corresponding to the last 3-page data is ended, the memory system 1 ends the write operation. In FIG. 5, an example has been illustrated in which the write operation (for example, after steps S11, S14, S17, S20, and S23) is executed, and then the next command set and data are input after the ready/busy signal RBn becomes the "H" level, but the operation order is not limited thereto. For example, by having an extra number of latch circuits (for example, latch circuits XDL) illustrated with reference to FIG. 2 for write cache usage, it is possible to input the next command set and data during the write operation.

Figure 9:
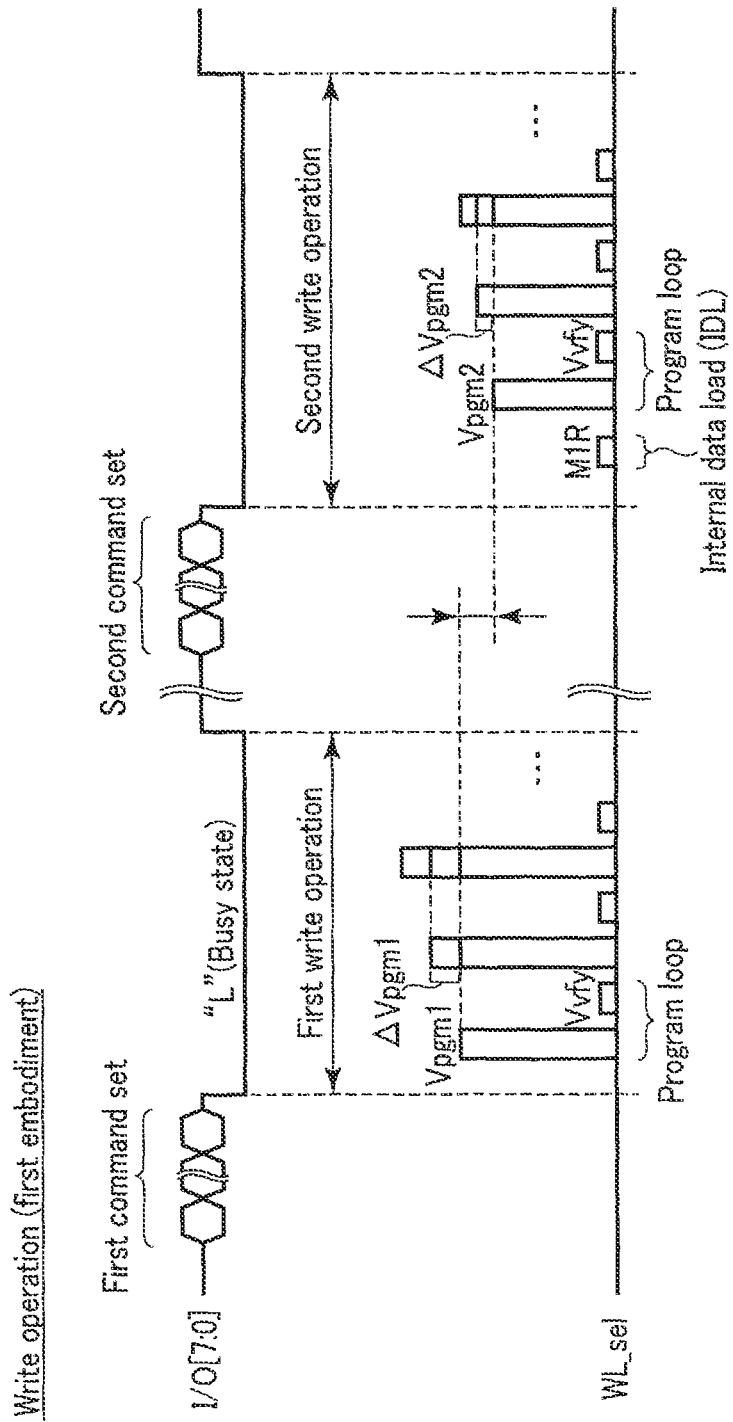
FIG. 9 is a diagram showing an example of a command sequence and a waveform of the write operation of the memory system according to the first embodiment.

In the first and second write operations described above, the waveform of the voltage applied to the selected word line WL is as shown in, for example, FIG. 9. FIG. 9 shows an example of an input/output signal I/O and a voltage applied to a selected word line WL. In the following description, the selected word line WL is referred to as a selected word line WL_sel.

As shown in FIG. 9, when receiving the first and second command sets, the semiconductor memory device 10 is in a busy state and executes the first and second write operations.

In the first write operation, first, the row decoder 16 applies a voltage Vpgm1 to the selected word line WL_sel. The voltage Vpgm1 is a program voltage and is a high voltage capable of injecting electrons into a charge storage layer of the memory cell transistor MT. When the voltage Vpgm1 is applied to the selected word line WL_sel, electrons are injected into the charge storage layer by the potential difference between the gate and the channel, and the threshold voltage of the corresponding memory cell transistor MT is increased. In a write-inhibited memory cell transistor MT set as a write inhibit state in the memory cell transistors MT connected to the selected word line WL_sel, variation of the threshold voltage is suppressed by, for example, boosting the channel of the corresponding NAND string NS to reduce the potential difference between the gate and the channel in the memory cell transistors MT connected to the selected word line WL_sel. Next, the row decoder 16 applies a voltage Vvfy, and the sense amplifier module 17 determines whether or not the threshold voltage of a writing target memory cell transistor MT exceeds the voltage Vvfy. The voltage Vvfy is a verify voltage and is, for example, the voltage M1V shown in FIG. 7.

The operation of applying the program voltage and the verify voltage described above corresponds to one program loop. The sequencer 14 repeats such a program loop while increasing a value of the program voltage in increments of ΔVpgm1. Then, when the memory cell transistor MT passes the verify using, for example, the voltage M1V by repeating the program loop, the sequencer 14 ends the first write operation, and the semiconductor memory device 10 changes to the ready state.

In the second write operation, first, the row decoder 16 applies the voltage M1R to the selected word line WL. This operation corresponds to the IDL, and the sense amplifier module 17 reads 1-page data (lower page data) stored in the memory cell transistors MT connected to the selected word line WL_sel. Subsequently, the sequencer 14 repeats the program loop based on the 3-page data retained in the latch circuits ADL, BDL, and CDL. Note that, in the program loop in the second write operation, the value of the program voltage to be applied first, the value of the program voltage incremented for each program loop, and the verify voltage to be used are different from those in the program loop in the first write operation.

Specifically, the value of the program voltage to be applied first is Vpgm2, and the value of the incremented program voltage is ΔVpgm2. As the verify voltage Vvfy, several voltages are selected and used from the voltages AV, BV, CV, DV, EV, FV, and GV in ascending order of the voltage value. Vpgm2 is smaller than Vpgm1, and ΔVpgm2 is smaller than ΔVpgm1. As described above, in the second write operation, the threshold voltage of the memory cell transistor MT is finely controlled by using the program voltage and ΔVpgm smaller than those in the first write operation. When the memory cell transistor MT passes the verify using, for example, the voltage GV by repeating the program loop, the sequencer 14 ends the second write operation, and the semiconductor memory device 10 changes to the ready state.

[1-3] Effects of First Embodiment

The memory system 1 according to the first embodiment described above can improve reliability of written data. Hereinafter, the details of the effects of the first embodiment will be described.

In a semiconductor memory device, a threshold voltage of a memory cell adjusted to a desired threshold voltage by a write operation can vary after a write operation to the memory cell. For example, in a memory cell using a NOMOS film, a phenomenon called an initial fall occurs in which a certain amount of electrons escape from a charge storage layer and the threshold voltage falls after the electrons are injected into the charge storage layer of the memory cell by a write operation. The variation amount of the threshold voltage due to the initial fall is based on the amount of electrons injected into the charge storage layer of the memory cell by the write operation.

In addition, when the write operation is executed to the memory cell adjacent to the memory cell to which data is written, the threshold voltage of the adjacent memory cell is increased, and the threshold voltage of the memory cell to which the data has already been written is increased accordingly. This phenomenon is caused by a change in the parasitic capacitance between adjacent memory cells, and the variation amount in the threshold voltage in the memory cell is increased as the variation amount of the threshold voltage in the adjacent memory cell is increased.

If the threshold voltage of the memory cell varies due to the initial fall of the threshold distribution or the influence of the parasitic capacitance between adjacent memory cells, the threshold distribution of the memory cells can be expanded, and the number of error bits during the read operation can be increased accordingly.

For this reason, the memory system 1 according to the first embodiment applies a two-stage write operation when writing 3-page data by the TLC method. Specifically, the semiconductor memory device 10 writes 1-page data including a lower bit in the first-stage write operation (first write operation), and 2-page data including a middle bit and an upper bit in the subsequent second-stage write operation (second write operation). In the memory system 1 according to the first embodiment, the first write operation in which the adjacent word line WL is selected is executed between the first write operation and the second write operation. Specifically, when, for example, the first write operation in which the word line WL0 is selected, the first write operation in which the adjacent word line WL1 is selected is executed next, and then the second write operation in which the word line WL0 is selected is executed.

In this case, in the memory cells corresponding to the word line WL0, the initial fall occurs while the first write operation in which the word line WL1 is selected is being executed. Then, the second write operation, in which the word line WL0 is selected, is executed from a state of being influenced by the change in the parasitic capacitance between the adjacent memory cells caused by the first write operation in which the word line WL1 is selected. As a result, in the threshold distribution finally obtained, these influences can be ignored.

Furthermore, the second write operation is to be a write operation to the memory cell transistor MT having the threshold voltage which has been increased to some extent by the first write operation. As a result, the variation amount of the threshold voltage of the memory cell transistor MT caused by the second write operation becomes small. That is, the amount of electrons to be injected into the charge storage layer of the memory cell transistor MT in the second write operation is smaller than that in the case where data is written in three bits at a time.

Thus, the memory system 1 according to the first embodiment can suppress the influences of the initial fall of the threshold voltage and the parasitic capacitance between the adjacent memory cells which occur after data is written. Accordingly, the memory system 1 according to the present embodiment can suppress the expansion of the threshold distribution in the writing operation, and improve the reliability of the written data.

The first write operation described above is a write operation using only lower page data. The threshold distribution after the first write operation is only required to be roughly formed, because the threshold distribution is finely formed by the following second write operation. In the first write operation, it is possible to set the initial value of the program voltage Vpgm used for the write operation and ΔVpgm for each program loop so as to be larger than those in the second write operation. Thus, the memory system 1 according to the first embodiment can accelerate the first-stage write operation when executing the two-stage write operation.

In addition, since the data written in the memory cell transistor MT by the first write operation appears to be binary, it is possible to execute the read operation for the lower page data. For this reason, the memory system 1 according to the first embodiment restores the lower page data to be used in the second write operation by reading the data from the corresponding memory cell by the IDL. Thus, when 3-page data is written in the first and second write operations, the controller 20 transmits 1-page data to be used in the first write operation to the semiconductor memory device 10 and then can discard the data. Accordingly, the memory system 1 according to the first embodiment can suppress the storage capacity of the RAM 22 and buffer memory 24, and suppress the circuit area of the controller 20.

Furthermore, the memory system 1 according to the first embodiment restores the lower page data by the IDL, and can omit data input for one page in the second write operation. Accordingly, the memory system 1 according to the first embodiment can shorten the time of data input in the second write operation, and accelerate the write operation.

In the memory system 1 according to the first embodiment, the 3-2-2 code described with reference to FIG. 3 is applied as the assignment of data to be written to the memory cell transistor MT. In the 3-2-2 code, the reading at the voltages AR and GR at which error bits are easily generated is assigned to the read operation for the middle page data and the upper page data, which are determined by executing the reading twice. In the read operation for the lower page data, by determining the data by reading at the voltages BR, DR, and FR at which error bits are relatively hard to generate, an increase in the number of error bits due to the increase in the number of read times is suppressed. Thus, the memory system 1 can disperse the number of error bits generated in the read operations for the lower page data, the middle page data, and the upper page data in the 3-page data read operation, and enhance the possibility of succeeding in the error correction by the ECC circuit 25. Accordingly, the memory system 1 according to the present embodiment can improve the reliability of the read operation.

[2] Second Embodiment

Next, a memory system 1 according to a second embodiment will be described. In the memory system 1 according to the second embodiment, data assignment different from that in the memory system 1 described in the first embodiment is applied, and 2-page data is written in a first write operation. Hereinafter, differences between the memory system 1 according to the second embodiment and that according to the first embodiment will be described.

[2-1] Data Assignment of Memory Cell

Figure 10:
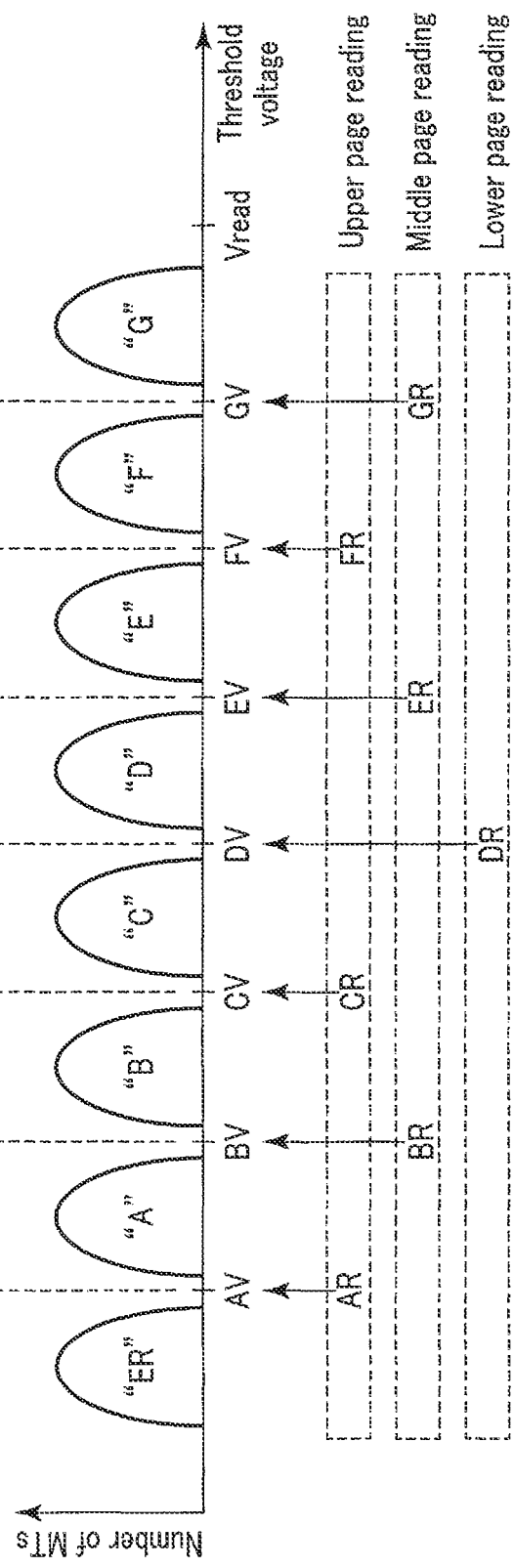
FIG. 10 is a diagram showing threshold distribution and data assignment of memory cells included in a semiconductor memory device according to a second embodiment.

First, data assignment to be applied to the memory system 1 according to the second embodiment will be described with reference to FIG. 10. FIG. 10 shows threshold distribution of memory cell transistors MT, assigned data, and voltages used in write and read operations, and data assignment is different from that shown in FIG. 3 described in the first embodiment.

As shown in FIG. 10, in the present embodiment, data is assigned to the memory cell transistors MT included in each threshold distribution as follows:
"ER" level: "111" ("lower bit/middle bit/upper bit") data,
"A" level: "110" data,
"B" level: "100" data,
"C" level: "101" data,
"D" level: "001" data,
"E" level: "011" data,
"F" level: "010" data, and
"G" level: "000" data.

In the read operation, the lower page data is determined by the read result using a voltage DR. The middle page data is determined by the read results using voltages BR, ER, and GR. The upper page data is determined by the read results using voltages AR, CR, and FR. That is, the lower page data, the middle page data, and the upper page data are determined by executing the read operation once, three times, and three times respectively. Hereinafter, such data assignment is referred to as a "1-3-3 code".

[2-2] Write Operation of Memory System 1

Figure 11:
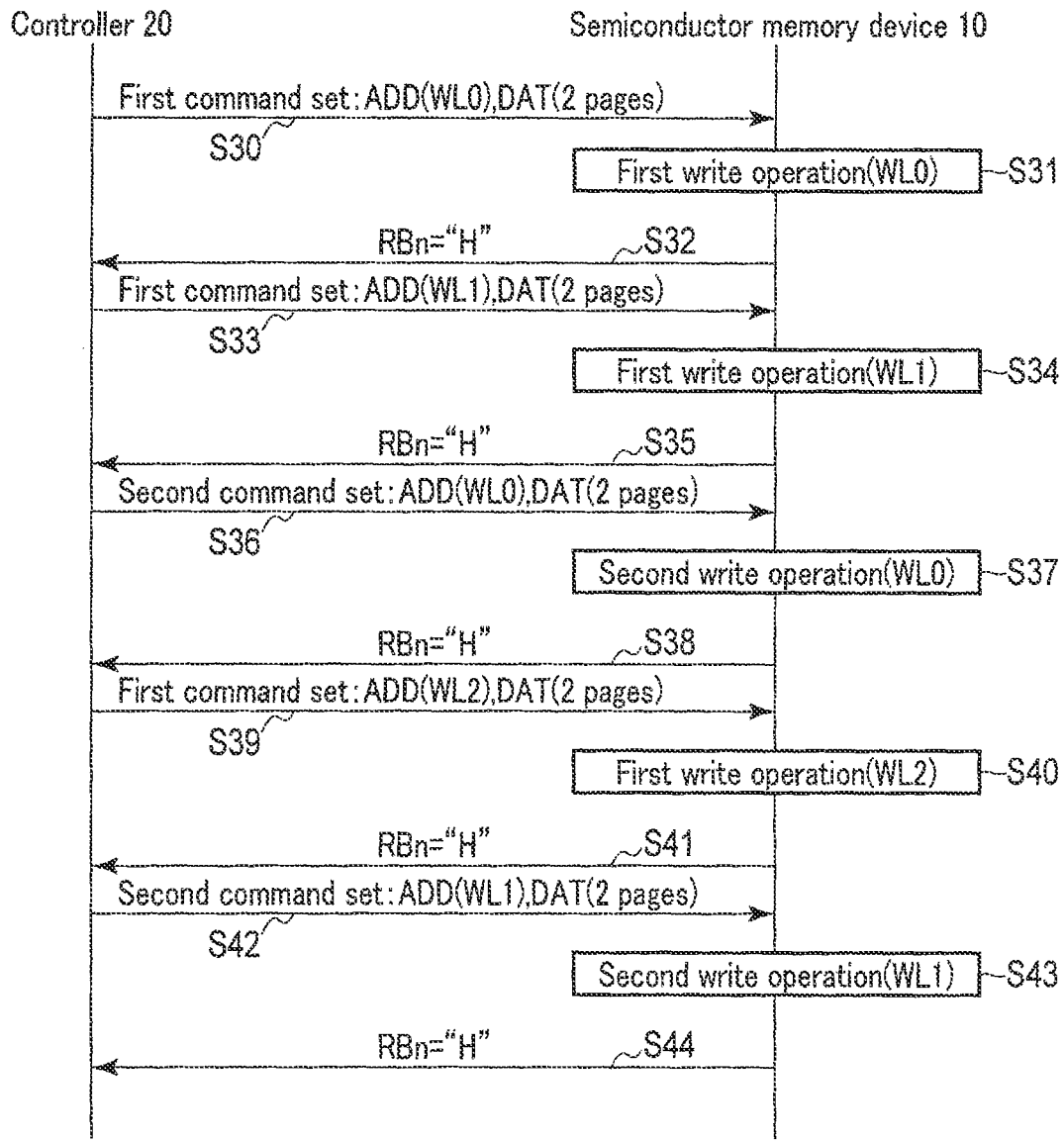
FIG. 11 is a flowchart showing an example of a write operation of a memory system according to the second embodiment.

Next, a write operation of the memory system 1 according to the second embodiment will be described with reference to FIGS. 11 and 12. FIG. 11 is a flowchart showing the write operation of the memory system 1, and FIG. 12 shows a command sequence of the operation corresponding to FIG. 11. Steps S30 to S44 shown in FIGS. 11 and 12 correspond to steps S10 to S24 respectively described in the first embodiment with reference to FIGS. 5 and 6. In the second embodiment, details of a first command set, a first write operation, and a second write operation are different from those in the first embodiment.

First, the details of the first command set in the second embodiment will be described. As shown in FIG. 12, the first command set in the second embodiment is similar to that of the write data DAT in which a second command set described in the first embodiment with reference to FIG. 6 is converted from the middle and upper page data to the lower and middle page data.

Figure 13:
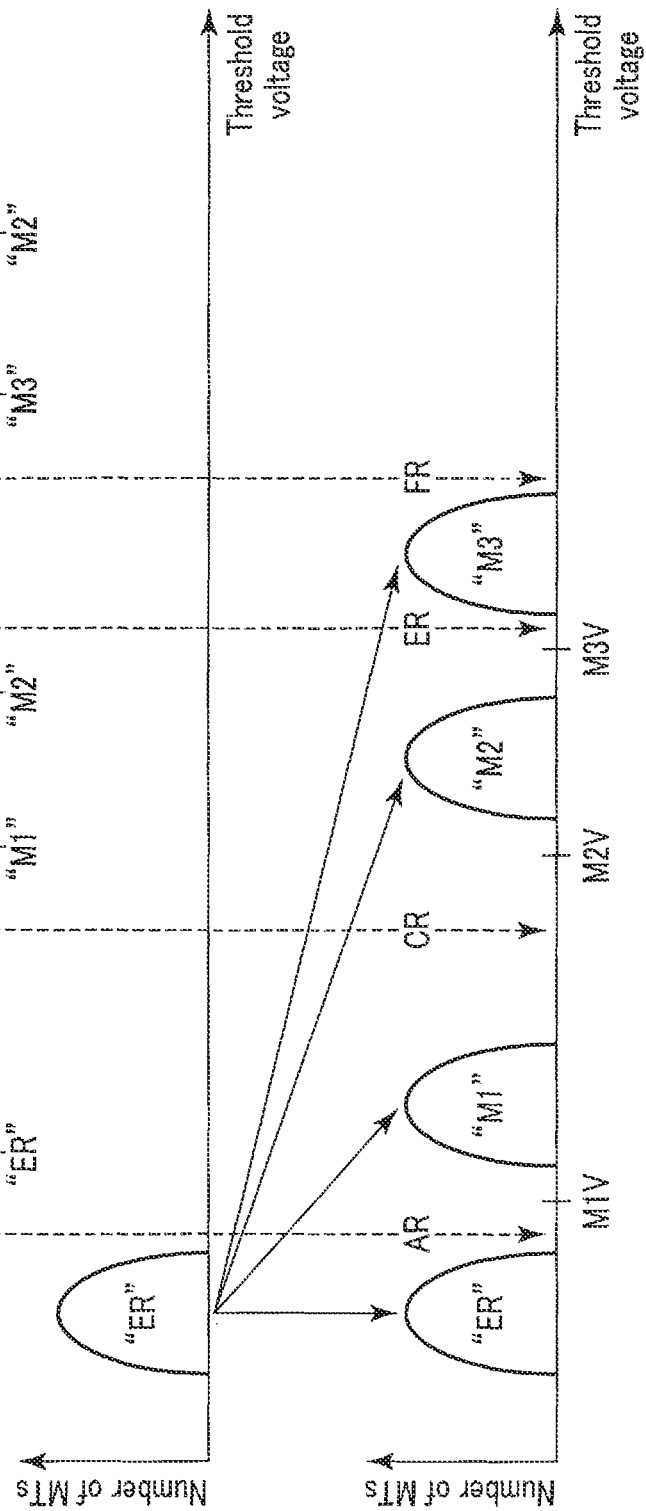
FIG. 13 is a diagram showing an example of a change in threshold distribution in a first write operation of the memory system according to the second embodiment.

Next, the details of the first write operation in the second embodiment will be described with reference to FIG. 13. FIG. 13 shows 2-page data used in the first write operation and threshold distributions of the memory cell transistors MT before and after the first write operation is executed. In the first write operation in the second embodiment, the write operation for 2-page data is executed based on the first command set.

As shown in FIG. 13, the threshold voltages of the memory cell transistors MT before the execution of the first write operation are distributed to the "ER" level, which is an erase state. In the first write operation, a semiconductor memory device 10 executes the write operation for 2-page data based on the lower page data and the middle page data input from a controller 20, and forms four threshold distributions from the threshold distribution at the "ER" level.

Specifically, a sequencer 14 sets the memory cell transistors MT to which "11" ("lower bit/middle bit") data is written as a write inhibit state, and executes the write operations using voltages M1V, M2V, and M3V as verify voltages to the memory cell transistors MT to which "10" data, "00" data, and "01" data are respectively written. The voltage M1V is lower than the voltage CR. The voltage M2V is higher than the voltage M1V and lower than the voltage ER. The voltage M3V is higher than the voltage M2V and lower than the voltage FR. Thus, the threshold voltages of the memory cell transistors MT to which the "11" data is written are distributed to the "ER" level, the threshold voltages of the memory cell transistors MT to which the "10" data is written are distributed to the "M1" level, the threshold voltages of the memory cell transistors MT to which the "00" data is written are distributed to the "M2" level, and the threshold voltages of the memory cell transistors MT to which the "01" data is written are distributed to the "M3" level.

The threshold voltage of the memory cell transistor MT included in the "M1" level is equal to or higher than the voltage M1V and lower than the voltage CR, the threshold voltage of the memory cell transistor MT included in the "M2" level is equal to or higher than the voltage M2V and lower than the voltage ER, and the threshold voltage of the memory cell transistor MT included in the "M3" level is equal to or higher than the voltage M3V and lower than the voltage FR. The verify voltages M1V, M2V, and M3V are set so that the threshold voltages of the memory cell transistors MT having passed the verify do not exceed the voltages CR, ER, and FR respectively. The verify voltages M1V and M2V may be set so that the interval between the threshold distribution at the "M1" level and the threshold distribution at the "M2" level is wider than the intervals between other threshold distributions.

Figure 14:
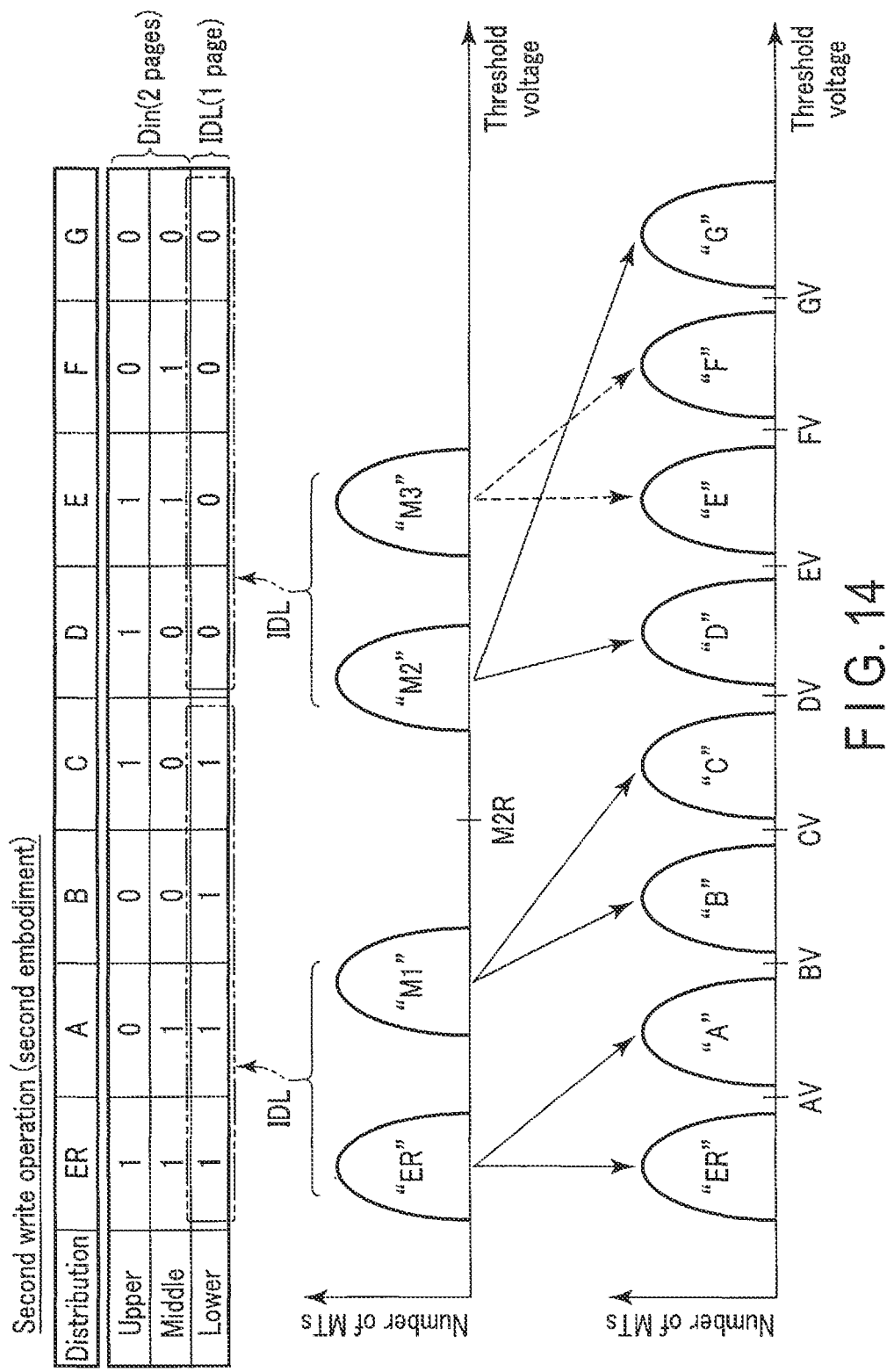
FIG. 14 is a diagram showing an example of a change in threshold distribution in a second write operation of the memory system according to the second embodiment.

Next, the details of the second write operation in the second embodiment will be described with reference to FIG. 14. FIG. 14 shows 3-page data used in the second write operation and threshold distributions of the memory cell transistors MT before and after the second write operation is executed. In the second write operation in the present embodiment, the write operation for 3-page data using the IDL is executed based on the second command set similar to that in the first embodiment.

As shown in FIG. 14, the threshold voltages of the memory cell transistors MT before the execution of the second write operation are distributed to the "ER" level, the "M1" level, the "M2" level, and the "M3" level. In the second write operation, the semiconductor memory device 10 executes the write operation for 3-page data based on the middle and upper page data input from the controller 20 and the lower page data read from a memory cell array 11, and forms eight threshold distributions from the threshold distributions at the "ER" level, the "M1" level, the "M2" level, and the "M3" level.

Specifically, the sequencer 14 first executes an internal data load (IDL). In the IDL in the present embodiment, a read operation using the voltage M2R is executed. The voltage M2R is a voltage set between the threshold distribution at the "M1" level and the threshold distribution at the "M2" level. Thus, since the lower page data at the "ER" level and the "M1" level is "1", and the lower page data at the "M2" level and the "M3" level is "0", a sense amplifier module 17 can determine whether the lower page data is "1" or "0" by determining whether the threshold voltage of the memory cell transistor MT is lower than the voltage M2R. In this manner, the semiconductor memory device 10 restores the "1" data and "0" data (lower page data) written by the first write operation to a latch circuit in a sense amplifier unit SAU.

The sequencer 14 sets the memory cell transistors MT to which "111" ("lower bit/middle bit/upper bit") data is written as a write inhibit state, and executes the write operations using the voltages AV, BV, CV, DV, EV, FV, and GV as verify voltages to the memory cell transistors MT to which the "110" data, the "100" data, the "101" data, the "001" data, the "011" data, the "010" data, and the "000" data are respectively written. Thus, the threshold distribution at the "A" level is formed from the threshold distribution at the "ER" level, the threshold distributions at the "B" level and "C" level are formed from the threshold distribution at the "M1" level, the threshold distributions at the "D" level and the "G" level are formed from the threshold distribution at the "M2" level, and the threshold distributions at the "E" level and "F" level are formed from the threshold distribution at the "M3" level.

[2-3] Effects of Second Embodiment

As described above, the memory system 1 according to the second embodiment executes the two-stage write operation using the 1-3-3 code, and writes 2-page data (the lower page data and the middle page data) in the first write operation.

In this case, in the first write operation in the second embodiment, data can be written to the memory cell transistor MT to a higher threshold voltage, as compared with the first write operation in the first embodiment. In the second write operation in the present embodiment, since the write operation starts from a threshold voltage higher than the second write operation in the first embodiment, it is possible to further suppress the variation amount of the threshold voltage, as compared with the second write operation in the first embodiment.

Therefore, the memory system 1 according to the second embodiment can further suppress the influences of the initial fall of the threshold voltage and the parasitic capacitance between the adjacent memory cells that occur after data is written, as compared with the first embodiment. Accordingly, the memory system 1 according to the second embodiment can further suppress the expansion of the threshold distribution in the writing operation as compared with the first embodiment, and improve the reliability of the written data.

In the memory system 1 according to the second embodiment, the 1-3-3 code described with reference to FIG. 10 is applied as the assignment of data to be written to the memory cell transistor MT. In the 1-3-3 code, the lower page data can be read in a state of writing 2-page data constituted by the lower page and the middle page. That is, the memory system 1 according to the second embodiment can restore the lower page data by the IDL, similar to the first embodiment.

Due to this, the memory system 1 according to the second embodiment can omit data input for one page in the second write operation. Accordingly, the memory system 1 according to the second embodiment can shorten the time of data input in the second write operation, similar to the first embodiment, and can accelerate the write operation. In addition, since the lower page data used in the second write operation is restored by the IDL, the controller 20 can discard the lower page data used in the first write operation after transmitting the lower page data to the semiconductor memory device 10. Accordingly, the memory system 1 according to the second embodiment can control the storage capacity of a RAM 22 and a buffer memory 24, and control the circuit area of the controller 20.

In the second embodiment, the sequencer 14 controls, in the first write operation, the interval formed between the threshold distribution at the "M1" level and the threshold distribution at the "M2" level in the four threshold distributions so as to be wider than the intervals between other threshold distributions. The read margin in the IDL in the second write operation is thereby widened, and it is possible to suppress the number of read error bits by the IDL.

Accordingly, the memory system 1 according to the second embodiment can suppress the deterioration of the reliability of the data to be written in the second write operation.

[3] Third Embodiment

Next, a memory system 1 according to a third embodiment will be described. In the memory system 1 according to the third embodiment, data assignment different from that in the memory system 1 described in the second embodiment is applied. Hereinafter, differences between the memory system 1 according to the third embodiment and that according to the first and second embodiments will be described.

[3-1] Data Assignment of Memory Cell

Figure 15:
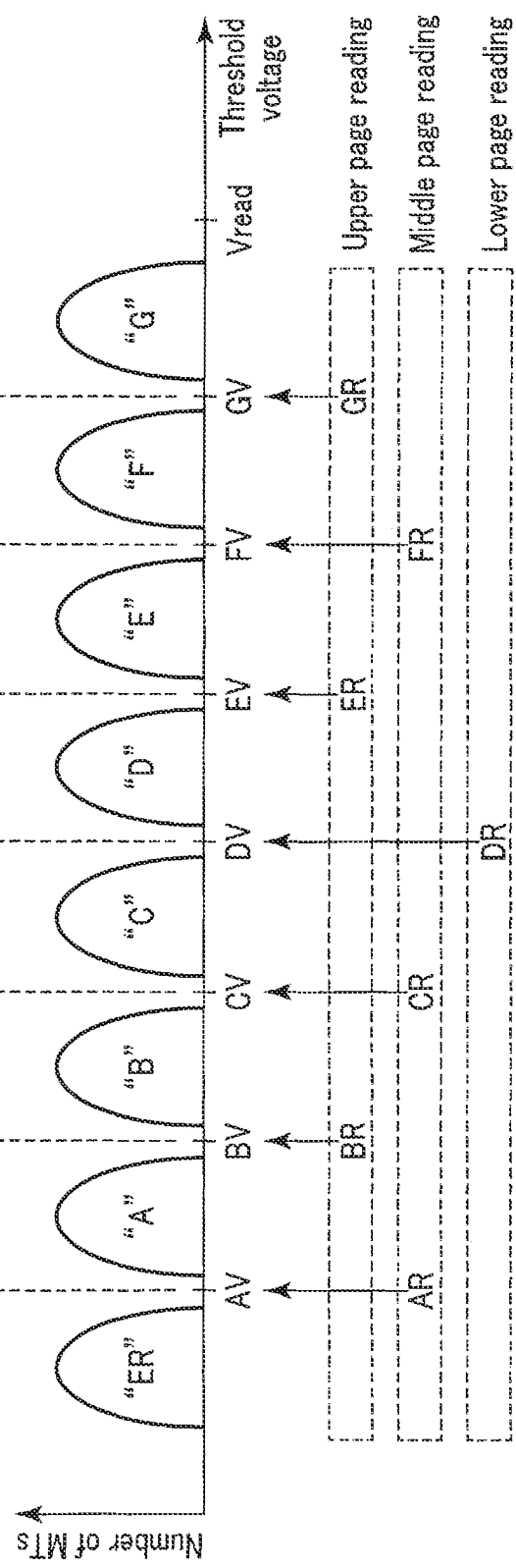
FIG. 15 is a diagram showing threshold distribution and data assignment of memory cells included in a semiconductor memory device according to a third embodiment.

First, data assignment to be applied to the memory system 1 according to the third embodiment will be described with reference to FIG. 15. FIG. 15 shows threshold distribution of memory cell transistors MT, assigned data, and voltages used in write and read operations, and data assignment is different from that shown in FIG. 10 described in the second embodiment.

As shown in FIG. 15, in the present embodiment, data is assigned to the memory cell transistors MT included in each threshold distribution as follows:
"ER" level: "111" ("lower bit/middle bit/upper bit") data,
"A" level: "101" data,
"B" level: "100" data,
"C" level: "110" data,
"D" level: "010" data,
"E" level: "011" data,
"F" level: "001" data, and
"G" level: "000" data.

In the read operation, the lower page data is determined by the read result using a voltage DR. The middle page data is determined by the read results using voltages AR, CR, and FR. The upper page data is determined by the read results using voltages BR, ER, and GR. That is, in the data assignment in the present embodiment, the lower page data, the middle page data, and the upper page data are determined by executing the read operation once, three times, and three times respectively, similar to the data assignment in the second embodiment. The data assignment used in the present embodiment is also referred to as a "1-3-3 code", similar to the second embodiment.

[3-2] Write Operation of Memory System 1

Next, a write operation of the memory system 1 according to the third embodiment will be described. In the write operation in the third embodiment, the details of a first write operation and a second write operation are different from the write operation described in the first embodiment.

Figure 16:
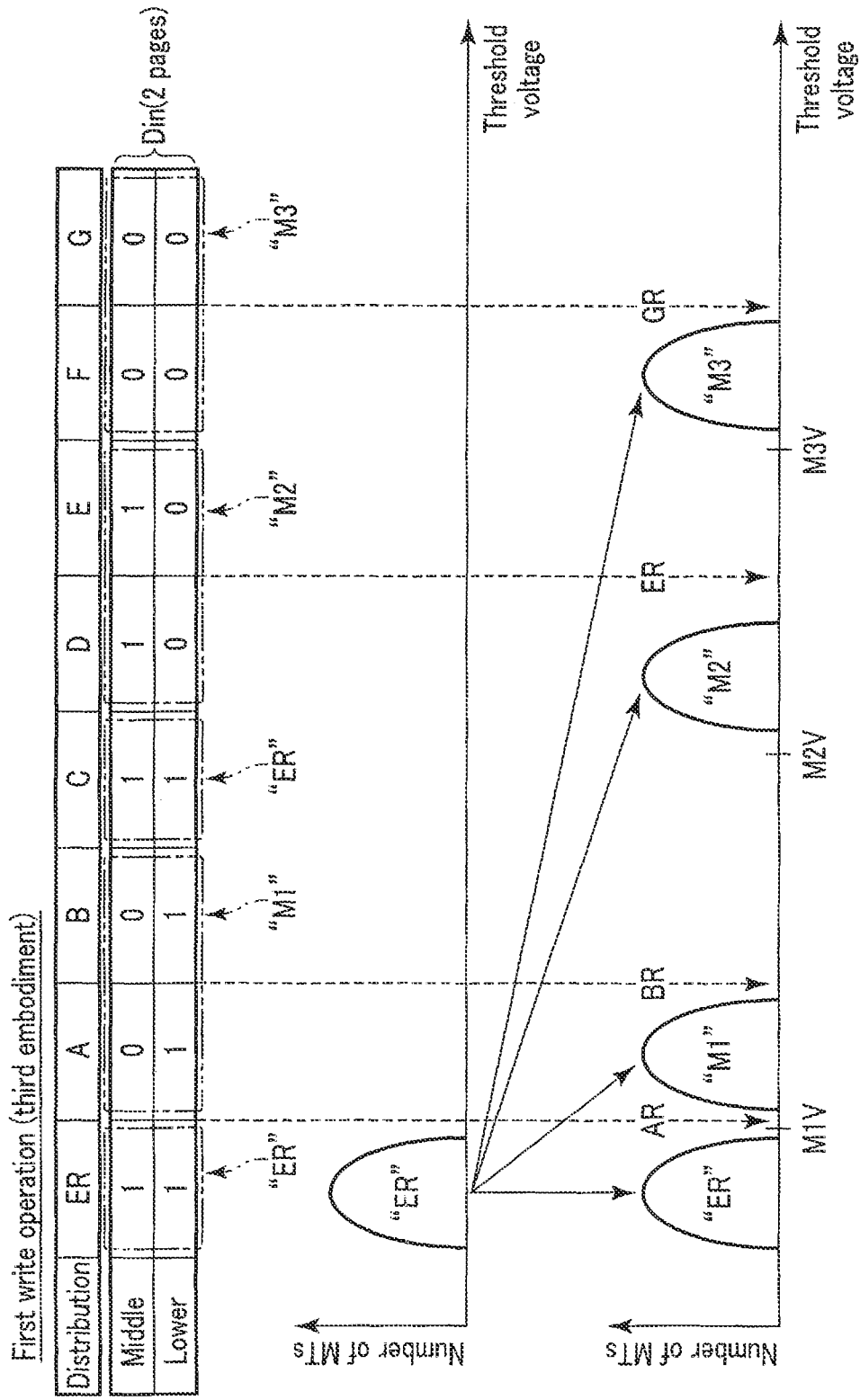
FIG. 16 is a diagram showing an example of a change in threshold distribution in a first write operation of a memory system according to the third embodiment.

First, the details of the first write operation in the third embodiment will be described with reference to FIG. 16. FIG. 16 shows 2-page data used in the first write operation and threshold distributions of the memory cell transistors MT before and after the first write operation is executed.

As shown in FIG. 16, the arrangement of the corresponding threshold distribution after the write operation is different between the first write operation in the third embodiment and the first write operation described in the second embodiment with reference to FIG. 13.

Specifically, a semiconductor memory device 10 sets the memory cell transistors MT to which "11" ("lower bit/middle bit") data is written as a write inhibit state, and executes the write operations using voltages M1V, M2V, and M3V as verify voltages to the memory cell transistors MT to which "10" data, "01" data, and "00" data are written respectively. The voltage M1V is lower than the voltage BR. The voltage M2V is higher than the voltage M1V and lower than the voltage ER. The voltage M3V is higher than voltage M2V and lower than voltage GR. Thus, the threshold voltages of the memory cell transistors MT to which the "11" data is written are distributed to the "ER" level, the threshold voltages of the memory cell transistors MT to which the "10" data is written are distributed to the "M1" level, the threshold voltages of the memory cell transistors MT to which the "01" data is written are distributed to the "M2" level, and the threshold voltages of the memory cell transistors MT to which the "00" data is written are distributed to the "M3" level.

The threshold voltage of the memory cell transistor MT included in the "M1" level is equal to or higher than the voltage M1V and lower than the voltage BR, the threshold voltage of the memory cell transistor MT included in the "M2" level is equal to or higher than the voltage M2V and lower than the voltage ER, and the threshold voltage of the memory cell transistor MT included in the "M1" level is equal to or higher than the voltage M3V and lower than the voltage GR. The verify voltages M1V, M2V, and M3V are set so that the threshold voltages of the memory cell transistors MT having passed the verify do not exceed the voltages BR, ER, and GR respectively. The verify voltages M1V and M2V may be set so that the interval between the threshold distribution at the "M1" level and the threshold distribution at the "M2" level is wider than the intervals between other threshold distributions.

Next, the details of the second write operation in the third embodiment will be described with reference to FIG. 17.

Figure 17:
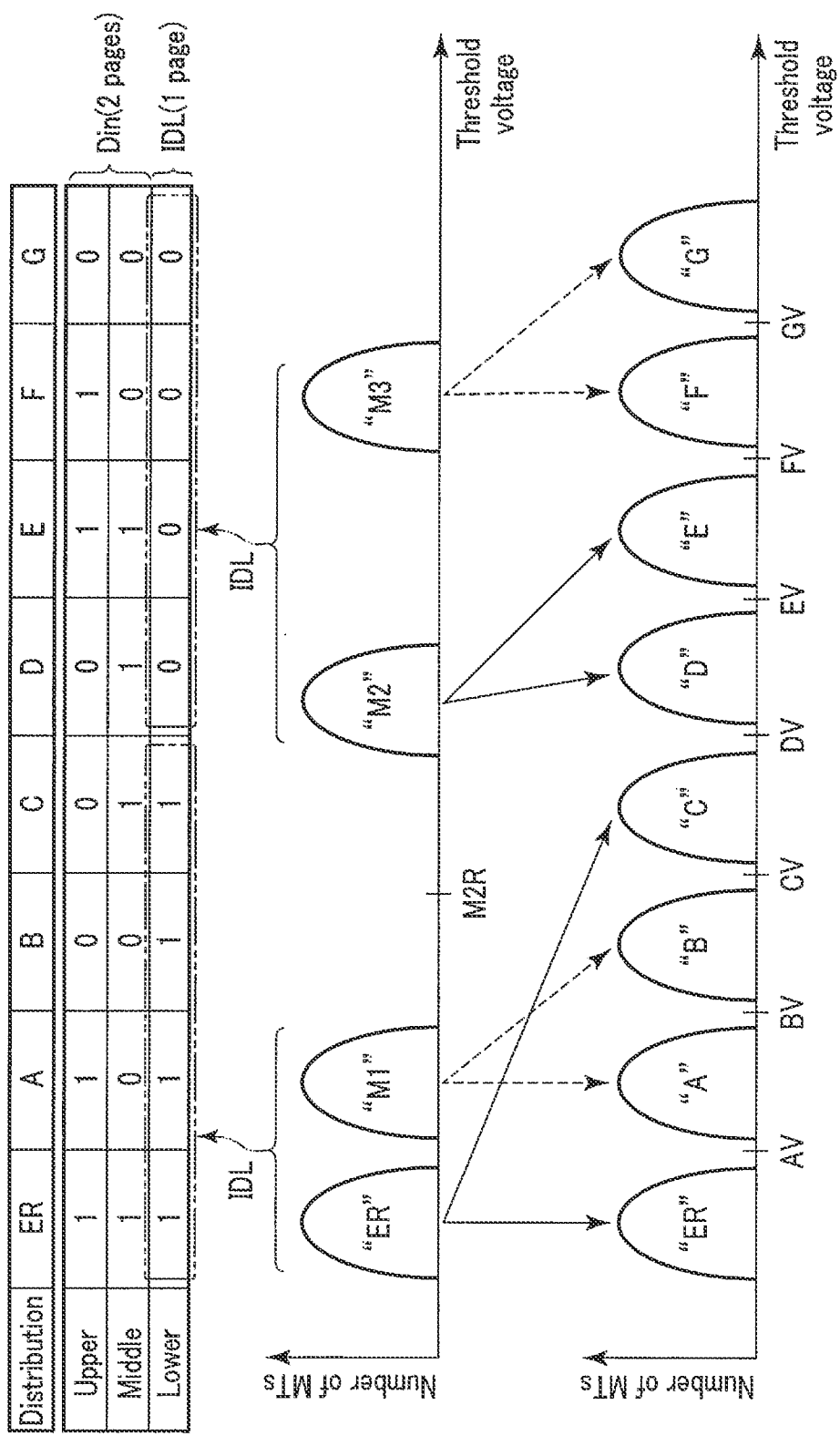
FIG. 17 is a diagram showing an example of a change in threshold distribution in a second write operation of the memory system according to the third embodiment.

FIG. 17 shows 3-page data used in the second write operation and threshold distributions of the memory cell transistors MT before and after the second write operation is executed.

As shown in FIG. 17, the correspondence relationship between the threshold distributions before and after the second write operation is different between the second write operation in the third embodiment and the second write operation described in the second embodiment with reference to FIG. 14.

Specifically, in the second write operation, a sequencer 14 sets the memory cell transistors MT to which "111" ("lower bit/middle bit/upper bit") data is written as a write inhibit state, and executes the write operations using the voltages AV, BV, CV, DV, EV, FV, and GV as verify voltages to the memory cell transistors MT to which "101" data, "100" data, "110" data, "010" data, "011" data, "001" data, and "000" data are respectively written. Thus, the threshold distribution at the "C" level is formed from the threshold distribution at the "ER" level, the threshold distributions at the "A" level and "B" level are formed from the threshold distribution at the "M1" level, the threshold distributions at the "D" level and the "E" level are formed from the threshold distribution at the "M2" level, and the threshold distributions at the "F" level and "G" level are formed from the threshold distribution at the "M3" level.

[3-3] Effects of Third Embodiment

The memory system 1 according to the third embodiment described above executes a two-stage write operation to which the 1-3-3 code different from that in the second embodiment is applied.

In such a case, the memory system 1 can suppress the influences of the initial fall of the threshold voltage and the parasitic capacitance between the adjacent memory cells which occur after data is written, similar to the second embodiment. Accordingly, the memory system 1 according to the third embodiment can further suppress the expansion of the threshold distribution in the writing operation as compared with the first embodiment, and improve the reliability of the written data.

In the memory system 1 according to the third embodiment, the 1-3-3 code shown in FIG. 15 is applied as the assignment of data to be written to the memory cell transistor MT. In this manner, with the 1-3-3 code shown in FIG. 15, it is possible to obtain effects similar to the case of applying the 1-3-3 code shown in FIG. 10. The memory system 1 according to the third embodiment can omit data input for one page in the second write operation, and accelerate the write operation similar to the second embodiment. Furthermore, since the memory system 1 according to the third embodiment can discard the lower page data used by the controller 20 in the first write operation after transmitting the lower page data to the semiconductor memory device 10, the memory system 1 can control the storage capacity of a RAM 22 and a buffer memory 24 similar to the second embodiment, and control the circuit area of the controller 20.

In the third embodiment, the sequencer 14 controls the interval between the threshold distribution at the "M1" level and the threshold distribution at the "M2" level in the four threshold distributions formed in the first write operation so as to be wider than the intervals between other threshold distributions, similar to the second embodiment. That is, the memory system 1 according to the third embodiment can suppress the number of read error bits in the IDL similar to the second embodiment, and can suppress the deterioration of the reliability of the data to be written in the second write operation.

[4] Fourth Embodiment

Next, a memory system 1 according to a fourth embodiment will be described. In the memory system 1 according to the fourth embodiment, data assignment different from that in the memory system 1 described in the second embodiment is applied, and a controller 20 executes a conversion process of write data. Hereinafter, differences between the memory system 1 according to the fourth embodiment and that according to the first to third embodiments will be described.

[4-1] Data Assignment of Memory Cell

First, data assignment to be applied to the memory system 1 according to the fourth embodiment will be described with reference to FIG. 18. FIG. 18 shows threshold distribution of memory cell transistors MT, assigned data, and voltages used in write and read operations, and data assignment is different from that shown in FIG. 10 described in the second embodiment.

As shown in FIG. 18, in the present embodiment, data is assigned to the memory cell transistors MT included in each threshold distribution as follows:
"ER" level: "111" ("lower bit/middle bit/upper bit") data,
"A" level: "011" data,
"B" level: "001" data,
"C" level: "000" data,
"D" level: "010" data,
"E" level: "110" data,
"F" level: "100" data, and
"G" level: "101" data.

In the read voltage, the lower page data is determined by the read results using voltages AR and ER. The middle page data is determined by the read results using voltages BR, DR, and FR. The upper page data is determined by the read results using voltages CR and GR. That is, in the data assignment according to the present embodiment, the lower page data, the middle page data, and the upper page data are determined by executing read operations twice, three times, and twice respectively. Hereinafter, such data assignment is referred to as a "2-3-2 code".

[4-2] Write Operation of Memory System 1

Next, a write operation of the memory system 1 according to the fourth embodiment will be described with reference to FIG. 19. FIG. 19 shows a flowchart of the write operation of the memory system 1. Steps S50 to S64 shown in FIG. 19 correspond to steps S30 to S44 respectively described in the second embodiment with reference to FIG. 11. In the present embodiment, differences from the second embodiment are that the controller 20 executes the conversion process of the write data before transmitting first and second command sets, and that the converted write data is written by first and second write operations.

As shown in FIG. 19, the controller 20 executes a first data conversion process (step ST1) before transmitting the first command set to a semiconductor memory device 10 (for example, before step S50). The controller 20 further executes a second data conversion process (step ST2) before transmitting the second command set to the semiconductor memory device 10 (for example, before step S56).

Figure 20:
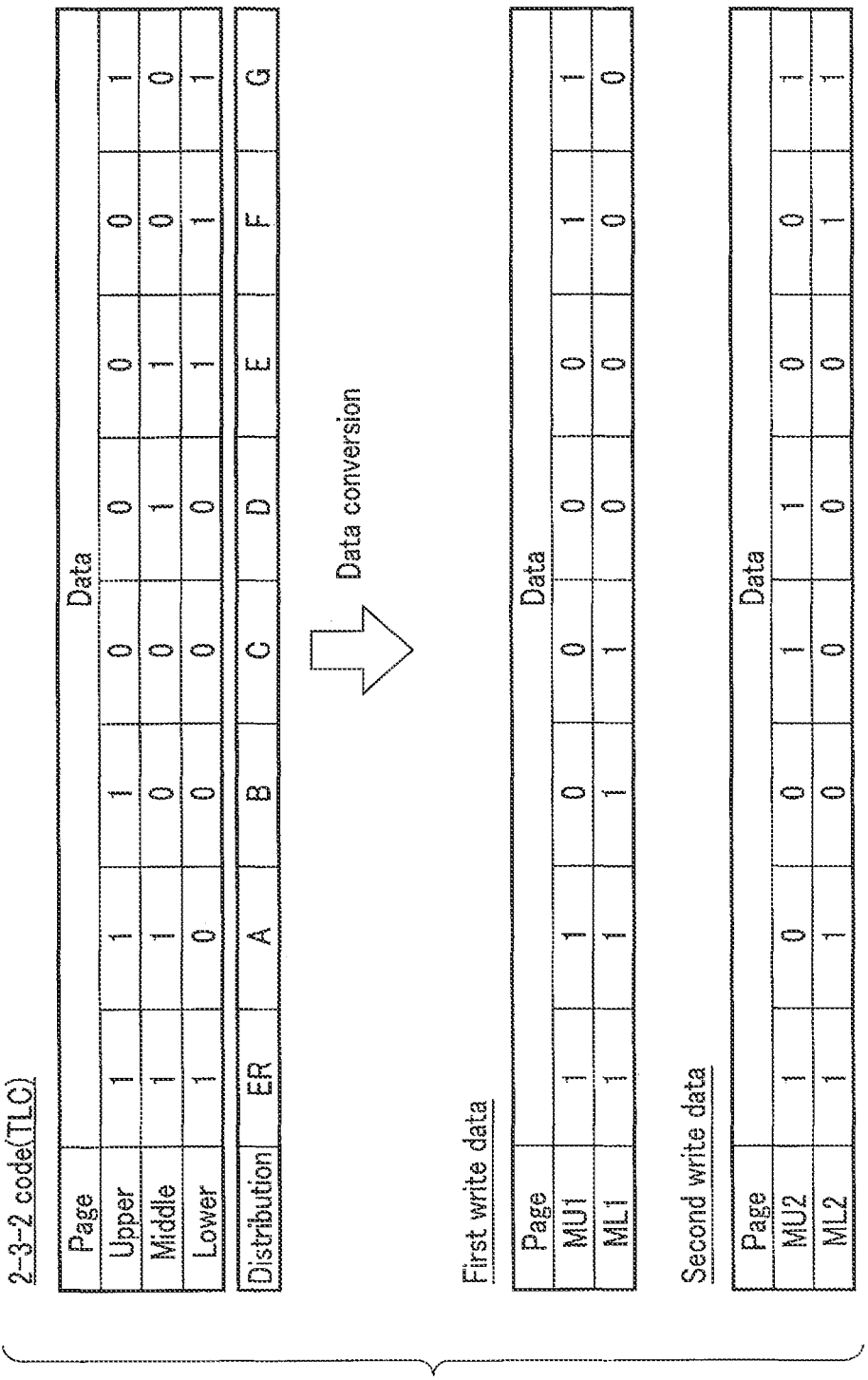
FIG. 20 is a diagram showing an example of a data conversion process in the write operation of the memory system according to the fourth embodiment.

Here, the first and second data conversion processes will be described with reference to FIG. 20. FIG. 20 shows data assignment to be applied to write data received from a host apparatus 30 and various types of write data generated from the write data.

As shown in FIG. 20, the controller 20 applies the 2-3-2 code to the write data received from the host apparatus 30. Then, the controller 20 generates first write data to be used in the first write operation by the first data conversion process from the write data to which the 2-3-2 code is applied, and generates second write data to be used in the second write operation by the second data conversion process.

In the first write data constituted by two pages, "11" (first lower bit/first upper bit after data conversion) data is assigned to the data corresponding to the "ER" level and the "A" level, "10" data is assigned to the data corresponding to the "B" level and the "C" level, "00" data is assigned to the data corresponding to the "D" level and the "E" level, and "01" data is assigned to the data corresponding to the "F" level and the "G" level. Hereinafter, among the 2-page data, the lower page data after the data conversion is referred to as a first lower page data ML1, and the upper page data after the data conversion is referred to as a first upper page data MU1.

In the second write data constituted by two pages, "11" (second lower bit/second upper bit after data conversion) data is assigned to the data corresponding to the "ER" level and the "G" level, "10" data is assigned to the data corresponding to the "A" level and the "F" level, "00" data is assigned to the data corresponding to the "B" level and the "E" level, and "01" data is assigned to the data corresponding to the "C" level and the "D" level. Hereinafter, among the 2-page data, the lower page data after the data conversion is referred to as a second lower page data ML2, and the upper page data after the data conversion is referred to as a second upper page data MU2.

As described above, in the present embodiment, the data assignment based on the 2-3-2 code is different from the data assignment based on the first and second write data.

Figure 21:
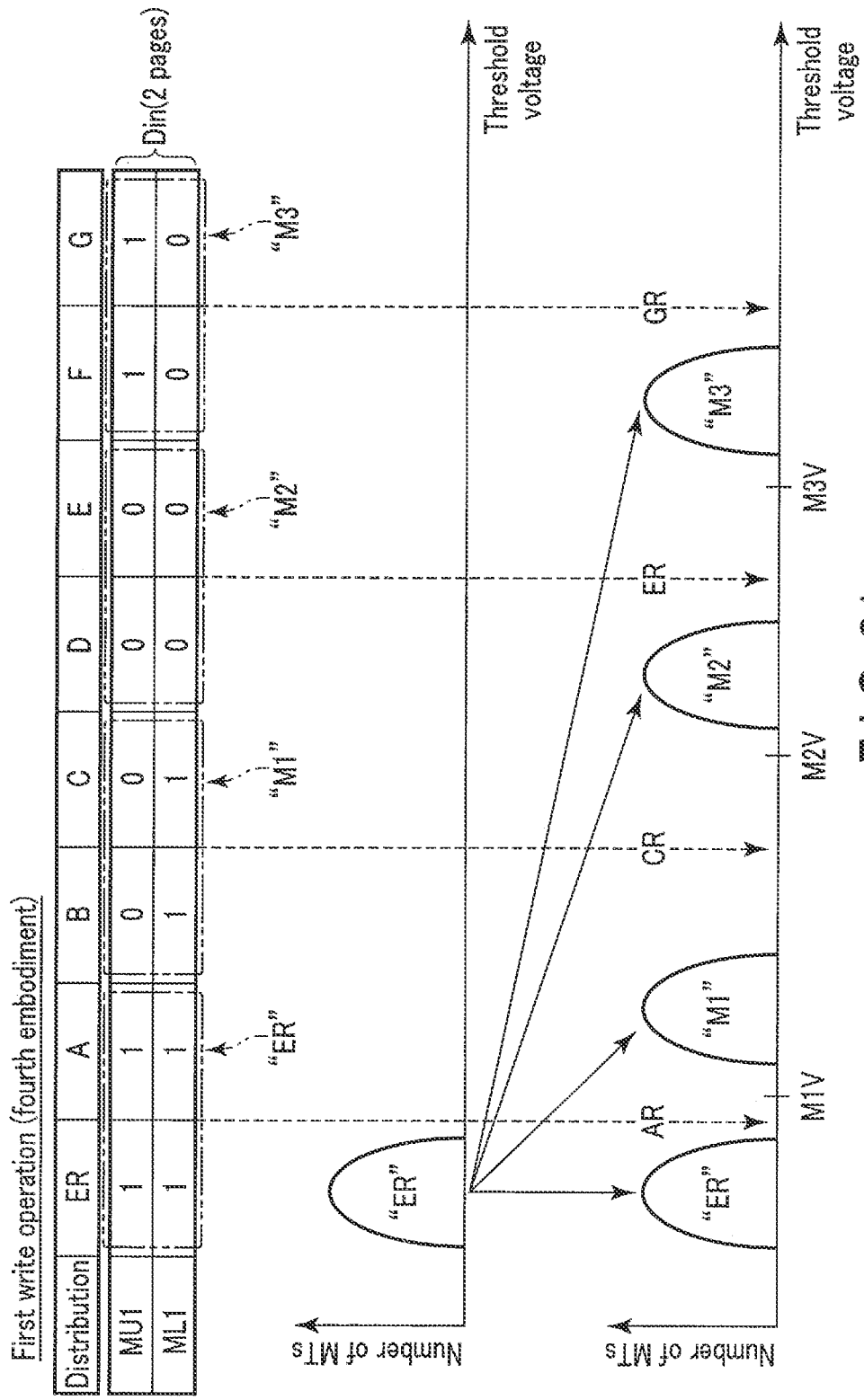
FIG. 21 is a diagram showing an example of a change in threshold distribution in a first write operation of the memory system according to the fourth embodiment.

Next, the details of the first write operation in the fourth embodiment will be described with reference to FIG. 21. FIG. 21 shows 2-page data used in the first write operation and threshold distributions of the memory cell transistors MT before and after the first write operation is executed.

As shown in FIG. 21, the threshold voltages of the memory cell transistors MT before the execution of the first write operation are distributed to the "ER" level, which is an erase state. In the first write operation, the semiconductor memory device 10 executes the write operation for 2-page data based on the first lower page data ML1 and the first upper page data MU1 input from the controller 20, and forms four threshold distributions from the threshold distribution at the "ER" level.

Specifically, the semiconductor memory device 10 sets the memory cell transistor MT to which "11" ("first lower bit/first upper bit after data conversion") data is written as a write inhibit state, and executes the write operation using voltages M1V, M2V, and M3V as verify voltages to the memory cell transistors MT to which "10" data, "00" data, and "01" data are written respectively. The voltage M1V is lower than the voltage CR. The voltage M2V is higher than the voltage M1V and lower than the voltage ER. The voltage M3V is higher than voltage M2V and lower than voltage GR. Thus, the threshold voltages of the memory cell transistors MT to which the "11" data is written are distributed to the "ER" level, the threshold voltages of the memory cell transistors MT to which the "10" data is written are distributed to the "M1" level, the threshold voltages of the memory cell transistors MT to which the "00" data is written are distributed to the "M2" level, and the threshold voltages of the memory cell transistors MT to which the "01" data is written are distributed to the "M3" level.

The threshold voltage of the memory cell transistor MT included in the "M1" level is equal to or higher than the voltage M1V and lower than the voltage CR, the threshold voltage of the memory cell transistor MT included in the "M2" level is equal to or higher than the voltage M2V and lower than the voltage ER, and the threshold voltage of the memory cell transistor MT included in the "M1" level is equal to or higher than the voltage M3V and lower than the voltage GR. The verify voltages M1V, M2V, and M3V are set so that the threshold voltages of the memory cell transistors MT having passed the verify do not exceed the voltages CR, ER, and GR respectively. The verify voltages M1V and M2V may be set so that the interval between the threshold distribution at the "M1" level and the threshold distribution at the "M2" level is wider than the intervals between other threshold distributions.

Figure 22:
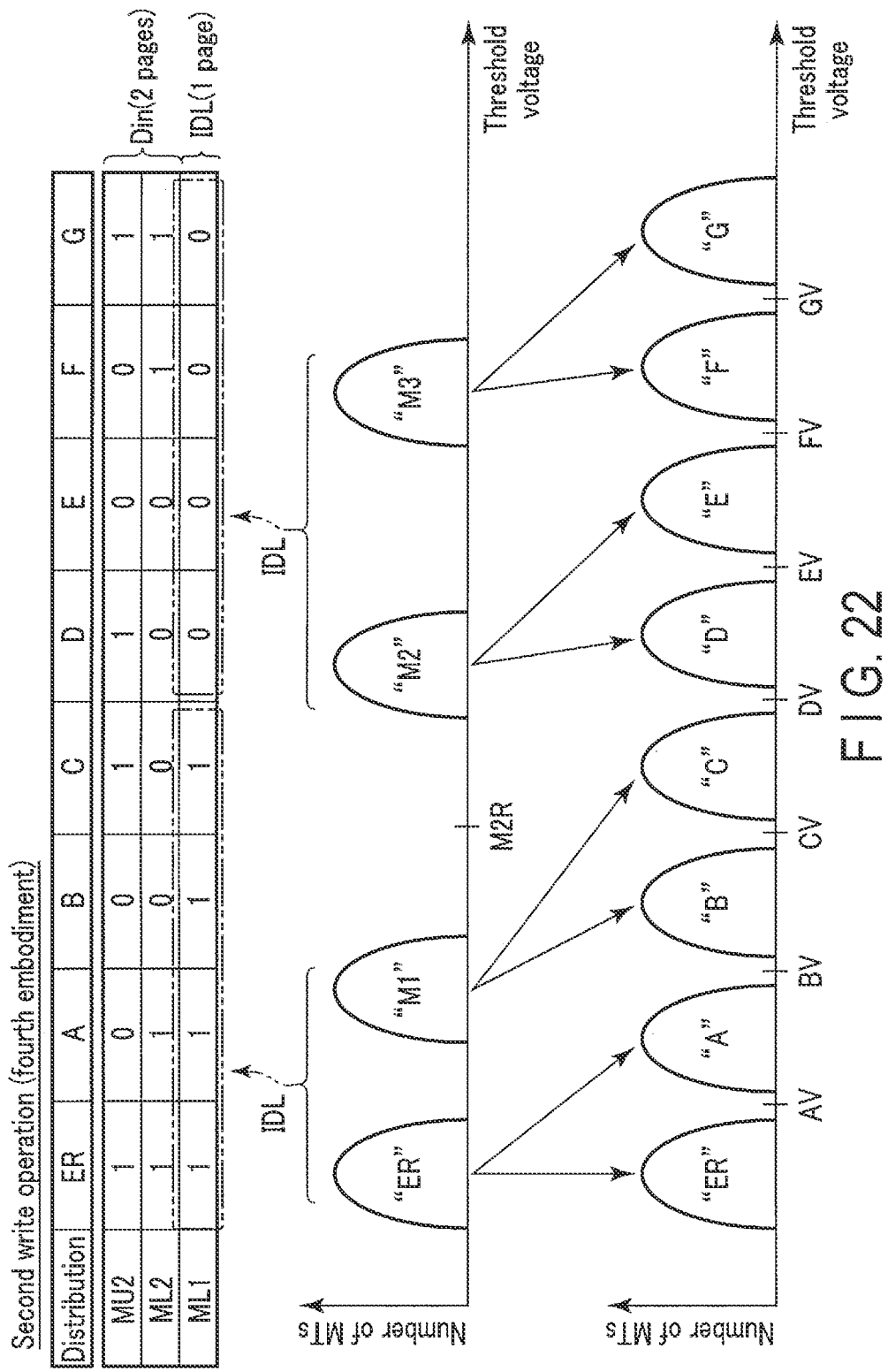
FIG. 22 is a diagram showing an example of a change in threshold distribution in a second write operation of the memory system according to the fourth embodiment.

Next, the details of the second write operation in the fourth embodiment will be described with reference to FIG. 22. FIG. 22 shows 3-page data used in the second write operation and threshold distributions of the memory cell transistors MT before and after the second write operation is executed.

As shown in FIG. 22, the threshold voltages of the memory cell transistors MT before the execution of the second write operation are distributed to the "ER" level, the "M1" level, the "M2" level, and "M3" level. In the second write operation, the semiconductor memory device 10 executes the write operation for 3-page data based on the second lower page data ML2 and the second upper page data MU2 input from the controller 20 and the first lower page data ML1 read from a memory cell array 11, and forms eight threshold distributions from the threshold distributions at the "ER" level, the "M1" level, the "M2" level, and the "M3" level.

Specifically, a sequencer 14 first executes an internal data load (IDL). In the IDL in the present embodiment, a read operation using a voltage M2R is executed. The voltage M2R is a voltage set between the threshold distribution at the "M1" level and the threshold distribution at the "M2" level. Therefore, since the lower page data at the "ER" level and the "M1" level is "1" and the first lower page data ML1 at the "M2" level and the "M3" level is "0", a sense amplifier module 17 can determine whether the lower page data is "1" or "0" by determining whether or not the threshold voltage of the memory cell transistor MT is lower than the voltage M2R. In this manner, the semiconductor memory device 10 restores "1" data and "0" data (first lower page data ML1) written by the first write operation to a latch circuit in a sense amplifier unit SAU.

Next, the sequencer 14 sets the memory cell transistors MT to which "111" ("first lower bit/second lower bit/second upper bit after data conversion") data is written as a write inhibit state, and executes the write operations using the voltages AV, BV, CV, DV, EV, FV, and GV as verify voltages to the memory cell transistors MT to which "110" data, "100" data, "101" data, "001" data, "000" data, "010" data, and "011" data are written respectively. Thus, the threshold distribution at the "A" level is formed from the threshold distribution at the "ER" level, the threshold distributions at the "B" level and "C" level are formed from the threshold distribution at the "M1" level, the threshold distributions at the "D" level and the "E" level are formed from the threshold distribution at the "M2" level, and the threshold distributions at the "F" level and "G" level are formed from the threshold distribution at the "M3" level.

In the example shown in FIG. 19, it has been described that the write operation (for example, after steps S51, S54, S57, S60, and S63) is executed, and then the next command set and data are input after a ready/busy signal RBn becomes the "H" level, but the operation order is not limited thereto. For example, by having an extra number of latch circuits (for example, latch circuits XDL) described with reference to FIG. 2 for write cache usage, it is possible to input the next command set and data during the write operation.

The command sequence in the write operation described above is similar to the command sequence described in the second embodiment with reference to FIG. 12 in that the content of the write data transmitted from the controller 20 is changed. Specifically, the first command set used in the present embodiment is similar in that the lower page data and the middle page data in the first command set shown in FIG. 12 are converted to the first lower page data ML1 and the first upper page data MU1 respectively. The second command set used in the present embodiment is similar in that the middle page data and the upper page data in the second command set shown in FIG. 12 are respectively converted to the second lower page data ML2 and the second upper page data MU2.

[4-3] Effects of Fourth Embodiment

The memory system 1 according to the fourth embodiment described above further executes the data conversion process to the write data received from the host apparatus 30 and to which data is assigned, and executes the first and second write operations similar to those in the second and third embodiments using the converted data. As a result, in the memory system 1 according to the fourth embodiment, the data to be read in the read operation is similar to the write data before the data conversion. Thus, the memory system 1 according to the fourth embodiment can selectively execute the data assignment suitable for the read operation and the data assignment suitable for the write operation.

Specifically, in the memory system 1 according to the fourth embodiment, the data assignment shown in FIG. 20 is respectively applied to the first and second write data after the data conversion used in first and second write operations. Since the first write data is evenly assigned to the eight threshold distributions, it is possible to write the data to the memory cell transistor MT to a high threshold voltage in the first write operation. That is, in the second write operation in the fourth embodiment, it is possible to suppress the variation amount of the threshold voltage, similar to the second and third embodiments, and to suppress the influences of the initial fall of the threshold voltage and the parasitic capacitance between the adjacent memory cells which occur after data is written.

In the memory system 1 according to the fourth embodiment, the 2-3-2 code shown in FIG. 18 is applied as the data assignment to the write data before the data conversion process. In the 2-3-2 code, the number of read times for determining each page data is averaged, and by determining the data by reading at the voltages BR, DR, and FR at which error bits are relatively hard to generate in the read operation for the middle page which needs to be read three times, an increase in the number of error bits due to the increase in the number of read times is suppressed. Thus, the memory system 1 can disperse the number of error bits generated in the read operations for the lower page, the middle page, and the upper page in the 3-page data read operation, and enhance the possibility of succeeding in the error correction by the ECC circuit 25.

The memory system 1 according to the fourth embodiment described above can suppress the expansion of the threshold distribution in the write operation similar to the second and third embodiments, and suppress the number of error bits in the read operation. Accordingly, the memory system 1 according to the fourth embodiment can further improve the reliability of the written data and the reliability of the read operation, as compared with the first embodiment.

As described above, in the fourth embodiment, since the data assignment during the read operation is different from that during the write operation, the data transmitted from the controller 20 to the semiconductor memory device 10 during the write operation is different from the data transmitted from the semiconductor memory device 10 to the controller 20 during the read operation.

Figure 23:
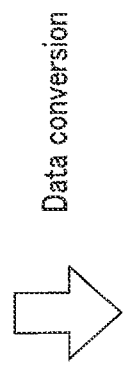
FIG. 23 is a diagram showing an example of a data conversion process of a write operation of a memory system according to a variation of the fourth embodiment.

The second write data described above may be assigned as shown in FIG. 23. Specifically, as shown in FIG. 23, "11" (second lower bit/second upper bit after data conversion) data is assigned to the data corresponding to the "ER" level and the "F" level, "10" data is assigned to the data corresponding to the "A" level and the "G" level, "01" data is assigned to the data corresponding to the "B" level and the "D" level, and "00" data is assigned to the data corresponding to the "C" level and the "E" level. In such a case, it is possible to execute the write operation described in the fourth embodiment.

The memory system 1 according to the fourth embodiment executes the second write operation using the IDL, similar to the second and third embodiments. Accordingly, the memory system 1 according to the fourth embodiment can shorten the time of data input in the second write operation, and can accelerate the write operation similar to the second and third embodiments.

The memory system 1 according to the fourth embodiment controls the interval between the threshold distribution at the "M1" level and the threshold distribution at the "M2" level in the four threshold distributions formed in the first write operation so as to be wider than the intervals between other threshold distributions, similar to the second and third embodiments. Accordingly, the memory system 1 according to the present embodiment can suppress the number of read error bits generated in the IDL, similar to the second and third embodiments, and suppress the deterioration of the reliability of the data to be written in the second write operation.

[5] Fifth Embodiment

Next, a memory system 1 according to a fifth embodiment will be described. In the fifth embodiment, a data conversion process different from that in the memory system 1 described in the fourth embodiment is executed, and the IDL of 2-page data is executed in a second write operation using a soft bit. Hereinafter, differences between the memory system 1 according to the fifth embodiment and that according to the first to fourth embodiments will be described.

[5-1] Write Operation of Memory System 1

Hereinafter, a write operation of the memory system 1 according to the fifth embodiment will be described. The write operation in the fifth embodiment is different from the write operation described in the fourth embodiment in details of a write data conversion process, a first write operation, and a second write operation.

First, the data conversion process in the fifth embodiment will be described with reference to FIG. 24. FIG. 24 shows data assignment to be applied to write data received from a host apparatus 30 and various types of write data converted from the write data.

As shown in FIG. 24, the data conversion process in the fifth embodiment is different in the assignment of second write data from the data conversion process described in the fourth embodiment with reference to FIG. 20. Specifically, in the second write data, "11" (second lower bit/second upper bit after data conversion) data is assigned to the data corresponding to an "ER" level and a "D" level, "10" data is assigned to the data corresponding to an "A" level and an "E" level, "00" data is assigned to the data corresponding to a "B" level and an "F" level, and "01" data is assigned to the data corresponding to a "C" level and a "G" level.

Figure 25:
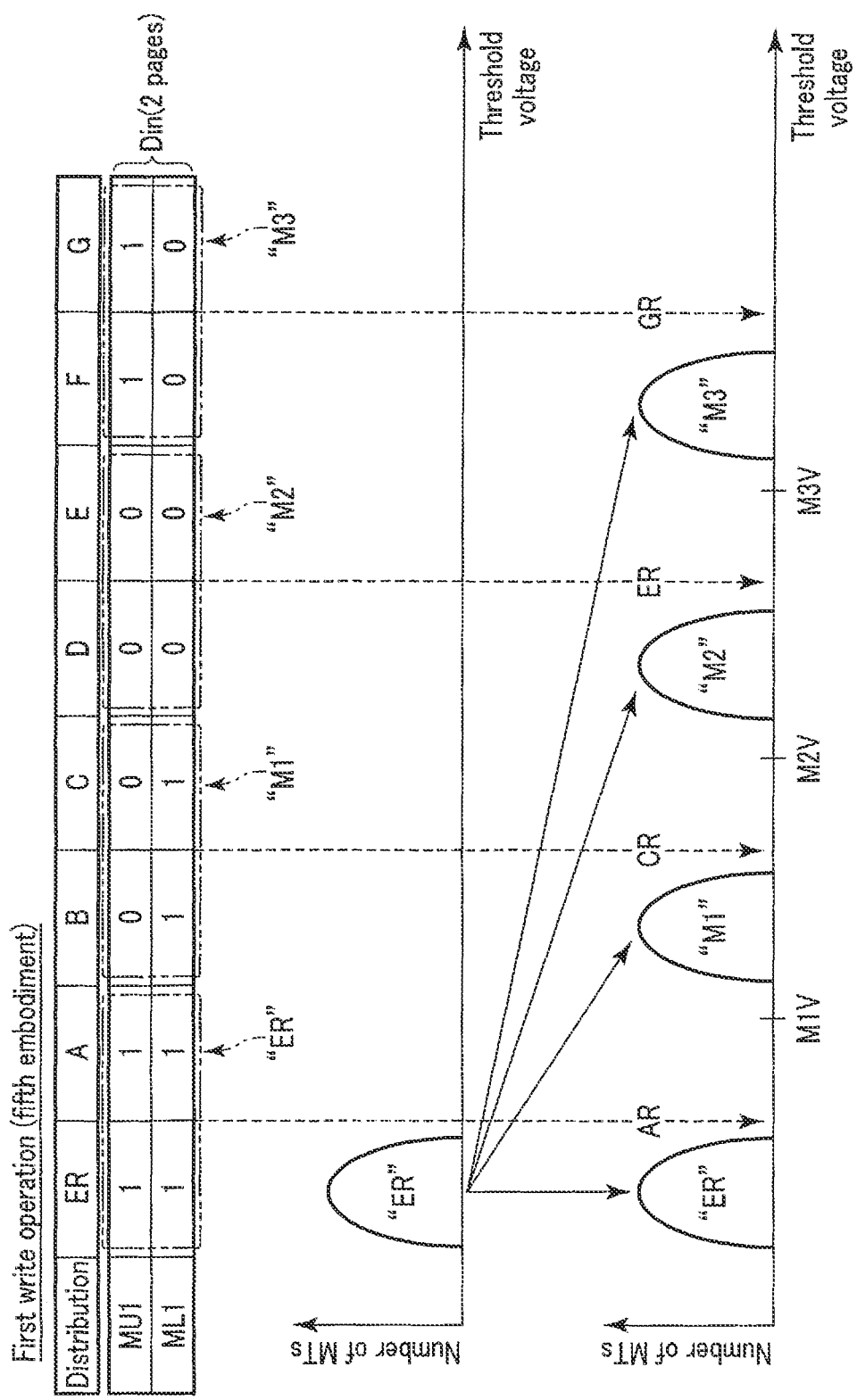
FIG. 25 is a diagram showing an example of a change in threshold distribution in a first write operation of the memory system according to the fifth embodiment.

Next, the first write operation in the fifth embodiment will be described with reference to FIG. 25. FIG. 25 shows 2-page data used in the first write operation and threshold distributions of the memory cell transistors MT before and after the first write operation is executed.

As shown in FIG. 25, in the first write operation in the fifth embodiment, the write operation for 2-page data is executed based on a first command set including first lower page data ML1 and first upper page data MU1. In the first write operation in the fifth embodiment, the interval between the threshold distributions is different from that in the first write operation described in the fourth embodiment with reference to FIG. 21. Specifically, in the first write operation in the fifth embodiment, verify voltages M1V, M2V, and M3V are set so that the threshold distributions at, for example, the "ER" level, the "M1" level, the "M2" level, and the "M3" level are evenly arranged as much as possible. Since the other operations are similar to the operations described in the fourth embodiment with reference to FIG. 21, the description thereof is omitted.

Next, the second write operation in the fifth embodiment will be described with reference to FIG. 26. FIG. 26 shows 4-page data used in the second write operation and threshold distributions of the memory cell transistors MT before and after the second write operation is executed.

As shown in FIG. 26, the threshold voltages of the memory cell transistors MT before the execution of the second write operation are distributed to the "ER" level, the "M1" level, the "M2" level, and the "M3" level. In the second write operation, a semiconductor memory device 10 executes write operation for 3-page data based on second upper page data MU2 and second lower page data ML2 input from a controller 20, and the first lower page data ML1 and the first upper page data MU1 corrected using a soft bit, and forms eight threshold distributions from the threshold distributions at the "ER" level, the "M1" level, the "M2" level, and the "M3" level.

Specifically, the sequencer 14 first executes an internal data load (IDL). In the IDL in the fifth embodiment, the read operation using voltages M1R, M2R, and M3R is executed. The voltage M1R is a voltage set between the threshold distribution at the "ER" level and the threshold distribution at the "M1" level, the voltage M2R is a voltage set between the threshold distribution at the "M1" level and the threshold distribution at the "M2" level, and the voltage M1R is a voltage set between the threshold distribution at the "ER" level and the threshold distribution at the "M1" level.

A sense amplifier part SA determines whether the threshold voltage of the memory cell transistor MT is included in which threshold distribution at the "ER" level, the "M1" level, the "M2" level, or the "M3" level by the read operation using the voltages M1R, M2R, and M3R, and transfers the determined 2-bit data to a latch circuit in a sense amplifier unit SAU. Then, an operation unit OP executes a data correction process using the read 2-bit data, the second lower page data ML2 received from the controller 20, and a soft bit. The soft bit indicates data read using a read voltage shifted to the plus side or the minus side as compared with the ordinary read voltage.

Figure 27:
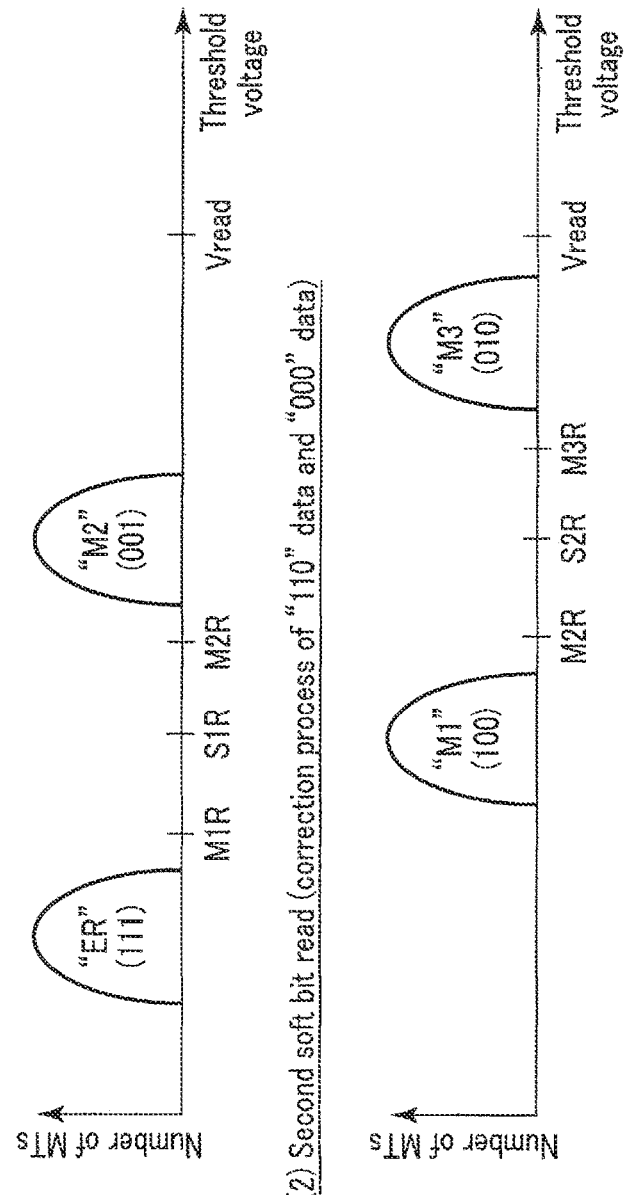
FIG. 27 is a diagram showing an example of an internal data load using a soft bit in the second write operation of the memory system according to the fifth embodiment.

Here, an example of the data correction process using the second lower page data ML2 and the soft bit will be described with reference to FIG. 27. FIG. 27 shows a table for explaining the data correction process and threshold distribution for explaining a soft bit read executed in the data correction process.

In the second write operation, it can be regarded that the second lower page data ML2 received from the controller 20 does not include error bits. On the other hand, the 2-page data read from a memory cell array 11 during the IDL probably includes error bits. Taking these points into consideration, eight kinds of data shown in FIG. 27 can be listed as data retained in the latch circuit of each sense amplifier unit SAU.

Since data "111" (first lower bit/first upper bit/second lower bit after data conversion) data, "100" data, "001" data, and "010" data shown in FIG. 27 match the combination of the data shown in FIG. 26, it is considered that the data is read correctly. On the other hand, since "110" data, "101" data, "000" data, and "010" data shown in FIG. 27 do not match the combination of the data shown in FIG. 26, the data is regarded as error data.

Among the error data, the "101" data and the "011" data are considered to correctly be either "001" data or "111" data because the second lower bit data is regarded as correct data. Similarly, the "110" data and the "000" data among the error data are considered to correctly be either "100" data or "010" data. Based on these points, the sequencer 14 executes the first and second soft bit read, and the error data is corrected by the operation unit OP.

In the first soft bit read, the "101" data and the "011" data are corrected. Specifically, the sequencer 14 executes the read operation using a read voltage S1R to the memory cell transistor MT in which the data is determined as the "101" data and the "011" data, and the operation unit OP corrects the error data. The voltage S1R is higher than the voltage M1R and lower than the voltage M2R, and is set to, for example, a voltage included in the "M1" level. By this read operation, the sense amplifier part SA determines whether the threshold voltage of the memory cell transistor MT is included in which threshold distribution at the "ER" level or the "M2" level. Based on the read result, the operation unit OP corrects the data in the memory cell transistor MT determined as the "101" data and the "011" data to the "111" data when the threshold voltage thereof is equal to or lower than the voltage S1R, and corrects the data to the "001" data when the threshold voltage exceeds the voltage S1R.

In the second soft bit read, the "110" data and the "000" data are corrected. Specifically, the sequencer 14 executes the read operation using a read voltage S2R to the memory cell transistor MT in which the data is determined as the "110" data and the "000" data, and the operation unit OP corrects the error data. The voltage S2R is higher than the voltage M2R and lower than the voltage M3R, and is set to, for example, a voltage included in the "M2" level. By this read operation, the sense amplifier part SA determines whether the threshold voltage of the memory cell transistor MT is included in which threshold distribution at the "M1" level or the "M3" level. Based on the read result, the operation unit OP corrects the data in the memory cell transistor MT determined as the "100" data and the "010" data to the "100" data when the threshold voltage thereof is equal to or lower than the voltage S2R, and corrects the data to the "010" data when the threshold voltage exceeds the voltage S2R.

The details of the read operation using the soft bit described above are disclosed in, for example, U.S. patent application Ser. No. 12/504,966 entitled "Semiconductor memory device and semiconductor storage system" filed on Jul. 17, 2009. It is also disclosed in U.S. patent application Ser. No. 14/688,442 entitled "Semiconductor memory device" filed on Apr. 16, 2015. These patent applications are incorporated by reference herein in their entirety.

As described above, the "11" (first lower bit/first upper bit after data conversion) data, the "10" data, the "00" data, and the "01" data written by the first write operation are restored to the latch circuit in the sense amplifier unit SAU by the IDL using the second lower page data ML2 and the soft bit.

The sequencer 14 sets the memory cell transistors MT to which "111" ("first lower bit/first upper bit/second upper bit after data conversion") data is written as a write inhibit state, and executes the write operations using the voltages AV, BV, CV, DV, EV, FV, and GV as the verify voltages to the memory cell transistors MT to which "110" data, "100" data, "101" data, "001" data, "000" data, "010" data, and "011" data are written respectively. Thus, the threshold distribution at the "A" level is formed from the threshold distribution at the "ER" level, the threshold distributions at the "B" level and "C" level are formed from the threshold distribution at the "M1" level, the threshold distributions at the "D" level and the "E" level are formed from the threshold distribution at the "M2" level, and the threshold distributions at the "F" level and "G" level are formed from the threshold distribution at the "M3" level.

In the first and second write operations described above, the waveform of the voltage applied to a selected word line WL is, for example, as shown in FIG. 28. FIG. 28 shows an example of an input/output signal I/O and a voltage applied to a selected word line WL.

As shown in FIG. 28, the write operation in the fifth embodiment is different from the write operation described in the first embodiment with reference to FIG. 9 in the waveform of a selected word line WL_sel during the IDL period in the second write operation.

Specifically, in the second write operation, first, a row decoder 16 sequentially applies the read voltages M1R, M2R, and M3R to the selected word line WL_sel. Subsequently, the row decoder 16 sequentially applies the read voltages S1R and S2R to the selected word line WL_sel. The periods during the voltages M1R, M2R, M3R, S1R, and S2R that are applied to the selected word line WL_sel correspond to the IDL.

The order and the timing of applying each read voltage during the IDL period are not limited thereto. For example, the voltages S1R and S2R corresponding to the soft bit read may not be applied consecutively. Alternatively, the read voltages may be applied in the order of, for example, the voltages M1R, S1R, M2R, S2R, and M3R during the IDL period. The order of executing the normal read operation and the soft bit read during the IDL period is not particularly limited. Since the other operations are similar to the operations described in the first embodiment with reference to FIG. 9, the description thereof is omitted.

[5-2] Effects of Fifth Embodiment

The memory system 1 according to the fifth embodiment described above executes the IDL of 2-page data using 1-page data received from the controller 20 and the soft bit in the second write operation described in the fourth embodiment.

Thus, the memory system 1 according to the fifth embodiment can correct errors of 2-page data read by the IDL. Accordingly, the memory system 1 according to the fifth embodiment can improve the reliability of the write data in the second write operation using the IDL of 2-page data, and improve the reliability of the written data.

The memory system 1 according to the fifth embodiment can suppress the expansion of the threshold distribution in the write operation similar to the fourth embodiment, and can suppress the number of error bits in the read operation. Accordingly, the memory system 1 according to the fifth embodiment can further improve the reliability of the written data and the reliability of the read operation, as compared with the first embodiment.

Figure 29:
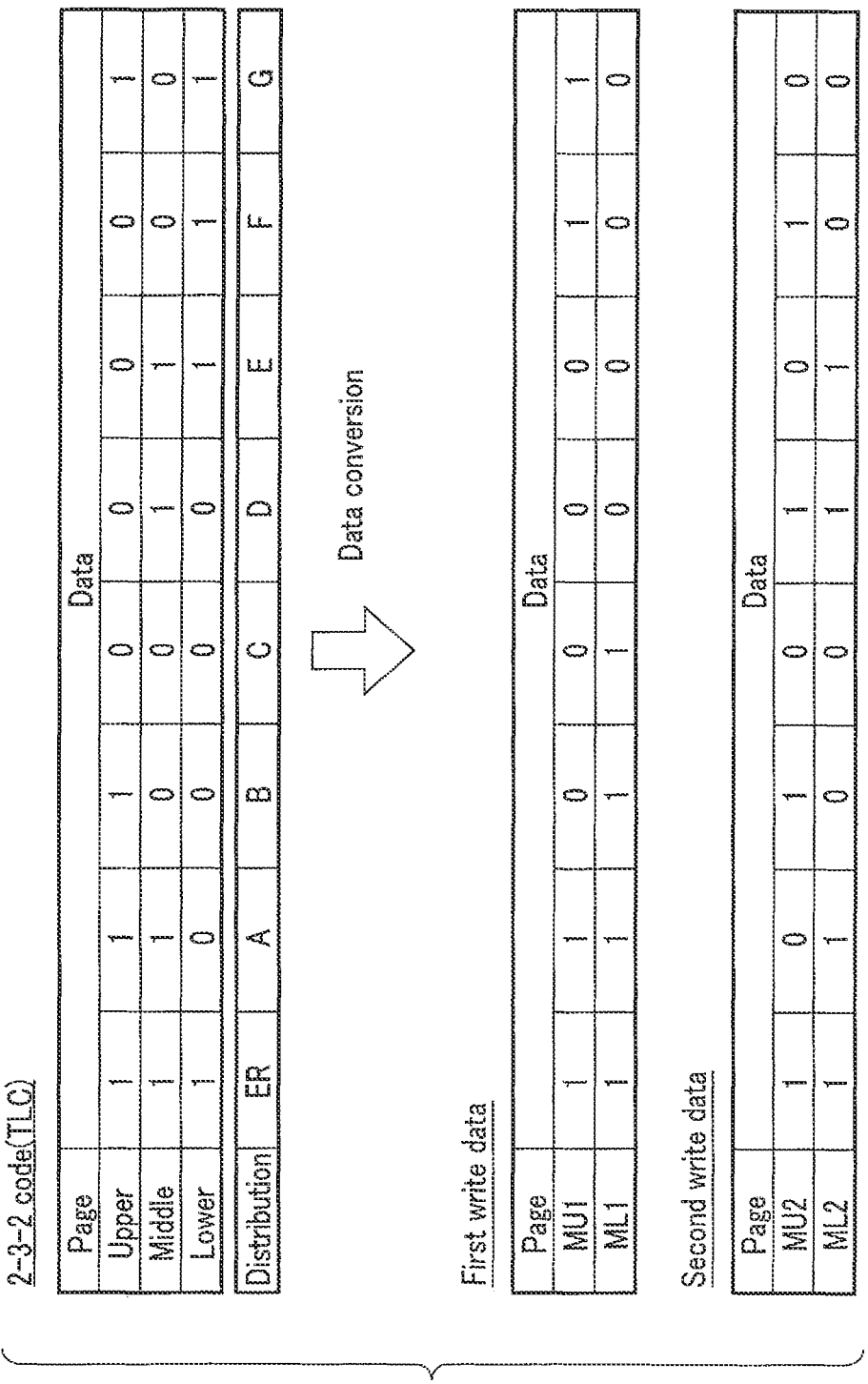
FIG. 29 is a diagram showing an example of a data conversion process of a write operation of a memory system according to a variation of the fifth embodiment.

The second write data described above may be assigned as shown in FIG. 29. Specifically, as shown in FIG. 29, "11" (second lower bit/second upper bit after data conversion) data is assigned to the data corresponding to the "ER" level and the "D" level, "10" data is assigned to the data corresponding to the "A" level and the "E" level, "01" data is assigned to the data corresponding to the "B" level and the "F" level, and "00" data is assigned to the data corresponding to the "C" level and the "F" level. In such a case, it is possible to execute the write operation described in the fifth embodiment.

In the memory system 1 according to the fifth embodiment, the data to be read in the read operation is similar to the write data before the data conversion, similar to the fourth embodiment. In the present embodiment as well, the data transmitted from the controller 20 to the semiconductor memory device 10 during the first write operation is different from the data transmitted from the semiconductor memory device 10 to the controller 20 during the read operation, similar to the fourth embodiment.

[6] Sixth Embodiment

Next, a memory system 1 according to a sixth embodiment will be described. The memory system 1 according to the sixth embodiment executes the second write operation in the fourth embodiment based on 3-page data received from a controller 20. Hereinafter, differences between the memory system 1 according to the sixth embodiment and those according to the first to fifth embodiments will be described.

[6-1] Write Operation of Memory System 1

Figure 30:
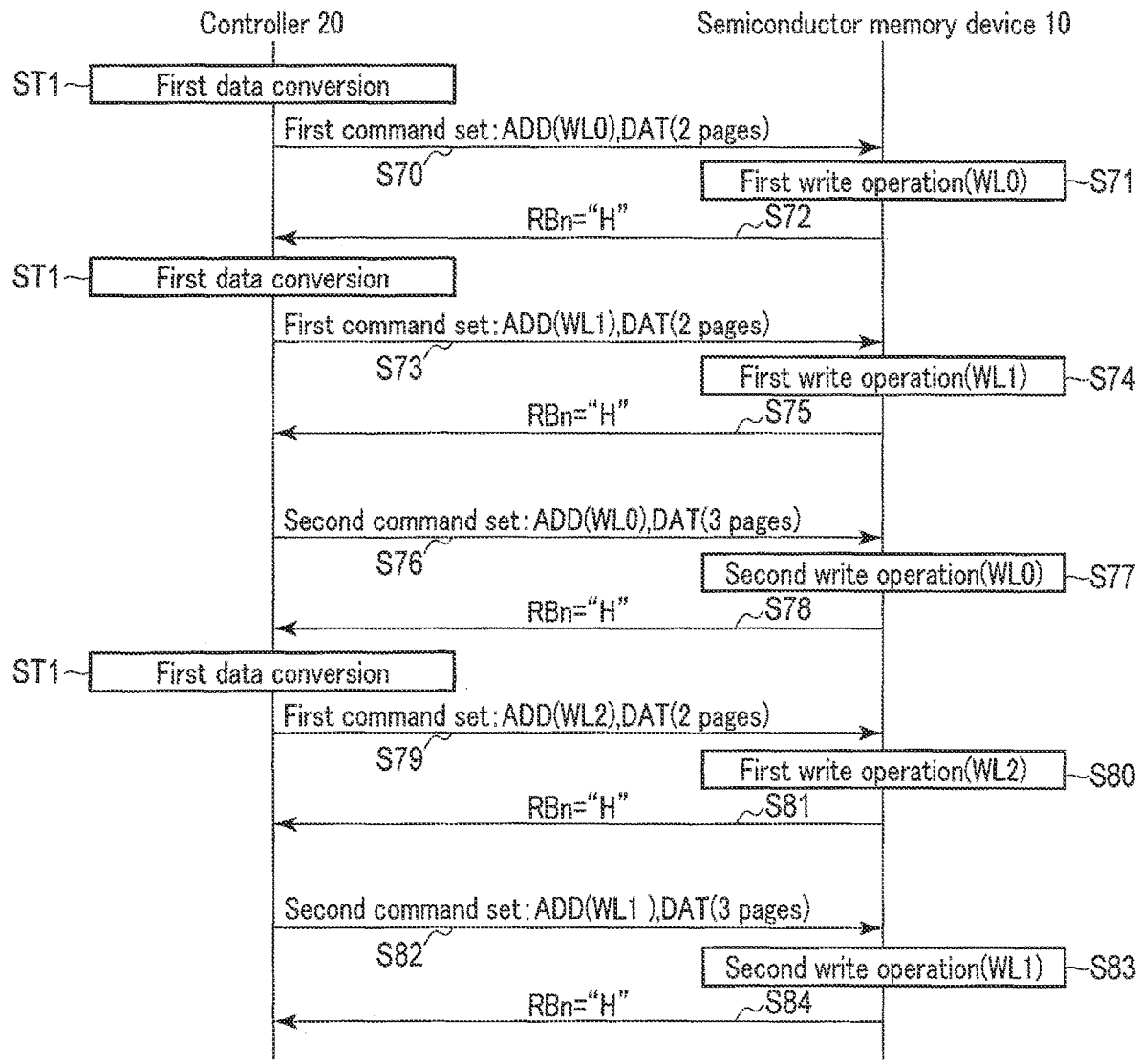
FIG. 30 is a flowchart showing an example of a write operation of a memory system according to a sixth embodiment.

Hereinafter, a write operation of the memory system 1 according to the sixth embodiment will be described with reference to FIG. 30. FIG. 30 shows a flowchart of the write operation of the memory system 1. Steps S70 to S84 shown in FIG. 30 correspond to steps S50 to S64 respectively described in the fourth embodiment with reference to FIG. 19. The write operation in the sixth embodiment is different from the write operation described in the fourth embodiment in details of a write data conversion process, and a command sequence and a second write operation.

Figure 31:
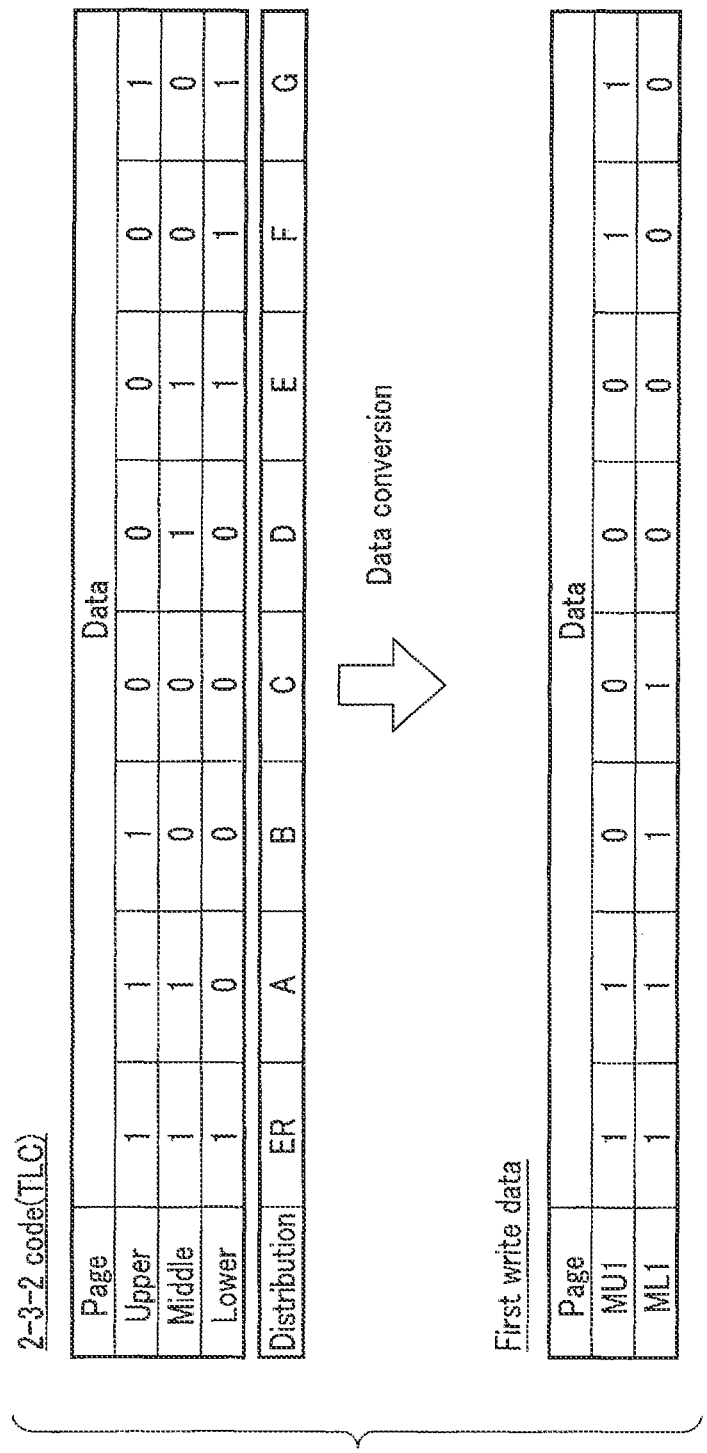
FIG. 31 is a diagram showing an example of a data conversion process in the write operation of the memory system according to the sixth embodiment.

As shown in FIG. 30, in the write operation in the sixth embodiment, a second data conversion process before a controller 20 transmits a second command set to a semiconductor memory device 10 is omitted, as compared with the operation described in the fourth embodiment with reference to FIG. 19. Here, a data conversion process in the sixth embodiment will be described with reference to FIG. 31. FIG. 31 shows data assignment to be applied to write data received from a host apparatus 30, and various types of write data converted from the write data.

As shown in FIG. 31, in the sixth embodiment, the controller 20 applies a 2-3-2 code to the write data received from the host apparatus 30, similar to the fourth embodiment. Then, the controller 20 executes a first data conversion process similar to that in the fourth embodiment to the write data to which the 2-3-2 code is applied. That is, the memory system 1 according to the sixth embodiment uses first write data similar to that in FIG. 20 in a first write operation.

Next, a command sequence of the write operation in the sixth embodiment will be described with reference to FIG. 32. FIG. 32 shows the command sequence of the operation corresponding to FIG. 30.

As shown in FIG. 32, a first command set in the sixth embodiment is similar to that the lower page data, and the middle page data in the first command set shown in FIG. 12 in the second embodiment are respectively converted to first lower page data ML1 and first upper page data MU1. On the other hand, a second command set in the sixth embodiment is similar in that the set of commands "80h" to "xxh" in the second command set shown in FIG. 12 is repeated twice. In the second command set in the sixth embodiment, for example, the write data to be transmitted before the two commands of "xxh" and the command "10h" is lower page data, middle page data, and upper page data.

Figure 33:
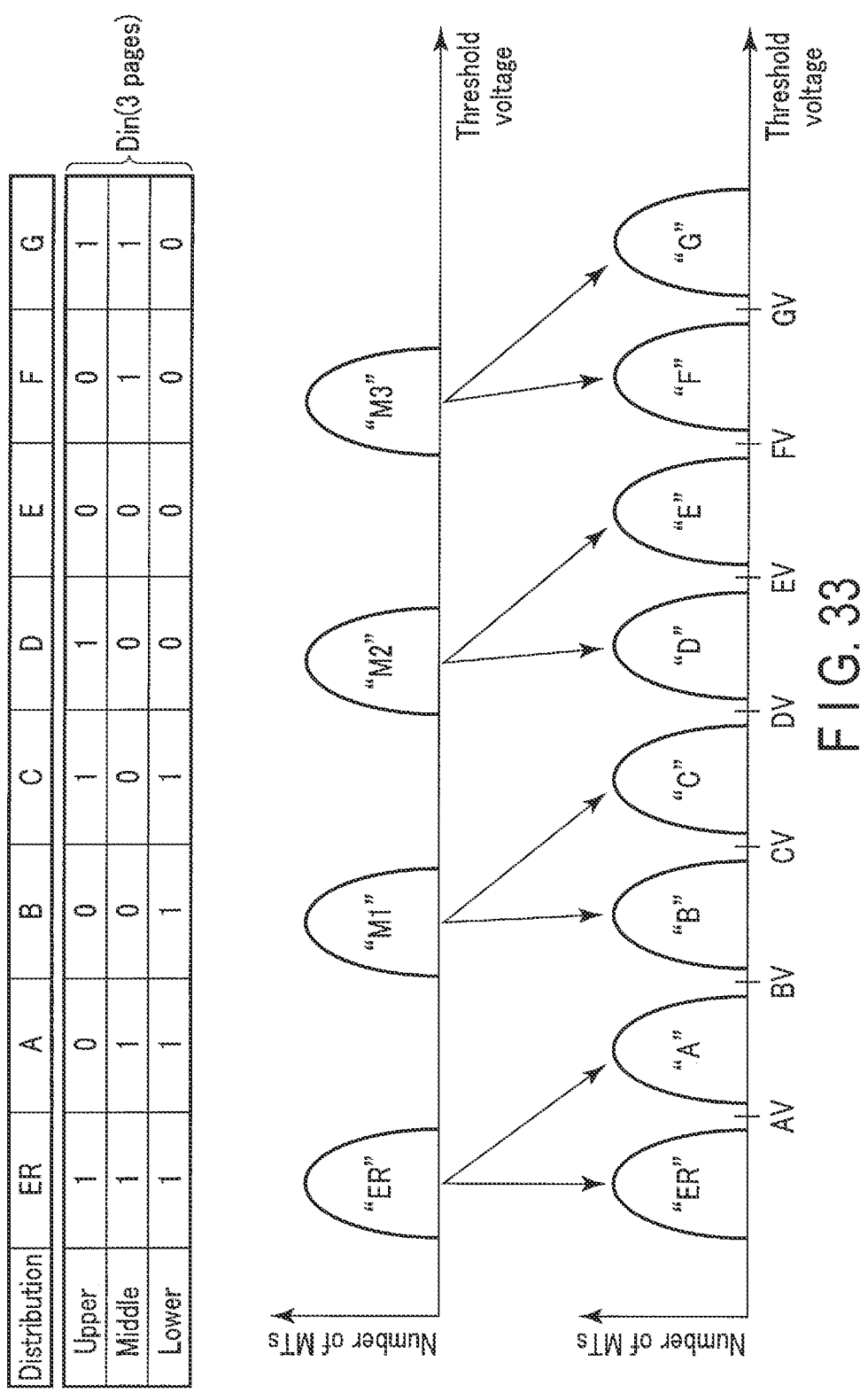
FIG. 33 is a diagram showing an example of a change in threshold distribution in a second write operation of the memory system according to the sixth embodiment.

Next, the second write operation in the sixth embodiment will be described with reference to FIG. 33. FIG. 33 shows 3-page data used in the second write operation and threshold distributions of memory cell transistors MT before and after the second write operation is executed.

As shown in FIG. 33, the threshold voltages of the memory cell transistors MT before the execution of the second write operation are distributed to an "ER" level, an "M1" level, an "M2" level, and an "M3" level. In the second write operation, the semiconductor memory device 10 executes the write operation for 3-page data based on the lower page data, the middle page data, and upper page data MU2 input from the controller 20, and forms eight threshold distributions from the threshold distributions at the "ER" level, the "M1" level, the "M2" level, and the "M3" level.

Specifically, the semiconductor memory device 10 sets the memory cell transistors MT to which "111" ("lower bit/middle bit/upper bit") data is written as a write inhibit state, and executes the write operations using voltages AV, BV, CV, DV, EV, FV, and GV as verify voltages to the memory cell transistors MT to which "110" data, "100" data, "101" data, "001" data, "000" data, "010" data, and "011" data are respectively written. Thus, the threshold distribution at the "A" level is formed from the threshold distribution at the "ER" level, the threshold distributions at the "B" level and "C" level are formed from the threshold distribution at the "M1" level, the threshold distributions at the "D" level and the "E" level are formed from the threshold distribution at the "M2" level, and the threshold distributions at the "F" level and "G" level are formed from the threshold distribution at the "M3" level.

In the example shown in FIG. 30, it has been described that the write operation (for example, after steps S71, S74, S77, S80, and S83) is executed, and then the next command set and data are input after a ready/busy signal RBn becomes the "H" level, but the operation order is not limited to thereto. For example, by having an extra number of latch circuits (for example, latch circuits XDL) described with reference to FIG. 2 for write cache usage, it is possible to input the next command set and data during the write operation.

[6-2] Effects of Sixth Embodiment

The memory system 1 according to the sixth embodiment described above executes the second write operation using 3-page data to which the data conversion process is not executed in the write operation described in the fourth embodiment.

Thus, in the memory system 1 according to the sixth embodiment, it is unnecessary to adjust the interval between the threshold distributions in the first write operation in consideration of executing the IDL in the second write operation in the second embodiment.

The memory system 1 according to the sixth embodiment can suppress the influences of the initial fall of the threshold voltage and the parasitic capacitance between the adjacent memory cells that occur after data is written, similar to the fourth embodiment. Accordingly, the memory system 1 according to the sixth embodiment can further suppress the expansion of the threshold distribution in the writing operation as compared with the first embodiment, and can improve the reliability of the written data.

In the sixth embodiment, it has been described that the data conversion process is not executed to the write data used in the second write operation, but the operation is not limited to this. For example, 3-page data to which the data conversion process is executed may be used in the second write operation. In this case, the conversion process is executed to the 3-page data, for example, before the controller 20 transmits the second command set to the semiconductor memory device 10.

In the memory system 1 according to the sixth embodiment, the data to be read in the read operation is similar to the write data before the data conversion, which is similar to the fourth embodiment. That is, in the sixth embodiment, the data transmitted from the controller 20 to the semiconductor memory device 10 during the first write operation is different from the data transmitted from the semiconductor memory device 10 to the controller 20 during the read operation.

[7] Seventh Embodiment

Next, a memory system 1 according to a seventh embodiment will be described. The memory system 1 according to the seventh embodiment relates to the writing order when the write operation described in the first to sixth embodiments is applied to a semiconductor memory device 10 having a structure in which memory cells are three-dimensionally stacked. Hereinafter, differences between the memory system 1 according to the seventh embodiment and those according to the first to sixth embodiments will be described.

[7-1] Configuration of Memory Cell Array 11

Figure 34:
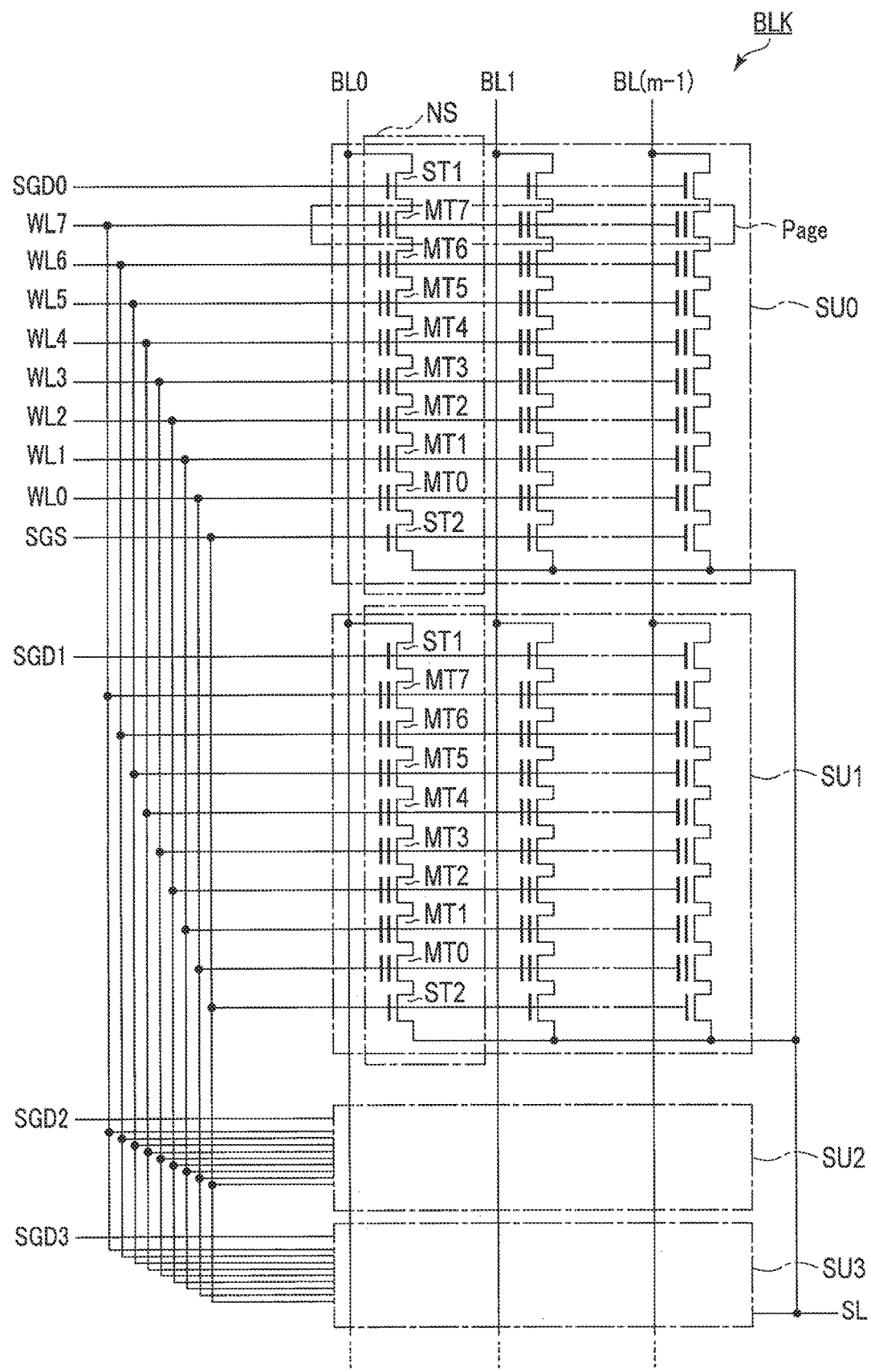
FIG. 34 is a diagram showing an example of a circuit configuration of a memory cell array included in a semiconductor memory device according to a seventh embodiment.

First, a configuration example of a memory cell array 11 in the seventh embodiment will be described with reference to FIG. 34. FIG. 34 is a circuit diagram of the memory cell array 11 and shows a detailed circuit configuration of one block BLK in the memory cell array 11. The circuit configuration of the memory cell array 11 in the seventh embodiment is different, in that a plurality of string units SU is provided in each block BLK, from the circuit configuration of the memory cell array 11 described using FIG. 2 in the first embodiment.

Specifically, the block BLK includes, for example, string units SU0 to SU3 as shown in FIG. 34. Each of the string units SU includes m number of NAND strings NS. Gates of select transistors ST1 in the string units SU0 to SU3 are commonly connected to select gate lines SGD0 to SGD3 respectively. Drains of the select transistors ST1 on the same column in the same block are commonly connected to a corresponding bit line BL. That is, the drains of the select transistors ST1 on the same column are commonly connected between the blocks BLK. Control gates of memory transistors MT0 to MT7 in the same block are commonly connected to word lines WL0 to WL7 respectively. Gates of select transistors ST2 in the same block are commonly connected to a select gate line SGS. Sources of the select transistors ST2 in the same block are commonly connected to a source line SL. That is, the sources of the select transistors ST2 are commonly connected between the blocks BLK. Since the other circuit configurations are similar to the circuit configurations described in the first embodiment with reference to FIG. 2, the description thereof is omitted.

Figure 35:
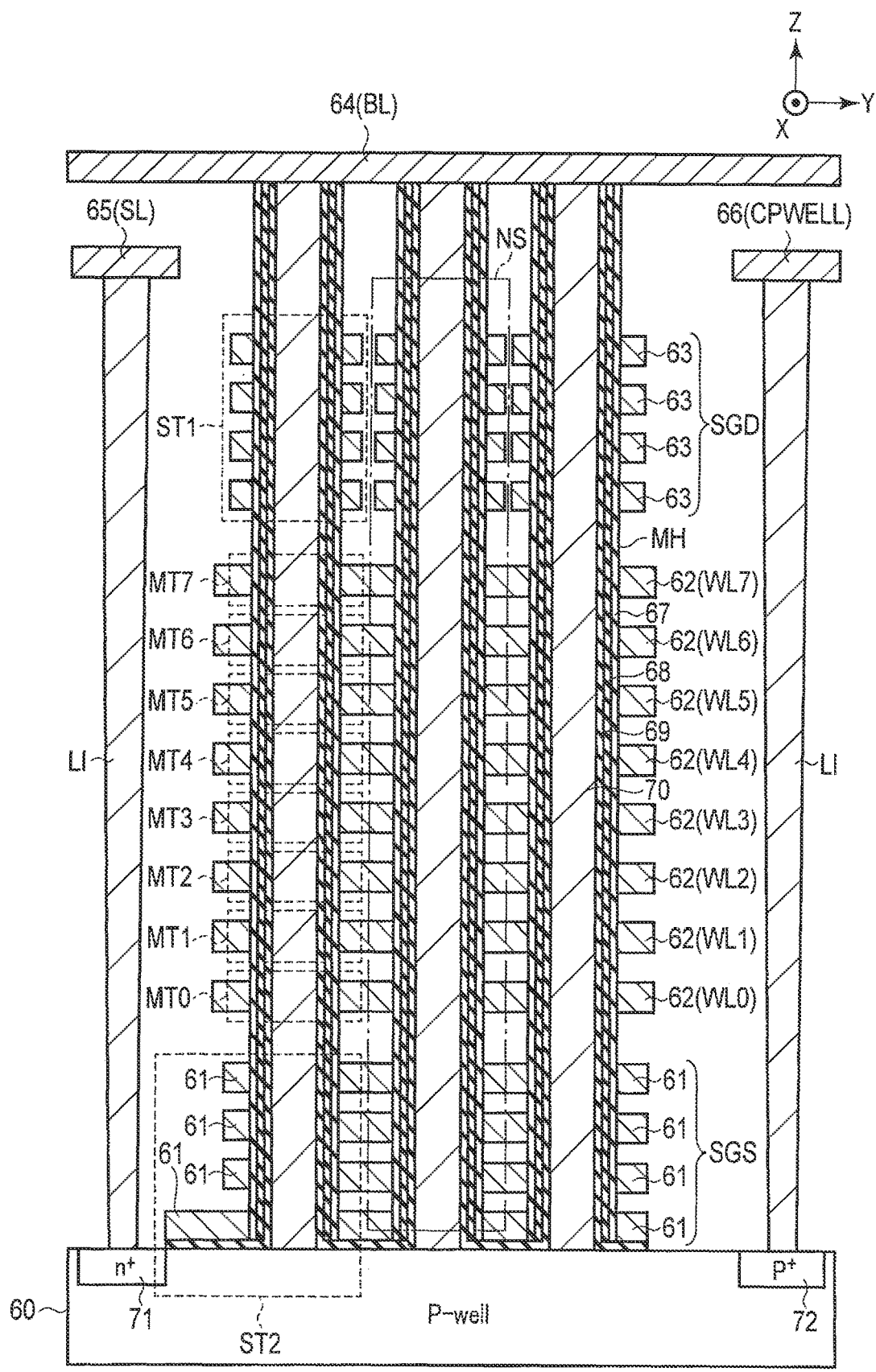
FIG. 35 is a diagram showing an example of a cross-sectional configuration of the memory cell array included in the semiconductor memory device according to the seventh embodiment.

Next, an example of the cross-sectional configuration of the memory cell array 11 will be described with reference to FIG. 35. FIG. 35 shows a cross-sectional view of the memory cell array 11, and X, Y, and Z axes crossing each other. In FIG. 35, the interlayer insulating film is omitted. As shown in FIG. 35, the semiconductor memory device 10 includes a P-type well region 60, conductors 61 to 66, a plurality of semiconductor pillars MH, and a plurality of contact plugs LI.

The P-type well region 60 is formed in the surface of the semiconductor substrate. The conductors 61 to 63 are laminated in order above the P-type well region 60. The conductors 61 to 63 function as the select gate line SGS, the word line WL, and the select gate line SGD respectively.

For example, the number of layers of the conductors 62 corresponds to the number of word lines WL. In the example shown in FIG. 35, the select gate lines SGS and SGD are each constituted by four layers of conductors. The select gate lines SGS and SGD may be constituted by a plurality of conductors as described above, or may be constituted by one layer of conductor. The conductors 61 to 63 are provided in a plate shape extending in the X direction and the Y direction.

The semiconductor pillars MH are formed so as to extend from the upper surface of the conductor 63 to the upper surface of the P-type well region 60. The semiconductor pillars MH are provided so as to pass through the conductors 61 to 63 along the Z direction. On the side face of each semiconductor pillar MH, a block insulating film 67, an insulating film (charge storage layer) 68, and a tunnel oxide film 69 are formed in order. In the semiconductor pillar MH, a semiconductor material 70 including a conductive material is buried at the inner side of the tunnel oxide film 69. The inner side of the tunnel oxide film 69 of the semiconductor pillar MH may be constituted by a plurality of materials.

The conductor 64 corresponding to the bit line BL is formed above the conductor 63 and the semiconductor pillar MH. The bit line BL is connected to the corresponding semiconductor pillar MH. A contact plug containing a conductive material may be formed between the bit line BL and the corresponding semiconductor pillar MH.

The conductors 65 and 66 corresponding to the source line SL and a well line CPWELL respectively are formed between the conductors 63 and 64. The conductor 65 is connected via the contact plug LI to an $n^+$ type impurity diffusion region 71 formed in the surface of the well region 60. The conductor 66 is connected via the contact plug LI to a $p^+$ type impurity diffusion region 72 formed in the surface of the well region 60. The contact plug LI is provided in a plate shape extending in the X direction and the Z direction.

In the above configuration, one semiconductor pillar MH corresponds to one NAND string NS. Specifically, the intersections between the select gate line SGD and the semiconductor pillar MH, and between the select gate line SGS and the semiconductor pillar MH correspond to the select transistors ST1 and ST2, respectively. Similarly, the intersection between the word line WL and the semiconductor pillar MH corresponds to the memory cell transistor MT.

Furthermore, a plurality of above configurations is arranged in the X direction. For example, one string unit SU is constituted by a group of NAND strings NS arranged in the X direction. When a plurality of string units SU is provided in the same block BLK, the conductors 63 corresponding to the select gate line SGD are separated between the string units SU.

The lowermost conductor 61 and the tunnel oxide film 69 are provided in the vicinity of the $n^+$ type impurity diffusion region 71. Accordingly, when the select transistor ST2 is turned ON, a current path is formed between the NAND string NS and the $n^+$ type impurity diffusion region 71.

The memory cell array 11 may have other configurations.

A memory cell array formation may be disclosed in U.S. patent application Ser. No. 14/532,030 filed on Mar. 23, 2009, the entire contents of which are incorporated by reference herein.

Furthermore a memory cell array formation may be disclosed in U.S. patent application Ser. No. 12/679,991 filed on Mar. 25, 2010, the entire contents of which are incorporated by reference herein.

A memory cell array formation may be disclosed in U.S. patent application Ser. No. 14/406,524 filed on Mar. 18, 2009, the entire contents of which are incorporated by reference herein.

Additionally, a memory cell array formation may be disclosed in U.S. patent application Ser. No. 12/407,403 filed on Mar. 19, 2009, the entire contents of which are incorporated by reference herein.

[7-2] Write Operation of Memory System 1

Figure 36:
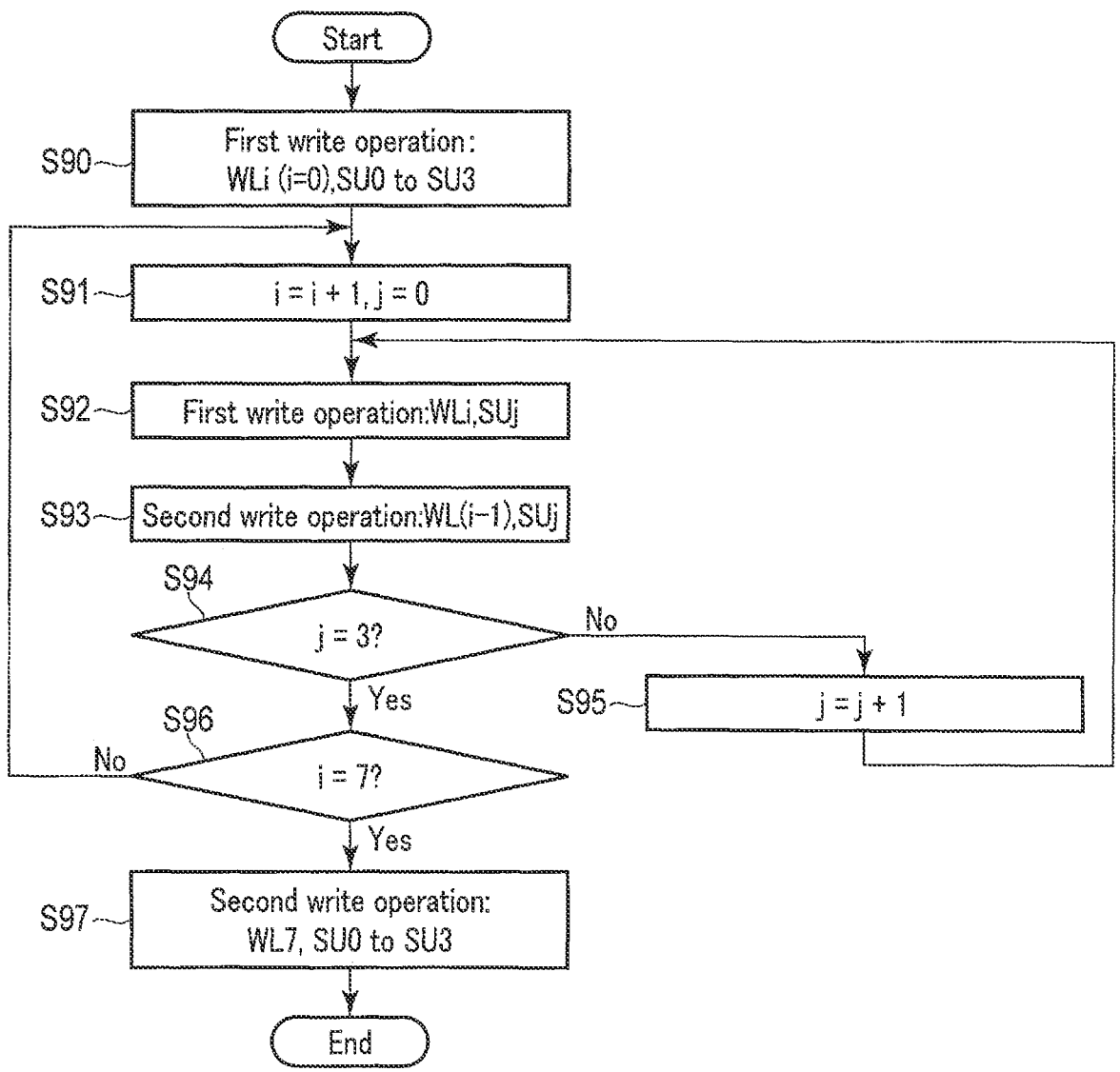
FIG. 36 is a flowchart showing an example of a write operation of a memory system according to the seventh embodiment.

Next, a write operation of the memory system 1 will be described with reference to FIG. 36. FIG. 36 is a flowchart for explaining a writing order in the seventh embodiment. In the following description, variables i and j are used for ease of explanation. The variables i and j are kept by a counter of a controller 20 and incremented by, for example, control from the controller 20.

As shown in FIG. 36, first, the semiconductor memory device 10 executes a first write operation in which a word line WLi (i=0) is selected and the string units SU0 to SU3 are sequentially selected (step S90). When the first write operation in step S90 is ended, the variable i is incremented, and the variable j is reset (j=0) (step S91). Then, the semiconductor memory device 10 executes the first write operation in which the word line WLi is selected and a string unit SUj is selected (step S92). Specifically, the semiconductor memory device 10 executes the first write operation in which the word line WL1 is selected and the string unit SU0 is selected.

Next, the semiconductor memory device 10 executes a second write operation in which a word line WL(i−1) is selected and a string unit SUj is selected (step S93). Specifically, the semiconductor memory device 10 executes the second write operation in which the word line WL0 is selected and the string unit SU0 is selected.

When j=3 is not satisfied once the second write operation in step S93 is ended (NO in step S94), the variable j is incremented (step S95), and step S82 and subsequent operations are repeated. On the other hand, when j=3 is satisfied (YES in step S94), the value of the variable i is continuously checked (step S96).

When i=7 is not satisfied (NO in step S96), the operation returns to step S91. After the variable i is incremented and the variable j is reset, step S92 and subsequent operations are repeated. On the other hand, when i=7 is satisfied (YES in step S96), the semiconductor memory device 10 executes the second write operation in which a word line WLi (i=7) is selected and the string units SU0 to SU3 are sequentially selected (step S97).

FIG. 37 shows the writing order in each write operation described above. FIG. 37 shows combinations of word lines WL and string units SU in a certain block BLK. FIG. 37 also shows a frame (white background) corresponding to the first write operation and a frame (hatched background) corresponding to the second write operation in each combination, and the number representing the order for executing the operation in each frame. The solid arrow shown in FIG. 37 indicates that the operation at the starting point of the arrow is the first write operation, and the dotted arrow indicates that the operation at the starting point of the arrow is the second write operation.

As shown in FIG. 37, the semiconductor memory device 10 executes the first write operation to the string units SU in which the word line WL0 is selected, and then alternately executes the first write operation in which the word line WL1 is selected, and the second write operation in which the word line WL0 is selected. This operation is executed such that the string units SU0 to SU3 are sequentially selected. The memory system 1 executes the second write operation in which the word line WL0 and the string unit SU3 are selected, and then alternately executes the first write operation in which the word line WL2 is selected, and the second write operation in which the word line WL1 is selected. The same applies hereinafter.

[7-3] Effects of Seventh Embodiment

The memory system 1 according to the seventh embodiment described above can suppress the storage capacity of a RAM 22. Hereinafter, effects of the seventh embodiment will be described in detail.

Figure 38:
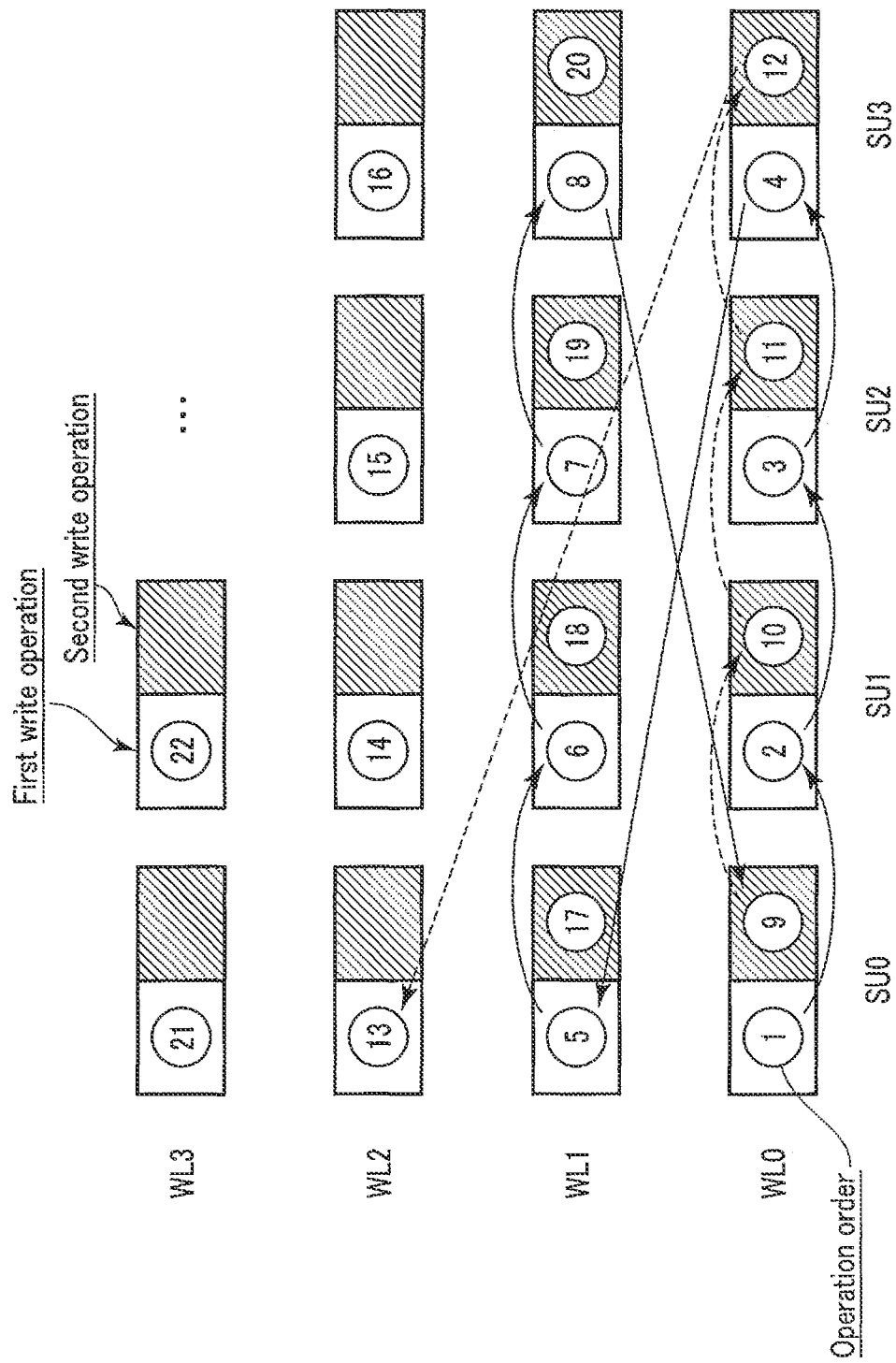
FIG. 38 is a diagram showing an example of a writing order in the write operation of the memory system according to a comparative example of the seventh embodiment.

When the two-stage write operation described in the first to sixth embodiments is applied to a memory system in which each block BLK has a plurality of string units SU, the order shown in FIG. 38 is considered as the writing order of the first write operation and the second write operation.

In a comparative example of the seventh embodiment shown in FIG. 38, after the first write operation in which the word line WL0 and each string unit SU are selected, the first write operation is executed in which the word line WL1 and each string unit SU are selected. After the first write operation is executed in which the word line WL1 and each string unit SU are selected, the second write operation is executed in which the word line WL0 and each string unit SU are selected. That is, in the memory system in the comparative example, the order for executing the first write operation and the second write operation is managed in the unit of word line WL.

On the other hand, in the present embodiment, after the first write operation in which the word line WL0 and each string unit SU are selected, the first write operation is executed in which the word line WL1 and the string unit SU0 are selected as shown in FIG. 37. Then, after the first write operation is executed in which the word line WL1 and the string unit SU0 are selected, the second write operation is executed in which the word line WL0 and the string unit SU0 are selected. As described above, in the present embodiment, the memory system 1 sequentially executes the second write operation from the string unit SU in which the first write operation with respect to the adjacent word line WL is ended.

In the write operation of the memory system 1 according to the present embodiment described above, since the period until the second write operation is executed is shorter than that in the comparative example, the period during which the RAM 22 retains the write data is shortened. Accordingly, the memory system 1 according to the present embodiment can suppress the consumption amount of the RAM 22 and the storage capacity of the RAM 22.

The writing order with which the period until the second write operation is executed is shortened may be the order shown in FIG. 39. In a variation of the seventh embodiment shown in FIG. 39, after the first write operation in which the word line WL0 and the string unit SU0 are selected, the first write operation is executed in which the word line WL1 and the string unit SU0 are selected. Then, after the first write operation is executed in which the word line WL1 and the string unit SU0 are selected, the second write operation is executed in which the word line WL0 and the string unit SU0 are selected. The writing order is continuously used until the second write operation is executed in which the word line WL0 and the string unit SU3 are selected. The subsequent writing order is similar to FIG. 37 described in the present embodiment. The memory system 1 can similarly suppress the storage capacity of the RAM 22 when such a writing order is applied.

In the above description, it has been described that each block BLK includes the four string units SU, but the number of string units is not limited thereto. For example, the number of the string units SU may be two, three, or five or more. The determination values of the variable j in step S94 and of the variable i in step S96 used in the description in the flowchart of FIG. 36 are merely examples, and the determination value is not limited thereto. These determination values are set based on, for example, the number of the string units SU corresponding to one block BLK or the number of the word lines WL.

[8] Eighth Embodiment

Next, a memory system 1 according to an eighth embodiment will be described. The eighth embodiment relates to a write method applicable to the write operation described in the first to seventh embodiments, in which the reference of a verify pass at each level is set to a lower verify voltage used in a write operation by a quick pass write (QPW) method. Hereinafter, differences between the memory system 1 according to the eighth embodiment and that according to the first to seventh embodiments will be described.

[8-1] Data Assignment of Memory Cell

Figure 40:
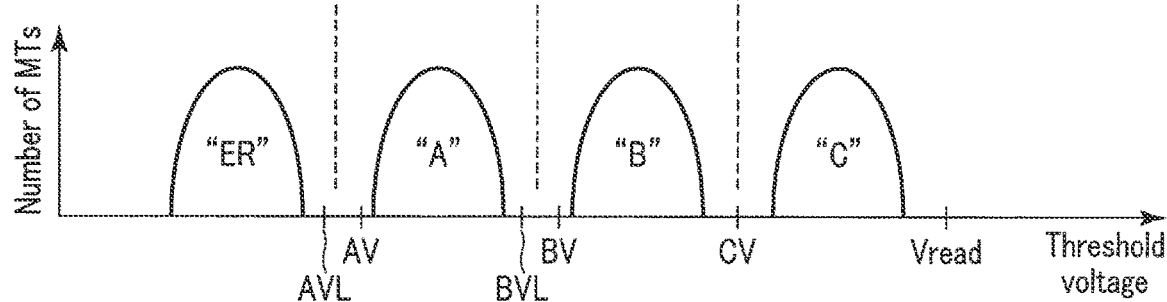
FIG. 40 is a diagram showing threshold distribution and data assignment of memory cells included in a semiconductor memory device according to an eighth embodiment.

First, data assignment to be applied to the memory system 1 according to the eighth embodiment will be described with reference to FIG. 40. FIG. 40 shows threshold distribution of memory cell transistors MT, assigned data, and voltages used in the write operation.

As shown in FIG. 40, in the eighth embodiment, it will be described that an MLC method for storing 2-bit data in one memory cell transistor MT is applied. When data is written by the MLC method, threshold distribution of the memory cell transistors MT is divided into four. These four threshold distributions are referred to as an "ER" level, an "A" level, a "B" level, and a "C" level in order from a lower threshold voltage.

The "ER" level corresponds to an erase state of the memory cell transistor MT. The "A" level, the "B" level, and the "C" level correspond to write states of the memory cell transistor MT, and are formed by write operations using verify voltages AV, BV, and CV respectively. In the write operation by the QPW method, a verify voltage AVL lower than the verify voltage AV at the "A" level and a verify voltage BVL lower than the verify voltage BV at the "B" level are used. The relation between these voltage values is as follows:

$$AVL<AV<BVL<BV<CV<DV<EV<FV<GV.$$

In the eighth embodiment, "10" (lower bit/upper bit) data, "11" data, "01" data, and "00" data are respectively written to the memory cell transistors MT at the "ER" level, the "A" level, the "B" level, and the "C" level. The data assignment in the present embodiment is called a "1-2 code" because the lower bit and the upper bit are determined by respectively executing the read operation once and twice.

[8-2] Write Operation of Memory System 1

Next, the write operation of the memory system 1 will be described. The memory system 1 according to the eighth embodiment uses the write operation by the quick pass write (QPW) method. In the write operation by the QPW method, two verify voltages are used in the verify operation for the memory cell transistor MT in which data at each level is written.

Specifically, as shown in, for example, FIG. 40, the two verify voltages AV and AVL are used in the verify operation at the "A" level, and the two verify voltages BV and BVL are used in the verify operation at the "B" level. When it is detected by repeating a program loop that the threshold voltage of the memory cell transistor MT is between the lower verify voltage and the normal verify voltage, the next program operation is executed while an intermediate voltage is being applied to a bit line BL corresponding to the memory cell transistor MT. When the program operation is executed while the intermediate voltage is being applied to the bit line BL in this manner, the potential difference between the gate and the channel of the memory cell transistor MT becomes small, and thus the variation of the threshold voltage is suppressed as compared with the case in which the voltage of the bit line BL is set to the ground voltage during the program operation.

As described above, in the program operation by the QPW method, the program operation in which the variation range of the threshold voltage is large and the program operation in which the variation range of the threshold voltage is small are switched in accordance with approaching the target threshold voltage. Accordingly, in the write operation by the QPW method, it is possible to narrow the width of the threshold distribution after the write operation while the increase in the write time is suppressed.

The details of the writing operation by the QPW method are disclosed in, for example, U.S. patent application Ser. No. 14/263,948 entitled "Nonvolatile semiconductor memory device" filed on Apr. 28, 2014. It is also described in U.S. patent application Ser. No. 12/563,296 entitled "Nonvolatile semiconductor memory device" filed on Sep. 21, 2009. These patent applications are incorporated by reference herein in their entirety.

Figure 41:
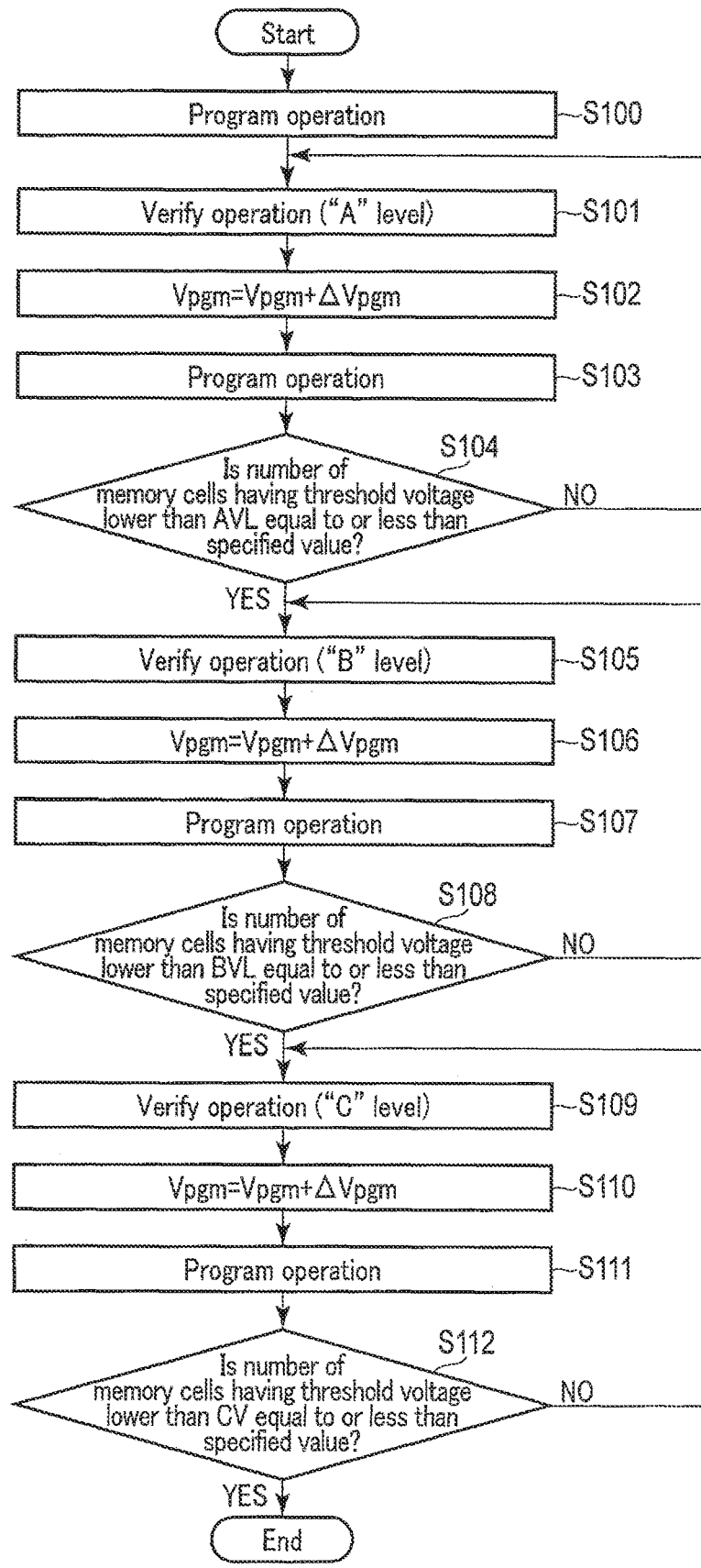
FIG. 41 is a flowchart showing an example of a write operation of a memory system according to the eighth embodiment.

In the write operation of the memory system 1 according to the eighth embodiment, the lower verify voltage (for example, voltage AVL) in the QPW method is used as a reference of the verify pass. Hereinafter, the details of the write operation in the eighth embodiment will be described with reference to FIGS. 41 and 42. FIG. 41 shows a flowchart of the write operation in the eighth embodiment, and FIG. 42 shows examples of voltages applied to a selected word line WL_sel and a bit line BL during the write operation. In the example shown in FIG. 42, the memory cell transistor MT passes the verify at the "A" level, the "B" level, and the "C" level after the program pulse is respectively applied twice, four times, and six times. In the following description, a bit line BL to be written is referred to as a bit line BL_prog, a write-inhibited bit line BL is referred to as a bit line BL_inh, and a bit line BL to which the QPW method is applied is referred to as a bit line BL_qpw.

As shown in FIG. 41, a sequencer 14 first executes a program operation (step S100). Specifically, as shown in FIG. 42, a sense amplifier module 17 applies a voltage Vss to the bit line BL_prog, and applies a voltage Vbl to the bit line BL_inh. The voltage Vss is the ground voltage, and the voltage Vbl is the power supply voltage supplied from the sense amplifier module 17. When the voltage Vbl is applied to the bit line BL_inh, a corresponding select transistor ST1 is cut off, and the channel of a corresponding NAND string NS is in a floating state. Then, a row decoder 16 applies a program voltage Vpgm to the selected word line WL_sel. Then, in the memory cell transistor MT connected to the bit line BL_prog, the threshold voltage varies due to the potential difference between the control gate and the channel. Thus, in the memory cell transistor MT connected to the bit line BL_inh, the variation of the threshold voltage is suppressed due to channel boost or the like.

Next, the sequencer 14 executes the verify operation at the "A" level (step S101). Specifically, the row decoder 16 sequentially applies the verify voltages AVL and AV to the selected word line WL_sel, and the sense amplifier module 17 determines whether the threshold voltage of the memory cell transistor MT is equal to or higher than the voltages AVL and AV. This verify result is counted while the subsequent operations are being executed. Subsequently, the sequencer 14 increments the program voltage Vpgm by ΔVpgm (step S102) and executes the program operation again (step S103).

Next, the sequencer 14 checks the count result of the verify operation in step S101, and determines whether or not the number of memory cells having the threshold voltage lower than the verify voltage AVL in the memory cell transistors MT to which the data at the "A" level is written is equal to or less than a specified value (step S104). This specified value can be set to a given numerical value.

When the number of memory cells lower than the verify voltage AVL is larger than the specified value (NO in step S103), the operation returns to step S101 to execute the verify operation at the "A" level and the program operation in which the program voltage Vpgm is incremented. In the second and subsequent program loops, the write operation to which the QPW method is applied is executed to the memory cell transistor MT having passed the verify operation using the lower verify voltage (for example, the verify voltage AVL). Specifically, while the sense amplifier module 17 is applying an intermediate voltage Vqpw to the bit line BL_qpw, the row decoder 16 applies the program voltage Vpgm to the selected word line WL_sel. The voltage Vqpw is higher than the voltage Vss and lower than the voltage Vbl. Then, the threshold voltage of the memory cell transistor MT connected to the bit line BL_qpw varies more finely than the case in which the voltage Vss is applied to the bit line BL.

When the number of memory cells lower than the verify voltage AVL is equal to or less than the specified value (YES in step S103), the sequencer 14 determines that the memory cell transistor MT has passed the verify at the "A" level. Then, the sequencer 14 executes the verify operation at "B" level (step S105). Specifically, the row decoder 16 sequentially applies the verify voltages BVL and BV to the selected word line WL_sel, and the sense amplifier module 17 determines whether the threshold voltage of the memory cell transistor MT is equal to or higher than the voltages BVL and BV. This verify result is counted while the subsequent operations are being executed. Subsequently, the sequencer 14 increments the program voltage Vpgm by ΔVpgm (step S106) and executes the program operation again (step S107).

Next, the sequencer 14 checks the count result of the verify operation in step S105, and determines whether the number of memory cells having the threshold voltage lower than the verify voltage BVL in the memory cell transistors MT to which the data corresponding to the "B" level is written is less than a specified value (step S108). This specified value can be set to an arbitrary numerical value.

When the number of memory cells lower than the verify voltage BVL is larger than the specified value (NO in step S108), the operation returns to step S105 to execute the verify operation at the "B" level and the program operation in which the program voltage Vpgm is incremented.

When the number of memory cells lower than the verify voltage BVL is equal to or less than the specified value (YES in step S108), the sequencer 14 determines that the memory cell transistor MT has passed the verify at the "B" level. Then, the sequencer 14 executes the verify operation at the CV level (step S109). Specifically, the row decoder 16 applies the verify voltage CV to the selected word line WL_sel, and the sense amplifier module 17 determines whether the threshold voltage of the memory cell transistor MT is equal to or higher than the voltage CV. This verify result is counted while the subsequent operations are being executed. Subsequently, the sequencer 14 increments the program voltage Vpgm by ΔVpgm (step S110) and executes the program operation again (step S111).

Next, the sequencer 14 checks the count result of the verify operation in step S109, and determines whether or not the number of memory cells having the threshold voltage lower than the verify voltage CV in the memory cell transistors MT to which the data corresponding to the "C" level is written is equal to or less than the specified value (step S112).

When the number of memory cells lower than the verify voltage CV is larger than the specified value (NO in step S112), the operation returns to step S109 to execute the verify operation at the "C" level, and the program operation in which the program voltage Vpgm is incremented.

When the number of memory cells lower than the CV is equal to or less than the specified value (YES in step S112), the sequencer 14 determines that the memory cell transistor MT has passed the verify at the "C" level, and ends the write operation.

[8-3] Effects of Eighth Embodiment

The memory system 1 according to the eighth embodiment described above can improve reliability of written data. Hereinafter, effects of the eighth embodiment will be described in detail with reference to FIG. 43. FIG. 43 shows an example of a change in the threshold distribution of the memory cell transistors MT corresponding to the waveforms shown in FIG. 42. The threshold distribution having the white background shown in FIG. 43 corresponds to the threshold distribution of the memory cell transistors MT to which data has been written, and the threshold distribution having the hatched background corresponds to the threshold distribution of the writing target memory cell transistors MT. Furthermore, (1) in FIG. 43 shows the threshold distribution before the write operation, and (2) to (8) show the threshold distributions after the program voltage is respectively applied in the first to seventh program loops.

As shown in FIG. 43, the threshold distribution of the memory cell transistors MT rises each time the program voltage is applied. The verify operation after the program voltage is applied is counted while the next program voltage is being applied. Thus, in the verify operation, when the threshold distribution is likely to exceed the specified verify voltage by applying the next program voltage, the sequencer 14 determines that the corresponding memory cell transistor MT has passed the verify. With respect to the verify pass in the data at each level, the case in which the number of memory cell transistors MT equal to or lower than the verify voltage (for example, voltages AV and BV) in the memory cell transistors MT to which the data at the corresponding level is written is less than the specified value, is determined as the verify pass.

However, when the number of memory cell transistors MT equal to or lower than the verify voltage is counted as the criterion for determination of the verify operation, the number of target memory cell transistors MT is large, and the counting accuracy can deteriorate. In addition, when the number of memory cell transistors MT to be counted is large, current consumption may significantly increase.

Therefore, in the memory system 1 according to the eighth embodiment, the lower verify voltage (for example, the voltages AVL and BVL) used in the write operation by the QPW method is used as a criterion for determination of the verify operation. For example, as shown in (3) of FIG. 43, since the number of the memory cell transistors MT equal to or lower than the voltage AVL is less than the number of the memory cell transistors MT equal to or lower than the voltage AV, the number of the memory cells to be counted at the time of determination of the verify pass can be reduced. This point applies to the verify operations at other levels.

Thus, the memory system 1 according to the eighth embodiment can reduce the number of the memory cell transistor MT to be counted as compared with the case of applying the normal verify voltage, and improve the counting accuracy. Accordingly, the memory system 1 according to the eighth embodiment can improve the accuracy of the verify operation and the reliability of the written data. Furthermore, the memory system 1 according to the eighth embodiment can reduce the number of memory cell transistors MT to be counted, and suppress the power consumption.

In the eighth embodiment, it has been described that two verify voltages are used in the write operation by the QPW method, but the number of voltages is not limited thereto. For example, if one verify voltage is used in the write operation by the QPW method, by changing the length and timing of the sense time, it is possible to obtain a verify result similar to the case of executing the verify operation with a low verify voltage.

In the eighth embodiment, it has been described that the verify operation for the subsequent level is started in accordance with passing the verify operation at a lower level, but the verify operation is not limited thereto. For example, the number of program loop times from which the verify operation at the corresponding level is executed may be determined in advance by a parameter based on the write characteristic of the memory cell transistor MT.

Figure 44:
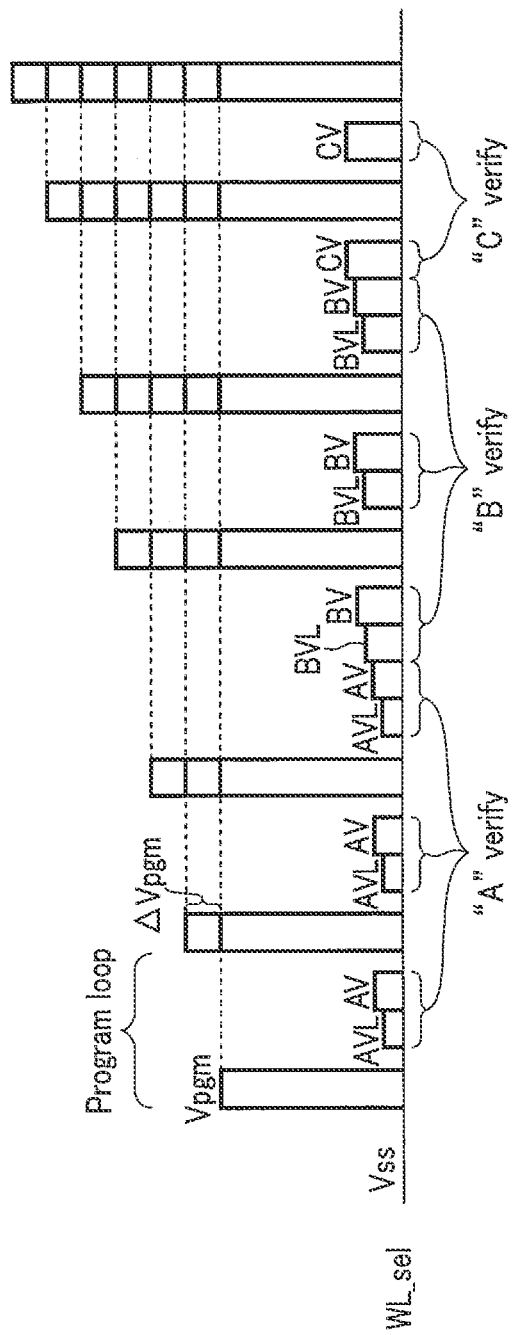
FIG. 44 is a waveform diagram showing an example of the write operation of the memory system according to the eighth embodiment.

Furthermore, in the eighth embodiment, it has been described that the verify operation at any one of the "A" level, the "B" level, or the "C" level is executed in each program loop, but the verify operation is not limited thereto. For example, as shown in FIG. 44, a plurality of verify operations may be executed in one program loop. FIG. 44 shows examples of the voltages applied to the selected word line WL_sel during the write operation. In the examples shown in FIG. 44, the verify operations at the "A" level and the "B" level are continuously executed in the third program loop, and the verify operations at the "B" level and the "C" level is continuously executed in the fifth program loop. In the memory system 1 described above, an appropriate verify operation is executed in accordance with the threshold voltage of the memory cell transistor MT that rises as the program loop progresses. In other words, the memory system 1 can improve the verify accuracy in the case of continuously executing the verify operations at a plurality of levels, by counting the number of memory cell transistors MT equal to or lower than the lower verify voltage used in the QPW method.

[9] Ninth Embodiment

Next, a memory system 1 according to a ninth embodiment will be described. The ninth embodiment relates to a write method applicable to the write operation described in the first to eighth embodiments, in which a program voltage is applied a predetermined number of times after passing the verify at a lower level. Hereinafter, differences between the memory system 1 according to the ninth embodiment and that according to the first to eighth embodiments will be described.

[9-1] Write Operation of Memory System 1

Figure 45:
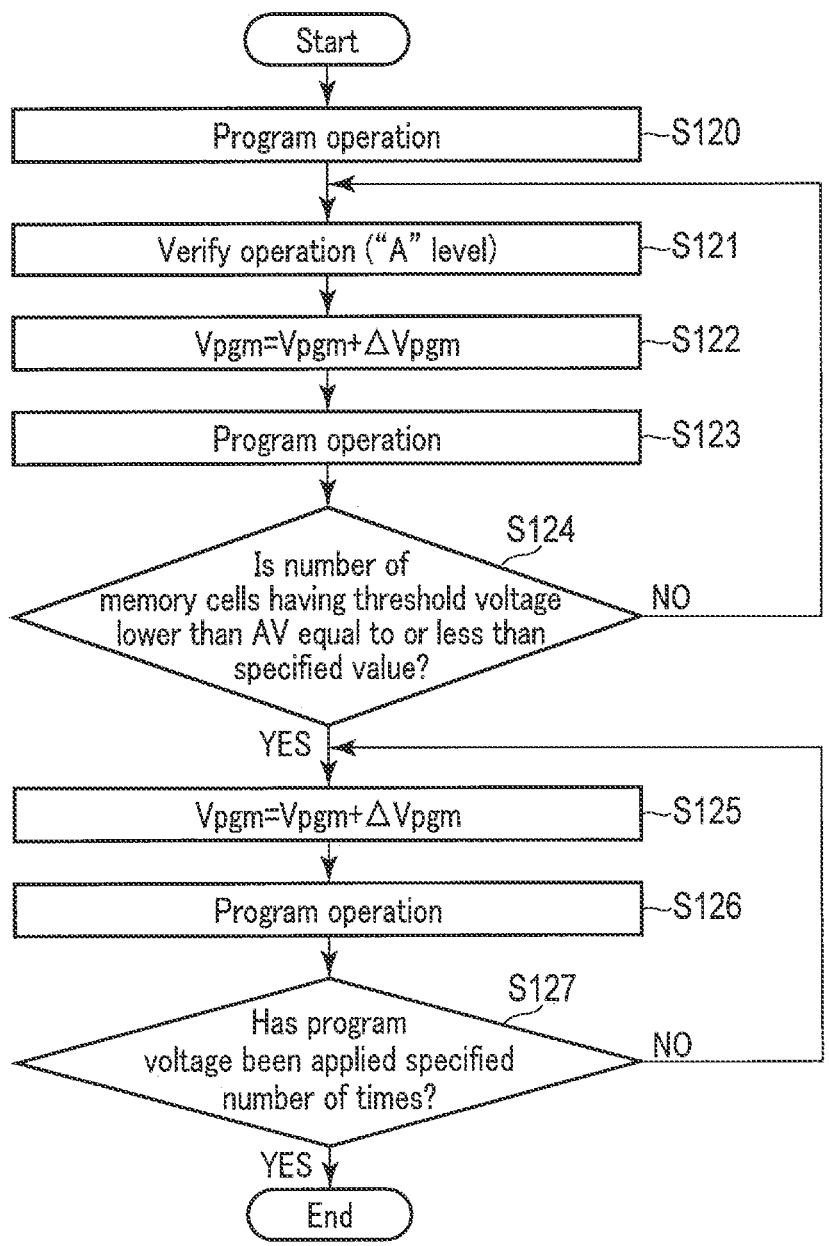
FIG. 45 is a flowchart showing an example of a write operation of a memory system according to a ninth embodiment.

Hereinafter, the details of a write operation in the ninth embodiment will be described with reference to FIGS. 45 and 46. FIG. 45 shows a flowchart of the write operation in the ninth embodiment, and FIG. 46 shows examples of voltages applied to a selected word line WL_sel and a bit line BL during the write operation. In the example shown in FIG. 46, a memory cell transistor MT passes the verify at an "A" level after the fifth program pulse is applied.

As shown in FIG. 45, a sequencer 14 first executes a program operation (step S120). Next, the sequencer 14 executes a verify operation at the "A" level (step S121). Specifically, as shown in FIG. 46, a row decoder 16 applies a verify voltage AV to the selected word line WL_sel, and a sense amplifier module 17 determines whether or not the threshold voltage of the memory cell transistor MT is equal to or higher than the voltage AV. This verify result is counted while the subsequent operations are being executed. Subsequently, the sequencer 14 increments a program voltage Vpgm by ΔVpgm (step S122) and executes the program operation again (step S123).

Next, the sequencer 14 checks the count result of the verify operation in step S121, and determines whether or not the number of memory cells having the threshold voltage lower than the verify voltage AV in the memory cell transistors MT to which the data corresponding to the "A" level is written is equal to or less than a specified value (step S124). This specified value can be set to a given numerical value.

When the number of memory cells lower than the verify voltage AV is larger than the specified value (NO in step S124), the operation returns to step S121 to execute the verify operation at the "A" level, and the program operation in which the program voltage Vpgm is incremented.

When the number of memory cells lower than the voltage AV is equal to or less than the specified value (YES in step S124), the sequencer 14 determines that the memory cell transistor MT has passed the verify at the "A" level, and the verify operation is omitted in the subsequent program loops.

Then, the sequencer 14 increments the program voltage Vpgm by ΔVpgm (step S125) and executes the program operation (step S126). Next, the sequencer 14 determines whether or not the program voltage have been applied a specified number of times after the memory cell transistor MT has passed the verify at the "A" level (step S127). This specified number of times is set to the number at which the threshold voltage of the memory cell transistor MT to which the data at the "C" level is written in the memory cell transistors MT having the threshold voltage lower than the verify voltage at the "A" level is expected to exceed the voltage CV.

When the program voltage has not been applied the specified number of times after the memory cell transistor MT has passed the verify at the "A" level (NO in step S127), the operation returns to step S125, and the program operation in which the program voltage Vpgm is incremented again is executed. When the program voltage has been applied the specified number of times after the memory cell transistor MT has passed the verify at the "A" level (YES in step S127), the sequencer 14 determines that the threshold voltage of the writing target memory cell transistor MT reaches a desired level, and the write operation is ended.

FIG. 47 shows an example of the change in the threshold distribution of the memory cell transistors MT corresponding to FIG. 46 in the write operation described above. The horizontal axis in FIG. 47 indicates the number of program loops, and the vertical axis indicates the threshold voltage Vth. In FIG. 47, the threshold distribution of the memory cell transistors MT in an erase state ("ER" level) is divided into four groups based on the initial value of the threshold voltages. These four groups are referred to as groups Gr1 to Gr4 in the descending order of the initial values of the threshold voltages. In FIG. 47, the relationship between the number of program loops for each group and the threshold voltage is plotted with black circles. In the example shown in FIG. 47, it is assumed that the memory cell transistor MT has passed the verify at the "A" level after executing the fifth program loop.

In the ninth embodiment as shown in FIG. 47, it is assumed that the increase width of the threshold voltage by one program loop is fixed. Then, the sequencer 14 determines whether writing of the data at the "B" level and the "C" level in each memory cell transistor MT is ended based on the number of application times of the program voltage after the memory cell transistor MT has passed the verify at the "A" level. Specifically, in the example shown in FIG. 47, the threshold voltage of the memory cell transistor MT exceeds the verify voltage AV at the "A" level, then exceeds the verify voltage BV at the "B" level by executing the program loop three times, and then exceeds the verify voltage CV at the "C" level by further executing the program loop three times.

The sequencer 14 further determines that the threshold voltage of the memory cell transistor MT in the group Gr4, which does not exceed the verify voltage at the "A" level at the time of passing the verify at the "A" level, exceeds the verify voltage at the "A" level by applying the program voltage one more time. That is, as the criterion for determination of the number of memory cells used in step S124 in the ninth embodiment, the number of the memory cell transistors MT expected to have the lowest threshold voltage in the threshold distribution in the erased state is set to the number at which the threshold voltage is expected to exceed the verify voltage AV at the "A" level by executing the program operation one more time.

In this case, in the write operation at the "B" level, the sequencer 14 determines that the threshold voltage of the memory cell transistor MT exceeds the verify voltage AV at the "A" level and then exceeds the verify voltage BV at the "B" level after the program loop is executed three times, and that the threshold voltage of the memory cell transistor MT in the group Gr4 exceeds the verify voltage BV at the "B" level after the program loop is executed four times (three+ one times). Similarly, in the write operation at the "C" level, the sequencer 14 determines that the threshold voltage of the memory cell transistor MT exceeds the verify voltage AV at the "A" level and then exceeds the verify voltage CV at the "C" level after the program loop is executed six times (three+three times), and that the threshold voltage of the memory cell transistor MT in the group Gr4 exceeds the verify voltage CV at the "C" level after the program loop is executed seven times (three+three+one times).

[9-2] Effects of Ninth Embodiment

As described above, the memory system 1 according to the ninth embodiment omits the verify operation after the number of the memory cell transistors MT that have passed the verify of the data at the "A" level is less than the predetermined number. Then, the memory system 1 executes, for the memory cell transistor MT having passed the verify at the "A" level, the program loop in which the verify operation is omitted by the number of times set for each data to be written.

Furthermore, in the memory system 1 according to the ninth embodiment, when data at a desired level is written, the program operation is executed for the memory cell transistor MT which has not passed the verify at the "A" level at the time of omitting the verify at the "A" level one more time than the memory cell transistor MT that has passed the verify at the "A" level. In other words, the memory system 1 omits one verify operation by reducing the number of the memory cell transistors MT for determining whether the writing of the data at the "A" level has ended.

Thus, the memory system 1 according to the ninth embodiment can shorten the time for one verify operation, and can accelerate the write operation.

In the ninth embodiment, it has been described that the write operations at the "B" level and the "C" level are executed using the verify pass at the "A" level as a criterion, but the criterion for the verify pass is not limited thereto. For example, similar effects can be obtained by executing the verify operations at the "A" level and "B" level and setting the criterion for the verify pass at the "B" level as the setting described in the ninth embodiment.

[10] Tenth Embodiment

Next, a memory system 1 according to a tenth embodiment will be described. In the tenth embodiment, the QPW method is applied to a program operation which is likely to exceed a verify voltage at a desired level in the write operation described in the ninth embodiment. Hereinafter, differences between the memory system 1 according to the tenth embodiment and that according to the first to ninth embodiments will be described.

[10-1] Write Operation of Memory System 1

Figure 49:
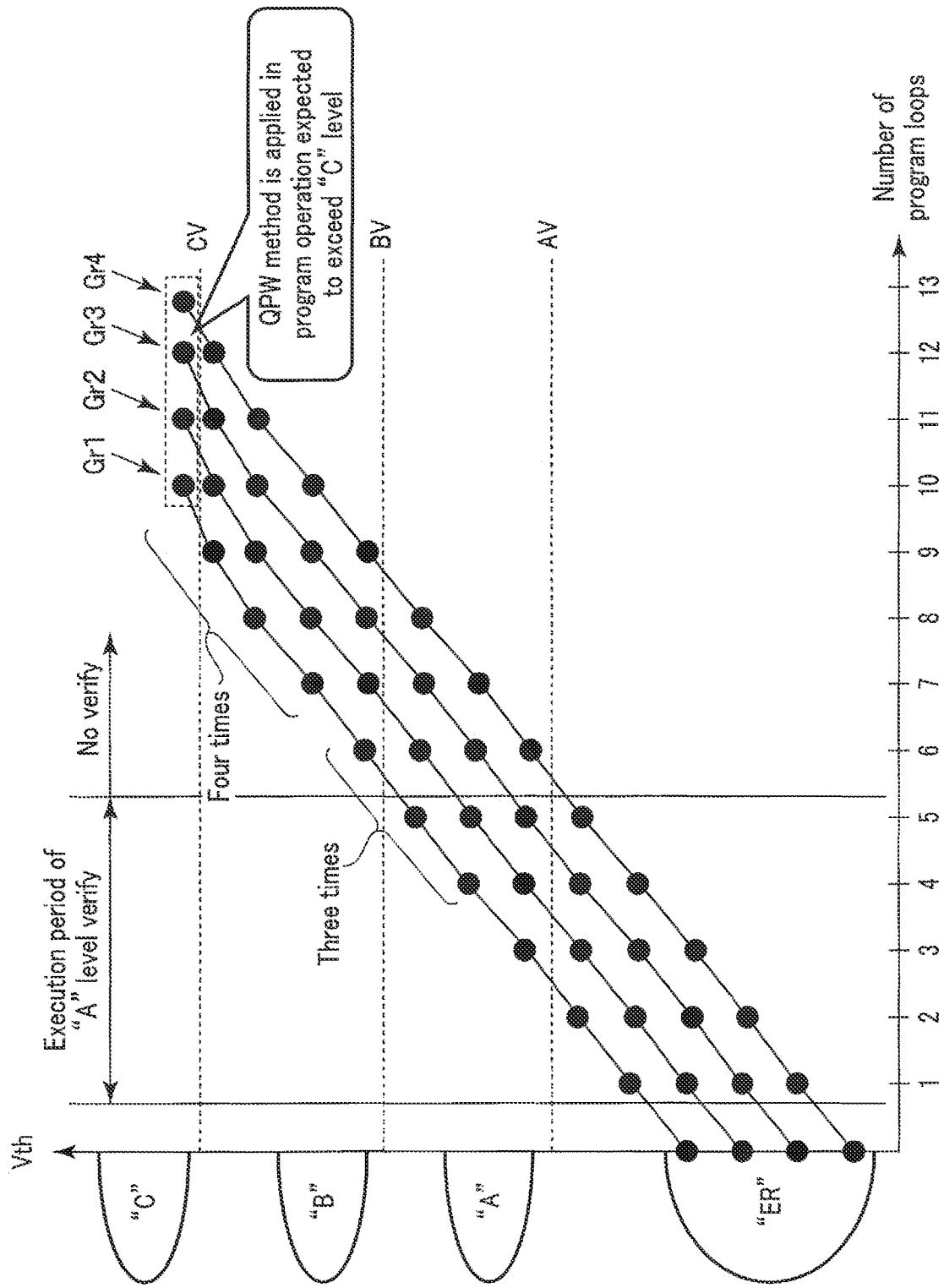
FIG. 49 is a diagram showing an example of a change in a threshold voltage in the write operation of the memory system according to the tenth embodiment.

Hereinafter, a write operation of the memory system 1 according to the tenth embodiment will be described below with reference to FIGS. 48 and 49. FIG. 48 shows examples of voltages applied to a selected word line WL_sel and a bit line BL during the write operation, and FIG. 49 shows an example of a change in threshold distribution of memory cell transistors MT corresponding to FIG. 48. The waveforms of the bit lines BL_prog in groups Gr1 and Gr4 shown in FIG. 48 correspond to those in the case of writing of data at a "C" level to the memory cell transistors MT in the groups Gr1 and Gr4 shown in FIG. 49.

In the examples shown in FIGS. 48 and 49, the memory cell transistor MT in the group Gr1 has passed the verify at an "A" level by the third program loop. Then, the memory cell transistor MT in the group Gr4 reaches the threshold voltage to exceed the "A" level by the one more program loop after the fifth program loop. As a result, in the sixth and subsequent program loops, the verify operation is omitted.

As shown in FIGS. 48 and 49, in the tenth embodiment, the write operation by the QPW method is applied in, for example, the write operation at the "C" level corresponding to the data in the highest threshold distribution in the MLC method.

Specifically, as shown in FIGS. 48 and 49, the threshold voltage of the memory cell transistor MT in, for example, the group Gr1 rises to the vicinity of the voltage CV by the ninth program loop. Thus, a sequencer 14 executes the write operation by the QPW method in the tenth program loop. That is, as shown in FIG. 48, the write operation is executed while an intermediate voltage Vqpw is being applied to the bit line BL_prog in the group Gr1. Thus, as shown in FIG. 49, the rising amount of the threshold voltage is suppressed, and the writing is ended in a state of slightly exceeding the voltage CV. In the subsequent program loops, the bit line BL in the group Gr1 is set as a write inhibit state, and a voltage Vbl is applied when a program voltage is applied. The sequencer 14 similarly applies the write operation by the QPW method to the memory cell transistors MT in the groups Gr2 to Gr4 in the program loop expected to reach the vicinity of the target threshold voltage in the subsequent program loops.

[10-2] Effects of Tenth Embodiment

The memory system 1 according to the tenth embodiment described above can improve reliability of write data. Hereinafter, the details of the effects of the tenth embodiment will be described.

The data retention of the memory cell transistor MT tends to become worse as the threshold voltage deviates from the neutral threshold value, that is, as the threshold voltage rises. Therefore, there is a case in which the difference between the verify voltage BV and the verify voltage CV (voltage CV-voltage BV) needs to be larger than the difference between the verify voltage AV and the verify voltage BV (voltage BV-voltage AV).

In addition, the threshold voltage of the memory cell transistor MT hardly rises as the threshold voltage rises. Thus, the rising width of the threshold voltage is not expected to be fixed after, for example, exceeding the verify voltage BV at the "B" level in the write operation by the MLC method. For this reason, in order to write data at the "C" level corresponding to the highest threshold distribution, the program loop can be executed four times which is one more than the example described in the ninth embodiment with reference to FIG. 47.

However, when the number of program loops is simply increased in this manner, overwriting in which the specified verify voltage is largely exceeded can occur. In the overwrite state, the threshold distribution in the erased state extends when the data in the corresponding page is erased for the next time.

Therefore, the memory system 1 according to the tenth embodiment executes the write operation by the QPW method in a program loop expected to exceed a desired level in the write operation described in the ninth embodiment. Thus, the memory system 1 according to the tenth embodiment can suppress overwriting in the write operation at the "C" level and further narrow the threshold distribution, and thereby improve the reliability of the write data.

In the above description, it has been described that the write operation by the QPW method is applied only to the writing at the "C" level, but the applied level is not limited thereto. For example, as shown in FIG. 50, such a write operation may be applied to the write operation at the "B" level. FIG. 50 shows an example of a change in the threshold distribution of the memory cell transistors MT corresponding to FIG. 49. In FIG. 50, the change in the threshold voltage of the memory cell transistor MT, to which data at the "B" level is written, is indicated by solid lines and black circles, and the change in the threshold voltage of the memory cell transistor MT, to which data at the "C" level is written, is indicated by broken lines and white circles. As shown in FIG. 50, the memory system 1 can narrow the threshold distribution at the "B" level by applying the write operation by the QPW method to the program loop expected to reach the "B" level. Accordingly, the memory system 1 can improve the reliability of write data.

The memory system 1 according to the tenth embodiment omits one verify operation by reducing the number of the memory cell transistors MT for determining whether writing the data at the "A" level has ended, similar to the ninth embodiment. Accordingly, the memory system 1 according to the tenth embodiment can accelerate the writing operation.

[11] Eleventh Embodiment

Next, an eleventh embodiment will be described. In a known method, in order to distinguish whether a program for a word line WLi is before a second write operation or after the second write operation, writing is executed to the flag memory cell (flag cell) at the time of the second write operation. The memory system may proceed that a reading sequence is appropriately controlled based on the information recorded in the flag cell at the time of data reading. The memory system 1 according to the eleventh embodiment may use no flag cell. In the eleventh embodiment, since data is written after a second write operation at an "ER" level or higher of the threshold voltage of a memory cell in the normal write operation, it is determined that the second write operation has been executed if the data is written at the "ER" level or higher of the threshold voltage of the memory cell, and that the second write operation has not been executed if the data is not written at the "ER" level or higher of the threshold voltage of the memory cell.

[11-1] Data Assignment of Memory Cell

Figure 51:
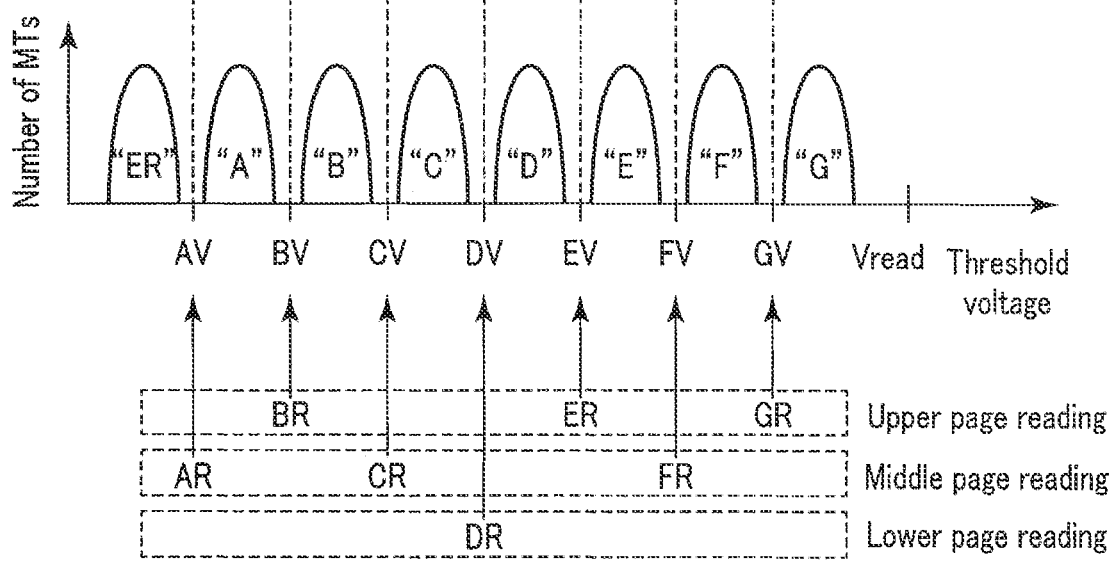
FIG. 51 is a diagram showing threshold distribution and data assignment of memory cells included in a semiconductor memory device according to an eleventh embodiment.

First, data assignment to be applied to a memory system 1 according to the eleventh embodiment will be described with reference to FIG. 51. FIG. 51 shows threshold distribution of memory cell transistors MT, assigned data, and voltages used in write and read operations, and data assignment is different from that shown in FIG. 10 described in the second embodiment.

As shown in FIG. 51, in the eleventh embodiment, data is assigned to the memory cell transistors MT included in each threshold distribution as follows:
"ER" level: "111" ("lower bit/middle bit/upper bit") data,
"A" level: "101" data,
"B" level: "100" data,
"C" level: "110" data,
"D" level: "010" data,
"E" level: "011" data,
"F" level: "001" data, and
"G" level: "000" data.

At the read voltage, the lower page data is determined by the read result using a voltage DR. The middle page data is determined by the read results using voltages AR, CR, and FR. The upper page data is determined by the read result using voltages BR, ER, and GR. That is, in the data assignment according to the present embodiment, the lower page data, the middle page data, and the upper page data are determined by respectively executing read operations once, three times, and three times. Hereinafter, such data assignment is referred to as a "1-3-3 code".

[11-2] Write Operation of Memory System 1

The write operation of the memory system 1 according to the present embodiment is similar to the operation described in the first embodiment with reference to FIGS. 5 and 6.

Figure 52:
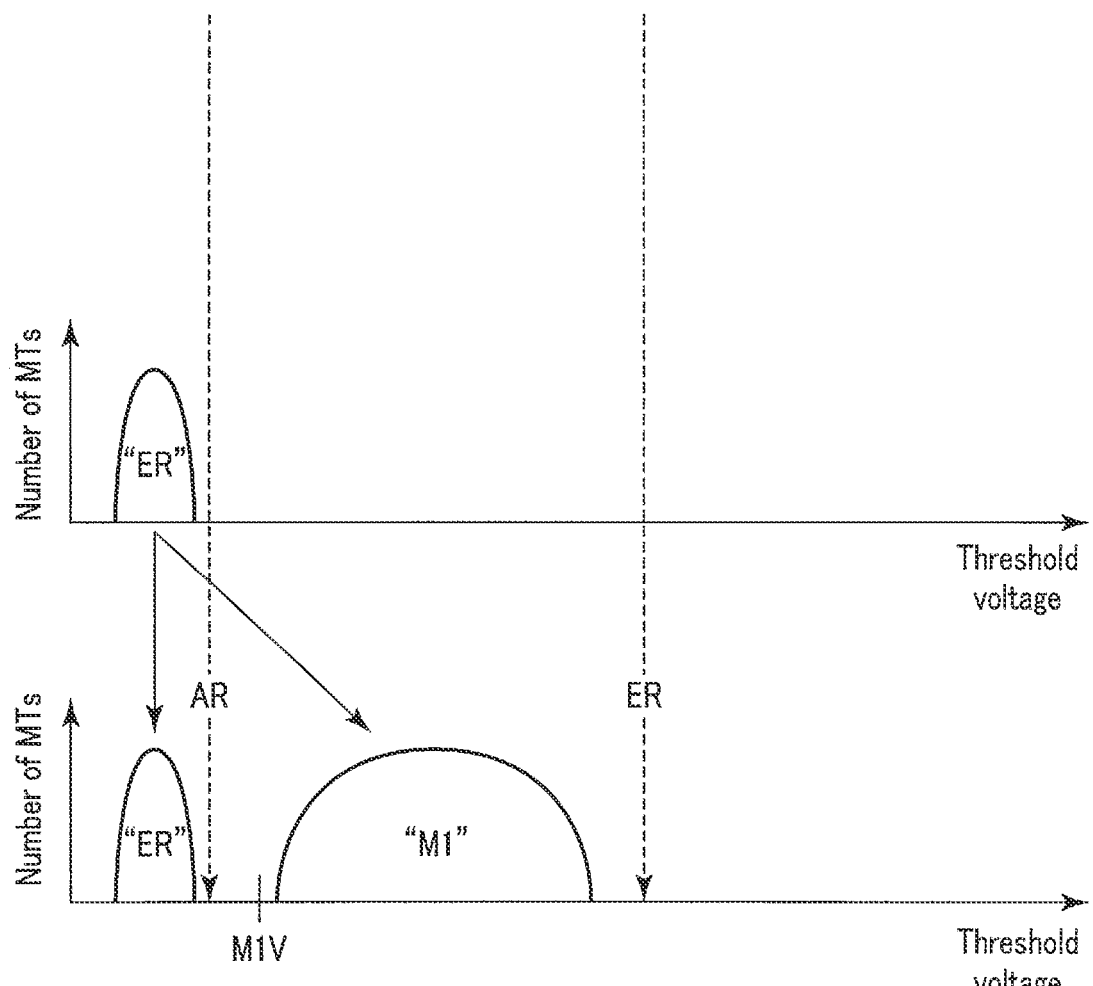
FIG. 52 is a diagram showing an example of a change in threshold distribution in a first write operation of a memory system according to the eleventh embodiment.

Next, the details of the first write operation in the present embodiment will be described with reference to FIG. 52. FIG. 52 shows 1-page data used in a first write operation, and threshold distributions of the memory cell transistors MT before and after the first write operation is executed.

As shown in FIG. 52, the threshold voltages of the memory cell transistors MT before the execution of the first write operation are distributed to the "ER" level which is an erase state. In the first write operation, a semiconductor memory device 10 executes the write operation for 1-page data based on the lower page data input from a controller 20, and forms two threshold distributions from the threshold distribution at the "ER" level.

Specifically, the semiconductor memory device 10 sets the memory cell transistor MT to which "1" data is written as a write inhibit state, and executes the write operation using a voltage M1V as a verify voltage to the memory cell transistor MT to which "0" data is written. The voltage M1V is lower than the voltage ER. The verify voltage M1V is set so that the threshold voltage of the memory cell transistor MT having passed the verify does not exceed the voltage ER. Thereafter, the first write operation is similarly executed to the adjacent memory cells.

Figure 53:
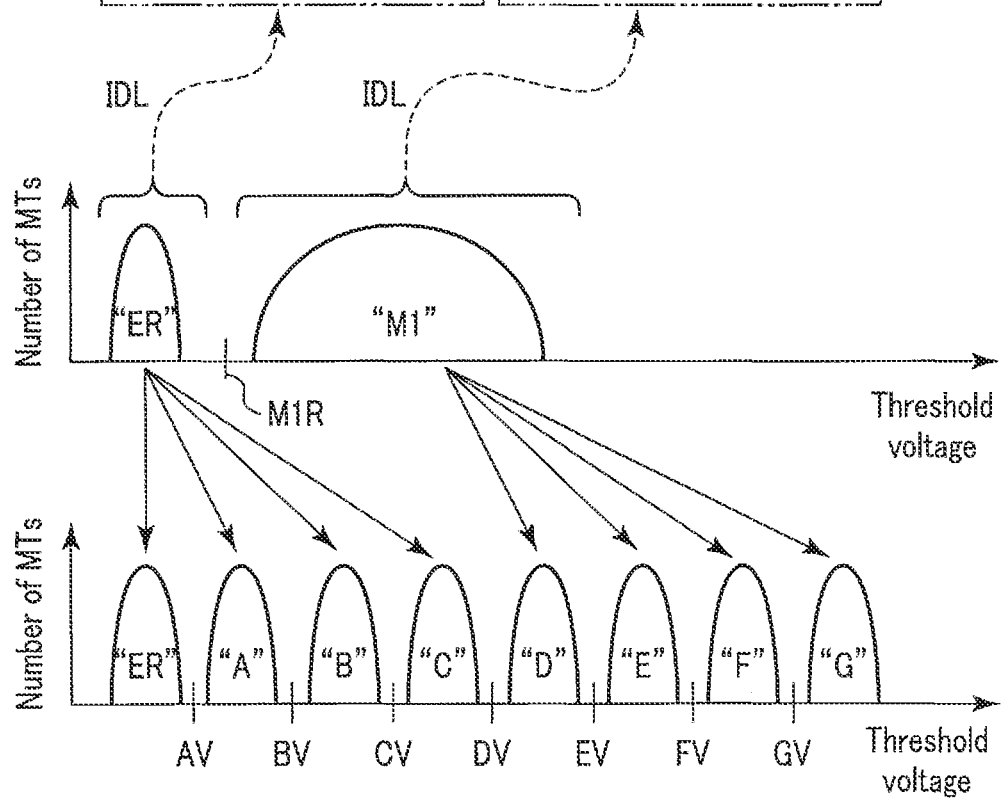
FIG. 53 is a diagram showing an example of a change in threshold distribution in the first write operation of the memory system according to the eleventh embodiment.

Next, the details of the second write operation in the present embodiment will be described with reference to FIG. 53. FIG. 53 shows 3-page data used in the second write operation and threshold distributions of the memory cell transistors MT before and after the second write operation is executed. As shown in FIG. 53, the threshold voltages of the memory cell transistors MT before the execution of the second write operation are distributed to the "ER" level and the "M1" level. In the second write operation, the semiconductor memory device 10 executes the write operation for 3-page data based on the middle and upper page data input from the controller 20 and the lower page data read from a memory cell array 11, and forms eight threshold distributions from the threshold distributions at the "ER" level and the "M1" level.

Specifically, the sequencer 14 first executes an internal data load (IDL). In the IDL in the present embodiment, a read operation using a voltage M1R is executed. It can be determined whether the lower page data is "1" or "0" by determining whether the threshold voltage of the memory cell transistor MT is lower than the voltage M1R. In this manner, the semiconductor memory device 10 restores the "1" data and "0" data (lower page data) written by the first write operation to a latch circuit in a sense amplifier unit SAU.

The sequencer 14 sets the memory cell transistors MT to which "111" data is written as a write inhibit state, and executes the write operations using the voltages AV, BV, CV, DV, EV, FV, and GV as verify voltages to the memory cell transistors MT to which "101" data, "100" data, "110" data, "010" data, "011" data, "001" data, and "000" data are respectively written. Thus, the threshold distribution at the "A" level is formed from the threshold distribution at the "ER" level, the threshold distributions at the "B" level and "C" level are formed from the threshold distribution at the "M1" level, the threshold distributions at the "D" level and the "E" level are formed from the threshold distribution at the "M2" level, and the threshold distributions at the "F" level and "G" level are formed from the threshold distribution at the "M3" level.

In FIG. 5, it has been described that the write operation (for example, after steps S11, S14, S17, S20, and S23) is executed, and then the next command set and data are input after a ready/busy signal RBn becomes the "H" level, but the operation order is not limited thereto. For example, by having an extra number of latch circuits (for example, latch circuits XDL) described with reference to FIG. 2 for write cache usage, it is possible to input the next command set and data during the write operation.

[11-3] Read Operation of Memory System 1

Figure 54B:
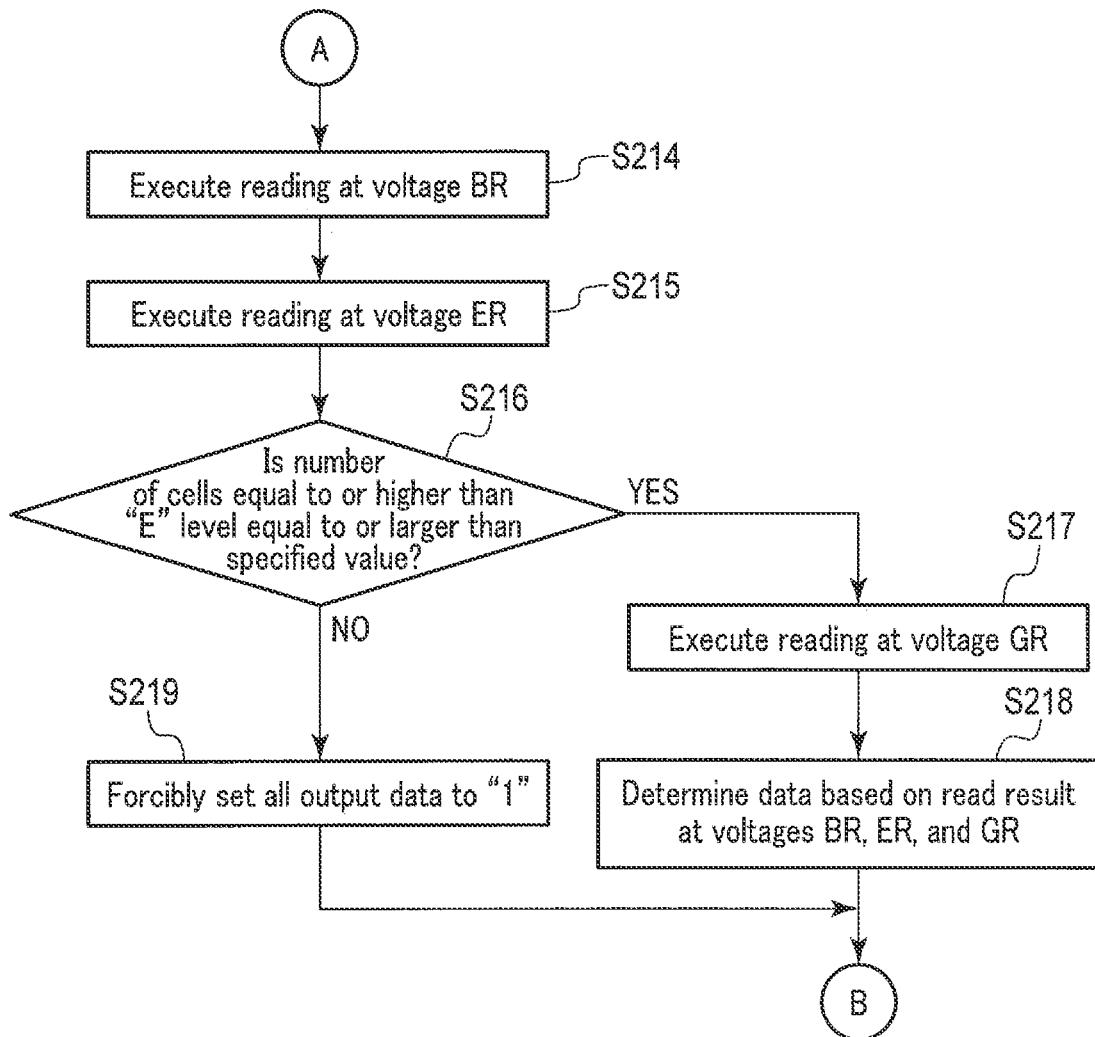

Here, a specific processing procedure of page reading will be described. FIGS. 54A and 54B are flowcharts showing the processing procedure of page reading according to the eleventh embodiment. As shown in FIG. 54, the sequencer 14 selects a read page (step S201).

When the read page is a lower page (step S201, lower), the sequencer 14 executes reading using the voltage ER (step S202). Then, the sequencer 14 determines whether the number of cells equal to or higher than the "E" level is equal to or larger than a specified value (step S203). When the number of cells equal to or higher than the "E" level is equal to or larger than the prescribed value (YES in step S203), the sequencer 14 executes reading using the voltage DR (step S204). Thereafter, the sequencer 14 determines data based on the result read by the voltage DR (step S205). On the other hand, when the number of cells equal to or higher than the "E" level is less than the prescribed value (NO in step S203), the sequencer 14 executes reading using the voltage AR (step S206). Thereafter, the sequencer 14 determines data based on the result read by the voltage AR (step S207).

When the read page is a middle page (step S201, Middle), the sequencer 14 executes reading using the voltage AR (step S208). Thereafter, the sequencer 14 executes reading using the voltage CR (step S209). Then, the sequencer 14 further executes reading using the voltage FR (step S210). Then, the sequencer 14 determines whether or not the number of cells equal to or higher than the "F" level is equal to or larger than a specified value (step S211). When the number of cells equal to or higher than the "F" level is equal to or larger than the specified value (YES in step S211), the sequencer 14 determines data based on the results read by the voltages AR, CR, and FR (step S212). On the other hand, when the number of cells equal to or higher than the "F" level is less than the specified value (NO in step S211), the sequencer 14 forcibly sets all output data to "1" (step S213).

When the read page is an upper page (step S201, Upper), the sequencer 14 executes reading using the voltage BR (step S214). Thereafter, the sequencer 14 executes reading using the voltage ER (step S215). Then, the sequencer 14 determines whether or not the number of cells equal to or higher than the "E" level is equal to or larger than the specified value (step S216). When the number of cells equal to or higher than the "E" level is equal to or larger than the specified value (YES in step S216), the sequencer 14 executes reading using the voltage GR (step S217). Thereafter, the sequencer 14 determines data based on the result read by the voltages BR, ER, and GR (step S218). On the other hand, when the number of cells equal to or higher than the "E" level is less than the specified value (NO in step S216), the sequencer 14 forcibly sets all output data to "1" (step S219).

The memory system 1 by storing information in the flag cell in the second write operation, it is possible to execute an appropriate read operation in the flash memory. Thus, the external system can read the page data in the same processing order without distinguishing whether the second write operation has been executed or not. In the eleventh embodiment, it is possible to read the page data in the same processing order without distinguishing whether the second write operation has been executed or not and without additionally using a flag cell.

The determination as to whether or not the number of cells equal to or higher than the "E" level is equal to or larger than the prescribed value (S203), as to whether the number of cells equal to or higher than the "F" level is equal to or larger than the prescribed value (S211), and as to whether the number of cells equal to or higher than the "E" level is equal to or larger than the prescribed value (S216) may be executed based on, for example, all memory cells of 2 k to 16 kB read at the same time, or a part of memory cells of 2 k to 16 kB.

Figures 55A, 55B:
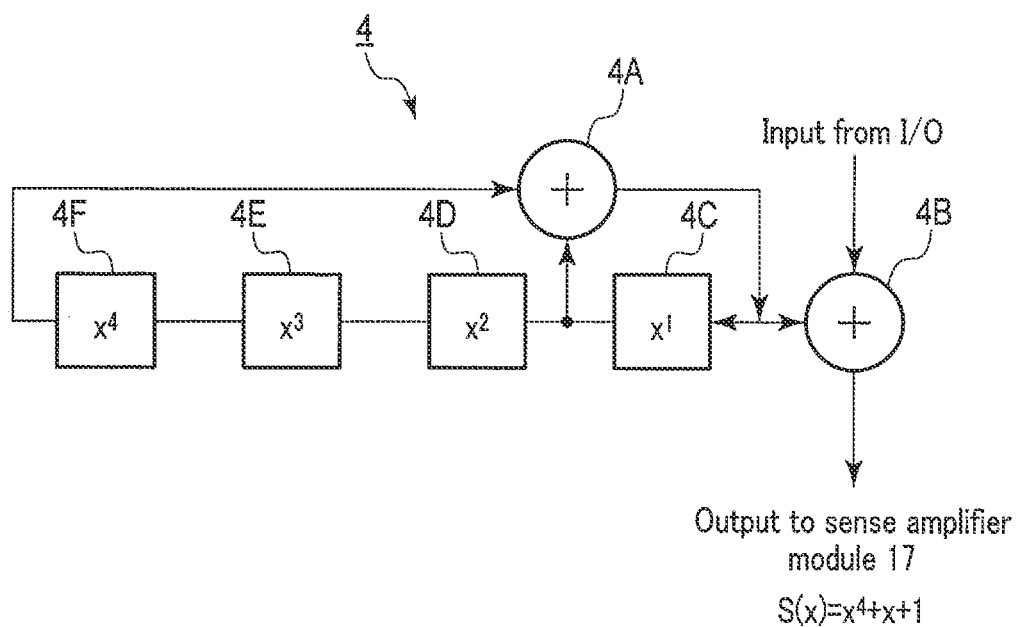
FIGS. 55A and 55B are diagrams showing an example of a randomization circuit using M sequences in the memory system according to the eleventh embodiment.

In this method, when there is no data to be written at the "E" level, the "F" level, and the "G" level during the second write operation in the write data, the sequencer 14 can determine that the second write operation has not been executed. In order to prevent such a case, it is preferable that a randomization circuit is provided between the input DAT and the sense amplifier module 17 of FIG. 1 in the semiconductor memory device 10. FIGS. 55A and 55B show an example of a randomization circuit 4. FIG. 55A shows an example of the circuit configuration of the randomization circuit 4, and FIG. 55B is a table showing an example of random numbers used for randomization corresponding to the randomization circuit 4 in FIG. 55A. The randomization circuit 4 randomizes the input data using, for example, the circuit configuration and the random numbers as shown in FIG. 55A and FIG. 55B. Thus, the randomization circuit 4 can generate the data to be written at the "E" level, the "F" level, and the "G" level when there is no input data corresponding to the "E" level, the "F" level, and the "G" level. Thus, the semiconductor memory device 10 using this method can prevent the sequencer 14 from determining that the second write operation has not been executed when there is no data to be written at the "E" level, "F" level, and "G" level.

FIGS. 56A and 56B show a first variation of the page reading processing procedure according to the eleventh embodiment described with reference to FIG. 54. As shown in FIG. 56, in the present variation, the sequencer 14 first selects a read page (step S221).

When the read page is a lower page (step S221, Lower), the sequencer 14 executes reading using the voltage DR (step S222). Then, the sequencer 14 determines whether or not the number of cells equal to or higher than the "D" level is equal to or larger than the specified value (step S223). As shown in FIG. 52, since data is written at the levels lower than the "E" level according to the threshold distribution of the memory cell after the first write operation, if the determination is executed with the "D" level, the sequencer 14 can determine that the second write operation has been executed. In contrast to this, in the first variation, the sequencer 14 sets the number of specified values to be large when it is determined whether or not the number of cells equal to or higher than the "E" level is equal to or larger than the specified value (step S203), or writes data to the memory cell having the threshold voltage of the "D" level or lower during the first write operation. Thus, in the first variation, when the read operation is executed after the second write operation, two read operations using the voltage ER and the voltage DR are required in the sequence of FIG. 54, but it is possible to execute the read operation by one read operation using the voltage DR (step S222) in the sequence of FIG. 56, and to accelerate the read time. The operations in steps S225 to S238 shown in FIG. 56 are similar to the operations in steps S205 to S218 described with reference to FIG. 54 respectively, and the description thereof is omitted.

Figure 57B:
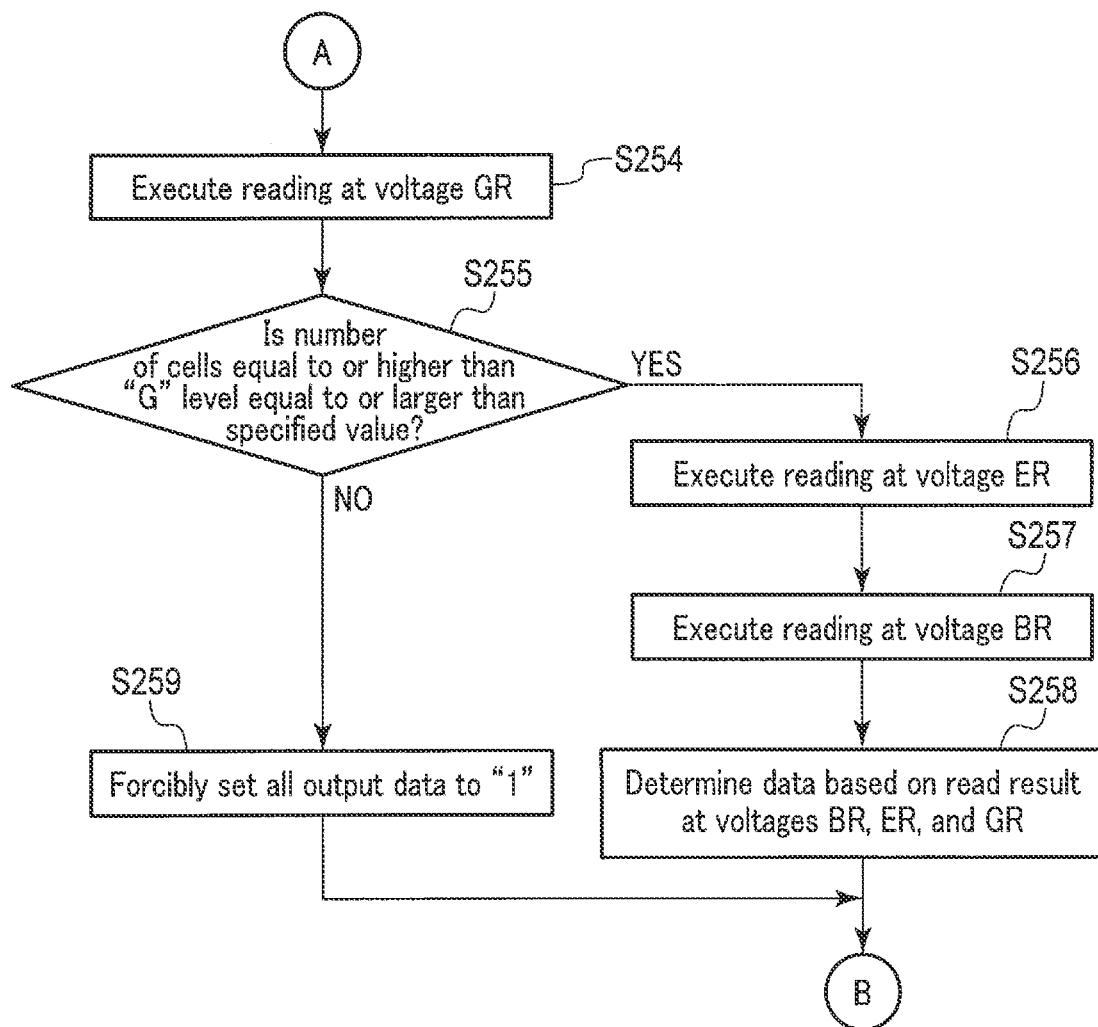

FIGS. 57A and 57B show a second variation of the page reading processing procedure according to the eleventh embodiment described with reference to FIG. 54. The operations in steps S241 to S258 shown in FIG. 57 respectively correspond to the operations in steps S201 to S218 described with reference to FIG. 54. Hereinafter, differences between the flowchart of the second variation shown in FIG. 57 and the flowchart shown in FIG. 54 will be described.

When the read page is a middle page, the sequencer 14 first reads the page using the voltage FR (step S248). Thereafter, the sequencer 14 determines whether the number of cells equal to or higher than the "FR" level is equal to or larger than the specified value (step S249). At this time, the sequencer 14 can take time to determine whether the number of cells equal to or higher than the "F" level is equal to or larger than the specified number. Thus, while the read operation using the voltage CR is being executed (step S250), the sequencer 14 determines whether the number of cells equal to or higher than the "F" level is equal to or larger than the specified number. The sequencer 14 may determine whether or not the number of cells equal to or higher than the "F" level is equal to or larger than the specified number (step S249) in the middle of or after executing the read operation using the voltage CR (step S250).

When the read page is an upper page, the sequencer 14 first reads the page using the voltage GR (step S254). Thereafter, the sequencer 14 determines whether or not the number of cells equal to or higher than the "GR" level is equal to or larger than the specified value (step S255). At this time, the sequencer 14 can take time to determine whether or not the number of cells equal to or higher than the "G" level is equal to or larger than the specified number. Thus, while the read operation using the voltage ER is being executed (step S256), the sequencer 14 determines whether or not the number of cells equal to or higher than the "G" level is equal to or larger than the specified number. The sequencer 14 may determine whether or not the number of cells equal to or higher than the "G" level is equal to or larger than the specified number (step S255) in the middle of or after executing the read operation using the voltage ER (step S256).

As described above, the semiconductor memory device 10 according to the second variation of the eleventh embodiment concurrently executes the operation for determining whether or not the number of cells is equal to or larger than the specified value and the read operation in the next memory cell, and can accelerate the reading time.

Figure 58B:
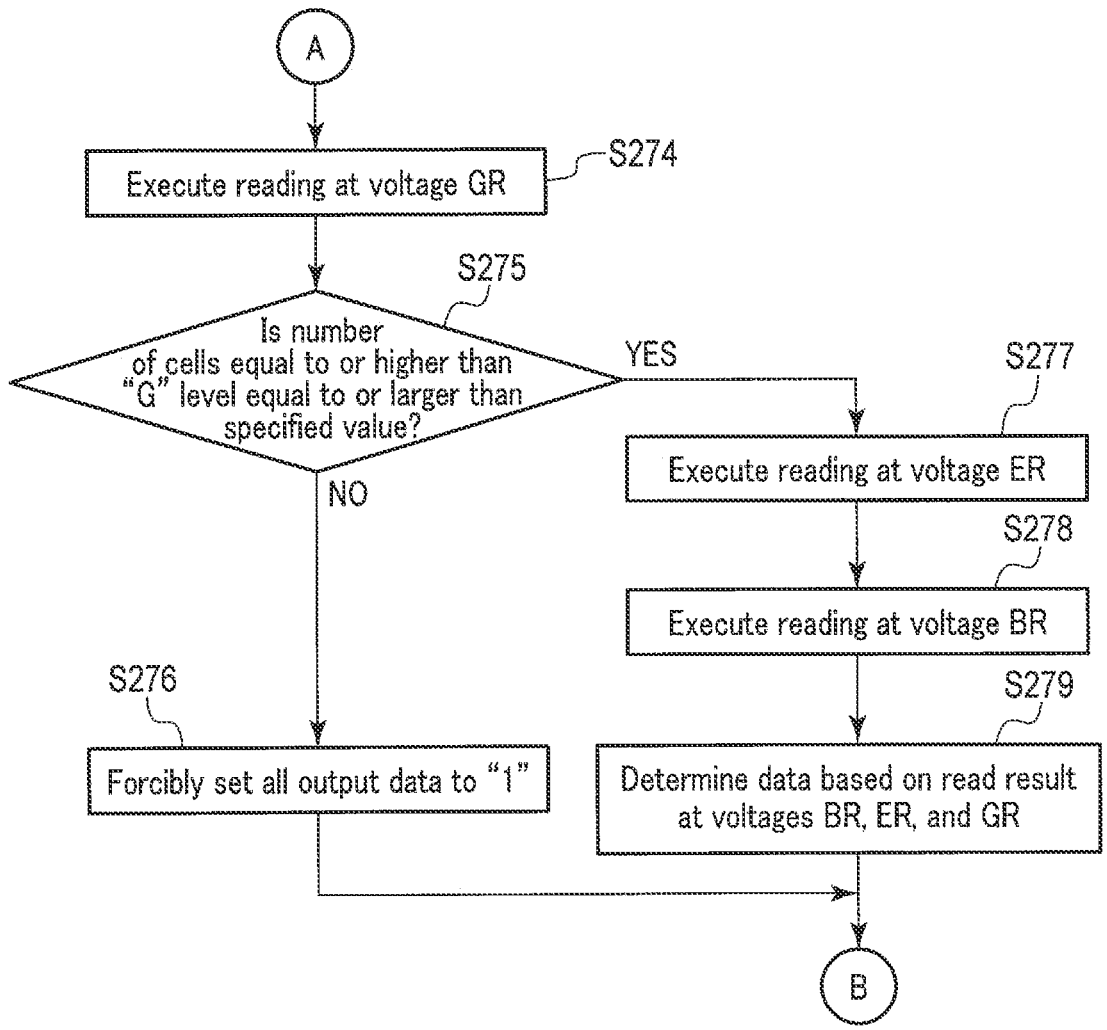

FIGS. 58A and 58B are a modified example of the processing procedure described with reference to FIG. 56. While the reading is executed from a low threshold distribution in FIG. 56, the reading is executed from a high threshold distribution in FIG. 58. Hereinafter, differences between the flowchart shown in FIG. 58 and the flowchart shown in FIG. 56 will be described.

When the read page is a middle page, the sequencer 14 first reads the page using the voltage FR (step S268). Thereafter, the sequencer 14 determines whether or not the number of cells equal to or higher than the "F" level is equal to or larger than the specified value (step S269). Thereafter, the sequencer 14 executes reading using the voltage CR (step S271) and reading using the voltage AR (step S272). At this time, the sequencer 14 can take time to determine whether or not the number of cells equal to or higher than the "FR" level is equal to or larger than the specified number. Thus, while the read operation using the voltage CR is being executed (step S271), the sequencer 14 determines whether or not the number of cells equal to or higher than the "F" level is equal to or larger than the specified number. The sequencer 14 may determine whether or not the number of cells equal to or higher than the "F" level is equal to or larger than the specified number (step S269) in the middle of, or after executing the read operation using the voltage CR (step S271). Thus, the semiconductor memory device 10 in the present example can concurrently execute the operation for determining whether or not the number of cells is equal to or larger than the specified value and the read operation in the next memory cell, and can accelerate the read time.

Similarly, when the read page is an upper page, the sequencer 14 first reads the page using the voltage GR (step S274). Thereafter, the sequencer 14 determines whether or not the number of cells equal to or higher than the "GR" level is equal to or larger than the specified value (step S275). Thereafter, the sequencer 14 executes reading using the voltage ER (step S277) and reading using the voltage BR (step S278). At this time, the sequencer 14 can take time to determine whether or not the number of cells equal to or higher than the "G" level is equal to or larger than the specified number. Thus, while the read operation using the voltage ER is being executed (step S277), the sequencer 14 determines whether or not the number of cells equal to or higher than the "G" level is equal to or larger than the specified number. The sequencer 14 may determine whether or not the number of cells equal to or higher than the "G" level is equal to or larger than the specified number (step S275) in the middle of or after executing the read operation using the voltage ER (step S277). Thus, the semiconductor memory device 10 in the present example can concurrently execute the operation for determining whether or not the number of cells is equal to or larger than the specified value and the read operation in the next memory cell, and can accelerate the read time.

FIGS. 59, 60, 61A, 61B, and 61C show an operation order of the first write operation and the second write operation to the memory cells respectively corresponding to the word lines WL0 to WL7. FIGS. 59, 60, 61A, 61B, and 61C also show a frame (white background) corresponding to the first write operation and a frame (hatched background) corresponding to the second write operation in each combination, and show the number representing the order for executing the operation in each frame. In the present embodiment, the first write operation executes a 1-page data program, and the second write operation executes a 2-page data program.

Figure 59:
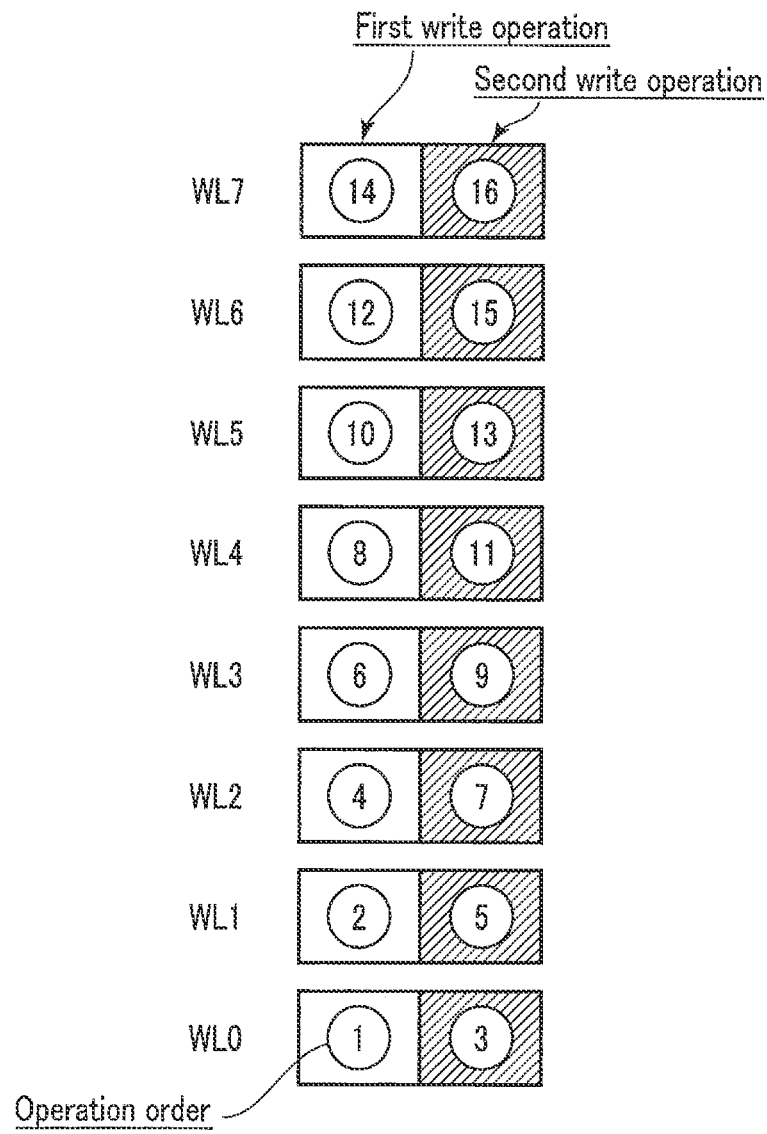
FIGS. 59, 60, 61A, 61B, and 61C is a diagram showing an example of a writing order in a write operation of a memory system according to the eleventh embodiment.

FIG. 59 shows an example in which the sequencer 14 executes the first write operation and the second write operation to word lines provided in edge portions (for example, word lines WL0 and WL7).

Figure 60:
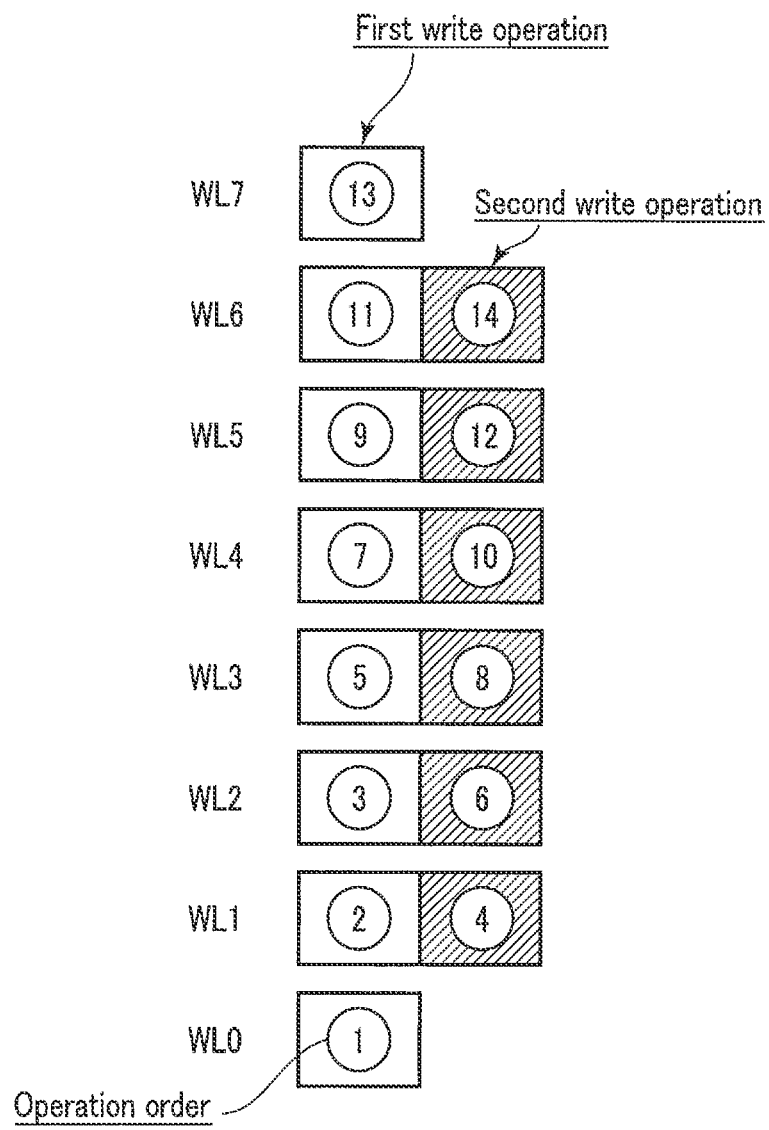

FIG. 60 shows an example in which the sequencer 14 only executes the first write operation to word lines provided in the edge portions.

Figure 61A:
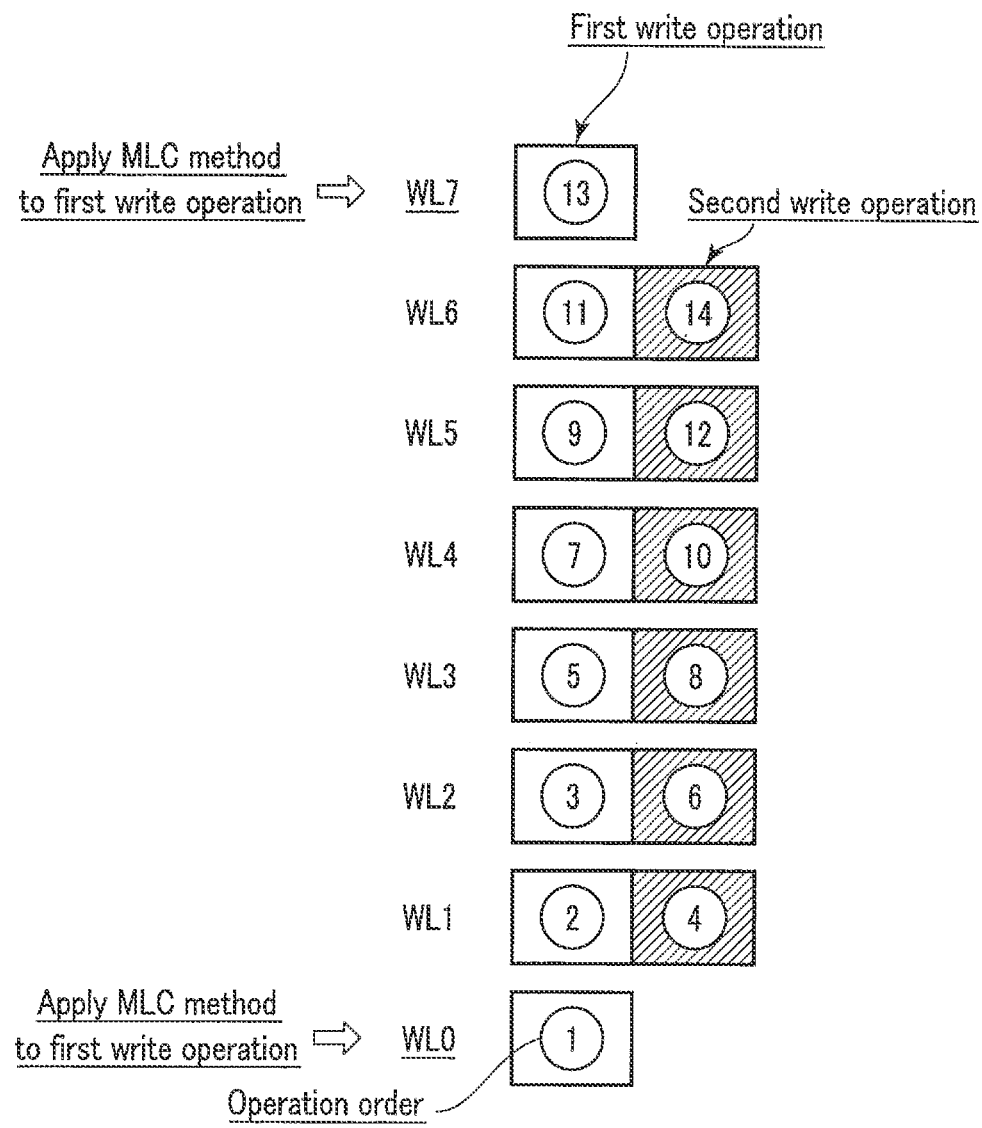

FIG. 61A shows an example in which the sequencer 14 only executes the first write operation to word lines provided in the edge portions, and apply the MLC method to the first write operation to the word lines provided in the edge portions (for example, word line WL0 and WL7).

Figure 61B:
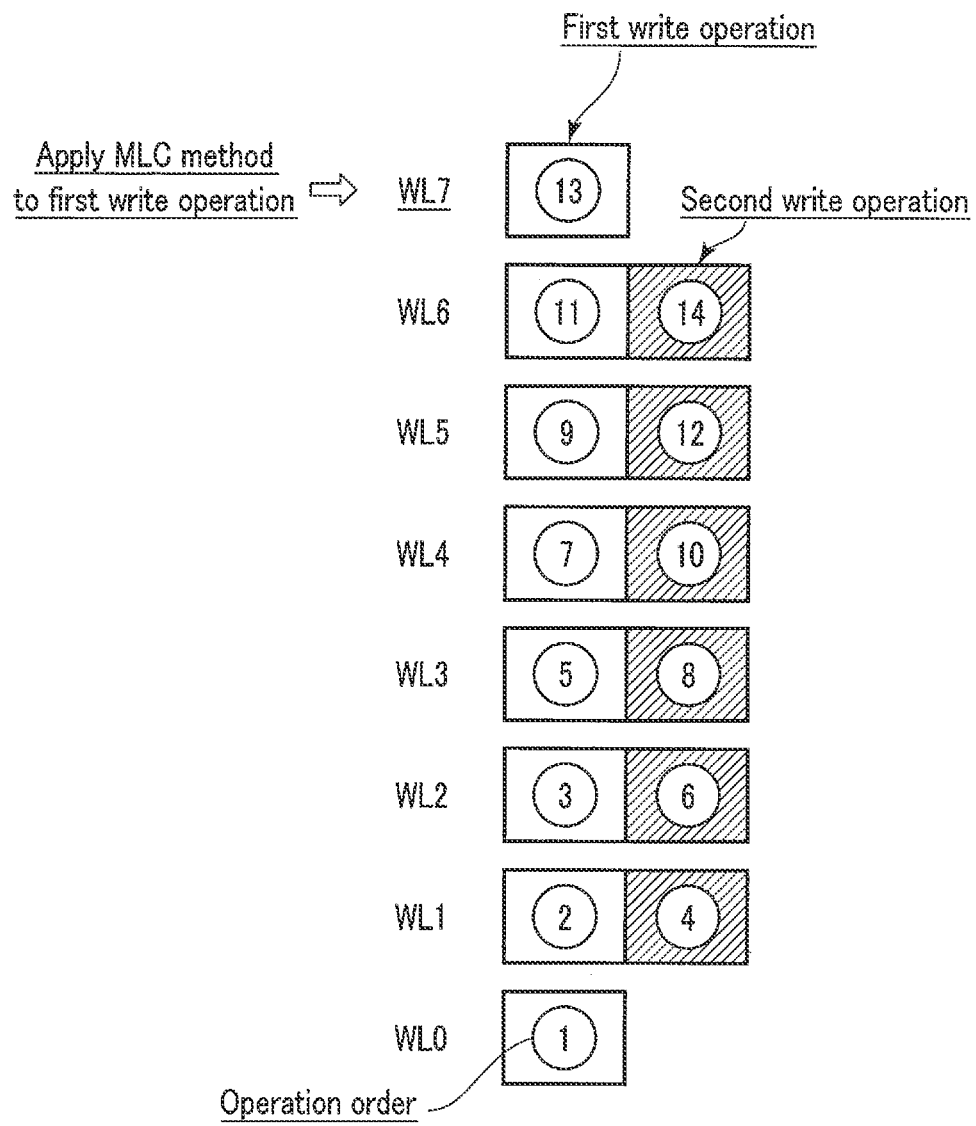

FIG. 61B shows an example in which the sequencer 14 only executes the first write operation to word lines provided in the edge portions, and apply the MLC method to the first write operation to the word line provided in one edge portion (for example, word line WL7).

Figure 61C:
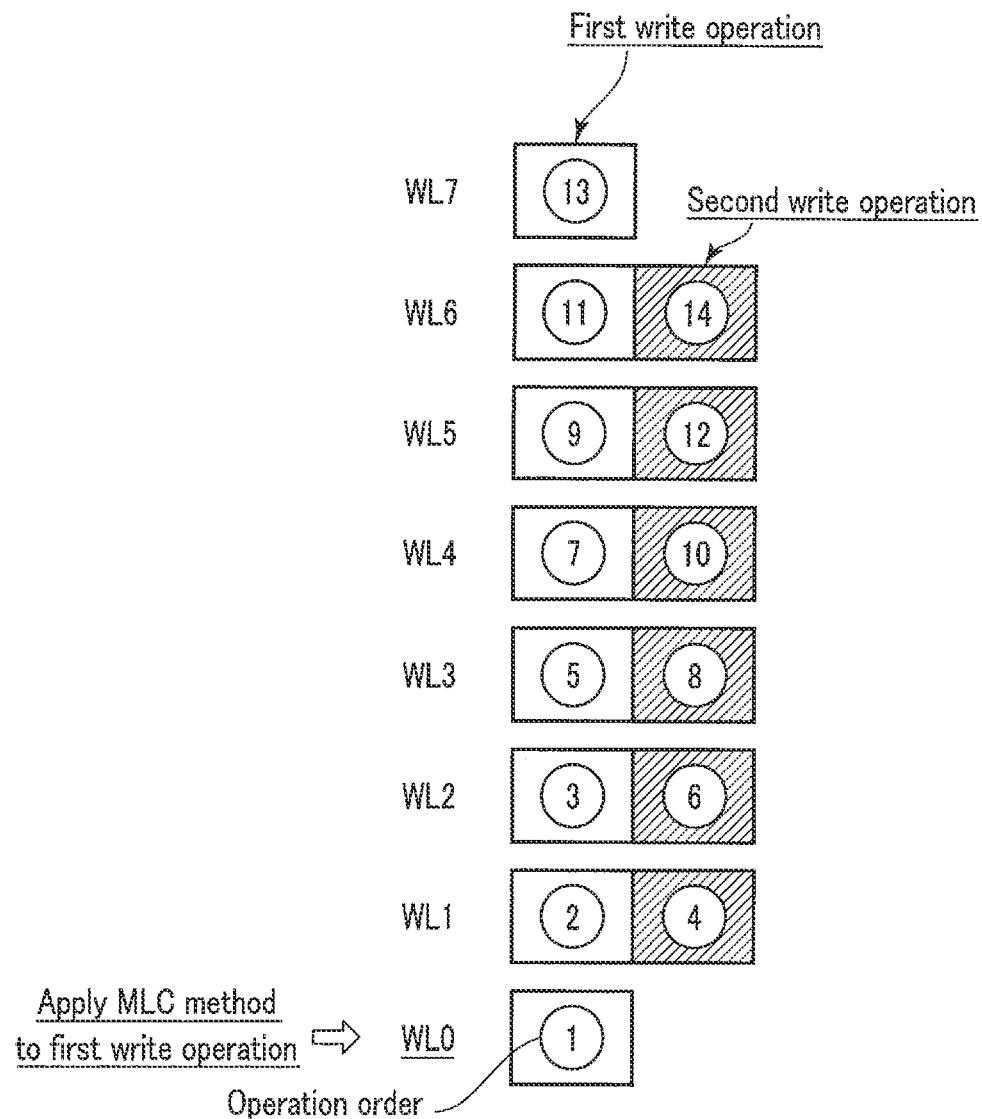

FIG. 61C shows an example in which the sequencer 14 only executes the first write operation to word lines provided in the edge portions (for example, word lines WL0 and WL7), and apply the MLC method to the first write operation to the word line provided in another edge portion (for example, word line WL0).

As described above, the memory system 1 according to the present embodiment may omit the second write operation in accordance with a characteristic of the memory cells corresponding to the word lines in the edge portions. In this case, the memory system 1 may apply the SLC method or the MLC method to the memory cells corresponding to the word lines provided in the edge portions.

[11-4] Variation of the Eleventh Embodiment

In the variation of the eleventh embodiment, one memory cell retains two-bit data.

Figure 62:
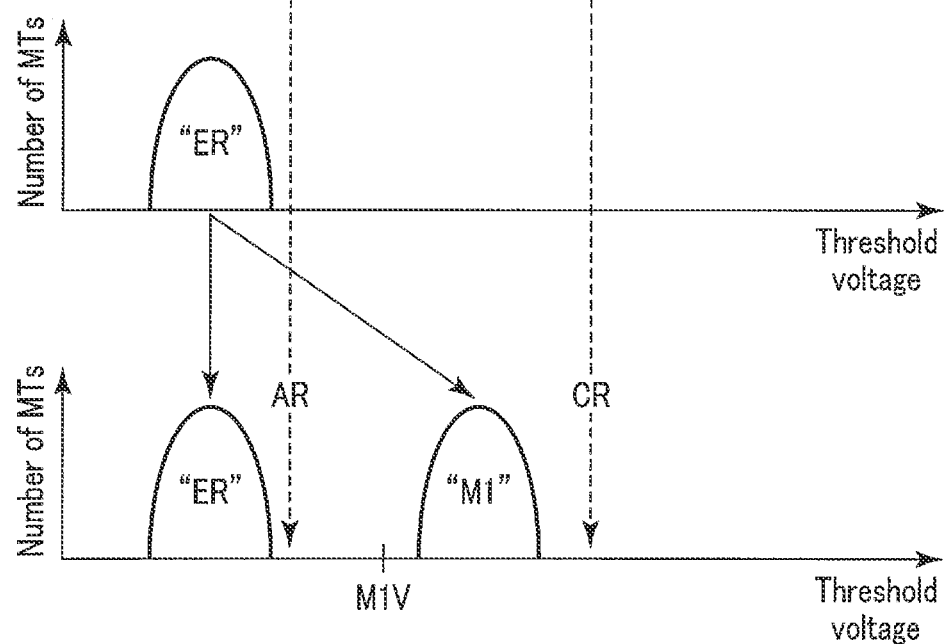
FIG. 62, is a diagram showing an example of a change in threshold distribution in the first write operation of the memory system according to a variation of the eleventh embodiment.

FIG. 62 shows 1-page data used in the first write operation and threshold distributions of the memory cell transistors MT before and after the first write operation is executed in the variation of the eleventh embodiment.

Figure 63:
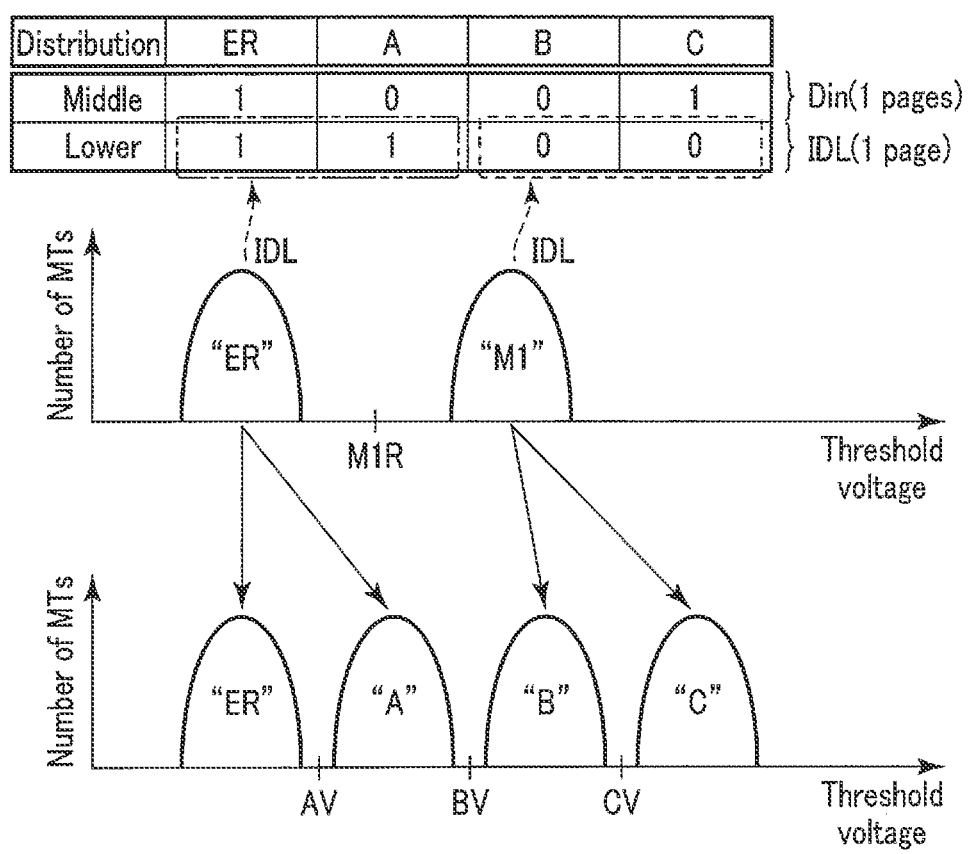
FIG. 63, is a diagram showing an example of a change in threshold distribution in the second write operation of the memory system according to the variation of the eleventh embodiment.

FIG. 63 shows 2-page data used in the first write operation and threshold distributions of the memory cell transistors MT before and after the first write operation is executed in the variation of the eleventh embodiment.

Figure 64:
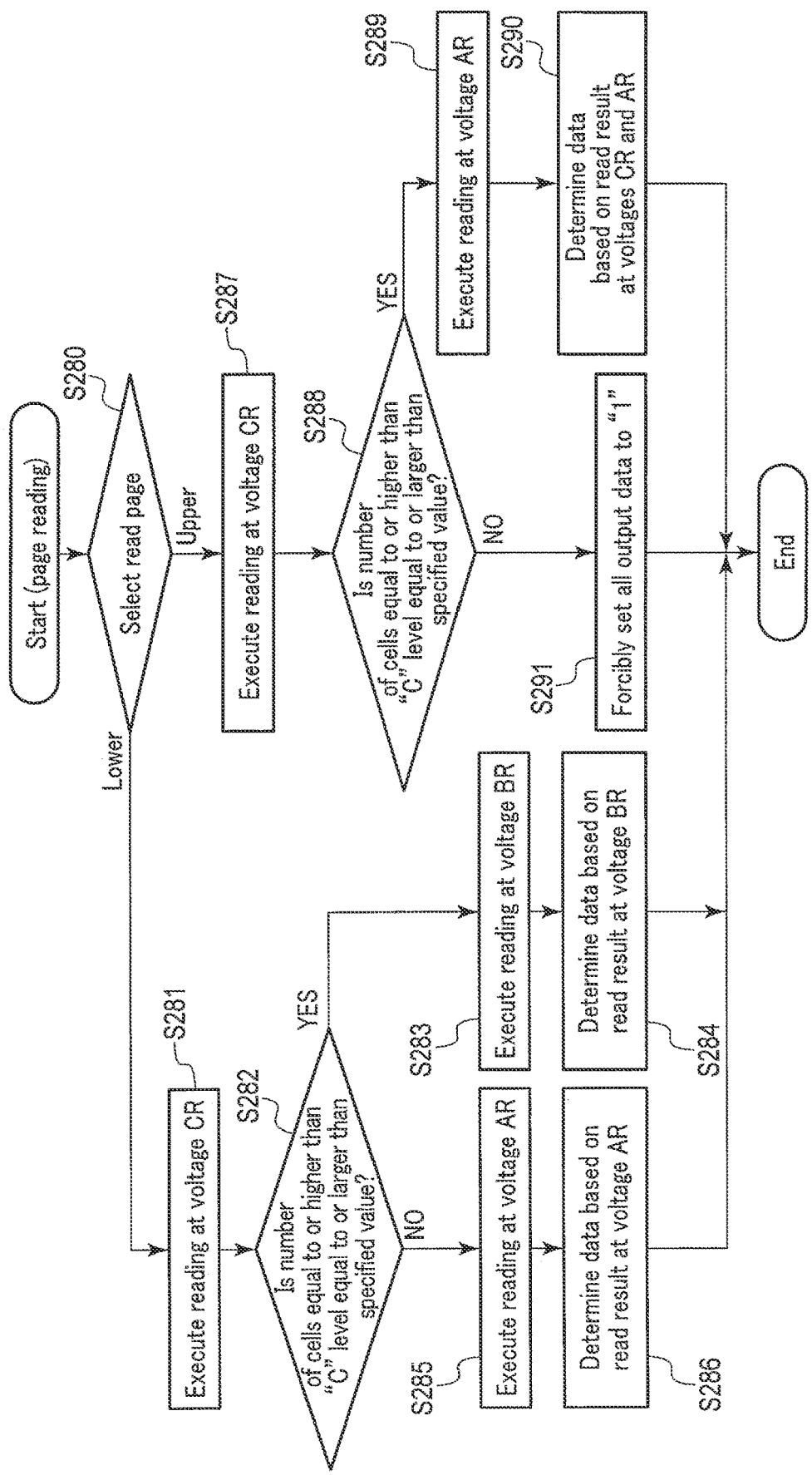
FIGS. 64 and 65 are flowcharts showing an example of a write operation of the memory system according to the variation of the eleventh embodiment.

FIG. 64 is flowcharts showing the processing procedure of page reading according to the variation of the eleventh embodiment. As shown in FIG. 64, the sequencer 14 selects a read page (step S280).

When the read page is a lower page (step S280, lower), the sequencer 14 executes reading using the voltage CR (step S281). Then, the sequencer 14 determines whether the number of cells equal to or higher than the "C" level is equal to or larger than a specified value (step S282). When the number of cells equal to or higher than the "C" level is equal to or larger than the prescribed value (YES in step S203), the sequencer 14 executes reading using the voltage BR (step S204). Thereafter, the sequencer 14 determines data based on the result read by the voltage BR (step S284). On the other hand, when the number of cells equal to or higher than the "C" level is less than the prescribed value (NO in step S282), the sequencer 14 executes reading using the voltage AR (step S285). Thereafter, the sequencer 14 determines data based on the result read by the voltage AR (step S286).

When the read page is an upper page (step S280, Upper), the sequencer 14 executes reading using the voltage AR (step S287). Then, the sequencer 14 determines whether or not the number of cells equal to or higher than the "C" level is equal to or larger than the specified value (step S288). When the number of cells equal to or higher than the "C" level is equal to or larger than the specified value (YES in step S288), the sequencer 14 executes reading using the voltage AR (step S289). Thereafter, the sequencer 14 determines data based on the result read by the voltages CR and AR (step S290). On the other hand, when the number of cells equal to or higher than the "C" level is less than the specified value (NO in step S288), the sequencer 14 forcibly sets all output data to "1" (step S291).

Figure 65:
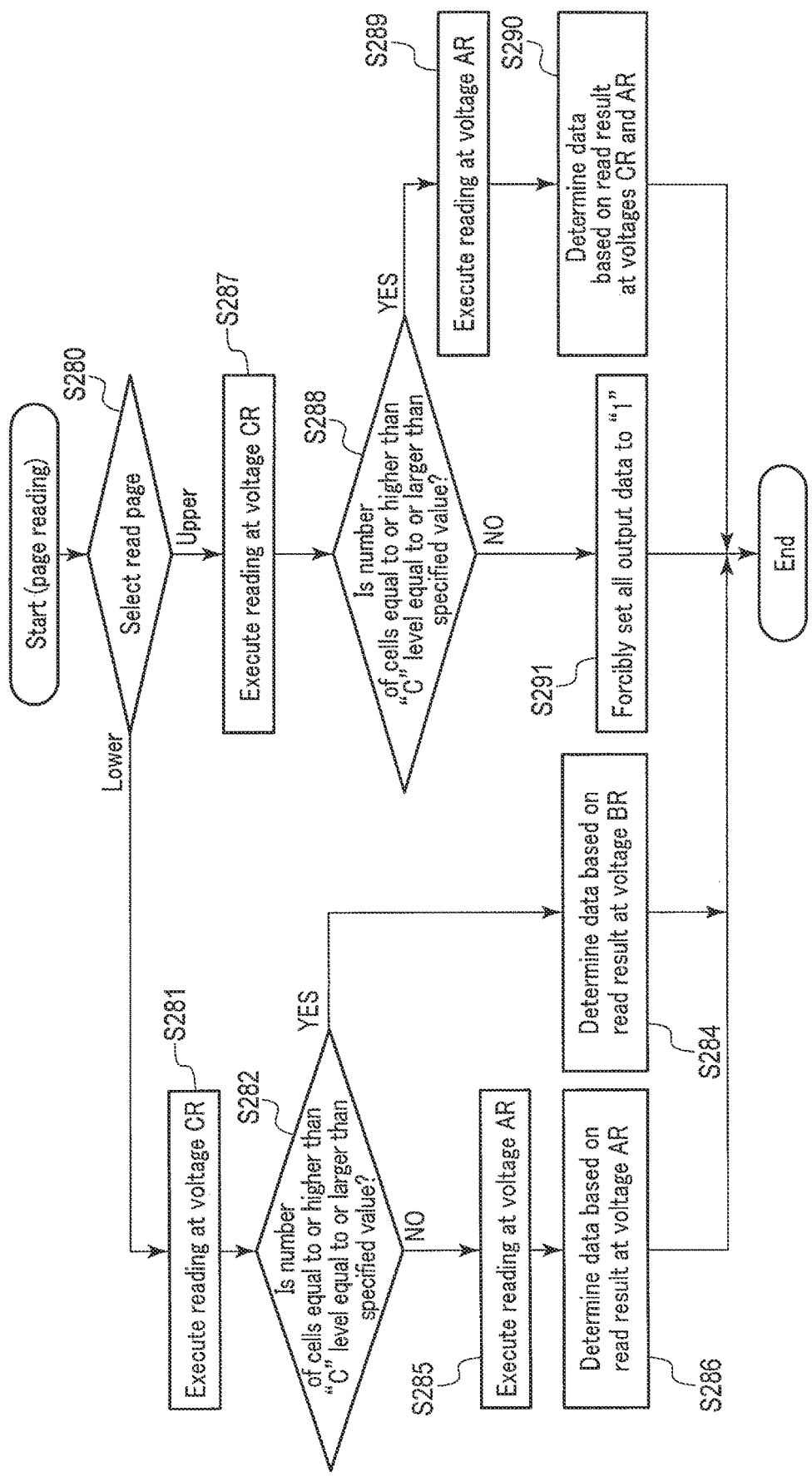

FIG. 65 show a variation of the page reading processing procedure according to the variation of the eleventh embodiment described with reference to FIG. 64. As shown in FIG. 64, in the present variation, the sequencer 14 first selects a read page (step S280).

When the read page is a lower page (step S280, Lower), the sequencer 14 executes reading using the voltage CR (step S281). Then, the sequencer 14 determines whether or not the number of cells equal to or higher than the "C" level is equal to or larger than the specified value (step S282). As shown in FIG. 62, since data is written at the levels lower than the "C" level according to the threshold distribution of the memory cell after the first write operation, if the determination is executed with the "B" level, the sequencer 14 can determine that the second write operation has been executed. In contrast to this, in the first variation, the sequencer 14 sets the number of specified values to be large when it is determined whether or not the number of cells equal to or higher than the "C" level is equal to or larger than the specified value (step S282), or writes data to the memory cell having the threshold voltage of the "B" level or lower during the first write operation. Thus, in the variation, when the read operation is executed after the second write operation, two read operations using the voltage CR and the voltage BR are required in the sequence of FIG. 64, but it is possible to execute the read operation by one read operation using the voltage CR (step S222) in the sequence of FIG. 65, and to accelerate the read time. The operations in steps S284 to S291 shown in FIG. 65 is similar to the operations described with reference to FIG. 64, and the description thereof is omitted.

[11-5] Effects of Eleventh Embodiment

As described above, the memory system 1 according to the present embodiment executes the first write operation to the write data in which the data received from a host apparatus 30 is assigned based on the data of the lower page, similar to the first embodiment. Then, the memory system 1 executes the second write operation based on the data of the middle page, the upper page, and the data of the lower page read by the internal data load (IDL).

The sequencer 14 of the semiconductor memory device 10 according to the present embodiment determines that the second write operation has been executed if the data is written at the "E" level or higher at the time of the data reading, and determines that the second write operation has not been executed if the data is not written at the "E" level or higher. As a result, the sequencer 14 can execute an appropriate read operation before and after the second write operation.

The sequencer 14 of the semiconductor memory device 10 according to the present embodiment can determine whether the reading target memory cell is before or after the second write operation without using a flag cell for distinguishing the second write operation.

Furthermore, the semiconductor memory device 10 according to the present embodiment generates write data corresponding to the "E" level, the "F" level, and the "G" level by using the randomization circuit 4. Thus, the semiconductor memory device 10 according to the present embodiment can prevent the sequencer 14 from determining that the second write operation has not been executed when there is no data to be written at the "E" level, the "F" level, and the "G" level.

[12] Twelfth Embodiment

Figure 68:
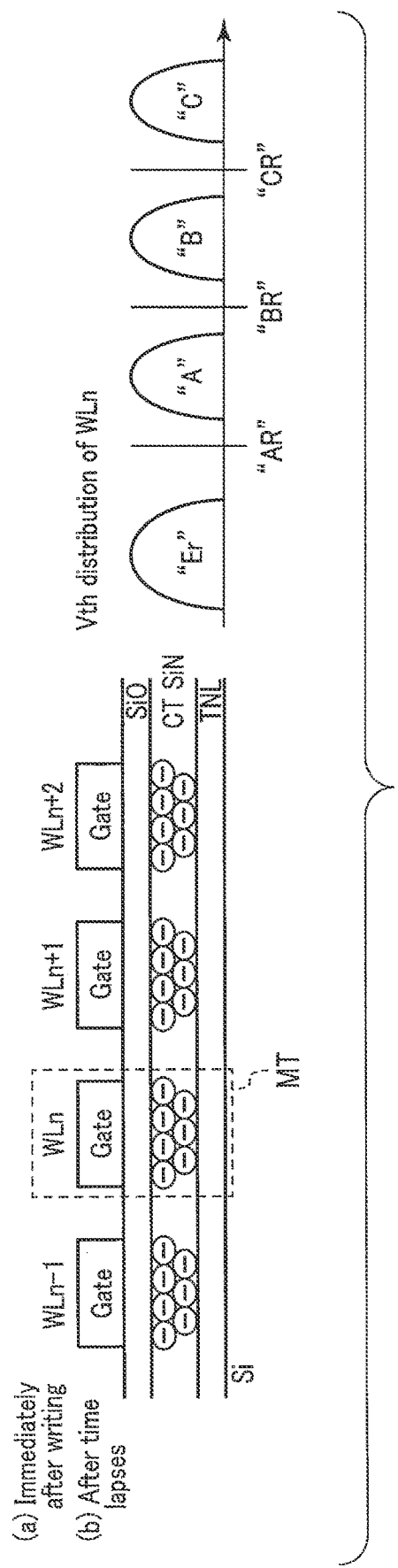

For example, in a charge trap type memory cell used for a semiconductor memory device in which memory cells are three-dimensionally stacked, when adjacent cells are at an erase level, electrons in the memory cell to which data is written are diffused in SiN after the writing and the lapse of time. At this time, the threshold voltage of the memory cell shifts to the lower side. FIG. 66 shows a part of the memory cell array 11 described with reference to FIG. 2 and the arrangement of the memory cells connected to a word line WL. In the present embodiment, it will be described that 2-bit data is stored in one memory cell in a charge trap type memory cell with reference to FIGS. 67 to 69. FIG. 67 shows an example of a state and threshold distribution of memory cells when the threshold voltages of the memory cells of the adjacent cells are in an erase state ("Er level"). FIG. 68 shows a state and threshold distribution of memory cells when the threshold voltages of the memory cells of the adjacent cells are high (for example, "C level") and the threshold voltage of the memory cell corresponding to a word line WLn is also high (for example, "C level"). FIG. 69 shows a state and threshold distribution of a memory cell when the threshold voltages of the memory cells of the adjacent cells are high (for example, "C level") and the threshold voltage of the memory cell corresponding to the word line WLn is in the erase state (for example, "Er level").

As shown in FIG. 67, when the adjacent cells are at the erase level and the time lapses after the writing, electrons in the memory cell to which data is written are diffused in SiN. Then, the threshold voltage of the memory cell shifts to the lower side. On the other hand, as shown in FIG. 68, when the adjacent cells have high threshold voltages, the threshold voltage of the memory cell to which data is written is hard to change if time lapses after the writing. Furthermore, as shown in FIG. 69, in a memory cell to which data is written at a low level (for example, erase state "Er"), when the adjacent cells have high threshold voltages and the time lapses after the writing, electrons in the memory cell to which data is written are diffused in SiN, and the threshold voltage of the memory cell shifts to the higher side.

Figure 70:
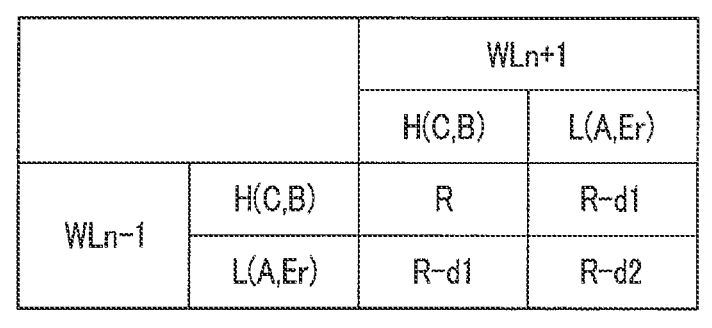

FIG. 70 shows an example of the read voltage during the read operation according to the state of the adjacent memory cell. The row indicates the threshold voltage state of the memory cell corresponding to the word line WLn−1, and the column indicates the threshold voltage state of the memory cell corresponding to the word line WLn+1. Then, H(C, B) shown in FIG. 70 indicates that the threshold voltage of the corresponding memory cell is high (C level or B level), and L (A, Er) indicates that the threshold voltage of the corresponding memory cell is low (A level or Er level).

As shown in FIG. 70, at the time of reading the word line WLn, a sequencer 14 checks the threshold voltages of the memory cells corresponding to the adjacent word lines WLn+1 and WLn−1. When the threshold voltages of the memory cells corresponding to the word lines WLn+1 and WLn−1 are both high (H: C level or B level), the sequencer 14 executes reading at a normal read voltage R. When one of the threshold voltages of the memory cells corresponding to the word lines WLn+1 and WLn−1 is high (H: C level or B level) and the other is low (L: A level or Er level), the sequencer 14 executes reading at a voltage R-d1 lower than the normal read voltage. When the threshold voltages of the memory cells corresponding to the word lines WLn+1 and WLn−1 are both low (L: A level or Er level), the sequencer 14 executes reading at a voltage R-d2 lower than the voltage R-d1.

Figure 71:
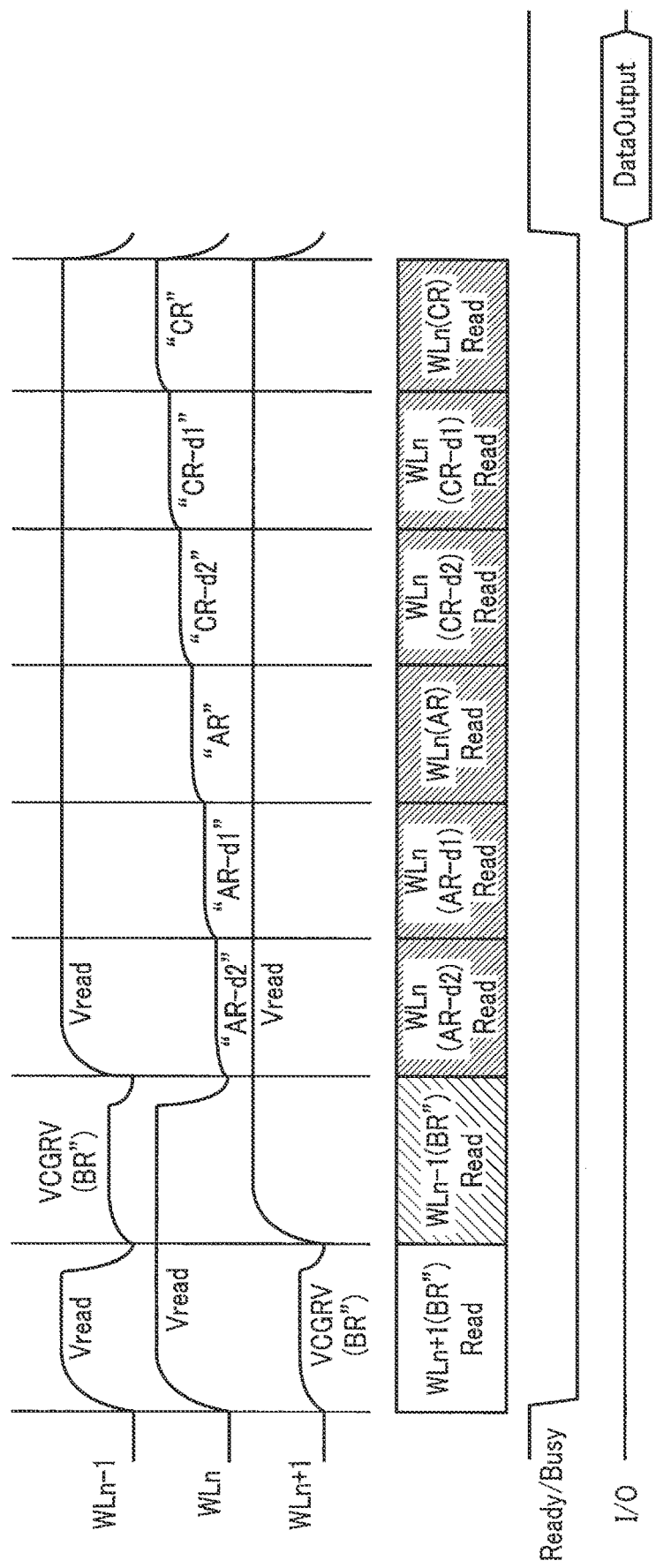

FIGS. 71 and 72 show the waveforms at the time of reading the lower page and the waveforms at the time of reading the upper page respectively. FIG. 73 is an example in which the cases described in FIG. 70 are further divided. In the example shown in FIG. 73, the adjacent memory cell is divided into four threshold voltage states and the read level is corrected. Note that, the classification of the threshold voltages of the adjacent cells can be set to an arbitrary number, and may be divided into, for example, three.

As shown in FIG. 69, in the memory cell in which data is written at the low level (for example, the erase state "Er"), when the threshold voltage tends to shift to a high level due to the influence of the adjacent memory cell, a reading method shown in FIG. 74 may be used. Hereinafter, the reading method in the case of executing reading at a low reading level (for example, voltage AR) will be described. As shown in FIG. 74, at the time of reading the word line WLn, the sequencer 14 first reads the adjacent memory cells corresponding to the word lines WLn+1 and WLn−1. When the threshold voltages of the adjacent memory cells corresponding to the word lines WLn+1 and WLn−1 are both high (H: C level or B level), the sequencer 14 executes reading using a voltage AR+da higher than the normal read voltage. When one of the threshold voltages of the adjacent memory cells corresponding to the word lines WLn+1 and WLn−1 is high (H: C level or B level) and the other is low (L: A level or Er level), the sequencer 14 executes reading using the normal read voltage AR. When the threshold voltages of the adjacent memory cells corresponding to the word lines WLn+1 and WLn−1 are both low (L: A level or Er level), the sequencer 14 executes reading using a voltage AR-d2 lower than a voltage AR-d1.

Figure 75:
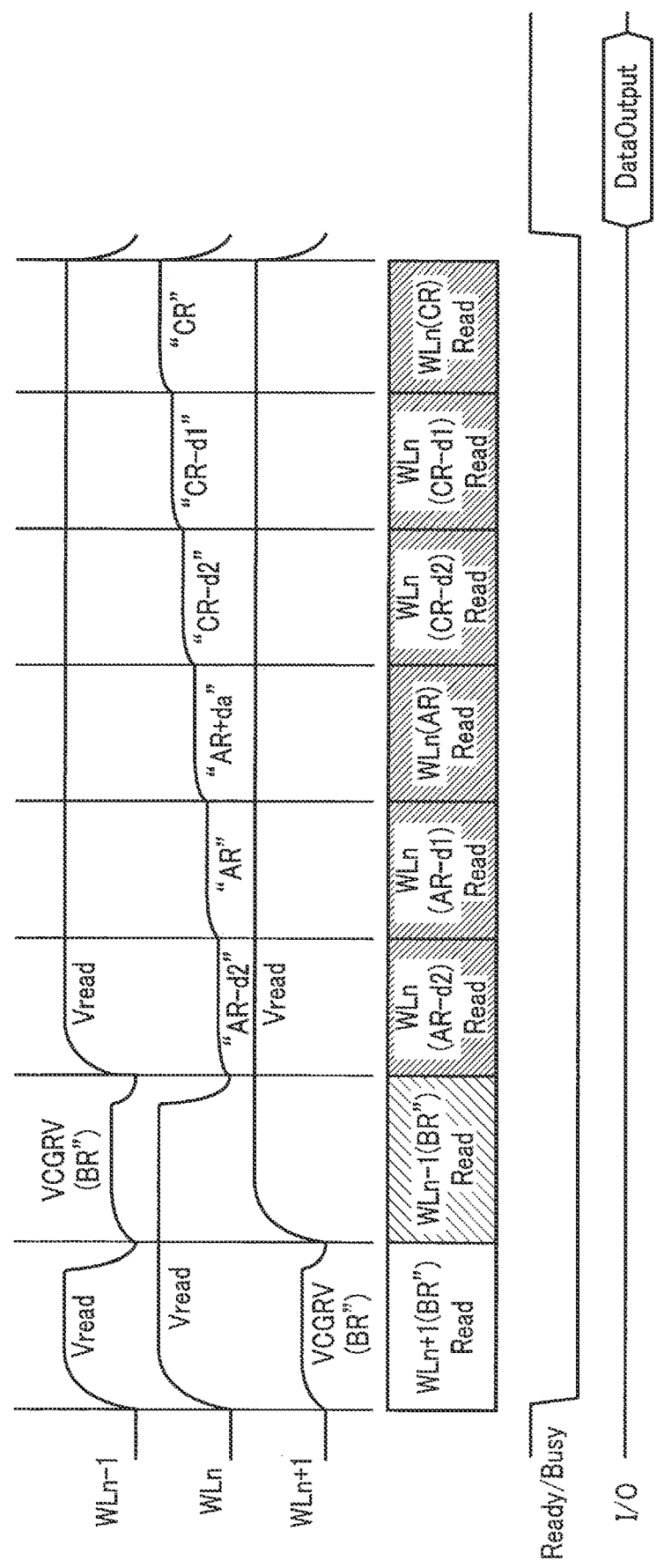
FIG. 75 is a waveform diagram showing an example of the read operation of the memory system according to the twelfth embodiment.

FIG. 75 shows examples of the waveforms at the time of reading the lower page. The waveforms at the time of reading the upper page may be as shown in FIG. 72. In this manner, in the present example, since the read voltage is changed according to the threshold voltage of the adjacent cells on both sides, it is possible to correct the read voltage to a read voltage based on the threshold voltages of the adjacent cells. Thus, it is possible to improve the reliability. In the present embodiment, the correction is made according to the threshold voltages of the adjacent memory cells on both sides, but the correction is not limited thereto. For example, only the threshold voltage of the adjacent memory cell on one side may be used for correcting the read voltage. Alternatively, the present embodiment may or may not be applied based on the reliability of the read operation. For example, the sequencer 14 executes the normal read operation when the read time needs to be shortened, and executes the read operation described in the present embodiment when the reliability needs to be increased. In addition, the sequencer 14 may execute the read operation described in the present embodiment at the time of retry reading when the correction cannot be made by the ECC or the like, instead of executing the read operation in the normal operation.

Figure 77:
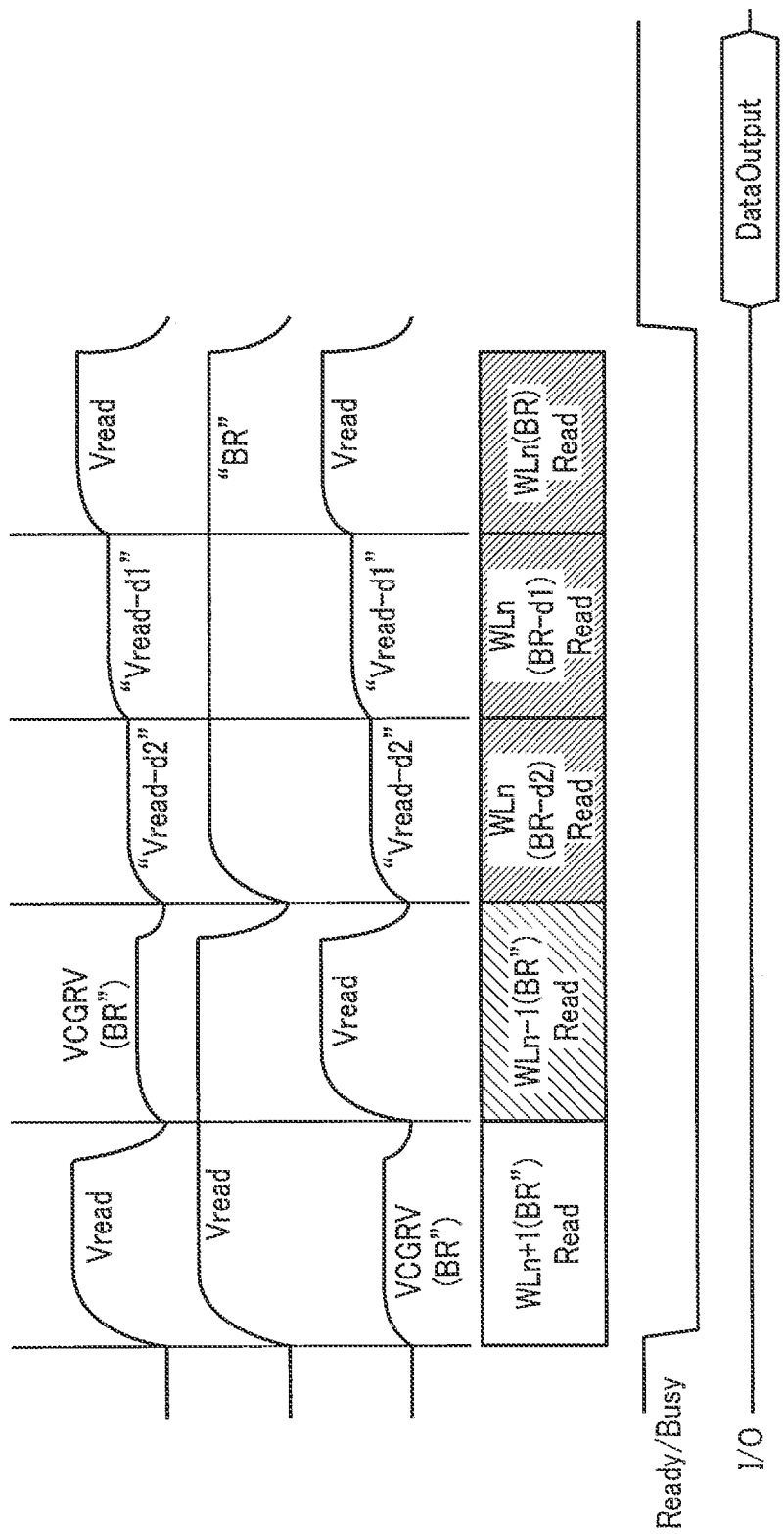

The read operation of the memory system 1 according to the present embodiment is not limited to the description above. FIG. 76 shows examples of the waveforms at the time of reading the lower page. FIG. 77 shows examples of the waveforms at the time of reading the upper page.

As shown in FIGS. 76 and 77, the memory system 1 may correct the read voltage of the word line WLn, and not correct the reading voltage of the word lines WLn+1 and WLn−1 during reading of the word line WLn.

[13] Thirteenth Embodiment

[13-1] Variation of Configuration of Memory Cell Array 11

Figure 78:
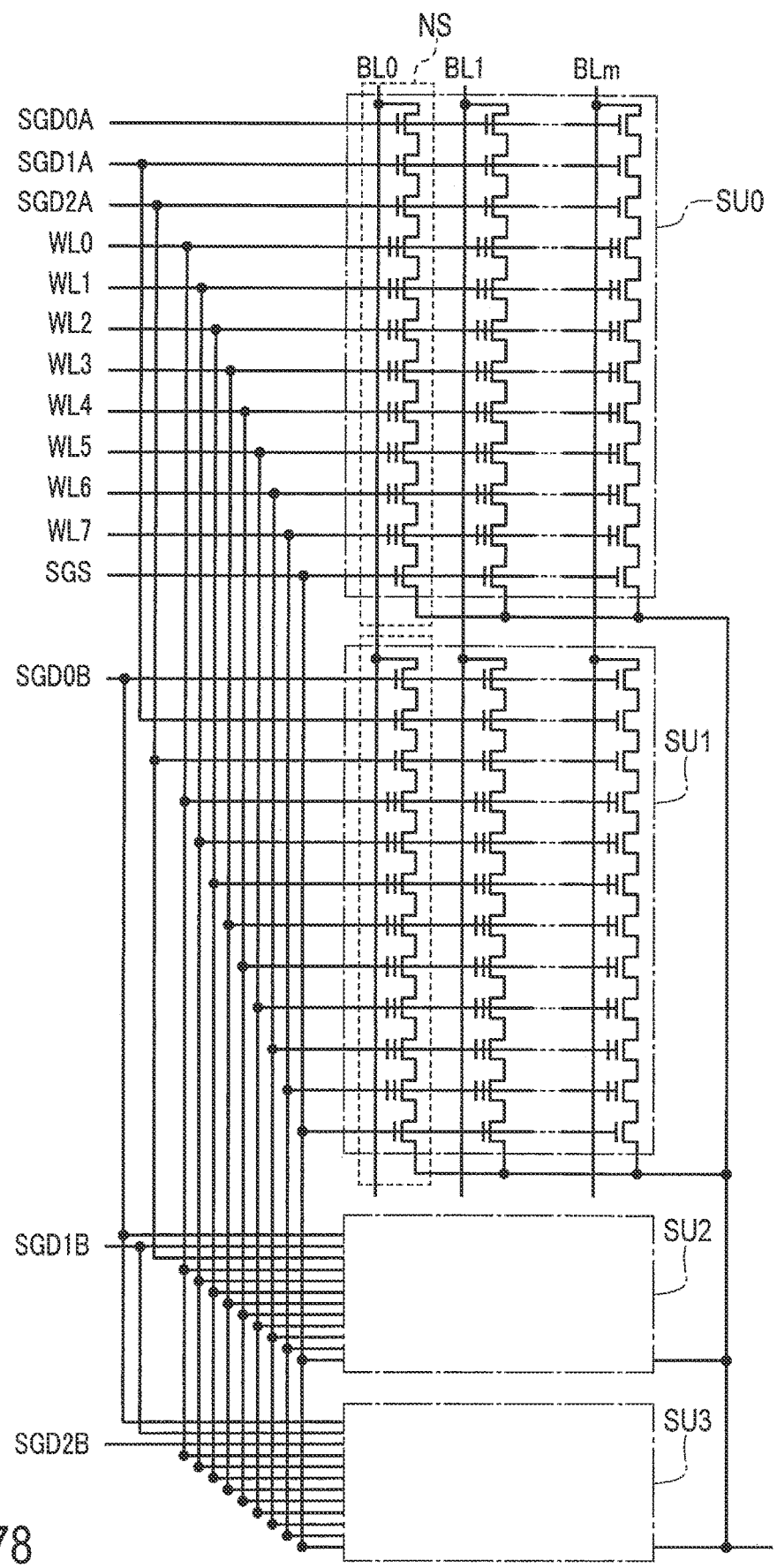
FIG. 78 is a diagram showing an example of a circuit configuration of a memory cell array included in a semiconductor memory device according to a thirteenth embodiment.

FIG. 78 shows a variation of the configuration of the memory cell array 11 shown in FIG. 34. In a memory cell array 11 shown in FIG. 78, select gate lines SGD0A, SGD1A and SGD2A are connected to a string unit SU0, select gate lines SGD0B, SGD1A, and SGD2A are connected to a string unit SU1, select gate line SGD0B, SGD1B, and SGD2A are connected to a string unit SU2, and select gate lines SGD0B, SGD1B, and SGD2B are connected to a string unit SU3. In this configuration, transistors corresponding to the number of select gate lines SGD are connected in series at each NAND string in the string unit SU.

FIG. 79 shows states of the transistors corresponding to the respective select gate lines when each string unit SU of the memory cell array 11 is selected. As shown in FIG. 79, the string unit SU0 is in a selected state when all the transistors corresponding to the select gate lines SGD0A, SGD1A, and SGD2A are turned ON. The string unit SU1 is in a selected state when all the transistors corresponding to the select gate lines SGD0B, SGD1A, and SGD2A are turned ON. The string unit SU2 is in a selected state when all the transistors corresponding to the select gate lines SGD0B, SGD1B, and SGD2A are turned ON. The string unit SU3 is in a selected state when all the transistors corresponding to the select gate lines SGD0B, SGD1B, and SGD2B are turned ON.

Figure 80:
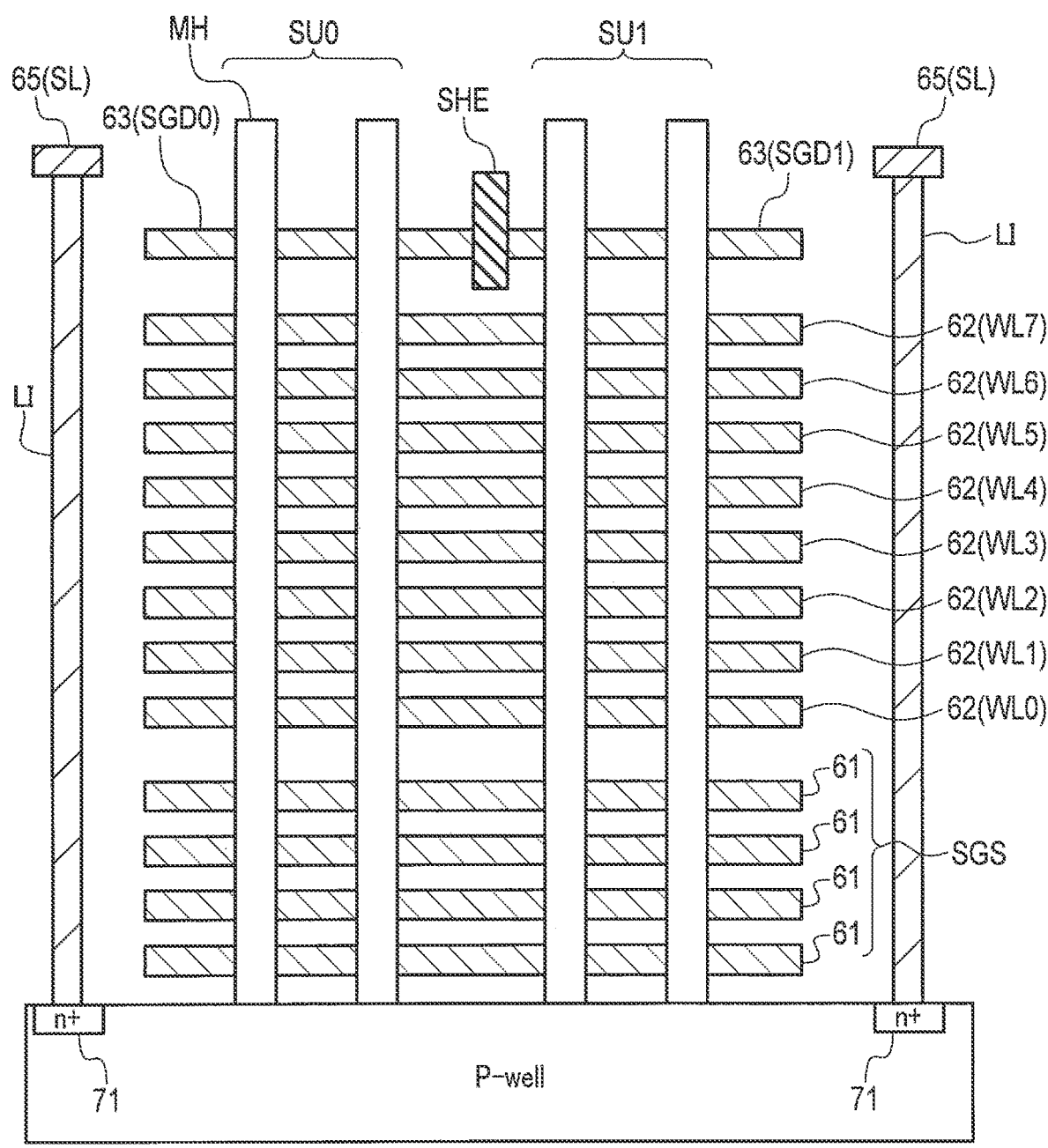
FIG. 80 is a diagram showing an example of a cross-sectional configuration of the memory cell array included in the semiconductor memory device according to the thirteenth embodiment.
Figure 81A:
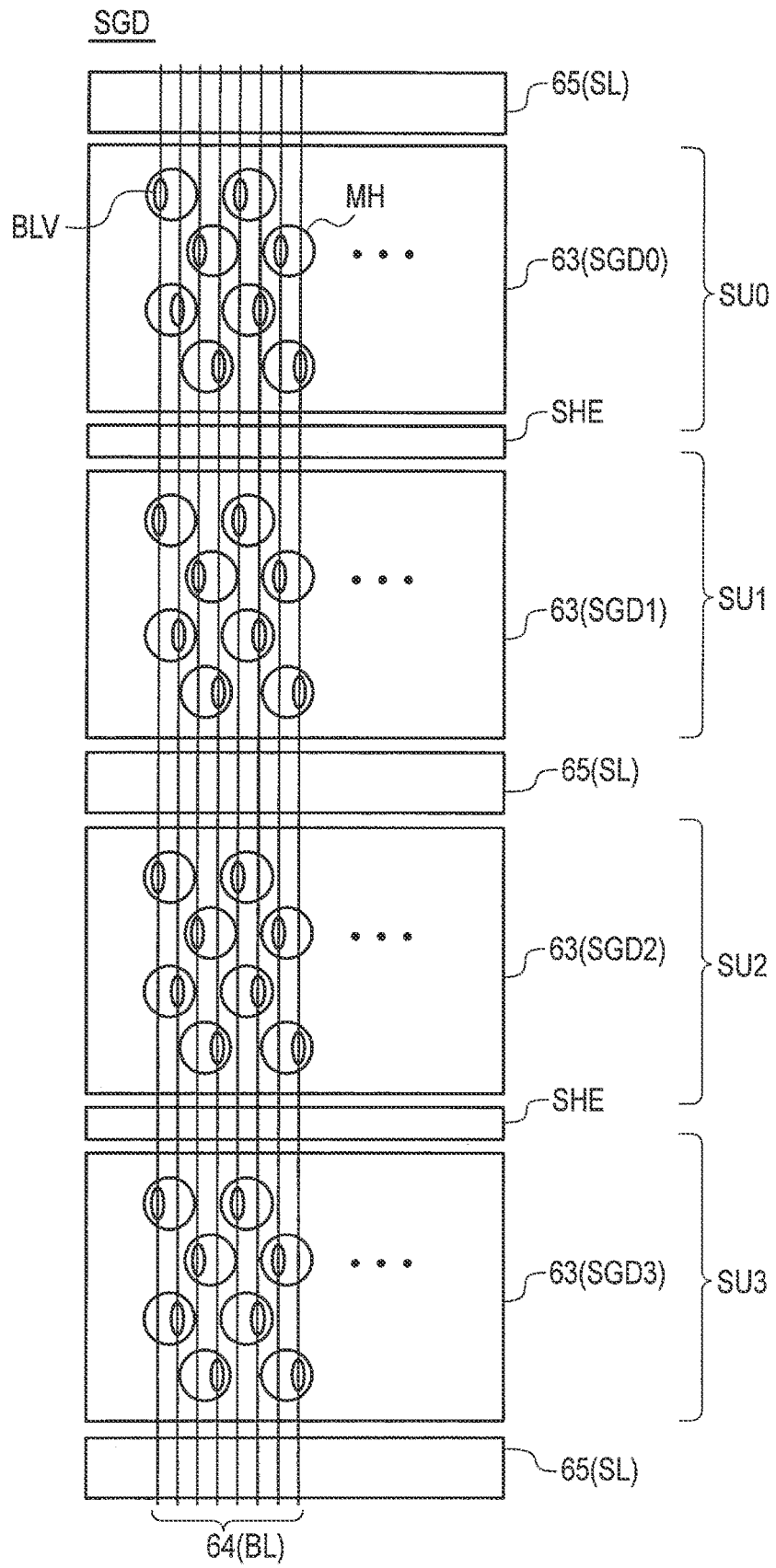
FIGS. 81A and 81B are diagrams showing an example of a planar layout of the memory cell array included in the semiconductor memory device according to the thirteenth embodiment.
Figure 81B:
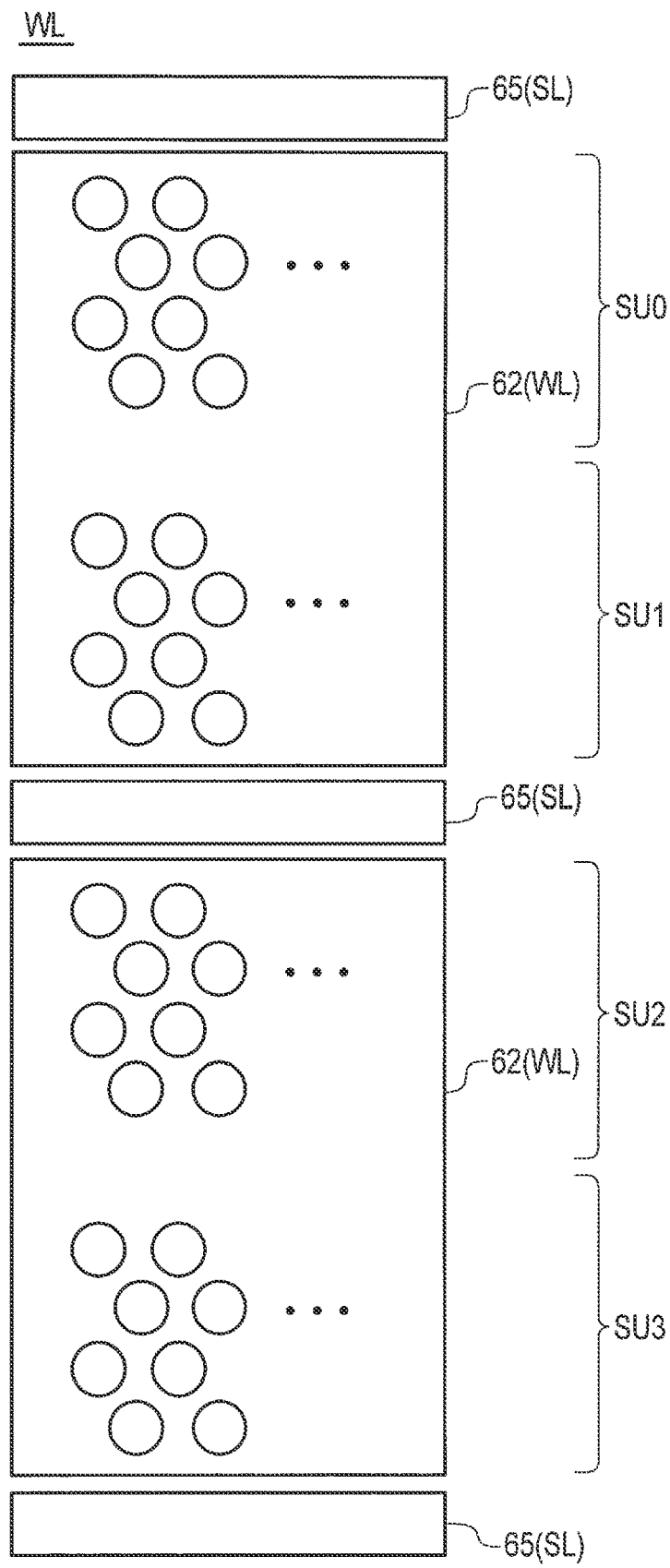

FIG. 80 shows an example of a cross-sectional configuration of the memory cell array 11 shown in FIG. 34. The cross-sectional configuration of the memory cell array 11 shown in FIG. 80 is substantially similar to that of the memory cell array 11 shown in FIG. 35. FIG. 80 shows two string units SU (SU0 and SU1) provided between the adjacent conductors 65. In FIG. 80, a conductor 66 (well line CPWELL) is omitted. A conductor 63 shown in FIG. 80 is separated by an insulator SHE between the string units SU0 and SU1. In a memory hole MH shown in FIG. 80, the detailed configuration is omitted. A detailed configuration of the memory hole MH in the drawing to be described below is also similarly omitted. In the example of the cross-sectional configuration of the memory cell array 11 shown in FIG. 35, the conductor 63 (select gate line SGD) is constituted by four layers. However, in the example of the cross-sectional configuration of the memory cell array 11 shown in FIG. 80, the conductor 63 (select gate line SGD) is constituted by one layer. In the memory cell array 11 shown in FIG. 80, the conductor 63 (select gate SGD) may be constituted by a plurality of layers similar to FIG. 35. Although omitted in FIG. 80, the string units SU2 and SU3 each having a configuration similar to the string units SU0 and SU1 are provided next to the string units SU0 and SU1. The select gate lines SGD0 to SGD3 are connected to the string units SU0 to SU3 respectively, and the select gate lines SGD0 to SGD3 are each constituted by an independent conductor 63. FIG. 81A shows a planar layout including a conductor corresponding to the select gate line SGD, and FIG. 81B shows a planar layout including a conductor corresponding to the word line WL. FIG. 81A shows memory holes MH, contacts BLV, and conductors 63 and 65. In each string unit SU, one contact BLV is provided for one memory hole MH, and the contact BLV connects the memory hole MH with the bit line BL. The conductor 63 (for example, select gate line SGD0), the insulator SHE, and the conductor 63 (for example, select gate line SGD1) are provided in order between the adjacent conductors 65. FIG. 81B shows the memory holes MH and the conductors 62 and 65. The conductor 62 (word line WL) is provided between the adjacent conductors 65. The conductor 62 may or may not include a region separated by the insulator SHE. In such a configuration, one string unit SU is selected when a voltage is applied to the conductor 63 corresponding to the selected select gate line SGD and the corresponding select transistor is turned ON.

FIG. 82 shows an example of a cross-sectional configuration of the memory cell array 11 shown in FIG. 78, and four string units SU (SU0 to SU3). In FIG. 82, four string units (SU0, SU1, SU2, and SU3) are provided between the adjacent conductors 65 (source lines SL). The conductor 63 is constituted by three layers which are, for example, electrically separated from each other. The conductors 63 provided on the different conductors each include a portion separated by the insulator SHE. Each layer of the electrically-separated conductors 63 may be constituted by a plurality of layers as shown in FIG. 35. The string unit SU0 is provided with the conductors 63 corresponding to the select gate lines SGD0A, SGD1A, and SGD2A, the string unit SU1 is provided with the conductors 63 corresponding to the select gate lines SGD0B, SGD1A, and SGD2A, and the string unit SU2 is provided with the conductors 63 corresponding to the select gate lines SGD0B, SGD1B, and SGD2A.

Figure 83A:
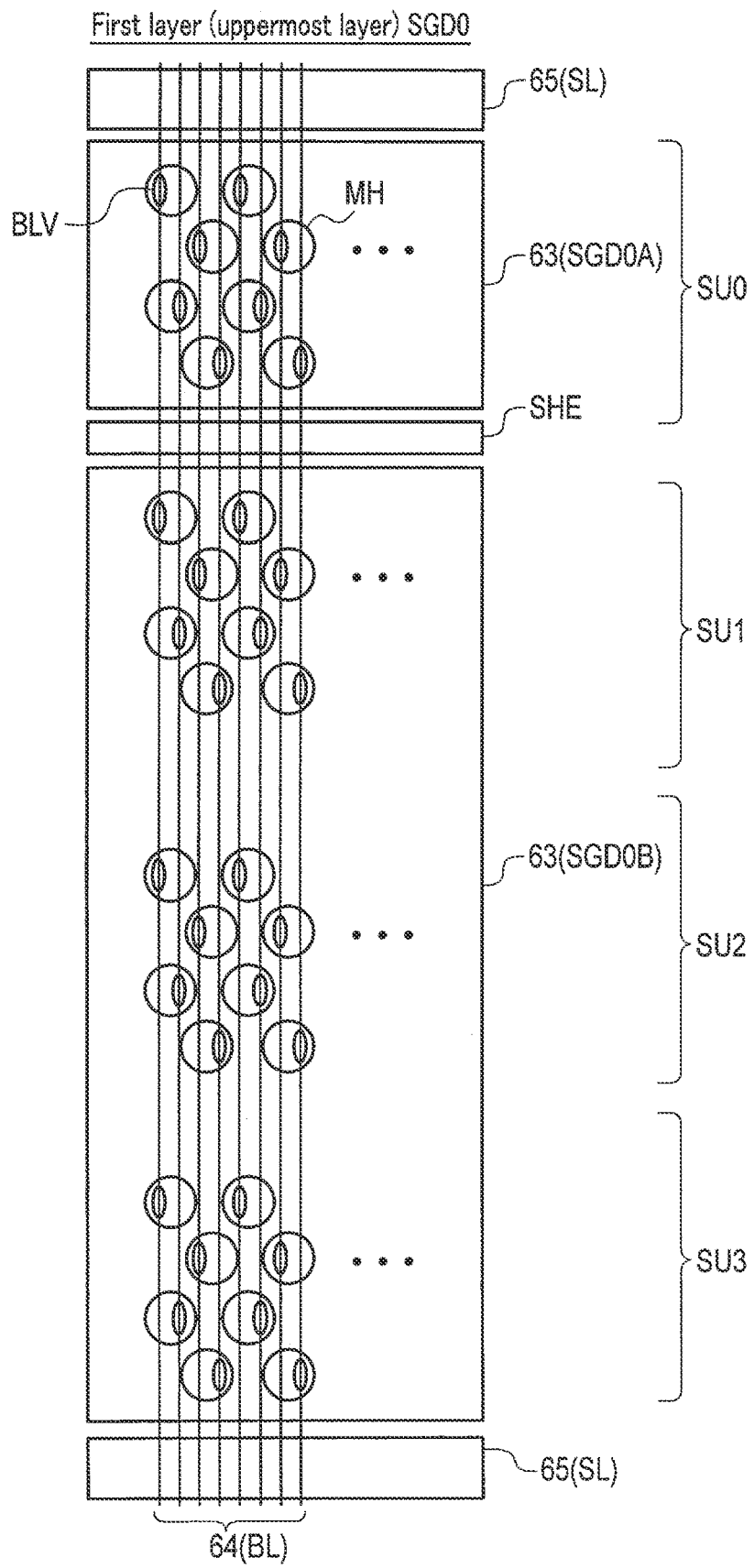
FIGS. 83A, 83B, 83C, and 83D are diagrams showing an example of a planar layout of the memory cell array included in the semiconductor memory device according to the thirteenth embodiment.
Figure 83B:
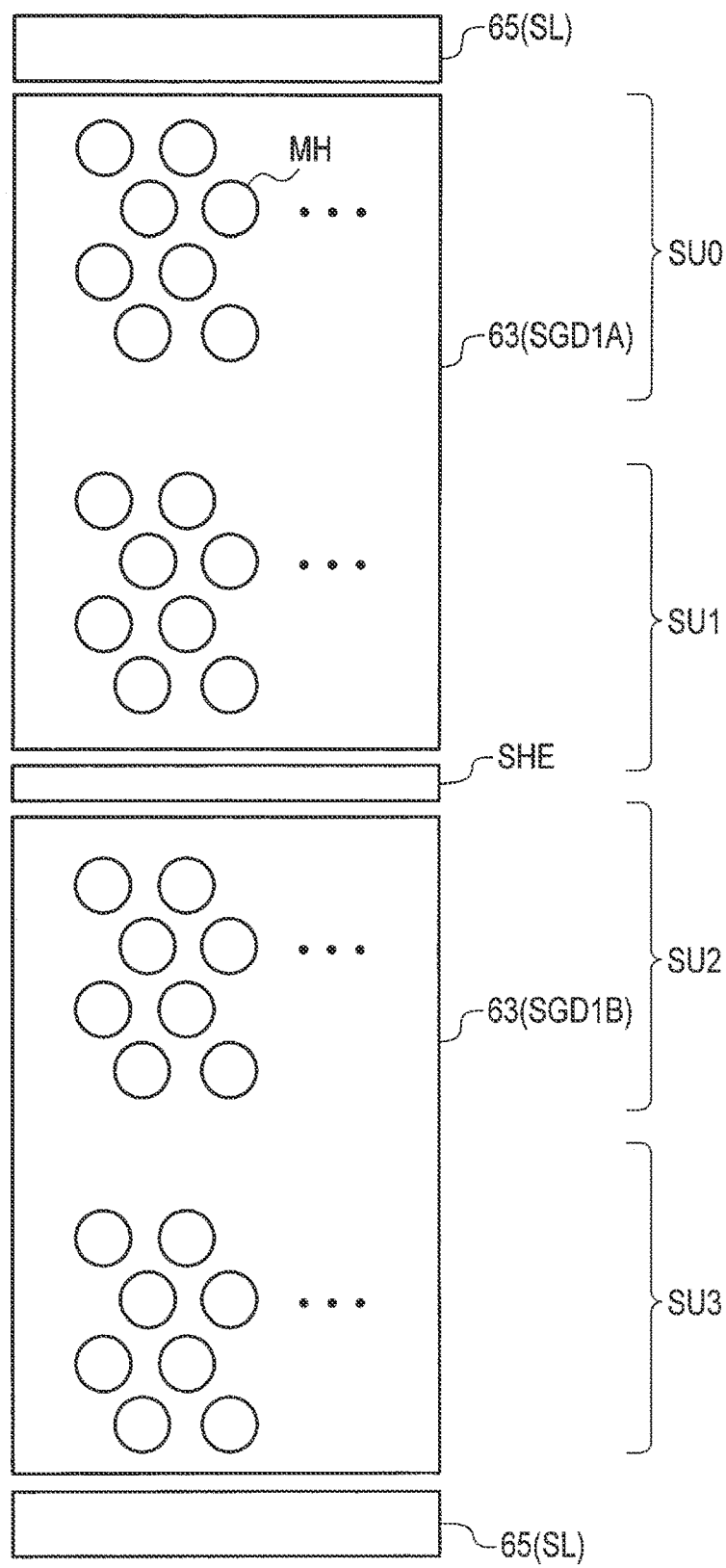
Figure 83C:
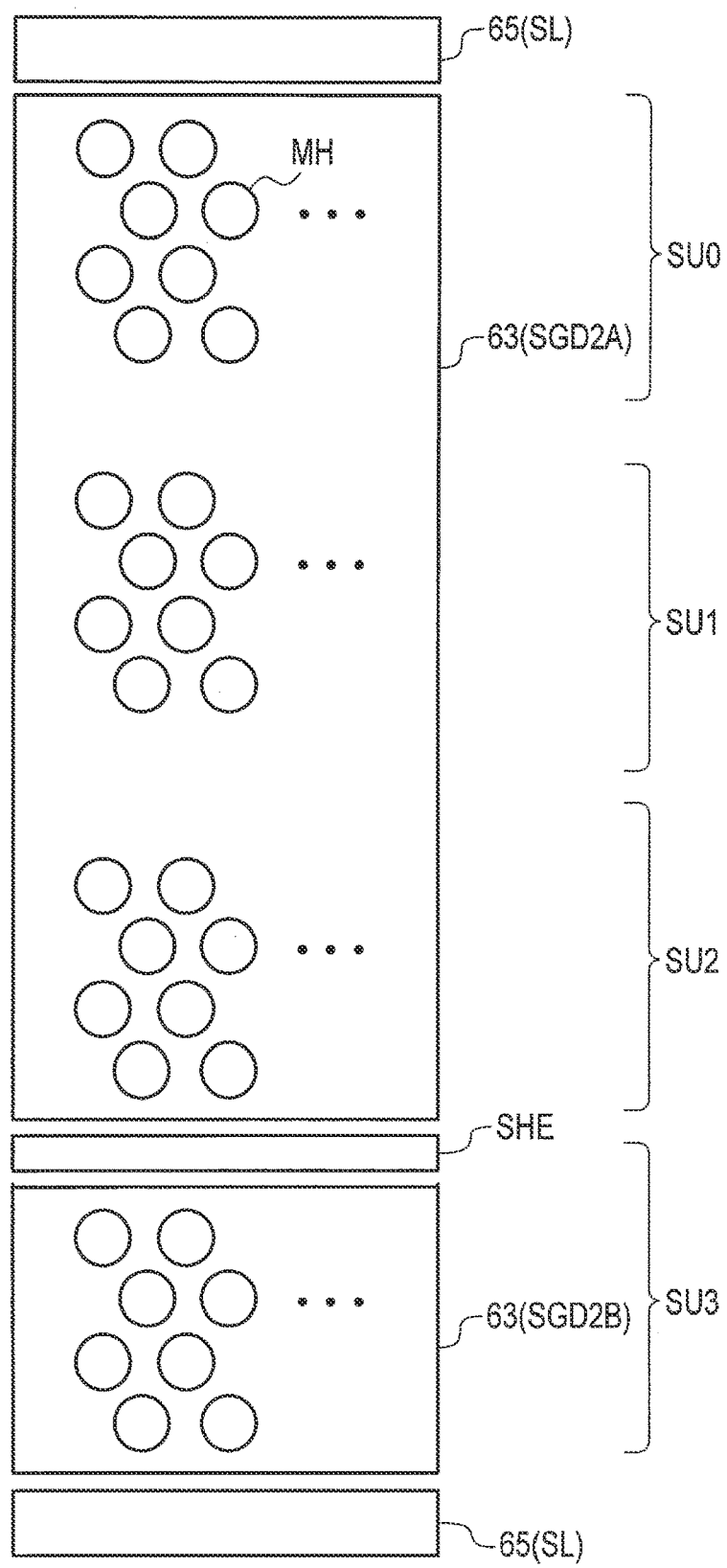
Figure 83D:
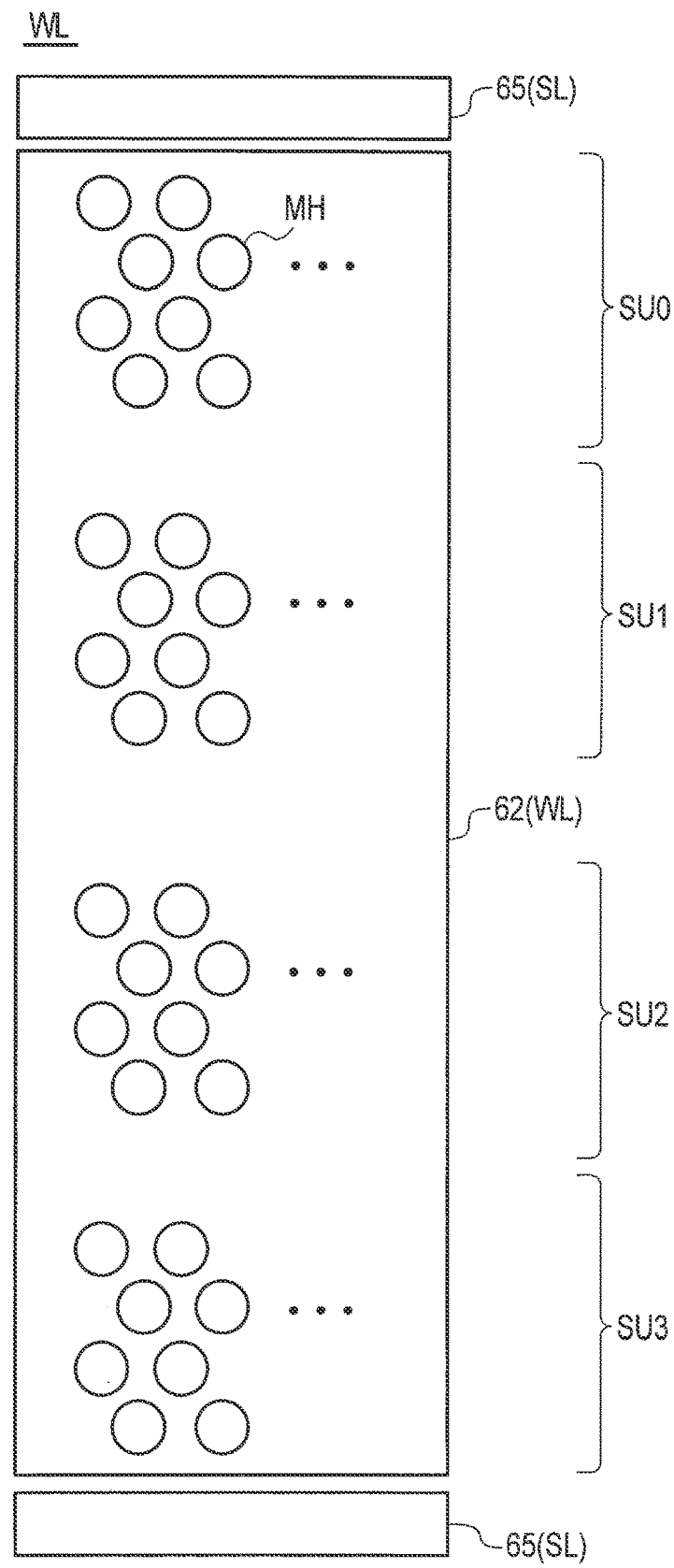

Hereinafter, the plan layout of this configuration will be described with reference to FIGS. 83A, 83B, 83C, and 83D. FIG. 83A shows a planar layout including the first layer (for example, uppermost layer) of the conductor 63 corresponding to the select gate line SGD0. FIG. 83B shows a planar layout including the second layer of the conductor 63 corresponding to the select gate line SGD1. FIG. 83C shows a planar layout including the third layer of the conductor 63 corresponding to the select gate line SGD2. FIG. 83D shows a planar layout including the conductor 62 corresponding to, for example, the word line WL7.

As shown in FIG. 83A, between the conductors 65, the conductor 63 corresponding to the select gate line SGD0A, the insulator SHE, and the conductor 63 corresponding to the select gate line SGD0B are provided in order. The conductor 63 corresponding to the select gate line SGD0A corresponds to the string unit SU0, and the conductor 63 corresponding to the select gate line SGD0B corresponds to the string units SU1 to SU3.

As shown in FIG. 83B, between the conductors 65, the conductor 63 corresponding to the select gate line SGD1A, the insulator SHE, and the conductor 63 corresponding to the select gate line SGD1B are provided in order. The conductor 63 corresponding to the select gate line SGD1A corresponds to the string units SU0 and SU1, and the conductor 63 corresponding to the select gate line SGD1B corresponds to the string units SU2 and SU3.

As shown in FIG. 83C, between the conductors 65, the conductor 63 corresponding to the select gate line SGD2A, the insulator SHE, and the conductor 63 corresponding to the select gate line SGD2B are provided in order. The conductor 63 corresponding to the select gate line SGD2A corresponds to the string units SU0 to SU2, and the conductor 63 corresponding to the select gate line SGD2B corresponds to the string unit SU3.

As shown in FIG. 83D, the conductor 62 corresponding to the word line WL is provided between the conductors 65. The conductor 62 may or may not include a region separated by the insulator SHE.

With this configuration, a sequencer 14 of a semiconductor memory device 10 selects a desired string unit SU based on the table as shown in FIG. 79.

[13-2] Effects of Thirteenth Embodiment

As described with reference to FIGS. 82 and 83, the four string units SU (SU0, SU1, SU2, and SU3) are provided between the conductor 65 (source line SL) and the conductor 65 (source line SL). The conductors 63 corresponding to the select gates SGD each include a portion separated by the insulator SHE. When the string units SU are separated by the conductor 65 (the source line SL), the word lines WL of all layers need to be cut off, and the area (plane size) of the memory cell array 11 is increased. On the other hand, when the string units SU are separated by the insulator SHE, only the conductor 63 corresponding to the select gate line SGD can be cut off, and the area of the memory cell array 11 can be reduced.

FIG. 84 shows an example of a cross-sectional configuration of the memory cell array 11. As shown in FIG. 84, the conductor 63 provided on the same conductor may be separated for each string unit SU by the insulator SHE. In this case, since the resistance of the conductors corresponding to the select gate line SGD and the word line WL is reduced from the conductor 65 (source line SL) side in the process step, the resistance of the select gate lines SGD (for example, SGD1 and SGD2) that do not face the conductor 65 (source line SL) is increased. On the other hand, in the cross-sectional configuration of the memory cell array 11 as shown in FIG. 82, one side of the conductor 63 corresponding to the select gate line SGD necessarily faces the conductor 65 (source line SL), and the resistance of the conductor 63 is reduced. Thus, the semiconductor memory device 10 according to the thirteenth embodiment can cause the resistance of the conductor 63 corresponding to the select gate line SGD to be reduced, and cause the area of the memory cell array 11 to be reduced.

In the example of the configuration of the memory cell array 11 described with reference to FIGS. 78, 82, 83, and 84, it has been described that the four string units SU (SU0, SU1, SU2, and SU3) are provided between the adjacent conductors 65, but the number of string units is not limited thereto. The number of string units SU provided between the adjacent conductors 65 can be designed to a given number. For example, it is possible to further arrange a plurality of string units SU between the adjacent conductors 65. In such a case, by providing the insulator SHE as described above, effects similar to that of the semiconductor memory device 10 in the thirteenth embodiment can be obtained.

In the above description, it has been described that the three select gate lines SGD electrically separated from each other are provided and one portion is separated by the insulator SHE in each layer, but the present invention is not limited thereto. For example, the semiconductor memory device 10 can further reduce the resistance of the select gate line SGD and the area of the memory cell array 11 by providing a plurality of conductors corresponding to the select gate line SGD.

For example, when n number of string units SU (n is a natural number) is provided between the adjacent conductors 65, (n−1) layers of the conductor 63 corresponding to the select gate line SGD and electrically separated is provided. For example, the first string unit is selected by the first to (n−1) th selection signals, the second string unit is selected by the second to ((n−1)+1) th selection signals, and the n-th string unit is selected by the n-th to 2×(n−1) th selection signals.

[14] Variations

The semiconductor memory device 10 in the embodiments includes a first memory cell capable of storing 3-bit data. When receiving first data including a first bit and a second bit from an external controller, the semiconductor memory device 10 writes the received first data to the first memory cell. After receiving the first data, when the semiconductor memory device 10 receives second data including a third bit and a fourth bit, the semiconductor memory device reads the first bit from the first memory cell and writes the 3-bit data to the first memory cell based on the read first bit and the received third and fourth bits.

Thus, it is possible to provide a semiconductor memory device capable of improving the reliability of written data.

In the above embodiments, when executing the IDL of 1-page data, the memory system 1 may correct the read data using a plurality of read results. Specifically, for example, the read operation for the page is executed a plurality of times, and the results of the reading is retained in the latch circuit in the sense amplifier unit SAU. Then, the operation unit OP may determine that data with a large number of appearances from the read results retained in the latch circuit is correct read data, and use the data for the subsequent write operations.

In the second write operation described in the above embodiments, the read voltage used in the IDL may be different from the read voltage used during the normal read operation. For example, the voltage M1R may be different from the voltages AR, BR, . . . , and GR. Consequently, the voltages M1R, M2R, and M3R can be set to a value optimized to the threshold distribution formed by the first write operation, and it is possible to suppress the number of error bits generated in the IDL.

In each command sequence described in the above embodiments, a special command may be used to instruct the first and second write operations. In this case, some special command is added before, for example, the command "80h" at the beginning of each command set.

In the first to seventh embodiments, it has been described that the value of the program voltage Vpgm applied first in the first write operation and the second write operation is different from the value of the program voltage ΔVpgm, but the value is not limited thereto. For example, the initial value of the program voltage Vpgm in the first write operation may be equal to or lower than the initial value of the program voltage Vpgm in the second write operation. Furthermore, the value of ΔVpgm in the first write operation may be equal to or lower than the value of ΔVpgm in the second write operation.

In the above embodiments, it has been described that the memory transistor eventually passes the verify in the write operation, but the present invention is not limited thereto. For example, when the memory transistor does not pass the verify, the write operation may be ended after a predetermined number of program loops are executed. In this case, it is regarded that the write operation in which the word line WL is selected has failed, and the information is transmitted from the semiconductor memory device 10 to the controller 20.

In the above embodiments, it has been described that the NOMOS film is used in the memory cell, but the present invention is not limited thereto. For example, in a case of using a memory cell using a floating gate as well, similar effects can be obtained by executing the write operation of the present embodiment.

In the fourth to sixth embodiments, is has been described that the 2-3-2 code is applied as data assignment, the code is not limited thereto. For example, the 3-2-2 code described in the first embodiment may be applied, or the 1-3-3 code described in the second and third embodiments may be applied. As described above, when other data assignment is applied, the operations described in the fourth to sixth embodiments can be executed.

In the fourth to sixth embodiments, the timing at which the controller 20 executes the data conversion process is not limited thereto. For example, data to which the controller 20 executes the conversion process in advance may be retained in the RAM 22, and the data may be used during each write operation.

In the fourth to sixth embodiments, the first and second write data after the data conversion process may be Gray codes. Thus, the memory system 1 according to the embodiments can suppress data corruption at the time of data transfer, and improve the reliability of write data.

In the write operation described in the above eighth to tenth and twelfth embodiments, it has been described that data of two bits is stored in one memory cell, but the data is not limited thereto. For example, data of one bit, or three or more bits may be stored in one memory cell. In such a case, by appropriately setting parameters, the write operation described in the eighth to tenth and twelfth embodiments can be executed.

In the write operation by the QPW method used in the ninth embodiment, the intermediate voltage Vqpw to be used may be changed based on the timing of passing the reference verify. For example, it is possible to increase the variation amount of the threshold voltage by reducing the value of the intermediate voltage Vqpw, and to reduce the variation amount of the threshold voltage by increasing the value of the intermediate voltage Vqpw. Thus, the memory system 1 can finely adjust the threshold voltages of the memory cell transistors MT having different write operation progress speeds, and can improve the reliability of read data.

The block BLK is, for example, an erase unit of data in the three-dimensional semiconductor memory device, but is not limited thereto. Other erase operations are described in U.S. patent application Ser. No. 13/235,389 entitled "Nonvolatile semiconductor memory device" filed on Sep. 18, 2011, and in U.S. patent application Ser. No. 12/694,690 entitled "Non-volatile semiconductor memory device" filed on Jan. 27, 2010. These patent applications are incorporated by reference herein in their entirety.

The eleventh embodiment can be applied to the other embodiments.

The "connection" in this specification means electrical connection and does not exclude the fact that another element is interposed in the connection.

In the embodiments according to the present invention:

(1) The voltage applied to the word line selected for the read operation at the "A"-level may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the "B"-level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 µs to 38 µs, 38 µs to 70 µs, or 70 µs to 80 µs.

(2) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5.

The voltage applied to the unselected word line may be, for example, 6.0 V to 7.3 V. The voltage is not limited thereto, and may be, for example, 7.3V to 8.4 V or may be 6.0V or less.

The pass voltage to be applied may be changed depending on whether the unselected word line is an odd word line or an even word line.

The time (tProg) for the write operation may be, for example, 1700 µs to 1800 µs, 1800 µs to 1900 µs, or 1900 µs to 2000 µs.

(3) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 µs to 4000 µs, 4000 µs to 5000 µs, or 4000 µs to 9000 µs.

(4) The structure of the memory cell may have the charge storage layer disposed on the semiconductor substrate (silicon substrate) via a tunnel insulating film having a thickness of 4 to 10 nm. This charge storage layer may have a stacked structure including an insulating film of SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm intervening between a lower high-k film having a thickness of 3 to 10 nm and an upper high-k film having a thickness of 3 to 10 nm. The high-k film includes, for example, HfO. The silicon oxide film can be greater in thickness than the high-k film. A control electrode having a thickness of 30 to 70 nm is formed on the insulating film via a material for work function adjustment having a thickness of 3 to 10 nm. Here, the material for work function adjustment includes a metal oxide film such as TaO or a metal nitride film such as TaN. W, for example, can be used for the control electrode.

An air gap can be formed between the memory cells.

Other claims relating to the present application will be added below.

<1> A semiconductor memory device including a plurality of first memory cells capable of storing n-bit data (n is a natural number), in which, after a plurality pieces of first data (m<n) is received from an external controller, the plurality pieces of first data is written to the first memory cells so as not to exceed a first level, then after a plurality of pieces of second data (h<n) is received, the plurality pieces of first data is read from the first memory cells, and based on the plurality pieces of read first data and the plurality pieces of received second data, in a read operation of the semiconductor memory device in which data is written to the first memory cells, when the number of cells, in the memory cells, which exceed the first level is equal to or less than a first specified number, it is determined that the second data has not been written, and when the number of cells, in the memory cells, which exceed the first level is equal to or larger than the first specified number, it is determined that the second data has been written, and the read operation is executed by changing a sequence based on a result thereof.

<2> The semiconductor memory device according to <1>, in which the first memory cells store 3-bit data, the first data includes a first bit, and the second data includes a second bit and a third bit.

<3> The semiconductor memory device according to <1>, further including:

a second memory cell capable of storing n-bit data and connected to the first memory cells, in which third data is received between writing of the received first data and reception of the second data, and the received third data is written to the second memory cell.

<4> The semiconductor memory device according to any one of <1> to <3>, in which in the 3-bit data written to the first memory cells, lower bit data is determined by two read operations, middle bit data is determined by three read operations, and upper bit data is determined by two read operations.

<5> The semiconductor memory device according to any one of <1> to <3>, in which in the 3-bit data written to the first memory cells, lower bit data is determined by one read operation, middle bit data is determined by three read operations, and upper bit data is determined by three read operations.

<6> The semiconductor memory device according to <1>, further including:

a word line connected to the first memory cells, in which when the second data is received, the first bit is read by applying a read voltage to the word line, and a program voltage is applied to the word line after the read voltage is applied.

<7> The semiconductor memory device according to <1>, in which the first memory cells store 2-bit data, the first data includes a first bit, and the second data includes a second bit.

<8> The semiconductor memory device according to <7>, in which in the 2-bit data written to the first memory cells, lower bit data is determined by two read operations, lower bit data is determined by two read operations, and upper bit data is determined by one read operations.

<9> A semiconductor memory device including a first memory cell capable of storing n-bit data (n is a natural number), a second memory cell adjacent to the first memory cell, and a third memory cell adjacent to the first memory and positioned opposite to the second memory cell, in which read operations from the second memory cell and the third memory cell are executed during a read operation from the first memory cell is executed, and the read operation from the first memory cell is executed based on the read results.

<10> The semiconductor memory device according to <9>, in which execute a read operation with correcting the gate voltage of the first memory cell based on reading results of the the second memory cell and the third memory cell during reading the first memory cell.

<11> The semiconductor memory device according to <9>, in which execute a read operation with correcting the gate voltage of the second memory cell and the third memory cell based on reading results of the the second memory cell and the third memory cell during reading the first memory cell.

<12> A semiconductor memory device including: a first string, a second string, a third string, and a fourth string in which a plurality of memory cells and a plurality of select gates are connected in series, in which the memory cells connected to the first to fourth strings are connected to a common word line and include first to sixth selection signal lines connected to the select gates, the first string is selected by first, second, and third selection signals, the second string is selected by second, third, and fourth selection signals, the third string is selected by third, fourth, and fifth selection signals, and the fourth string is selected by fourth, fifth, and sixth selection signals.

<14> A semiconductor memory device including a first to n-th (n is a natural number) strings in which a plurality of memory cells and a plurality of select gates are connected in series, in which the memory cells connected to the first to n-th strings are connected to a common word line and include 2×(n−1) selection signal lines connected to the select gates, the strings include (n−1) select gates, the first string is selected by the first to (n−1)th selection signals, the second string is selected by the second to (n−1+1)th selection signals, and the n-th string is selected by the n-th to 2×(n−1)th selection signals.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a first memory cell capable of storing data using at least three levels of threshold voltages, the at least three levels of threshold voltages comprising a first level, a second level higher than the first level, and a third level higher than the second level; and
a first word line connected to the first memory cell, wherein:
in writing of the data to the first memory cell from a state where a threshold voltage of the first memory cell is the first level, a plurality of program operations and a plurality of verify operations are performed, each program operation including applying a program voltage to the first word line, and each verify operation including applying a read voltage lower than the program voltage,
the plurality of program operations comprise a program operation for the second level and a program operation for the third level, and
the plurality of verify operations comprise a verify operation for the second level, and do not comprise a verify operation for the third level.

2. The semiconductor memory device according to claim 1, wherein:
the first memory cell is capable of storing at least 2-bit data, the 2-bit data corresponding to one of at least four levels of threshold voltages, and the at least four levels of threshold voltages comprising the first level, the second level, the third level, and a fourth level higher than the third level,
the plurality of program operations further comprise a program operation for the fourth level, and
the plurality of verify operations further do not comprise a verify operation for the fourth level.

3. The semiconductor memory device of claim 1, further comprising:
a second memory cell connected to the first memory cell and capable of storing data using at least three levels of threshold voltages, the at least three levels of threshold voltages comprising a fifth level, a sixth level higher than the fifth level, and a seventh level higher than the sixth level; and
a second word line connected to the second memory cell, wherein:
in writing of the data to the second memory cell from a state where a threshold voltage of the second memory cell is the fifth level, a plurality of program operations and a plurality of verify operations are performed, each program operation including applying a program voltage to the second word line, and each verify operation including applying a read voltage lower than the program voltage,
the plurality of program operations comprise a program operation for the sixth level and a program operation for the seventh level, and
the plurality of verify operations comprise a verify operation for the sixth level, and do not comprise a verify operation for the seventh level.

4. The semiconductor memory device according to claim 3, wherein:
the second memory cell is capable of storing at least 2-bit data, the 2-bit data corresponding to one of at least four levels of threshold voltages, and the at least four levels of threshold voltages comprising the fifth level, the sixth level, the seventh level, and an eighth level higher than the seventh level,
the plurality of program operations further comprise a program operation for the eighth level, and
the plurality of verify operations further comprise a verify operation for the eighth level.

5. The semiconductor memory device according to claim 3, wherein:
the fifth level is substantially the same as the first level,
the sixth level is substantially the same as the second level, and
the seventh level is substantially the same as the third level.

6. The semiconductor memory device according to claim 3, further comprising:
a first bit line connected to the first memory cell and the second memory cell.

7. The semiconductor memory device according to claim 1, wherein:
the first memory cell is configured to be capable of storing at least 3-bit data, the at least 3-bit data corresponding to one of at least eight levels of threshold voltages, and the at least eight levels of threshold voltages comprising the first level, the second level, the third level, a fourth level higher than the third level, a fifth level higher than the fourth level, a sixth level higher than the fifth level, a seventh level higher than the sixth level, and an eighth level higher than the seventh level,
in writing of the at least 3-bit data to the first memory cell from the state where the threshold voltage of the first memory cell is the first level, the plurality of program operations and the plurality of verify operations are performed,
the plurality of program operations further comprise a program operation for the fourth level, and
the plurality of verify operations further do not comprise a verify operation for the fourth level.

8. The semiconductor memory device according to claim 7, wherein:
when first data including a first bit and a second bit is received from an external controller, the received first data is written to the first memory cell, and when second data including a third bit and a fourth bit is received after the first data is received from the controller, the first data is read from the first memory cell and the 3-bit data is written to the first memory cell based on 1-bit of the read first data and the received second data.

9. The semiconductor memory device according to claim 8, further comprising:
a second memory cell capable of storing 3-bit data and connected to the first memory cell,
wherein third data including a fifth bit and a sixth bit is received from the controller between writing of the received first data and reception of the second data, and the received third data is written to the second memory cell.

10. The semiconductor memory device according to claim 9, wherein a value of the second bit included in the first data and a value of the third bit included in the second data are the same value.

11. The semiconductor memory device according to claim 7, wherein in the 3-bit data written to the first memory cell, lower bit data is determined by one read operation, middle bit data is determined by three read operations, and upper bit data is determined by three read operations.

12. The semiconductor memory device according to claim 7, wherein when second data is received, the first bit is read by applying a read voltage to the word line, and a program voltage is applied to the word line after the read voltage is applied.

13. A method for controlling a semiconductor memory device, the semiconductor memory device including (i) a first memory cell capable of storing at least 2-bit data, the at least 2-bit data corresponding to one of at least four levels of threshold voltages, and the at least four levels of threshold voltages comprising a first level, a second level higher than the first level, a third level higher than the second level, and a fourth level higher than the third level, and (ii) a word line connected to the first memory cell, and the method comprising:
writing the at least 2-bit data to the first memory cell from a state where a threshold voltage of the first memory cell is the first level, while performing a plurality of program operations and a plurality of verify operations, each program operation including applying a program voltage to the word line, and each verify operation including applying a read voltage lower than the program voltage,
wherein:
the plurality of program operations comprise a program operation for the second level, a program operation for the third level, and a program operation for the fourth level, and
the plurality of verify operations comprise a verify operation for the second level, and do not comprise a verify operation for the third level and a verify operation for the fourth level.

14. A semiconductor memory device, comprising:
a plurality of memory cell transistors each capable of storing data of a plurality of bits depending on which one of a plurality of states a threshold voltage is included in, the memory cell transistors being configured to store first data if the threshold voltage is included in a first state, and the memory cell transistors being configured to store second data if the threshold voltage is included in a second state higher than the first state;
a word line connected to the plurality of memory cell transistors;
a plurality of bit lines respectively connected to the plurality of memory cell transistors; and
a controller capable of executing a write operation including repeating a program loop including a program operation and a verify operation,
wherein:
a verify low voltage and a verify high voltage are set in the first state, and
the controller is configured to:
perform the verify operation for each state of write destinations such that a memory cell transistor having a threshold voltage determined to be lower than or equal to the verify low voltage is set to a first program target, a memory cell transistor having a threshold voltage determined to be exceeding the verify low voltage and lower than or equal to the verify high voltage is set to a second program target, and a memory cell transistor having a threshold voltage determined to be exceeding the verify high voltage is set to a program-inhibited target,
perform the program operation such that while a program voltage is applied to the word line, a first voltage is applied to the bit line connected to the memory cell transistor as the first program target, a second voltage higher than the first voltage is applied to the bit line connected to the memory cell transistor as the second program target, and a third voltage higher than the second voltage is applied to the bit line connected to the memory cell transistor as the program-inhibited target, and
in response to a number of the memory cell transistors having a threshold voltage lower than the verify low voltage becoming lower than or equal to a first value in the verify operation for the first state, execute the verify operation for the second state in a next program loop.

15. The semiconductor memory device according to claim 14, wherein in the program loop in which the verify operation for the first state is executed, the controller does not execute the verify operation for the remaining states.

16. The semiconductor memory device according to claim 14, wherein in the program loop in which the verify operation for the second state is executed, the controller does not execute the verify operation for the remaining states.

17. The semiconductor memory device according to claim 14, wherein:
the plurality of memory cell transistors are each configured to store third data if the threshold voltage is included in a third state higher than the second state,
the verify low voltage and the verify high voltage are set in the second state, and
the controller is configured to execute the verify operation for the third state in a next program loop, in response to a number of the memory cell transistors having a threshold voltage lower than the verify low voltage becoming lower than or equal to a second value in the verify operation for the second state.

18. The semiconductor memory device according to claim 17, wherein in the program loop in which the verify operation for the third state is executed, the controller does not execute the verify operation for the remaining states.

19. The semiconductor memory device according to claim 18, wherein in the verify operation for the third state, the controller uses one verify voltage.

20. The semiconductor memory device according to claim 14, wherein the controller executes each verify operation for only one of the states in the repeated program loop.

* * * * *